United States Patent
Fujiyama et al.

(10) Patent No.: US 12,384,965 B2
(45) Date of Patent: Aug. 12, 2025

(54) COPOLYMER, ELECTROLUMINESCENT DEVICE MATERIAL INCLUDING COPOLYMER, AND ELECTROLUMINESCENT DEVICE

(71) Applicant: SAMSUNG ELECTRONICS CO., LTD., Suwon-si (KR)

(72) Inventors: Takahiro Fujiyama, Yokohama (JP); Tomoyuki Kikuchi, Yokohama (JP); Fumiaki Kato, Yokohama (JP); Masashi Tsuji, Hwaseong-si (KR); Naotoshi Suganuma, Yokohama (JP); Norihito Ishii, Yokohama (JP); Dae Young Chung, Suwon-si (KR); Ha Il Kwon, Suwon-si (KR); Soonmin Cha, Suwon-si (KR); Tae Ho Kim, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 839 days.

(21) Appl. No.: 17/553,914

(22) Filed: Dec. 17, 2021

(65) Prior Publication Data

US 2022/0204673 A1 Jun. 30, 2022

(30) Foreign Application Priority Data

Dec. 18, 2020 (JP) ................................. 2020-210237

(51) Int. Cl.
*H01L 51/50* (2006.01)
*C08F 226/02* (2006.01)
(Continued)

(52) U.S. Cl.
CPC .......... *C09K 11/565* (2013.01); *C08F 226/02* (2013.01); *C08F 226/06* (2013.01); *C09K 11/883* (2013.01); *H10K 85/111* (2023.02); *B82Y 20/00* (2013.01); *B82Y 40/00* (2013.01); *H10K 50/11* (2023.02); *H10K 50/115* (2023.02);
(Continued)

(58) Field of Classification Search
None
See application file for complete search history.

(56) References Cited

U.S. PATENT DOCUMENTS 5,728,801 A 3/1998 Wu et al.
7,255,936 B2 8/2007 Doi et al.
(Continued)

FOREIGN PATENT DOCUMENTS

CN 107118333 A 9/2017
DE 102009010714 A1 9/2010
(Continued)

OTHER PUBLICATIONS

Iwan; Polymers with triphenylamine units: Photonic and electroactive materials; Progress in Polymer Science 36 (2011) 1277-1325 (Year: 2011).*
(Continued)

*Primary Examiner* — Gregory D Clark
(74) *Attorney, Agent, or Firm* — CANTOR COLBURN LLP

(57) ABSTRACT

Disclosed is a copolymer including a structural unit represented by Chemical Formula 1 capable of improving performance (particularly durability) of an electroluminescent device.

10 Claims, 2 Drawing Sheets

(51) Int. Cl.
  *C08F 226/06*   (2006.01)
  *C09K 11/56*    (2006.01)
  *C09K 11/88*    (2006.01)
  *H10K 85/10*    (2023.01)
  *B82Y 20/00*        (2011.01)
  *B82Y 40/00*        (2011.01)
  *H10K 50/11*        (2023.01)
  *H10K 50/115*       (2023.01)
  *H10K 50/15*        (2023.01)
  *H10K 50/17*        (2023.01)
  *H10K 101/30*       (2023.01)
  *H10K 101/40*       (2023.01)
  *H10K 102/00*       (2023.01)

(52) U.S. Cl.
  CPC ............ *H10K 50/15* (2023.02); *H10K 50/17* (2023.02); *H10K 2101/30* (2023.02); *H10K 2101/40* (2023.02); *H10K 2102/00* (2023.02)

(56) References Cited

U.S. PATENT DOCUMENTS

| | | | |
|---|---|---|---|
| 8,330,142 | B2 | 12/2012 | Cho et al. |
| 9,178,159 | B2 | 11/2015 | Pan et al. |
| 9,246,103 | B2 | 1/2016 | Pan et al. |
| 9,315,617 | B2 | 4/2016 | Meyer et al. |
| 9,815,940 | B2 | 11/2017 | Eckes et al. |
| 10,109,801 | B2 | 10/2018 | Lee et al. |
| 10,319,922 | B2 | 6/2019 | Lee et al. |
| 10,319,923 | B2 | 6/2019 | Lee et al. |
| 10,403,823 | B2 | 9/2019 | Humphries et al. |
| 11,021,568 | B2 | 6/2021 | Matsumoto et al. |
| 11,910,697 | B2 | 2/2024 | Kato et al. |
| 2013/0079517 | A1* | 3/2013 | Schafer ................ C07D 239/26 544/335 |
| 2022/0077394 | A1* | 3/2022 | Kato .................... C08L 65/02 |

FOREIGN PATENT DOCUMENTS

| | | |
|---|---|---|
| JP | 2001503074 A | 3/2001 |
| JP | 2003155476 A | 5/2003 |
| JP | 2008069367 A | 3/2008 |
| JP | 2009132882 A | 6/2009 |
| JP | 2010199067 A | 9/2010 |
| JP | 2012519215 A | 8/2012 |
| JP | 2014527290 A | 10/2014 |
| JP | 2014527550 A | 10/2014 |
| JP | 2017002287 A | 1/2017 |
| JP | 2018021187 A | 2/2018 |
| JP | 2019019326 A | 2/2019 |
| JP | 2022045759 A | 3/2022 |
| KR | 20070054890 A | 5/2007 |
| KR | 1512059 B1 | 4/2015 |
| KR | 20160013692 A | 2/2016 |
| KR | 20190136297 A | 12/2019 |
| KR | 20200018229 A | 2/2020 |
| WO | 2010097156 A | 9/2010 |
| WO | 2013013753 A2 | 1/2013 |
| WO | 2013013754 A1 | 1/2013 |
| WO | 2015044656 A | 4/2015 |
| WO | 2019004248 A1 | 1/2019 |

OTHER PUBLICATIONS

English Abstract of JP 2009132882.
English Abstract of JP 2017002287.
English Translation of Office Action dated Nov. 5, 2024, of the corresponding Japanese Patent Application No. 2020-210237, 5 pp.
Office Action dated Nov. 5, 2024, of the corresponding Japanese Patent Application No. 2020-210237, 6 pp.

* cited by examiner

COPOLYMER, ELECTROLUMINESCENT DEVICE MATERIAL INCLUDING COPOLYMER, AND ELECTROLUMINESCENT DEVICE

CROSS-REFERENCE TO RELATED APPLICATION

This application claims priority to Japanese Patent Application No. 2020-210237 filed in the Japan Patent Office on Dec. 18, 2020, and all the benefits accruing therefrom under 35 U.S.C. § 119, the entire content of which is herein incorporated by reference.

BACKGROUND

1. Field

A copolymer, an electroluminescent device material including the copolymer, and an electroluminescent device are disclosed.

2. Description of the Related Art

Research and development of electroluminescent devices (EL devices) are actively progressing. In particular, EL devices are expected to be used as solid-light emitting types that are inexpensive and can be used in large area full color display devices or recording light source arrays. An EL device is a light emitting device including a thin film of several nanometers to several hundred nanometers disposed between an anode and a cathode. In addition, the EL devices usually further include a hole transport layer, a light emitting layer, an electron transport layer, or the like.

Among these, the light emitting layer includes a fluorescent light emitting material and a phosphorescent light emitting material. A phosphorescent light emitting material is a material expected to have a high luminous efficiency compared with a fluorescent light emitting material. In addition, in order to cover a wide color gamut, an RGB light source requires an emission spectrum having a narrow full width at half maximum. Although deep blue is particularly preferred for blue, there are currently no devices found to have a long life-span and satisfactory color purity.

As a method of solving such a problem, some conventional light emitting devices use "quantum dots" which include an inorganic light emitting material as a light emitting material (See, Patent Document 1, Japanese Patent Laid-Open Publication No. 2010-199067). Quantum dots (QD) are semiconductor materials having crystal structures of several nanometers in size and are made up of hundreds to thousands of atoms.

Because quantum dots are very small in size, a surface area per unit volume is large. For this reason, most of the atoms are present on the surface of the nanocrystals, and exhibit quantum confinement effects.

Due to the quantum confinement effect, conventional approaches have adjusted the size of the quantum dot to adjust the emission wavelength resulting in improved characteristics such as improved color purity and high photoluminescence (PL) efficiency. A quantum dot light emitting diode (QD LED) is a three-layered device including a hole transport layer (HTL) and an electron transport layer (ETL) with a quantum dot light emitting layer located between the HTL and the ETL, which is known as the basic device.

SUMMARY

However, in the electroluminescent device (especially, a quantum dot electroluminescent device) using the hole transport material described in Patent Document 1, sufficient durability (particularly luminescence life-span) could not be achieved.

Accordingly, an embodiment provides a technology capable of improving durability (particularly, a luminescence life-span) of an electroluminescent device (particularly, a quantum dot electroluminescent device).

An embodiment provides a polymer having a specific structure.

An embodiment provides a copolymer having a structural unit represented by Chemical Formula 1.

[Chemical Formula 1]

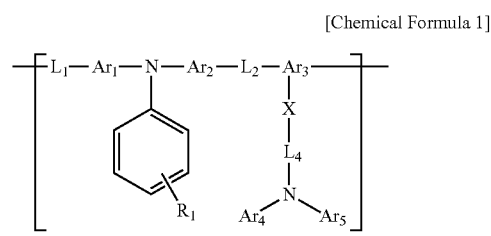

In Chemical Formula 1, $Ar_1$ and $Ar_2$ are each independently a substituted or unsubstituted divalent aromatic hydrocarbon group having 6 to 30 carbon atoms or a substituted or unsubstituted divalent aromatic heterocyclic group having 3 to 30 ring-member atoms, wherein when a plurality of $Ar_1$'s and $Ar_2$'s are present, they may be the same or different, $Ar_3$ is a substituted or unsubstituted trivalent aromatic hydrocarbon group having 6 to 30 carbon atoms or a substituted or unsubstituted trivalent aromatic heterocyclic group having 3 to 30 ring-member atoms, wherein when a plurality of $Ar_3$'s are present, they may be the same or different, $Ar_4$ and $Ar_5$ are each independently a substituted or unsubstituted aromatic hydrocarbon group having 6 to 30 carbon atoms or a substituted or unsubstituted aromatic heterocyclic group having 3 to 30 ring-member atoms, wherein when a plurality of $Ar_4$'s and $Ar_5$'s are present, they may be the same or different, $L_1$ and $L_2$ are each independently a single bond or a substituted or unsubstituted divalent aromatic hydrocarbon group having 6 to 30 carbon atoms, X is a single bond, $-L_{3a}-$, or $-L_{3b}-L_{3c}-$, wherein $L_{3a}$, $L_{3b}$, and $L_{3c}$ are each independently a substituted or unsubstituted divalent aromatic hydrocarbon group having 6 to 30 carbon atoms, $L_4$ is a substituted or unsubstituted aromatic hydrocarbon group having 6 to 30 carbon atoms, wherein $L_4$ may form a ring with $Ar_4$, $Ar_5$, or a combination thereof, and $R_1$ is hydrogen, a substituted or unsubstituted alkyl group having 1 to 20 carbon atoms, a substituted or unsubstituted alkoxy group having 1 to 20 carbon atoms, or a substituted or unsubstituted aromatic hydrocarbon group having 6 to 30 carbon atoms, and $R_1$ is optionally linked to the phenylene ring to provide a fused ring.

The structural unit represented by Chemical Formula 1 may include a structural unit represented by Chemical Formula 2.

[Chemical Formula 2]

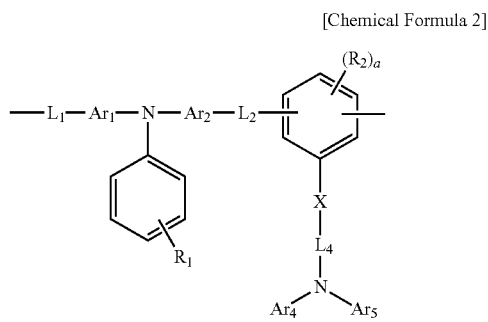

In Chemical Formula 2, $Ar_1$, $Ar_2$, $Ar_4$, $Ar_5$, $L_1$, $L_2$, X, $L_4$, and $R_1$ are the same as in Chemical Formula 1, $R_2$ may be a substituted or unsubstituted alkyl group having 1 to 20 carbon atoms, a substituted or unsubstituted alkoxy group having 1 to 20 carbon atoms, or a substituted or unsubstituted monovalent aromatic hydrocarbon group having 6 to 30 carbon atoms, and a may be 0, 1, 2, or 3.

The structural unit represented by Chemical Formula 1 may include a structural unit represented by Chemical Formula 3.

[Chemical Formula 3]

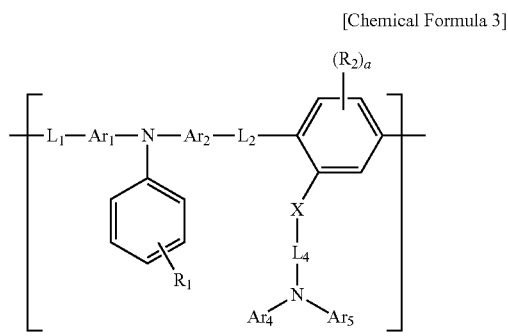

In Chemical Formula 3, $Ar_1$, $Ar_2$, $Ar_4$, $Ar_5$, $L_1$, $L_2$, X, $L_4$, and $R_1$ are the same as in Chemical Formula 1, and $R_2$ and a are the same as in Chemical Formula 1.

In Chemical Formula 1, the structural unit represented by Chemical Formula 1-1 may be a moiety represented by Chemical Formula 1-1a, Chemical Formula 1-1b, or Chemical Formula 1-1c.

[Chemical Formula 1-1]

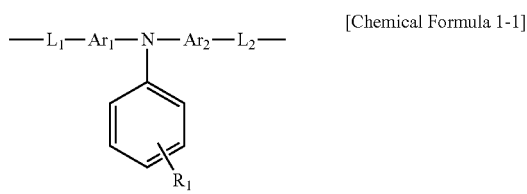

[Chemical Formula 1-1a]

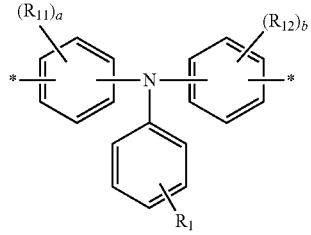

[Chemical Formula 1-1b]

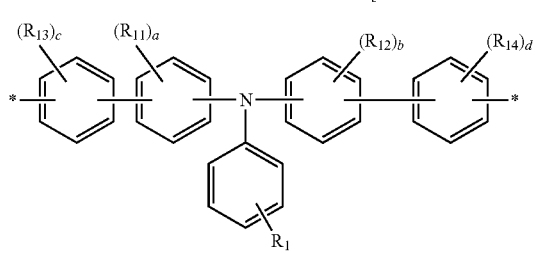

[Chemical Formula 1-1c]

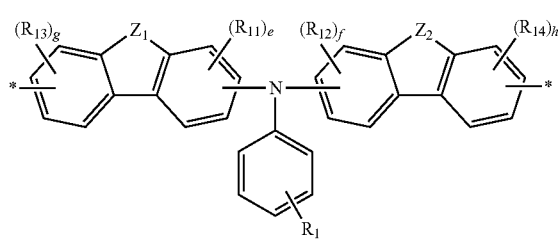

In Chemical Formula 1-1a, Chemical Formula 1-1b, and Chemical Formula 1-1c, $R_{11}$, $R_{12}$, $R_{13}$, and $R_{14}$ may each independently be hydrogen, a substituted or unsubstituted alkyl group having 1 to 20 carbon atoms, a substituted or unsubstituted alkoxy group having 1 to 20 carbon atoms, or a substituted or unsubstituted aromatic hydrocarbon group having 6 to 30 carbon atoms, $Z_1$ and $Z_2$ may each independently be $CR_aR_b$, $NR_c$, O, S, Se, or Te, wherein $R_a$, $R_b$, and $R_c$ may each independently be hydrogen, a linear or branched hydrocarbon group having 1 to 14 carbon atoms, or an aromatic hydrocarbon group having 6 to 14 carbon atoms, and $R_a$ and $R_b$ may be linked to each other to provide a spiro structure, a, b, c, and d may each independently be an integer of 1 to 4, e, f, g, and h may each independently be an integer of 1 or 2, $R_1$ is the same as in Chemical Formula 1, and

* indicates a bonding portion linked to the main chain.

At least one of $Ar_4$ and $Ar_5$ in Chemical Formula 1 may be a group represented by Chemical Formula 4.

[Chemical Formula 4]

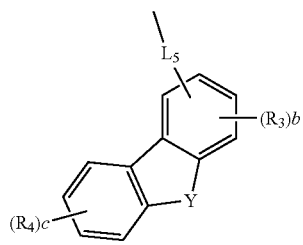

In Chemical Formula 4,

L₅ may be a single bond, a substituted or unsubstituted divalent aromatic hydrocarbon group having 6 to 30 carbon atoms, or a substituted or unsubstituted divalent aromatic heterocyclic group having 3 to 30 ring-member atoms, R₃ and R₄ may be the same or different, and may each independently be a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 3 to 30 ring-member atoms, Y may be =CR₅R₆—, —O—, or —S—, wherein R₅ and R₆ may each independently be a substituted or unsubstituted aryl group having 6 to 30 carbon atoms or a substituted or unsubstituted alkyl group having 1 to 20 carbon atoms, or R₅ and R₆ may be linked with each other to form a ring structure, b may be 0, 1, 2, or 3, and c may be 0, 1, 2, 3, or 4.

The group represented by Chemical Formula 4 may be one of Group 2 (Chemical Formulas 5 to 20).

[Group 2]

(5)

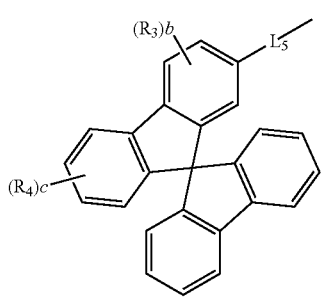

(6)

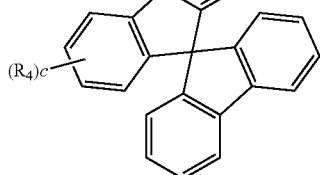

(7)

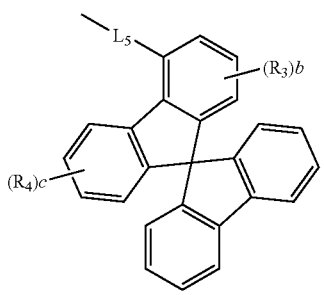

(8)

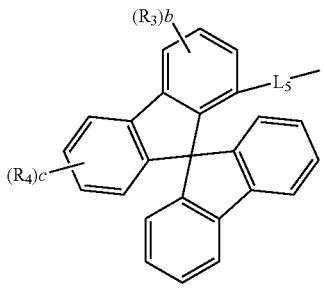

(9)

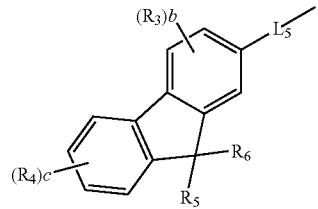

(10)

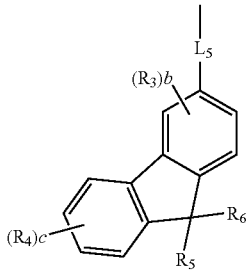

(11)

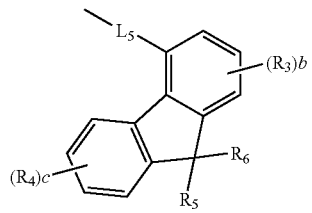

(12)

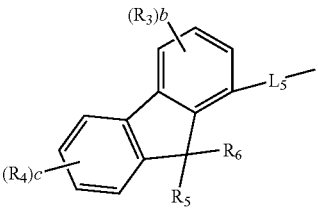

(13)
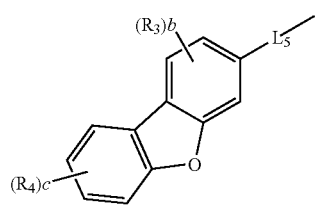

(14)
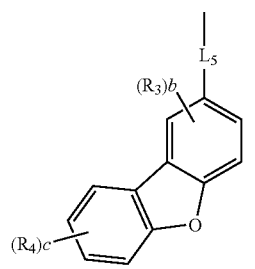

(15)
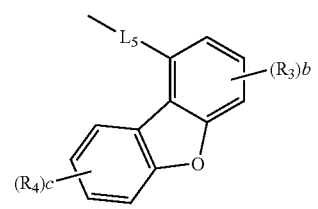

(16)
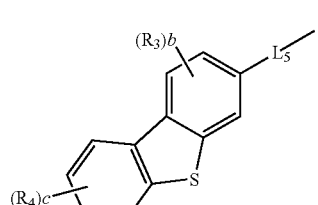

(17)
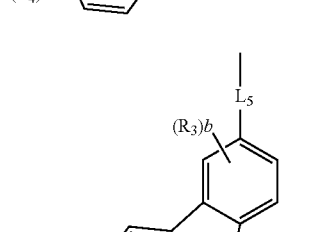

(18)
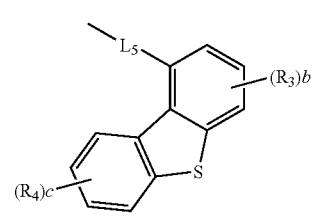

(19)

(20)
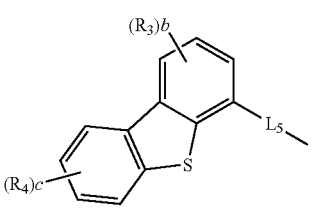

In Group 2 (Chemical Formula 5 to Chemical Formula 20), $L_5$, $R_3$, $R_4$, $R_5$, $R_6$, b, and c are the same as in Chemical Formula 4.

In Chemical Formula 1, $L_4$ may form a ring with $Ar_4$, and $-L_4-N(Ar_4)(Ar_5)$ may have a structure represented by Chemical Formula 21 or 22.

[Chemical Formula 21]

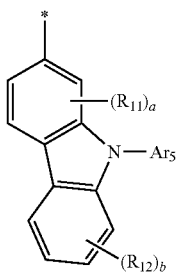

[Chemical Formula 22]

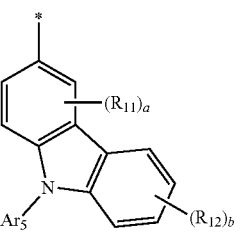

In Chemical Formula 21 and Chemical Formula 22, $Ar_5$ is the same as in Chemical Formula 1, and $R_{11}$ and $R_{12}$ may each independently be a hydrogen atom, a linear alkyl group having 3 to 10 carbon atoms, or a branched alkyl group having 3 to 10 carbon atoms, a may be an integer of 1 to 3, and b may be an integer of 1 to 4.

According to another embodiment, an electroluminescent device material comprising the aforementioned copolymer is provided.

According to another embodiment, an electroluminescent device includes a first electrode and a second electrode, and at least one organic layer between the first electrode and the second electrode comprising at least one layer, wherein the at least one layer of the organic layer includes the aforementioned copolymer.

The organic layer including the copolymer is a hole transport layer or a hole injection layer.

The organic layer may include a light emitting layer including semiconductor nanoparticles or an organometallic complex.

An electroluminescent device, and in particular, a quantum dot electroluminescent device having durability (particularly luminescence life-span), may be provided.

DETAILED DESCRIPTION

Figure 1:
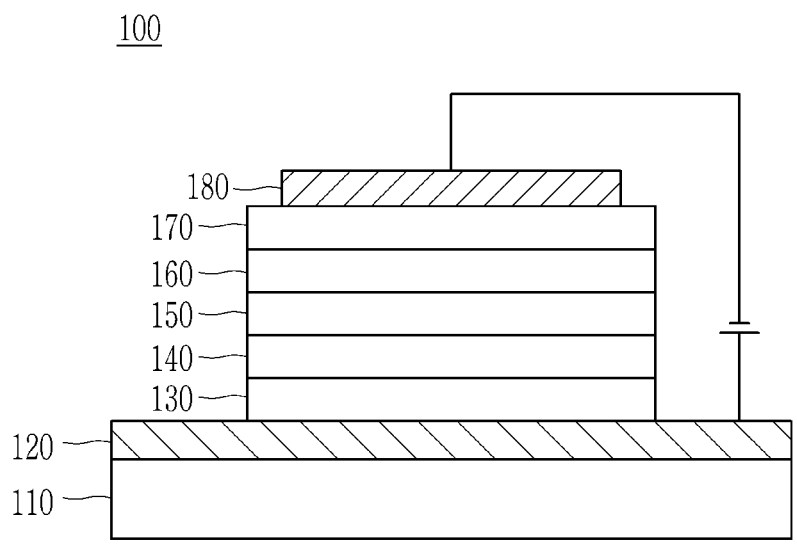
FIG. 1 is a schematic view illustrating an electroluminescent device according to an exemplary embodiment.

According to an embodiment, a copolymer having a structural unit represented by Chemical Formula 1 is provided:

[Chemical Formula 1]

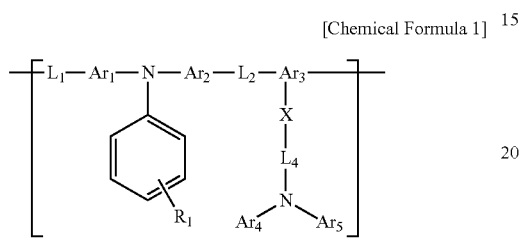

In Chemical Formula 1, $Ar_1$ and $Ar_2$ are each independently a substituted or unsubstituted divalent aromatic hydrocarbon group having 6 to 30 carbon atoms or a substituted or unsubstituted divalent aromatic heterocyclic group having 3 to 30 ring-member atoms, wherein when a plurality of $Ar_1$'s and $Ar_2$'s are present, they may be the same or different, $Ar_3$ is a substituted or unsubstituted trivalent aromatic hydrocarbon group having 6 to 30 carbon atoms or a substituted or unsubstituted trivalent aromatic heterocyclic group having 3 to 30 ring-member atoms wherein when a plurality of $Ar_3$'s are present, they may be the same or different, $Ar_4$ and $Ar_5$ are each independently a substituted or unsubstituted aromatic hydrocarbon group having 6 to 30 carbon atoms or a substituted or unsubstituted aromatic heterocyclic group having 3 to 30 ring-member atoms, wherein when a plurality of $Ar_4$'s and $Ar_5$'s are present, they may be the same or different, $L_1$ and $L_2$ are each independently a single bond or a substituted or unsubstituted divalent aromatic hydrocarbon group having 6 to 30 carbon atoms, X is a single bond, -$L_{3a}$-, or -$L_{3b}$-$L_{3c}$-, wherein $L_{3a}$, $L_{3b}$, and $L_{3c}$ are each independently a substituted or unsubstituted divalent aromatic hydrocarbon group having 6 to 30 carbon atoms, $L_4$ is a substituted or unsubstituted aromatic hydrocarbon group having 6 to 30 carbon atoms, wherein $L_4$ may form a ring with $Ar_4$, $Ar_5$, or a combination thereof, and $R_1$ is hydrogen, a substituted or unsubstituted alkyl group having 1 to 20 carbon atoms, a substituted or unsubstituted alkoxy group having 1 to 20 carbon atoms, or a substituted or unsubstituted aromatic hydrocarbon group having 6 to 30 carbon atoms, and $R_1$ is optionally linked to the phenylene ring to provide a fused ring.

As used herein, a "structural unit represented by Chemical Formula 1" is also referred to as "Structural Unit (1)."

A structural unit having a structure represented by Chemical Formula 1-1 among "structural units represented by Chemical Formula 1" is also referred to as "Structural Unit (1-1)."

[Chemical Formula 1-1]

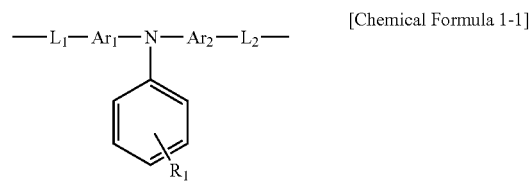

A structural unit having a structure represented by Chemical Formula 1-2 among "structural units represented by Chemical Formula 1" is also referred to as "Structural Unit (1-2)."

[Chemical Formula 1-2]

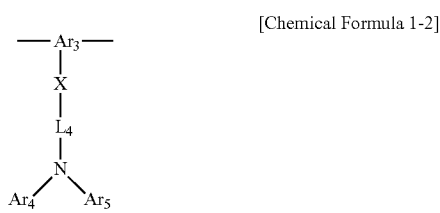

A copolymer having a structural unit represented by Chemical Formula 1 is also referred to as a "copolymer."

According to another embodiment, an electroluminescent device material includes the copolymer.

According to another embodiment, an electroluminescent device includes a first electrode and a second electrode each having a surface opposite the other, and an organic layer including at least one layer disposed between the first electrode and the second electrode, wherein at least one of the organic layers includes the aforementioned copolymer of Chemical Formula 1.

As used herein, the electroluminescent device is simply referred to as "LED."

Quantum dot electroluminescent devices are also referred to simply as "QLEDs."

An organic electroluminescent device is also simply referred to as "OLED."

A conventional organic electroluminescent device (organic light emitting diode, OLED) includes a hole transport layer (HTL) and a light emitting layer. The HOMO (Highest Occupied Molecular Orbital) level of the material used for the hole transport layer (HTL) may be greater than or equal to about −5.3 eV and less than or equal to about −5.0 eV. In addition, since a HOMO level of a material used for the light emitting layer is greater than or equal to about −5.5 eV and less than or equal to about −5.0 eV, there is a small difference from the HOMO level of the material used for the hole transport layer (HTL), providing a device having efficient hole transport and high luminous efficiency.

On the other hand, a valance band level of the quantum dots used in a quantum dot electroluminescent device (QLED), for example, in a blue QLED is about −5.7 eV, while in a red QLED is about −5.55 eV. For this reason, there may be a large band offset difference from a HOMO level of a hole transport layer (HTL) material used for a conventional organic electroluminescent device (OLED), bringing about problems of deteriorating carrier injection efficiency (durability (luminescence life-span)) and luminous efficiency, and increasing a turn-on voltage and a driving voltage of the QLED, and the like.

In order to solve these problems, conventional methods use a hole transport layer (HTL) material having a deeper HOMO level than that of the hole transport layer (HTL) to decrease the band offset with the light emitting layer (QD (Quantum Dot) layer). In the method, when the material having a deeper HOMO level alone is used for the hole transport layer (HTL), the band offset with the light emitting layer (QD (Quantum Dot) layer) is reduced and thus may improve the hole injection ability from the hole transport layer (HTL) to the light emitting layer.

On the other hand, since a hole injection layer (HIL) has a valance band of about −5.35 eV and in the configuration, there may exist a large band offset difference from the hole transport layer (HTL), there may be a problem of deteriorating durability (luminescence life-span) and the like due to small hole injection ability from the hole injection layer (HIL) to the hole transport layer (HTL). Accordingly, there is a need in the art for a method of reducing both the band offset of the hole injection layer (HIL) and the hole transport layer (HTL) and the band offset of the hole transport layer (HTL) and the light emitting layer.

The present inventors have discovered that the structure of Chemical Formula 1 is effective to provide the desired characteristics.

The copolymer according to an embodiment has a segment in which Structural Unit (1-1) with a shallow HOMO level and Structural Unit (1-2) with a deep HOMO level are alternately present. Herein, Structural Unit (1-1) has a nitrogen atom in a main chain, and the nitrogen atom and a substituent $R_1$ may be present at a para or meta position or desirably a para position. This structure makes a conjugate length thereof longer, and as a result, the homopolymer of Structural Unit (1-1) exhibits a shallow HOMO level.

On the other hand, Structural Unit (1-2) has monoamine (—N($Ar_4$)($Ar_5$)) in the side chain. A conjugate length thereof becomes shorter due to this structure, and as a result, the homopolymer of Structural Unit (1-2) may have a deeper HOMO level. In other words, the copolymer includes Structural Unit (1-1) with a shallow HOMO level and Structural Unit (1-2) with a deep HOMO level. Accordingly, since the band offset difference of the hole injection layer (HIL) and the hole transport layer (HTL) is reduced due to the Structural Unit (1-1) of the copolymer, the hole injection ability from the hole injection layer (HIL) to the hole transport layer (HTL) may be improved. Simultaneously, since the band offset difference of the hole transport layer (HTL) and the light emitting layer is also reduced due to Structural Unit (1-2), the hole injection ability from the hole transport layer (HTL) to the light emitting layer also may be improved. In other words, this copolymer may be used for the hole transport layer (HTL) to increase the hole mobility from the hole injection layer (HIL) to the light emitting layer and as a result, improve the durability.

Accordingly, an electroluminescent device manufactured by using the copolymer may exhibit excellent durability (a long luminescence life-span). In addition, the copolymer may suppress an increase in a driving voltage. Accordingly, the electroluminescent device manufactured by using the copolymer may exhibit excellent durability (e.g., a long luminescence life-span) at a low driving voltage.

Moreover, since the copolymer has excellent film-forming properties and solvent solubility, a film may be formed by a wet (coating) method. Therefore, by using the copolymer, a large area and high productivity of the electroluminescent device are possible. The above effect may be significantly exhibited when the copolymer is applied to an EL device, particularly in a hole transport layer of a QLED.

In addition, the mechanism is theoretical, and the present disclosure is not limited by the mechanism.

Hereinafter, embodiments are described. On the other hand, the present disclosure is not limited to the following embodiments. In addition, each drawing is exaggerated for better understanding and ease of description, and the dimensional ratio of each constituent element in each drawing may differ from reality. In addition, when the embodiment of the present disclosure has been described with reference to the drawings, the same reference numerals are given to the same elements in the description of the drawings, and redundant descriptions are omitted.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one elements relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

In the present specification, unless otherwise specified, operation and physical properties are measured under the conditions of room temperature (20° C. or more and 25° C. or less)/relative humidity 40% RH or more and 50% RH or less.

In the present specification, unless otherwise defined, the aromatic hydrocarbon group may be an aryl group or an arylene group derived from an aromatic compound (arene) and the aromatic heterocyclic group may be a heteroaryl group or a heteroarylene group derived from a heterocyclic aromatic compound (heteroarene), and may include at least one, for example, 1 to 3 heteroatoms of N, O, S, Se, Te, Si, or P in the ring.

As used herein, unless otherwise specified, "substituted" refers to substitution with an alkyl group, a cycloalkyl group, a hydroxyalkyl group, an alkoxyalkyl group, an alkoxyl group, a cycloalkoxyl group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), or a cyano group (—CN). Also, optionally the substituents are not same as the groups being substituted. For example, an alkyl group is not substituted with an alkyl group.

Herein, the alkyl group as the substituent may be either a linear or branched saturated aliphatic hydrocarbon monovalent group, for example a linear alkyl group having 1 to 20 carbon atoms or a branched alkyl group having 3 to 20 carbon atoms. Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-icosyl group, and the like.

As the substituent, the cycloalkyl group refers to a monovalent saturated hydrocarbon monocyclic group having 3 to 10 carbon atoms, and non-limiting examples thereof include a cyclopropyl group, a cyclobutyl group, a cyclopentyl group, and a cyclohexyl group.

As the hydroxyalkyl group, for example, the alkyl group may be substituted with 1 to 3 (for example 1 or 2, and more desirably 1) hydroxy groups (for example, hydroxymethyl group, hydroxyethyl group).

As the alkoxyalkyl group, for example, the alkyl group may be substituted with 1 to 3 (desirably 1 or 2 and more desirably 1) alkoxy groups.

The alkoxy group refers to a monovalent group represented by —OA$_{101}$ (wherein A$_{101}$ is the alkyl group) as the substituent and may be either linear or a branched, but desirably a linear alkoxy group having 1 to 20 carbon atoms or a branched alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyl oxy group, a 3-ethylpentyloxy group, and the like.

The cycloalkoxy group as a substituent refers to a monovalent group represented by —OA$_{102}$ (wherein A$_{102}$ is the cycloalkyl group) and may be, for example, a cyclopropyl oxy group, a cyclobutyl oxy group, a cyclopentyl oxy group, a cyclohexyl oxy group, and the like.

The alkenyl group refers to a hydrocarbon group formed by including at least one carbon-carbon double bond in the middle or at the terminus of the alkyl group and may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group as a substituent refers to a hydrocarbon group formed by including at least one carbon-carbon triple bond in the middle or at the terminus of the alkyl group and may include, for example, an acetylenyl group, a 1-propynyl group, a 2-propynyl group, a 1-butynyl group, a 2-butynyl group, a 3-butynyl group, a 1-pentetyl group, a 2-pentetyl group, a 3-pentetyl group, 1-hexynyl group, a 2-hexynyl group, a 3-hexynyl group, a 1-heptinyl group, a 2-heptinyl group, a 5-heptinyl group, a 1-octynyl group, a 3-octynyl group, a 5-octynyl group, and the like.

Examples of the aryl group as the substituent refers to a monovalent group having a carbocyclic aromatic system having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

The aryloxy group as the substituent indicates —$OA_{103}$ (wherein $A_{103}$ is the aryl group having 6 to 30 carbon atoms) and may include, for example, a phenoxy group, and a naphthyloxy group.

The alkylthio group as the substituent indicates —$SA_{104}$ (wherein $A_{104}$ is the aryl group having 6 to 30 carbon atoms) and may include, for example, a methylthio group, an ethylthio group, a propylthio group, a pentylthio group, a hexylthio group, an octylthio group, a dodecylthio group, and the like.

The cycloalkylthio group as the substituent indicates —$SA_{105}$ (wherein $A_{105}$ is the cycloalkyl group) and may include, for example, a cyclopentylthio group and a cyclohexylthio group.

The arylthio group as the substituent indicates —$SA_{106}$ (wherein $A_{106}$ is the aryl group having 6 to 30 carbon atoms) and may include, for example, a phenylthio group, a naphthylthio group, and the like.

The alkoxycarbonyl group (also known as an alkyl ester group) as the substituent may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group (also known as an aryl ester group) as the substituent may include, for example, a phenyloxycarbonyl group, a naphthyloxycarbonyl group, and the like.

Copolymer

The copolymer of the present disclosure may include a structural unit (Structural Unit (1)) represented by Chemical Formula 1. A copolymer having the following structure has segments in which Structural Unit (1-1) having a shallow HOMO level and Structural Unit (1-2) having a deep HOMO level are alternately arranged. For this reason, an electroluminescent device (particularly quantum dot electroluminescent device) including the copolymer (especially in the hole transport layer) exhibits excellent durability (long luminescence life-span). Moreover, high luminous efficiency, high current efficiency, and low driving voltage may be achieved.

The copolymer may include one type of structural unit (Structural Unit (1)) represented by Chemical Formula 1, or may include two or more types of Structural Unit (1). The plurality of structural units (1) may exist in a block type or in a random type.

In addition, when two or more types of Structural Unit (1) exist, "Structural Units (1-1)" of each Structural Unit (1) may be the same or different from each other. Similarly, when two or more types of Structural Units (1) are present, the "Structural Units (1-2)" of each Structural Unit may be the same or different from each other.

[Chemical Formula 1]

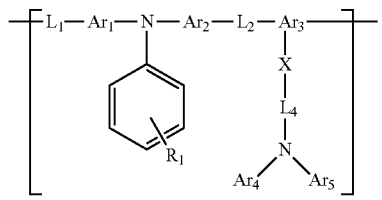

In Chemical Formula 1, $Ar_1$ and $Ar_2$ are each independently a substituted or unsubstituted divalent aromatic hydrocarbon group having 6 to 30 carbon atoms or a substituted or unsubstituted divalent aromatic heterocyclic group having 3 to 30 ring-member atoms. When a plurality of $Ar_1$'s and $Ar_2$'s are present, they may be the same or different from each other. In addition, $Ar_1$ and $Ar_2$ may be the same or different from each other.

The divalent aromatic hydrocarbon group having 6 to 30 carbon atoms is not particularly limited, but may be specifically a divalent group derived from an aromatic hydrocarbon compound such as benzene (phenylene group), pentalene, indene, naphthalene, anthracene, azulene, heptalene, acenaphthene, phenalene, fluorene, phenanthrene, biphenyl, terphenyl, quaterphenyl, quinquephenyl, pyrene, 9,9-diphenyl fluorene, 9,9'-spirobi[fluorene], 9,9-dialkyl fluorene, and the like. Herein, the alkyl may be either a linear or branched alkyl, for example a linear alkyl having 1 to 20 carbon atoms or a branched alkyl having 3 to 20 carbon atoms.

The divalent aromatic heterocyclic group having 3 to 30 ring-member atoms is not particularly limited, but may be specifically a divalent group derived from heterocyclic aromatic compounds such as acridine, phenazine, benzoquinoline, benzoisoquinoline, phenanthridine, phenanthroline, anthraquinone, fluorenone, dibenzofuran, dibenzothiophene, carbazole, imidazo phenanthridine, benzimidazophenanthridine, azadibenzofuran, 9-phenyl carbazole, azacarbazole, azadibenzothiophene, diazadibenzofuran, diazacarbazole, diazadibenzothiophene, xanthone, thioxanthone, pyridine, quinoline, anthraquinoline, and the like.

$Ar_1$ and $Ar_2$ (unsubstituted) may be the aforementioned divalent aromatic hydrocarbon group; a structure in which two or more types of the aforementioned divalent aromatic hydrocarbon groups are combined; the aforementioned divalent aromatic heterocyclic group; a structure in which two or more types of the aforementioned divalent aromatic heterocyclic groups; or a structure in which one or more types of the divalent aromatic hydrocarbon group and one or more types of the divalent aromatic heterocyclic group.

Among them, in view of a more appropriate HOMO level, at least one of $Ar_1$ and $Ar_2$ may be a divalent group derived from a compound of benzene (o-, m-, or p-phenylene group), dibenzofuran, or fluorene. For example, $Ar_1$ and $Ar_2$ may be a phenylene group (particularly a p-phenylene group). These $Ar_1$ and $Ar_2$ groups may appropriately control the HOMO level of the copolymer. In addition, a higher hole injection property, a higher triplet energy level, a lower drive voltage, a film formation property, and a balance of any two or more of these (particularly hole injection property and film formation property) may be achieved.

$L_1$ may be a single bond or a substituted or unsubstituted divalent aromatic hydrocarbon group having 6 to 30 carbon atoms. When a plurality of $L_1$'s are present, they may be the same or different from each other. As the divalent aromatic hydrocarbon group, the divalent groups derived from the aromatic hydrocarbon compounds in $Ar_1$ and $Ar_2$ may be exemplified in the same manner. Among these, from the viewpoint of a more appropriate HOMO level, $L_1$ may be desirably a single bond or a phenylene group, and more desirably a single bond.

$L_2$ may be a single bond or a substituted or unsubstituted divalent aromatic hydrocarbon group having 6 to 30 carbon atoms. When a plurality of $L_2$'s are present, they may be the same or different from each other. As the divalent aromatic hydrocarbon group, the divalent groups derived from the aromatic hydrocarbon compounds in $Ar_1$ and $Ar_2$ may be exemplified in the same manner. Among them, in view of a more appropriate HOMO level, $L_2$ may be desirably a single bond or a phenylene group, and more desirably a single bond.

$R_1$ may be hydrogen, a substituted or unsubstituted alkyl group having 1 to 20 carbon atoms, a substituted or unsubstituted alkoxy group having 1 to 20 carbon atoms, or a substituted or unsubstituted aromatic hydrocarbon group having 6 to 30 carbon atoms, and $R_1$ may be linked to the phenylene ring to provide a fused ring.

Herein, when a plurality of $R_1$'s are present, they may be the same or different from each other. The alkyl group having 1 or more and 20 or less carbon atoms and the alkoxy group having 1 or more and 20 or less carbon atoms may be, respectively, the alkyl group and the alkoxy group as in the aforementioned "substituent."

As the aromatic hydrocarbon group having 6 to 30 carbon atoms, the monovalent groups derived from the aromatic hydrocarbon compound in $Ar_1$ and $Ar_2$ may be exemplified in the same manner.

When $R_1$ is fused with a phenylene ring to form a fused ring, the fused ring is a substituted or unsubstituted aromatic hydrocarbon group having 6 to 30 carbon atoms (for example, a C9 to C30 aryl group, for example, a C9 to C20 aryl group, specifically a substituted or unsubstituted fluorenyl group or a substituted or unsubstituted spirobi[fluorenyl] group) or a substituted or unsubstituted aromatic heterocyclic ring group having 3 to 30 ring-member atoms (for example, a C8 to C30 heteroaryl group, for example, a C8 to C20 heteroaryl group, specifically a substituted or unsubstituted dibenzofuranyl group or a substituted or unsubstituted dibenzothiophenyl group).

The Structural Unit (1-1) may be a moiety represented by Chemical Formula 1-1a, Chemical Formula 1-1b, or Chemical Formula 1-1c.

[Chemical Formula 1-1a]

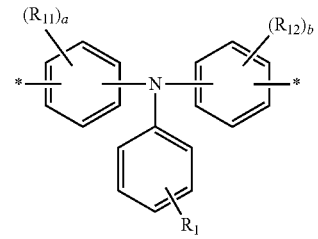

[Chemical Formula 1-1b]

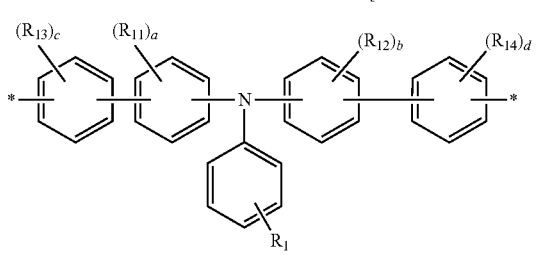

[Chemical Formula 1-1c]

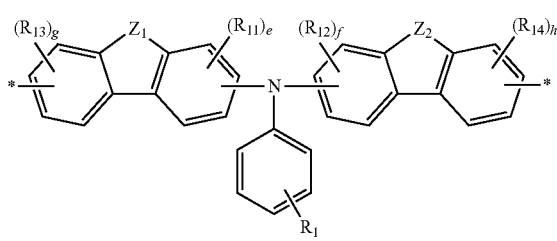

In Chemical Formula 1-1a, Chemical Formula 1-1b, and Chemical Formula 1-1c, $R_{11}$, $R_{12}$, $R_{13}$, and $R_{14}$ may be a hydrogen atom, a substituted or unsubstituted C1 to C20 alkyl group, a substituted or unsubstituted C1 to C20 alkoxy group, or a substituted or unsubstituted C6 to C30 aromatic hydrocarbon group, $Z_1$ and $Z_2$ may each independently be $CR_aR_b$, $NR_c$, O, S, Se, or Te, wherein $R_a$, $R_b$, and $R_c$ are each independently hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group) or an aromatic hydrocarbon group having 6 to 14 carbon atoms (a C6 to C14 aryl group, for example a C6 to C10 aryl group), and $R_a$ and $R_b$ may be linked to each other to form a spiro structure (e.g., a fluorenyl group), a, b, c, and d may each independently be an integer of 1 to 4, e, f, g, and h may each independently be an integer of 1 or 2, $R_1$ is the same as in Chemical Formula 1, and \* indicates a bonding portion linked to the main chain.

Specifically, Structural Unit (1-1) may be one of Group 1. On the other hand, in the following structures of Group 1, \* is a bonding portion forming a main chain.

[Group 1]

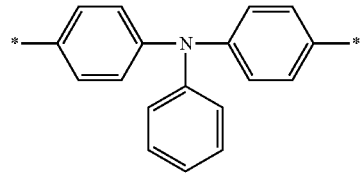

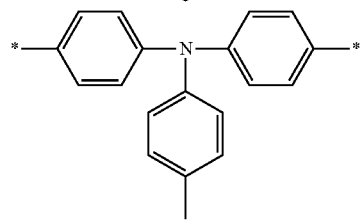

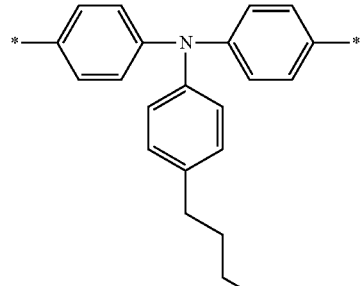

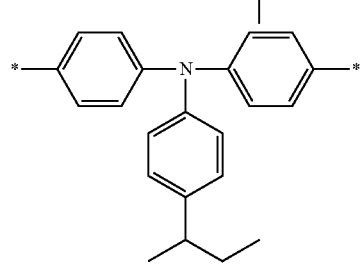

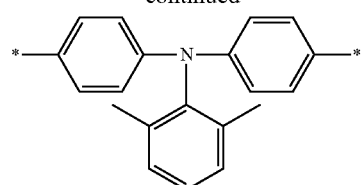
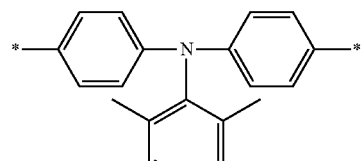
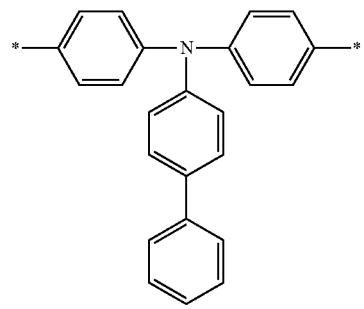
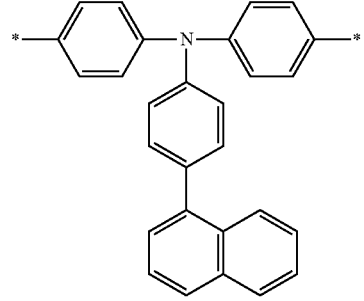
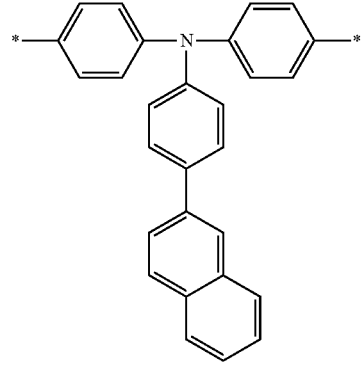
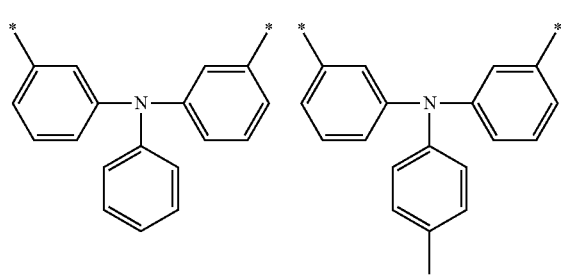
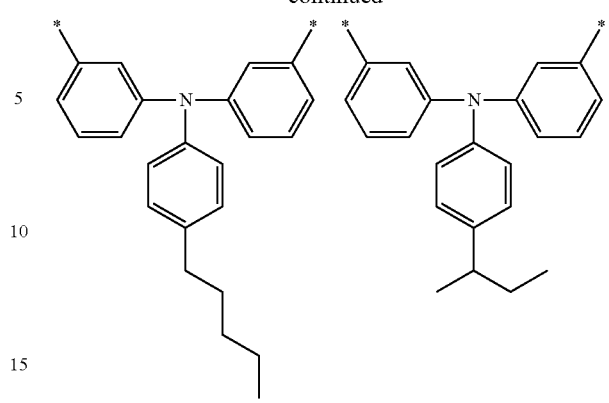
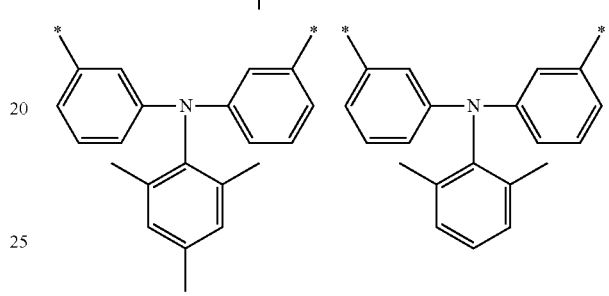
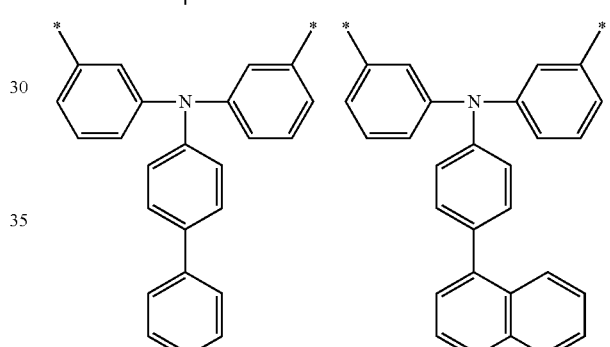
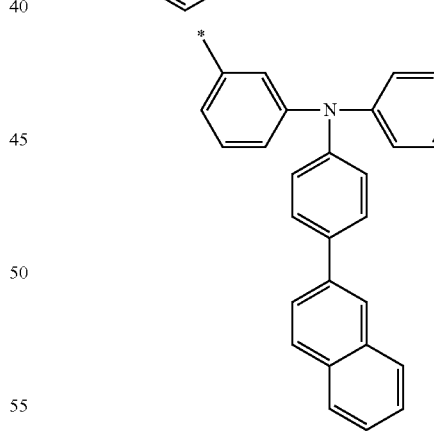
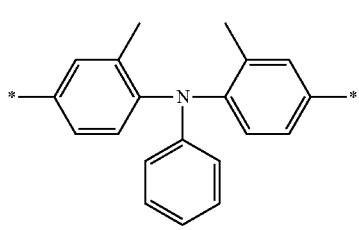

-continued
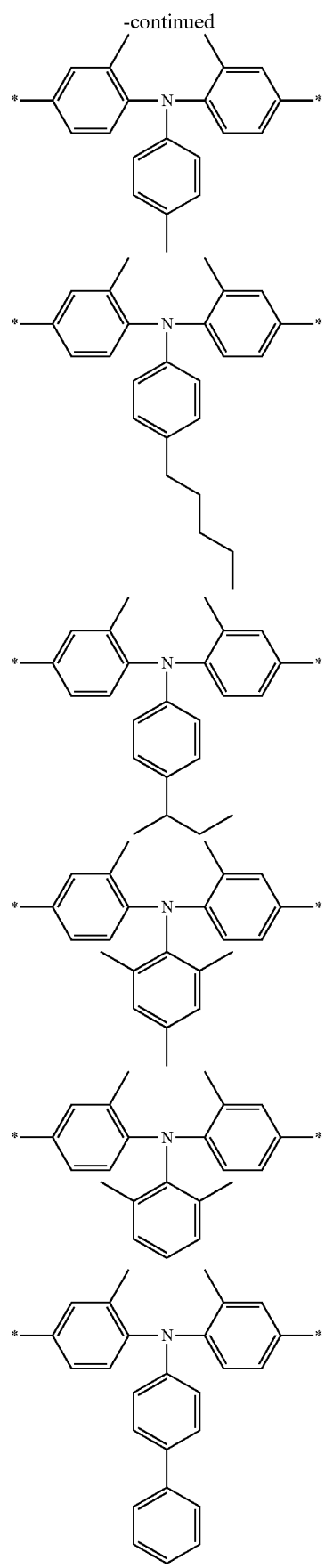
-continued
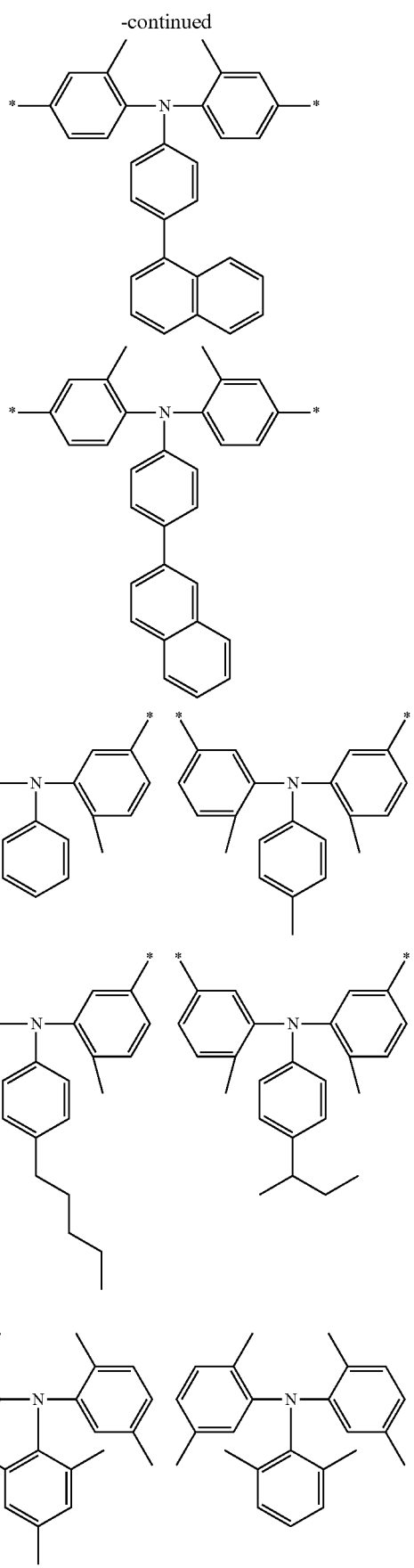

-continued
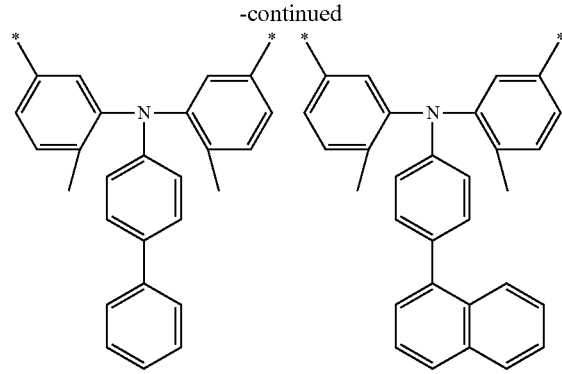
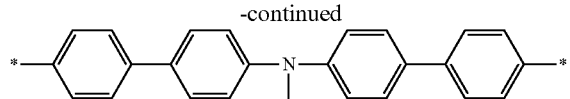
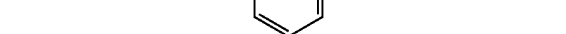
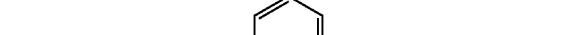
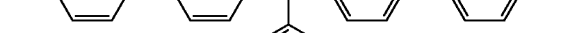
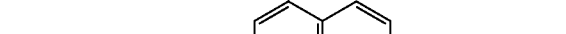
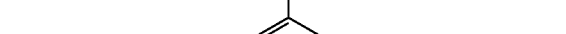
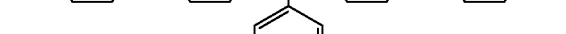
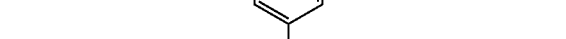

-continued
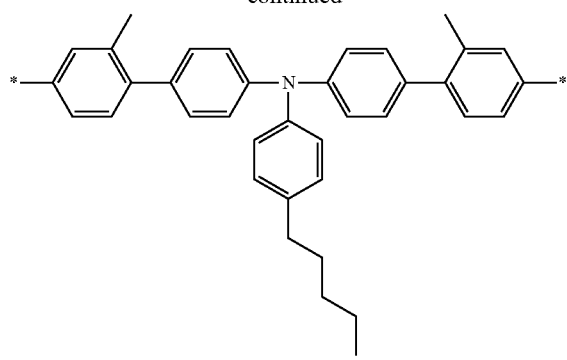
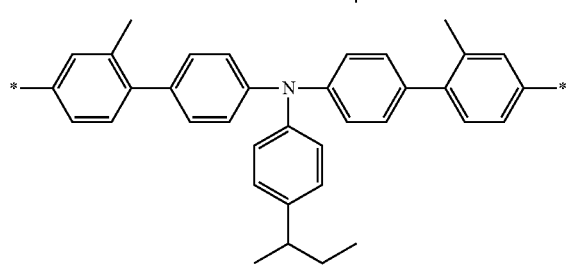
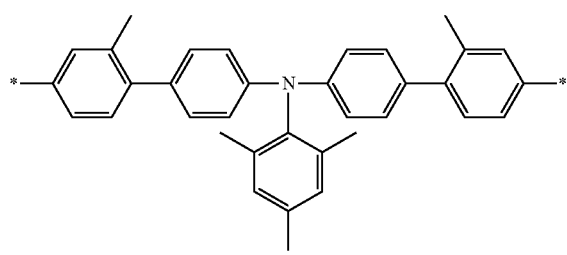
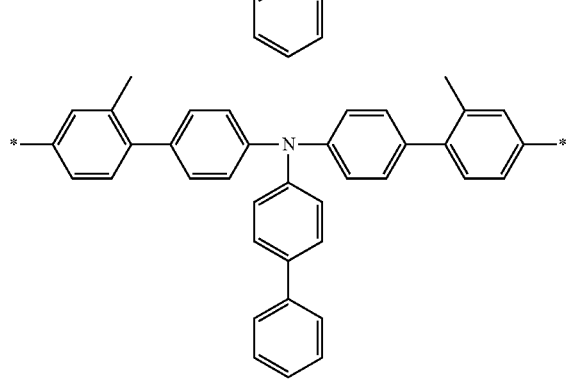
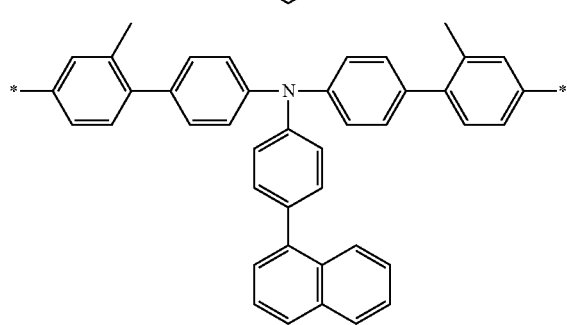
-continued
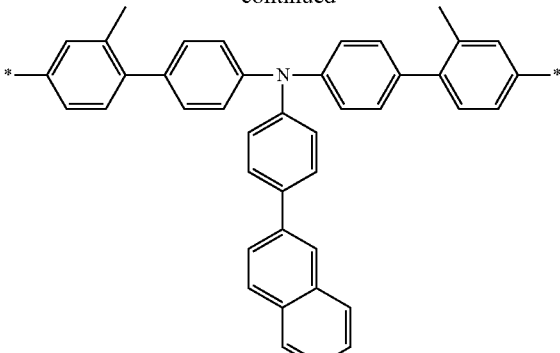
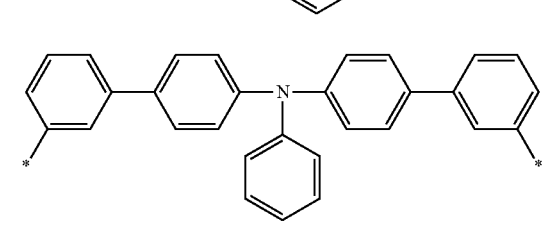
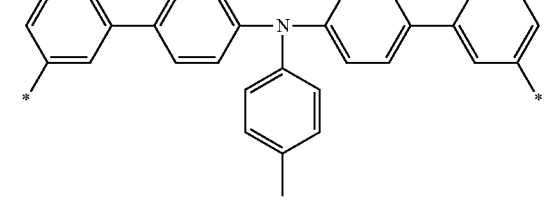
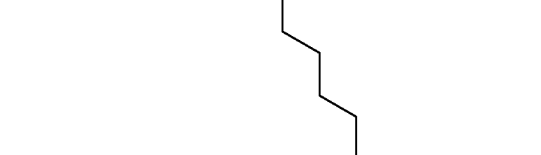
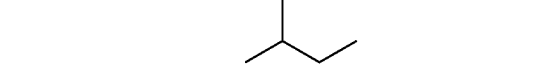
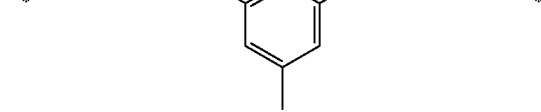

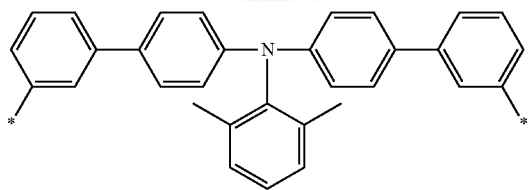
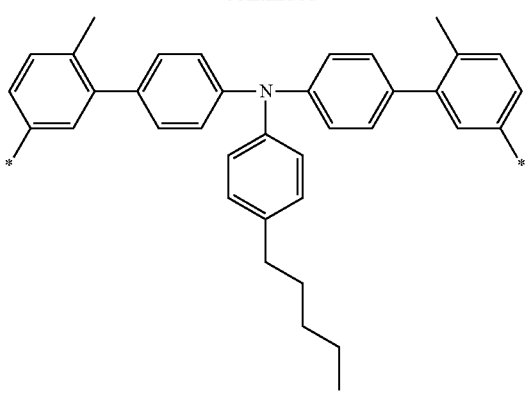
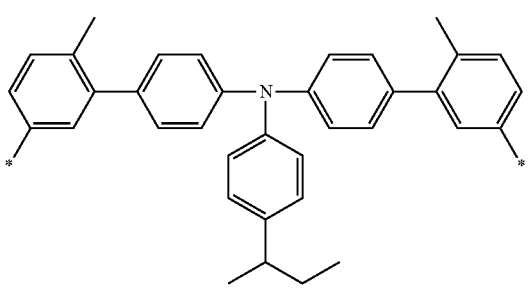
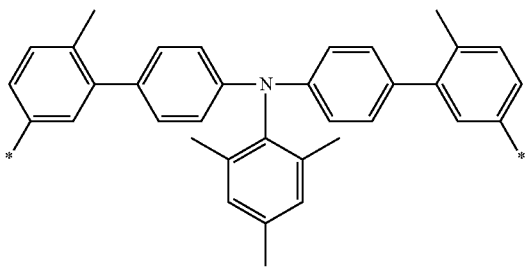
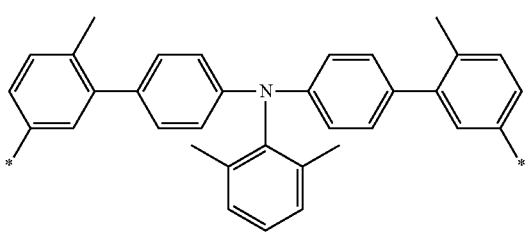

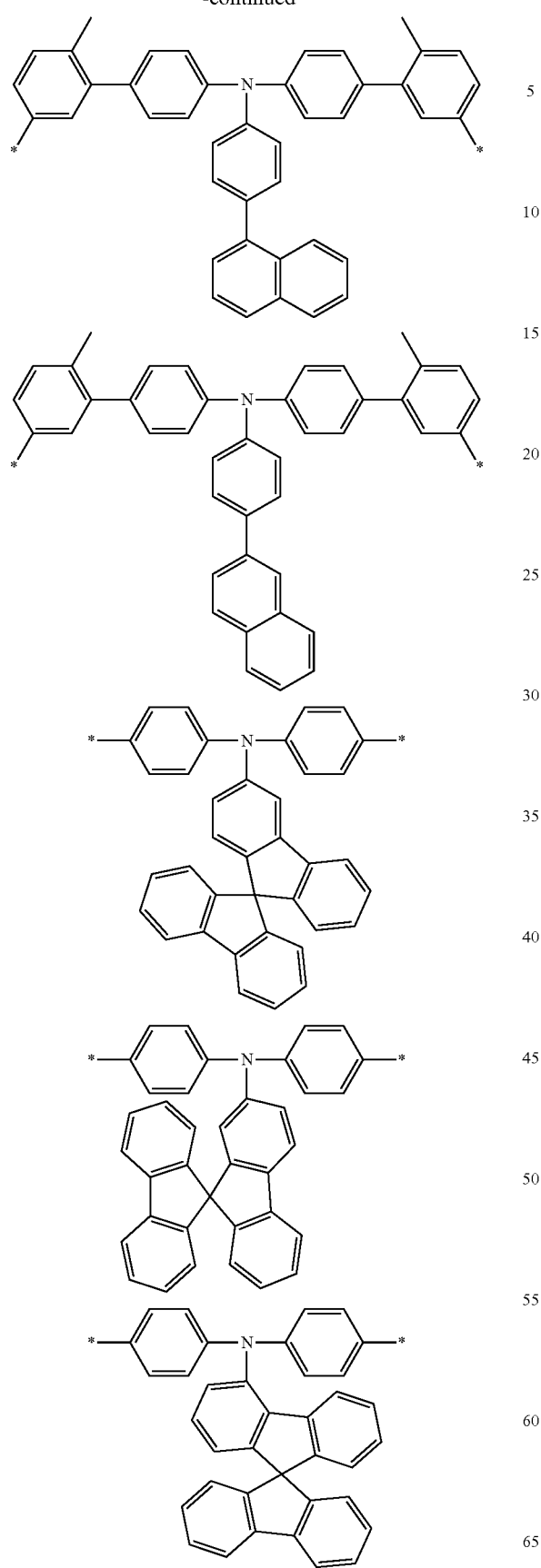
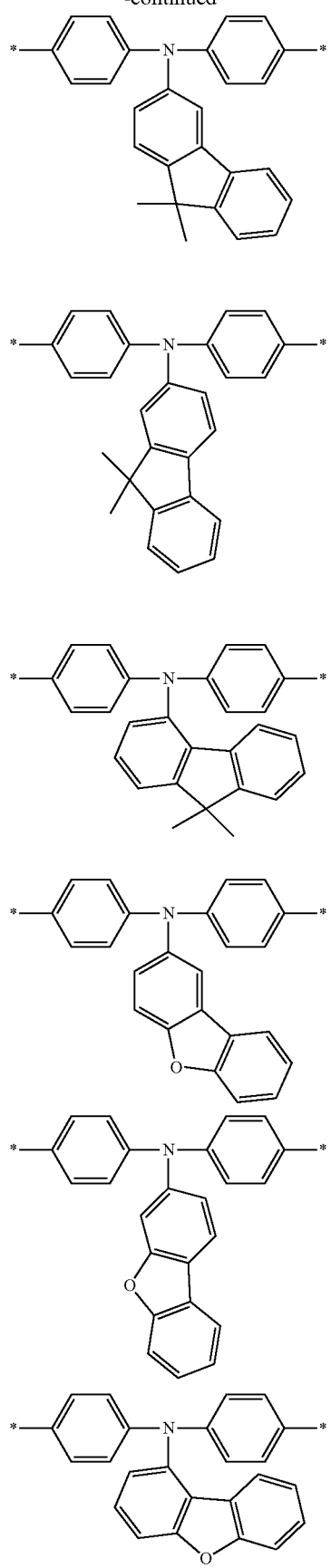

-continued
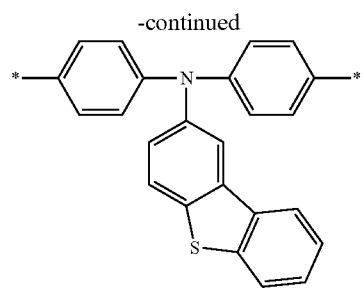
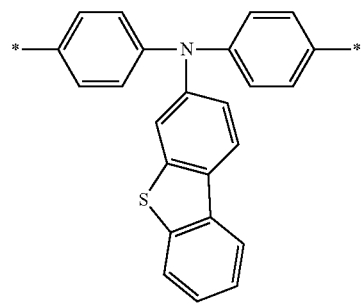
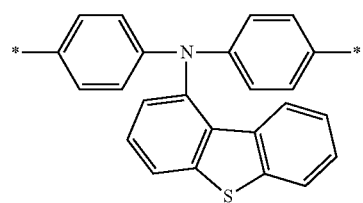
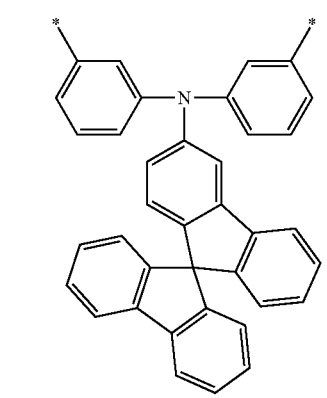
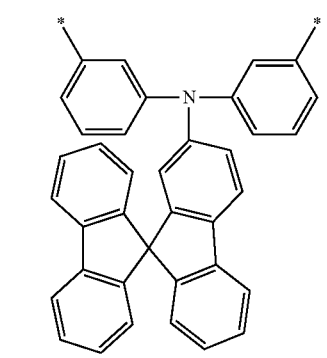
-continued
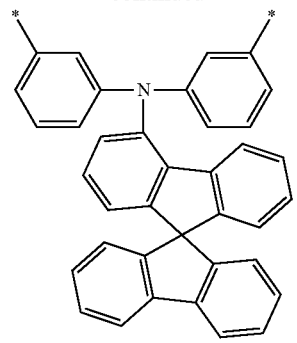
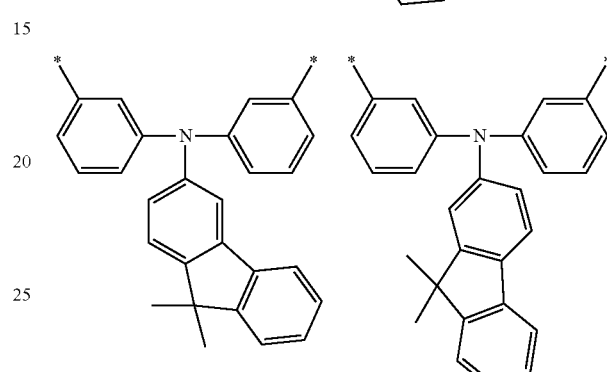
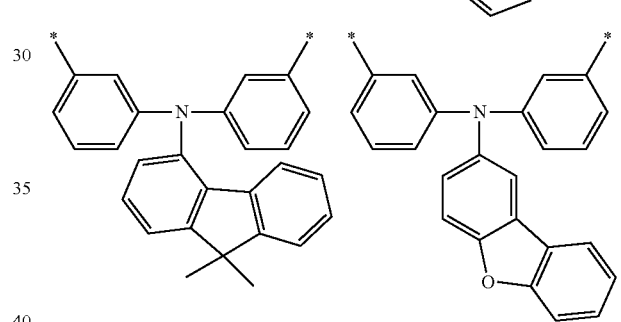
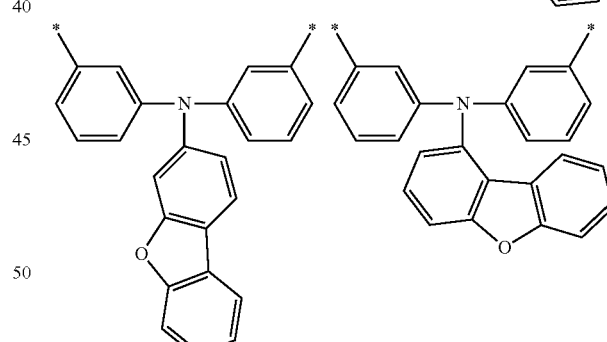
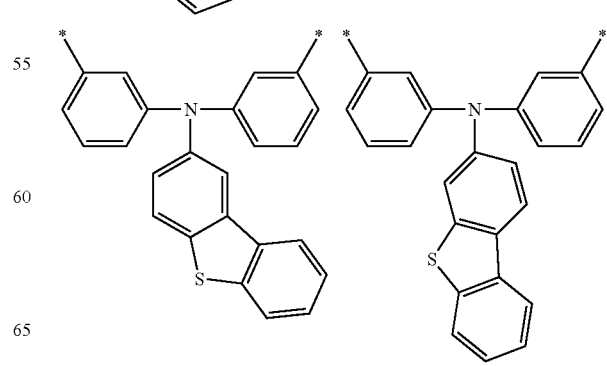

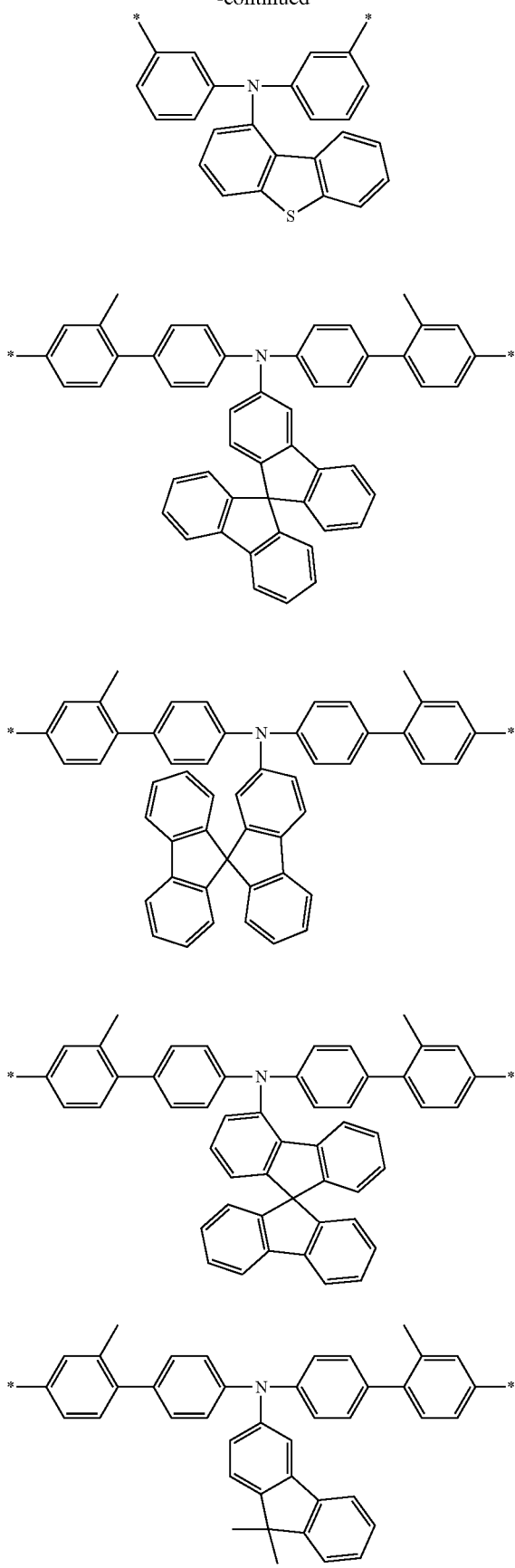
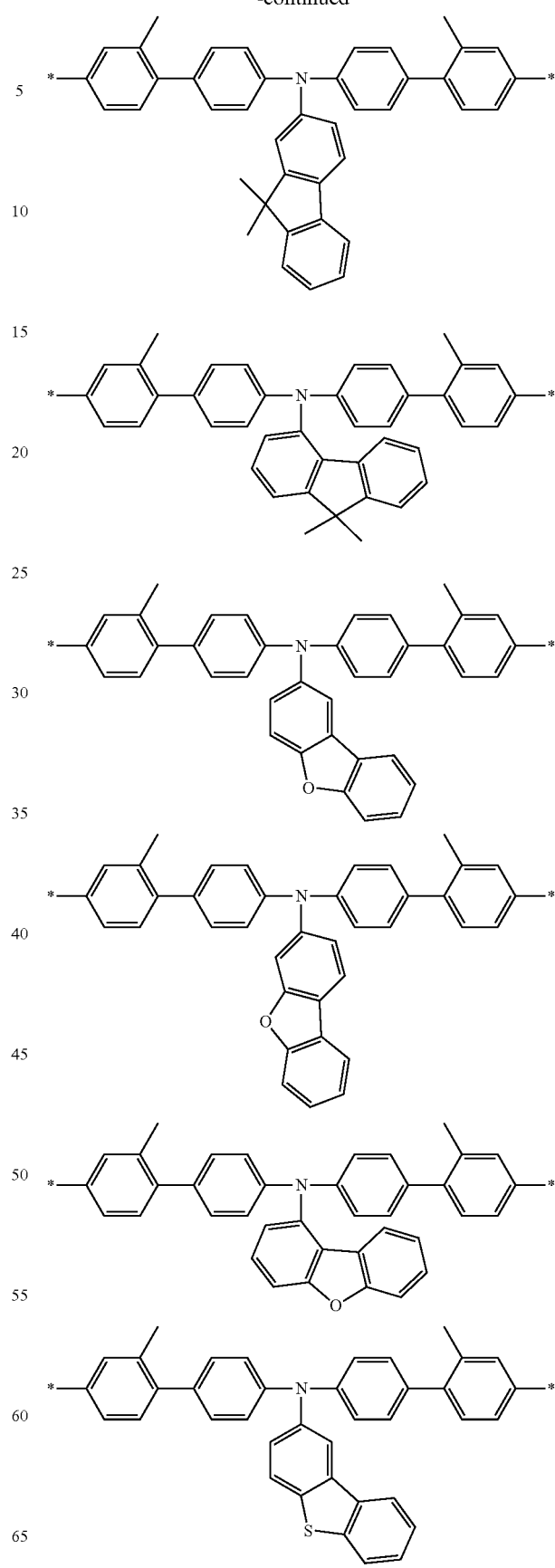

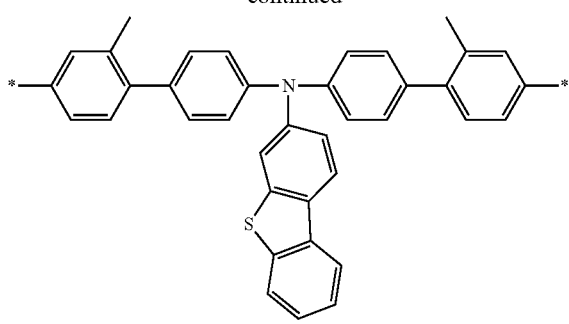
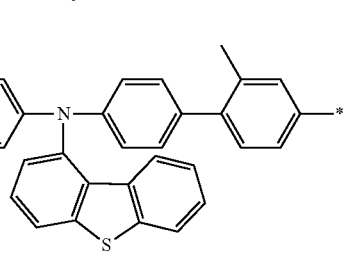
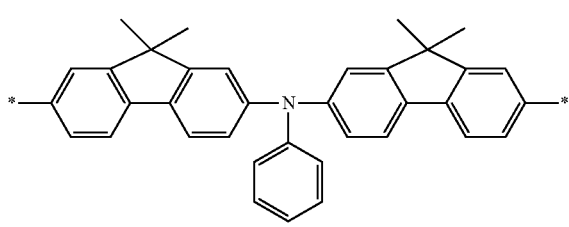
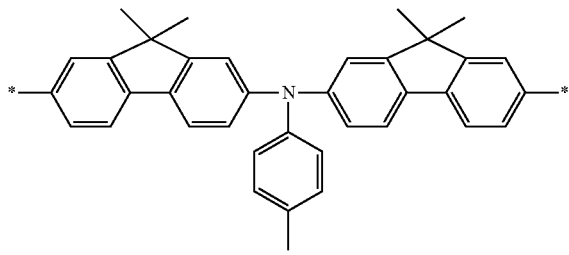
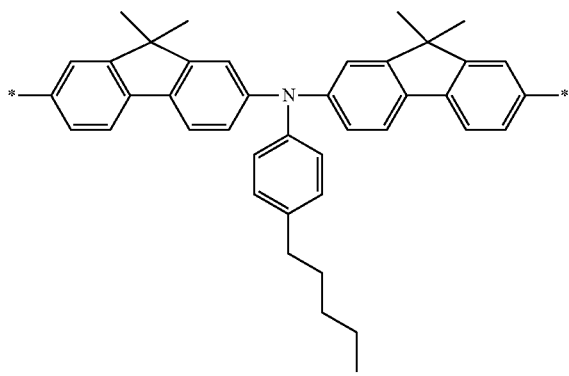
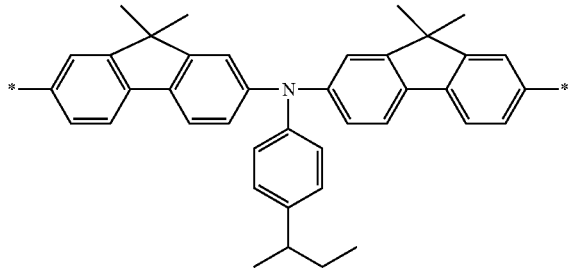
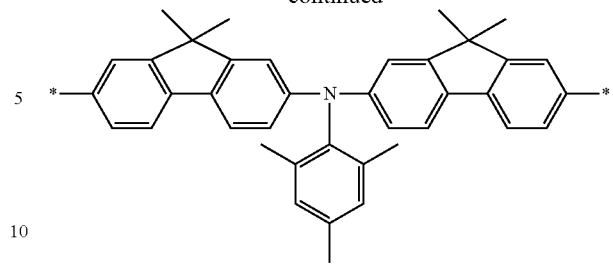
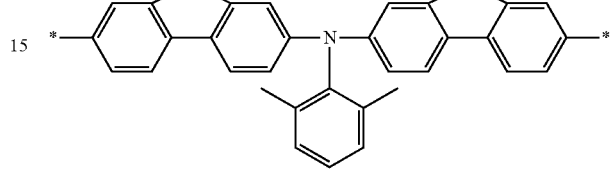
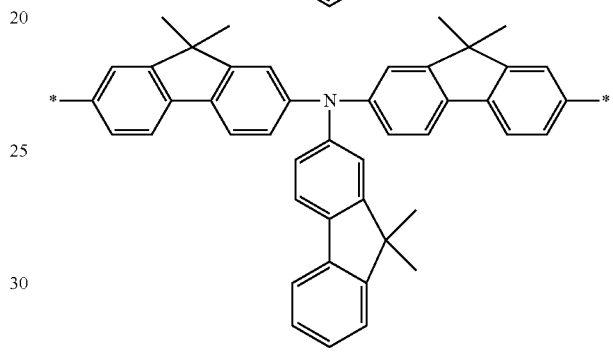
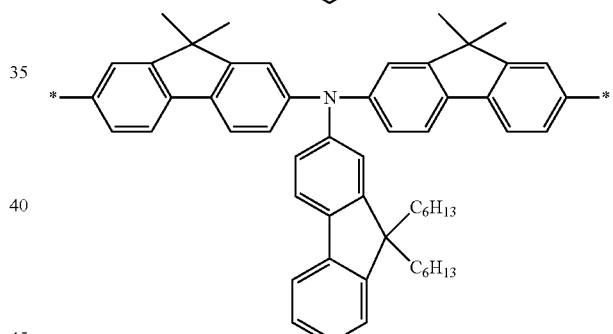
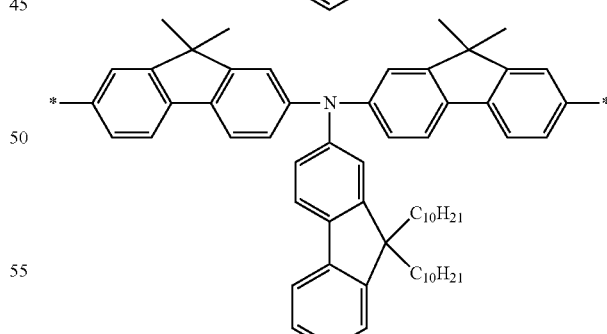
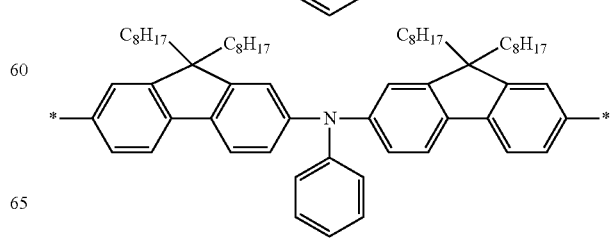

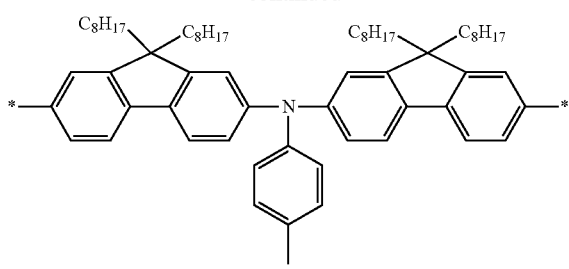

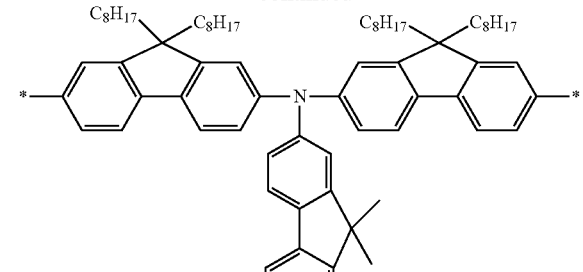

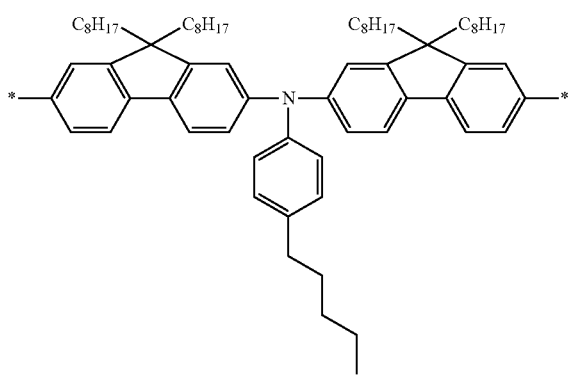

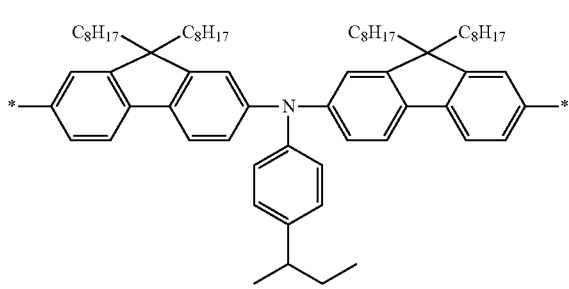

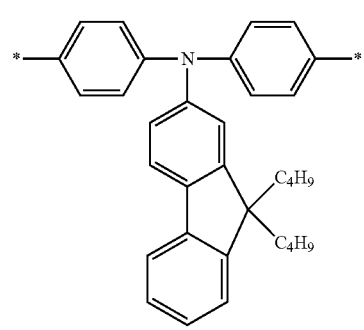

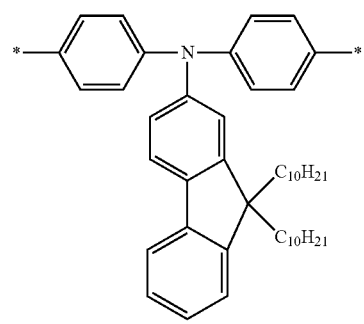

In Chemical Formula 1, $Ar_3$ may be a substituted or unsubstituted trivalent aromatic hydrocarbon group having 6 to 30 carbon atoms or a substituted or unsubstituted trivalent aromatic heterocyclic group having 3 to 30 ring-member atoms. Herein, when a plurality of $Ar_3$'s are present, they may be the same or different from each other. As the trivalent aromatic hydrocarbon group and trivalent aromatic heterocyclic cyclic group having 6 to 30 carbon atoms, the trivalent groups derived from the aromatic hydrocarbon compounds and the heterocyclic aromatic compounds in $Ar_1$ and $Ar_2$ may be respectively exemplified in the same manner. Among these, from the viewpoint of a more appropriate HOMO level (particularly a deep HOMO level), $Ar_3$ may be a trivalent group derived from benzene or thiophene; desirably a group derived from benzene (a group having a bonding group at the $1^{st}$, $2^{nd}$ and $3^{rd}$ positions (1,2,3-phenylene group), a group having a bonding group at the $1^{st}$, $2^{nd}$ and $4^{th}$ positions (1,2,4-phenylene group), or a group having a bonding group at the $1^{st}$, $3^{rd}$, and $5^{th}$ positions (1,3,5-phenylene group)); more desirably a group derived from benzene having a bonding group at the $1^{st}$, $2^{nd}$, and $4^{th}$ positions (1,2,4-phenylene group) or a group derived from benzene having a bonding group at the $1^{st}$, $3^{rd}$, and $5^{th}$ positions (1,3,5-phenylene group); or even more desirably a group derived from benzene having a bonding group at the $1^{st}$, $2^{nd}$, and $4^{th}$ positions (1,2,4-phenylene group). In an embodiment, the structural unit of Chemical Formula 1 may be represented by Chemical Formula 2.

[Chemical Formula 2]

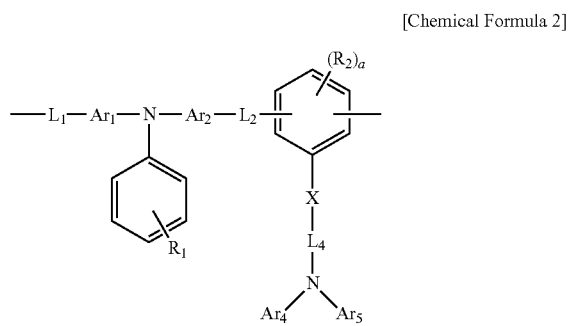

In Chemical Formula 2, $Ar_1$, $Ar_2$, $Ar_4$, $Ar_5$, $L_1$, $L_2$, X, $L_4$, and $R_1$ are the same as in Chemical Formula 1 described above or to be described later, and thus descriptions thereof are omitted.

$R_2$ may be a substituted or unsubstituted alkyl group having 1 to 20 carbon atoms, a substituted or unsubstituted alkoxy group having 1 to 20 carbon atoms, or a substituted or unsubstituted monovalent aromatic hydrocarbon group having 6 to 30 carbon atoms. Examples of the alkyl group having 1 to 20 carbon atoms and the alkoxy group having 1 to 20 carbon atoms may include the alkyl groups and alkoxy groups as in the aforementioned "substituent" above, respectively. As the monovalent aromatic hydrocarbon group having 6 to 30 carbon atoms, the monovalent groups derived from the aromatic hydrocarbon compounds in $Ar_1$ and $Ar_2$ may be exemplified in the same manner. a may be 0, 1, 2, or 3, desirably 0 or 1, or more desirably 0.

In an embodiment, the structural unit of Chemical Formula 1 may be represented by Chemical Formula 3.

[Chemical Formula 3]

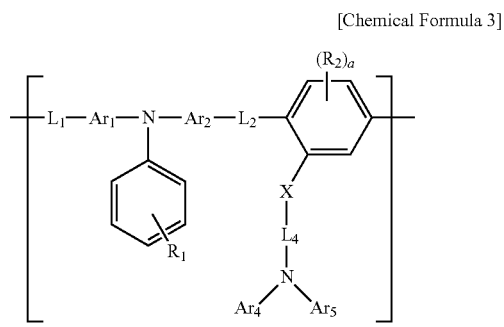

In Chemical Formula 3, $Ar_1$, $Ar_2$, $Ar_4$, $Ar_5$, $L_1$, $L_2$, X, $L_4$, and $R_1$ are the same as in Chemical Formula 1 described above or to be described later, thus descriptions thereof are omitted. $R_2$ and a are the same as in Chemical Formula 2, thus descriptions thereof are omitted.

In Chemical Formula 3, Structural Unit (1-2) has a structure in which a benzene ring constituting the main chain is linked to other structural units at the para position (the 1 and 4-positions constitute the main chain), and monoamine (—X-$L_4$-N($Ar_4$)($Ar_5$)) is linked at the meta position ($2^{nd}$ position). Thereby, the conjugate of monoamine is maintained, and the HOMO level of the copolymer may be made deeper.

Therefore, the copolymer having such Structural Unit (1-2) has a deeper HOMO level, and an electroluminescent device manufactured using such a copolymer may improve durability (which may prolong the luminescence life-span). Moreover, luminous efficiency may be improved.

X may be a single bond, -$L_{3a}$-, or -$L_{3b}$-$L_{3c}$-. Herein, when a plurality of X's are present, they may be the same or different from each other. Herein, $L_{3a}$, $L_{3b}$, and $L_{3c}$ may be a substituted or unsubstituted divalent aromatic hydrocarbon group having 6 to 30 carbon atoms. When X is -$L_{3b}$-$L_{3c}$-, each $L_{3b}$ and $L_{3c}$ may be the same as or different from each other.

As the divalent aromatic hydrocarbon group, the divalent groups derived from the aromatic hydrocarbon compounds in $Ar_1$ and $Ar_2$ may be exemplified in the same manner. Among them, X may be a single bond and a divalent group (-$L_{3a}$- or -$L_{3b}$-$L_{3c}$-) derived from a compound of benzene, fluorene, dibenzofuran, dibenzothiophene, or biphenyl. More desirably, X may be a single bond and a divalent group (-$L_{3a}$- or -$L_{3b}$-$L_{3c}$-) derived from a compound of benzene (o-, m-, or p-phenylene group), dibenzofuran, or fluorene. More desirably, X may be a single bond, a phenylene group (particularly a p-phenylene group). More desirably, X may be a single bond. Such X groups may appropriately control the HOMO level of the copolymer. In addition, a higher hole injection property, a higher triplet energy level, a lower drive voltage, a film formation property, and a balance of any two or more of these (particularly hole injection property and film formation property) may be achieved.

On the other hand, -$L_{3a}$- and -$L_{3b}$-$L_{3c}$- may be unsubstituted, or any hydrogen atom may be replaced by a substituent.

Herein, the number of substituents introduced when any one of the hydrogen atoms in -$L_{3a}$- and -$L_{3b}$-$L_{3c}$- is replaced is not particularly limited, but may be 1 or more and 3 or less, desirably 1 or more and 2 or less, and more desirably 1. When -$L_{3a}$- and -$L_{3b}$-$L_{3c}$- has a substituent, the bonding position of the substituent is not particularly limited.

The substituent may be present at a position as far from the nitrogen atom of the chain in which -$L_{3a}$- or -$L_{3b}$-$L_{3c}$- is linked via $L_4$. By the presence of a substituent at this position, the HOMO level of the copolymer may be appropriately controlled. In addition, a higher hole injection property, a higher triplet energy level, a lower drive voltage, a film formation property, and a balance of any two or more of these (particularly hole injection property and film formation property) may be achieved.

$Ar_4$ and $Ar_5$ are each independently a substituted or unsubstituted monovalent aromatic hydrocarbon group having 6 to 30 carbon atoms or a substituted or unsubstituted monovalent aromatic heterocyclic group having 3 to 30 ring-member atoms. When a plurality of $Ar_4$'s and $Ar_5$'s are present, they may be the same or different from each other. In addition, $Ar_4$ and $Ar_5$ may be the same or different from each other.

As described later, $L_4$ may form a ring with $Ar_4$, $Ar_5$, or a combination thereof. Herein, when $L_4$ forms a ring with $Ar_4$, $Ar_4$ may be a divalent group. Similarly, when $L_4$ forms a ring with $Ar_5$, $Ar_5$ may be a divalent group. When $L_4$ forms a ring with both $Ar_4$ and $Ar_5$, $Ar_4$ and $Ar_5$ may be divalent groups. When $L_4$ does not form a ring with $Ar_4$ and $Ar_5$, $Ar_4$ and $Ar_5$ may each be monovalent groups. As the aromatic hydrocarbon group and the aromatic heterocyclic cyclic group, the groups derived from the aromatic hydrocarbon compound and the heterocyclic aromatic compound in $Ar_1$ and $Ar_2$ may be respectively exemplified in the same manner. Among them, from the viewpoint of a more appropriate HOMO level (especially a deep HOMO level), at least one of $Ar_4$ and $Ar_5$ may be a group represented by Chemical Formula 4. For example, Ar$_4$ and Ar$_5$ may not form a ring with L$_4$, and one of Ar$_4$ and Ar$_5$ may be a group represented by Chemical Formula 4.

[Chemical Formula 4]

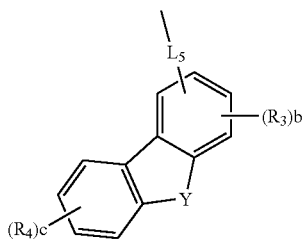

In Chemical Formula 4,

L$_5$ may be a single bond, a substituted or unsubstituted divalent aromatic hydrocarbon group having 6 to 30 carbon atoms, or a substituted or unsubstituted divalent aromatic heterocyclic group having 3 to 30 ring-member atoms. Herein, as the divalent aromatic hydrocarbon group having 6 to 30 carbon atoms and divalent aromatic heterocyclic group having 3 to 30 ring-member atoms, the divalent groups derived from the aromatic hydrocarbon compounds and heterocyclic aromatic compounds in Ar$_1$ and Ar$_2$ may be exemplified in the same manner. Among them, from the viewpoint of a more appropriate HOMO level (particularly a deep HOMO level), L$_5$ may be a single bond, or a group derived from benzene (phenylene group) or fluorene (fluorenylene group); desirably a single bond or a group derived from benzene (phenylene group); or more desirably a single bond.

R$_3$ and R$_4$ may be the same or different, and may be a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 3 to 30 ring-member atoms. Herein, as the alkyl group having 1 to 20 carbon atoms and alkoxy group having 1 to 20 carbon atoms, the groups in "Substituent" may be exemplified. Further, as the monovalent aromatic hydrocarbon group having 6 to 30 carbon atoms and the monovalent aromatic heterocyclic ring group having 3 to 30 ring atoms, the monovalent groups derived from the aromatic hydrocarbon compound and heterocyclic aromatic compound in Ar$_1$ and Ar$_2$ may be exemplified in the same manner. Among these, R$_3$ and R$_4$ may each independently be an alkyl group having 1 to 10 carbon atoms, or an alkyl group having 1 to 3 carbon atoms.

b may be an integer of 0, 1, 2, or 3. b may be desirably 0 or 1, or more desirably 0.

c may be an integer of 0, 1, 2, 3, or 4. c may be desirably 0 or 1, or more desirably 0.

Y may be =CR$_5$R$_6$—, —O—, or —S—. Y may be desirably =CR$_5$R$_6$— or —O—. When Y is =CR$_5$R$_6$—, R$_5$ and R$_6$ may each independently be a substituted or unsubstituted aryl group having 6 to 30 carbon atoms or a substituted or unsubstituted alkyl group having 1 to 20 carbon atoms. Further, R$_5$ and R$_6$ may be combined with each other to form a ring structure.

Herein, as the aryl group having 6 to 30 carbon atoms, the same aryl group as in "Substituent" may be exemplified. As the alkyl group having 1 to 20 carbon atoms, the alkyl groups in the "Substituent" may be exemplified. Among them, from the viewpoint of a more appropriate HOMO level (particularly a deep HOMO level), R$_5$ and R$_6$ may each independently be an alkyl group having 1 to 8 carbon atoms or an aryl group bonded to each other to form a ring structure, or may each independently be an alkyl group having 1 to 3 carbon atoms or a phenyl group bonded to each other to form a ring structure (spirobi[fluorenyl] group).

In other words, the group represented by Chemical Formula 4 may be one of Group 2 (Chemical Formula 5 to Chemical Formula 20).

[Group 2]

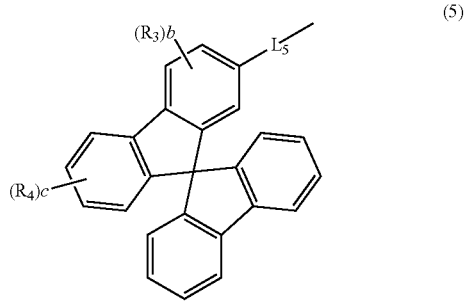

(5)

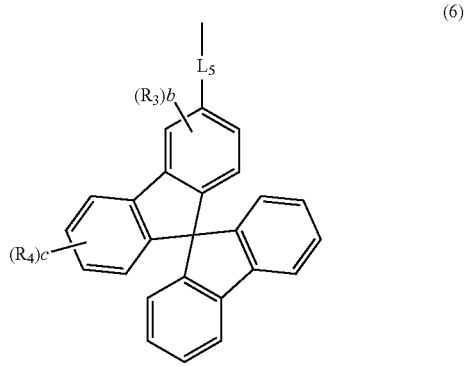

(6)

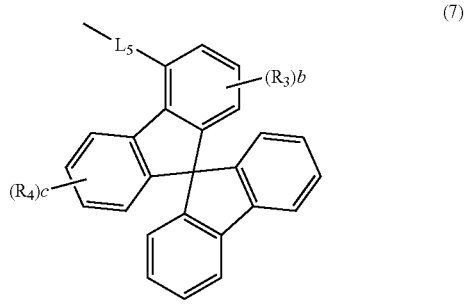

(7)

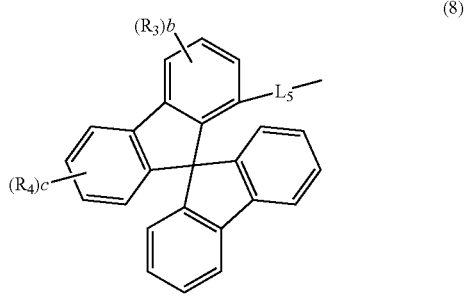

(8)

-continued (9)
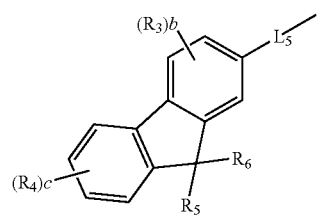

(10)
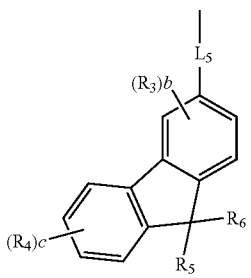

(11)
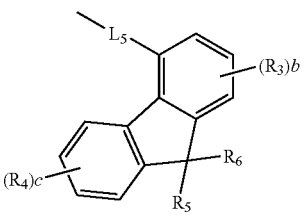

(12)
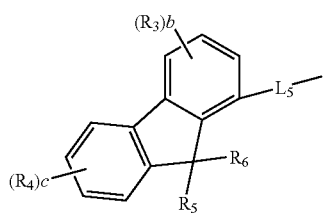

(13)
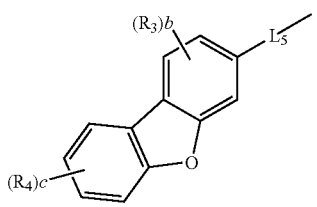

(14)
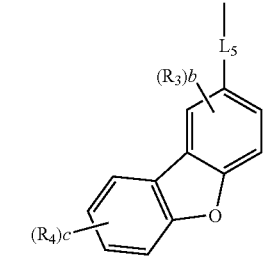

(15)
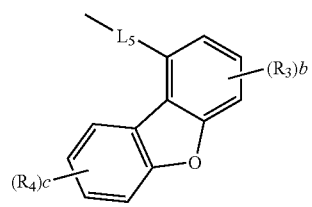

-continued

(16)
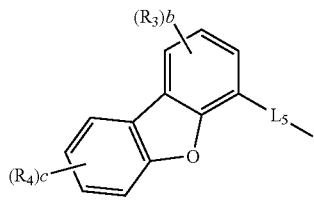

(17)
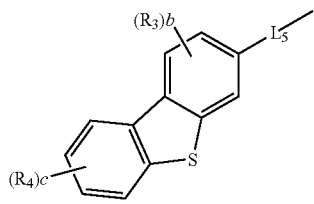

(18)
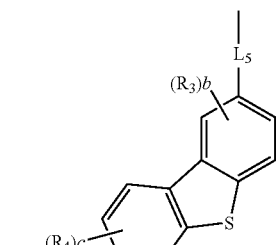

(19)
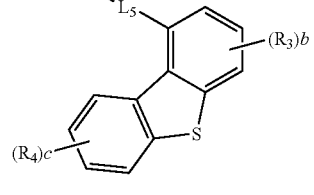

(20)
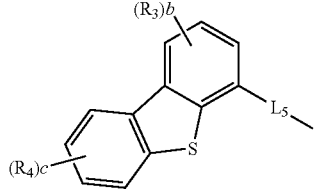

In Group 2 (Chemical Formula 5 to Chemical Formula 20), $L_5$, $R_3$, $R_4$, $R_5$, $R_6$, b, and c are the same as in Chemical Formula 4, thus descriptions thereof are omitted.

In Chemical Formula 1, when $L_4$ does not form a ring with $Ar_4$ or $Ar_5$, $Ar_4$ may be one of groups represented by Chemical Formulas 5 to 8 and Chemical Formulas 13 to 16 of Group 2 and $Ar_5$ may be one of groups represented by Chemical Formulas 9 to 16 of Group 2 or an aromatic hydrocarbon group having 6 to 25 carbon atoms which is unsubstituted or substituted with a linear alkyl group having 1 to 8 carbon atoms or branched alkyl group having 3 to 8 carbon atoms.

$Ar_4$ may be one of groups represented by Chemical Formulas 5, 7, and 16, and $Ar_5$ may be one of groups represented by Chemical Formulas 9 and 16 and an aromatic hydrocarbon having 6 to 25 carbon atoms which is unsubstituted or substituted with a branched alkyl group having 3 to 5 carbon atoms (for example, a biphenyl group and a 9,9-dimethyl fluorenyl group).

The copolymers having this combination may exhibit deeper HOMO levels. Herein, the aromatic hydrocarbon group having 6 to 25 carbon atoms may be monovalent groups derived from aromatic hydrocarbon compounds such as benzene (phenyl group), pentalene, indene, naphthalene, anthracene, azulene, heptalene, acenaphthene, phenalene, fluorene, phenanthrine, biphenyl, terphenyl, quaterphenyl, pyrene, 9,9-diphenyl fluorene, 9,9'-spirobi[fluorene], and 9,9-dialkyl fluorene. Herein, the alkyl may be either a linear or branched alkyl, for example a linear alkyl having 1 to 20 carbon atoms or a branched alkyl having 3 to 20 carbon atoms.

In an embodiment, $Ar_4$ may be one of groups represented by Chemical Formulas 5 to 8 and Chemical Formulas 13 to 16, and $Ar_5$ may be one of groups derived from substituted or unsubstituted benzene, substituted or unsubstituted fluorene, substituted or unsubstituted biphenyl, substituted or unsubstituted dibenzofuran, or substituted or unsubstituted dibenzothiophene, or a combination of two or more thereof. In another embodiment, $Ar_4$ may be a 9,9'-spirobi[fluorenyl] group or a group derived from a combination of benzene and dibenzofuran, and $Ar_5$ may be a group derived from benzene, 9,9-dimethyl fluorene, biphenyl that is substituted or unsubstituted with an alkyl group having 1 to 5 carbon atoms, dibenzofuran, or dibenzothiophene, or a combination of two or more thereof. In an embodiment, one of $Ar_4$ and $Ar_5$ may be one of Group 2-1 and a combination of the other of $Ar_4$ and $Ar_5$ may be one of Group 2-2.

[Group 2-1]

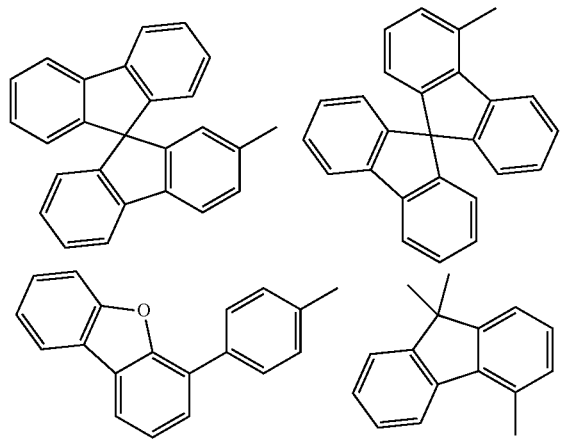

[Group 2-2]

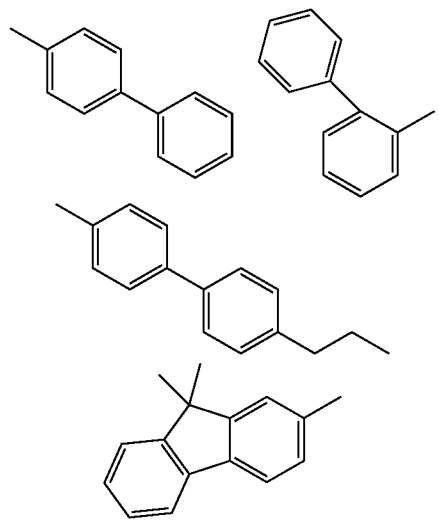

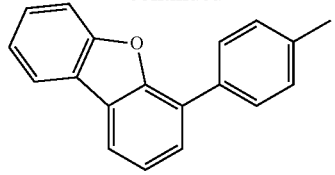

In Groups 2-1 and 2-2, a hydrogen atom of the aromatic ring may be replaced by a linear or branched hydrocarbon group having 1 to 14 carbon atoms (a C1 to C14 alkyl group, for example a C1 to C12 alkyl group), or an aromatic hydrocarbon group having 6 to 28 carbon atoms (a C6 to C28 aryl group, for example a C6 to C20 aryl group).

The copolymer including $Ar_4$ and $Ar_5$ as described above may have a deeper HOMO level (thus improving the durability of LEDs (particularly QLEDs) using the copolymers).

$L_4$ may be a substituted or unsubstituted aromatic hydrocarbon group having 6 to 30 carbon atoms. Herein, when a plurality of $L_4$'s are present, they may be the same or different from each other. $L_4$ may form a ring with $Ar_4$ and/or $Ar_5$. Herein, when $L_4$ forms a ring with $Ar_4$ or $Ar_5$, $L_4$ may be a trivalent group. When $L_4$ forms a ring with $Ar_4$ and $Ar_5$, $L_4$ may be a tetravalent group. When $L_4$ does not form a ring with $Ar_4$ and $Ar_5$, $L_4$ may be a divalent group. As the aromatic hydrocarbon group, the groups derived from the aromatic hydrocarbon compound (divalent, trivalent, or tetravalent group) in $Ar_1$ and $Ar_2$ may be exemplified in the same manner. Among them, from the viewpoint of a more appropriate HOMO level (particularly a deep HOMO level), $L_4$ may be a group derived from benzene, fluorene, or naphthalene; desirably benzene (in the case of a divalent group, o-, m-, or p-phenylene group or in the case of a trivalent group, 1,2,3-phenylene group, 1,2,4-phenylene group, 1,3,5-phenylene group); or more desirably (in the case of a divalent group) p-phenylene group, or (in the case of a trivalent group) 1,3,4-phenylene group. Such $L_4$ may appropriately control the HOMO level of the copolymer. In addition, a higher hole injection property, a higher triplet energy level, a lower drive voltage, a film formation property, and a balance of any two or more of these (particularly hole injection property and film formation property) may be achieved.

Meanwhile, in the above embodiment, $L_4$ may be unsubstituted or one hydrogen atom may be replaced by a substituent. In addition, when any one of the hydrogen atoms in $L_4$ is replaced, the substituent is not particularly limited, and the above examples are applicable. Desirably, $L_4$ may be unsubstituted.

When $L_4$ forms a ring with at least one of $Ar_4$ and $Ar_5$, a higher triplet energy level may be imparted. Among these, from the viewpoint of a more appropriate HOMO level (particularly a deep HOMO level), $L_4$ may form a ring with one of $Ar_4$ and $Ar_5$ ($L_4$ and $Ar_4$ or $L_4$ and $Ar_5$). When $L_4$ forms a ring with $Ar_4$ or $Ar_5$, the ring structure is not particularly limited, but $L_4$ and $Ar_4$ (or $L_4$ and $Ar_5$) may form a carbazole ring.

In other words, in an embodiment, in Chemical Formula 1, $L_4$ may form a ring with $Ar_4$, and $-L_4-N(Ar_4)(Ar_5)$ may have a structure represented by Chemical Formula 21 or 22. For example, in Chemical Formula 1, $L_4$ may form a ring with $Ar_4$, and $-L_4-N(Ar_4)(Ar_5)$ may have a structure represented by Chemical Formula 21.

[Chemical Formula 21]

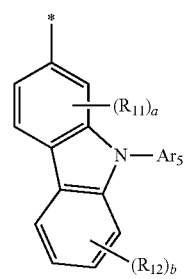

[Chemical Formula 22]

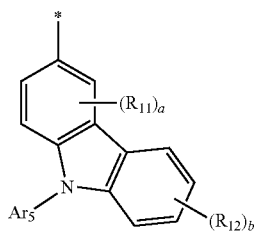

In Chemical Formula 21 and Chemical Formula 22, $Ar_5$ is the same as in the aforementioned Chemical Formula 1 and thus the descriptions thereof are omitted.

In Chemical Formula 21 and Chemical Formula 22, $R_{11}$ and $R_{12}$ may each independently be a hydrogen atom, a linear alkyl group having 3 to 10 carbon atoms, or a branched alkyl group having 3 to 10 carbon atoms. From the viewpoint of a more appropriate HOMO level (particularly a deep HOMO level), $R_{11}$ may be a hydrogen atom and $R_{12}$ may be a hydrogen atom or a linear alkyl group having 5 to 8 carbon atoms.

More desirably, $R_{11}$ and $R_{12}$ may be a hydrogen atom.

In Chemical Formula 21 and Chemical Formula 22, a may be an integer of 1 to 3 and b is an integer of 1 to 4.

In an exemplary embodiment, $Ar_5$ may have a linear hydrocarbon group having 1 to 12 carbon atoms or a branched hydrocarbon group having 3 to 12 carbon atoms as a substituent. By disposing such a hydrocarbon group at the terminal end of the copolymer, the copolymer in the hole transport layer may interact closely with the quantum dots in the light emitting layer, so that holes may be efficiently injected into the quantum dots (high hole injection property), and durability (luminescence life-span) may be improved. Herein, the hydrocarbon group having 1 to 12 carbon atoms is not particularly limited, and examples thereof include a linear or branched alkyl group, alkenyl group, or alkynyl group, and a cycloalkyl group. On the other hand, when the substituent is an alkenyl group or an alkynyl group, the number of carbon atoms of the substituent may be 2 or more and 16 or less. Similarly, when the substituent is a cycloalkyl group, the number of carbon atoms of the substituent may be 3 or more and 6 or less.

Examples of the alkyl group having 1 to 12 carbon atoms may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, and the like.

Examples of the alkenyl group having 2 to 16 carbon atoms include a vinyl group, an allyl group, a 1-propenyl group, a 2-butenyl group, a 1,3-butadienyl group, a 2-pentenyl group, an isopropenyl group, and the like.

Examples of the alkynyl group having 2 to 16 carbon atoms may include an ethynyl group and a propargyl group.

Examples of the cycloalkyl group having 3 to 6 carbon atoms may include a cyclopropyl group, a cyclobutyl group, a cyclopentyl group, and a cyclohexyl group.

Among them, the hydrocarbon group present in $Ar_5$ may be a linear alkyl group having 4 to 10 carbon atoms or a branched alkyl group having 4 to 10 carbon atoms. Thus, without wishing to be bound by theory, by increasing the number of carbon atoms of the hydrocarbon group present in $Ar_5$ (long chain), the HOMO level of the copolymer may be appropriately controlled. In addition, since the distance between the copolymer and the quantum dot becomes shorter and the interaction between the copolymer in the hole transport layer and the quantum dots in the light emitting layer becomes stronger, hole injection properties (thus, durability (luminescence life-span)) may be improved.

In other words, in an embodiment, $Ar_5$ may be a phenyl group, a biphenyl group, a dibenzofuranyl group, or a fluorenyl group, and may be substituted with a linear alkyl group having 4 to 10 carbon atoms or a branched alkyl group having 4 to 10 carbon atoms. More desirably, the hydrocarbon group present in $Ar_5$ may be a linear alkyl group having 5 to 8 carbon atoms. In other words, in an embodiment, $Ar_5$ may be a phenyl group substituted with a linear alkyl group having 5 to 8 carbon atoms. Particularly, the hydrocarbon group present in $Ar_5$ may be a linear alkyl group having 6 to 8 carbon atoms. In other words, in an embodiment, $Ar_5$ may be a phenyl group substituted with a linear alkyl group having 6 to 8 carbon atoms.

On the other hand, the position of the hydrocarbon group present in $Ar_5$ is not particularly limited, but may be located as far away from the nitrogen atom of $-L_4-N(Ar_4)(Ar_5)$ as possible. For example, when $L_4$ forms a ring with $Ar_4$ and $Ar_5$ is a phenyl group, the hydrocarbon group may be present in the para position with respect to the nitrogen atom. With this arrangement, the distance between the copolymer and the quantum dot becomes shorter, and the interaction between the copolymer in the hole transport layer and the quantum dots in the light emitting layer becomes stronger, so that hole injection properties (thus durability (luminescence life-span)) may be improved.

Specifically, the structural unit (1-2) may be one of Group 3. In the Group 3, * may be a bonding portion forming a main chain.

[Group 3]
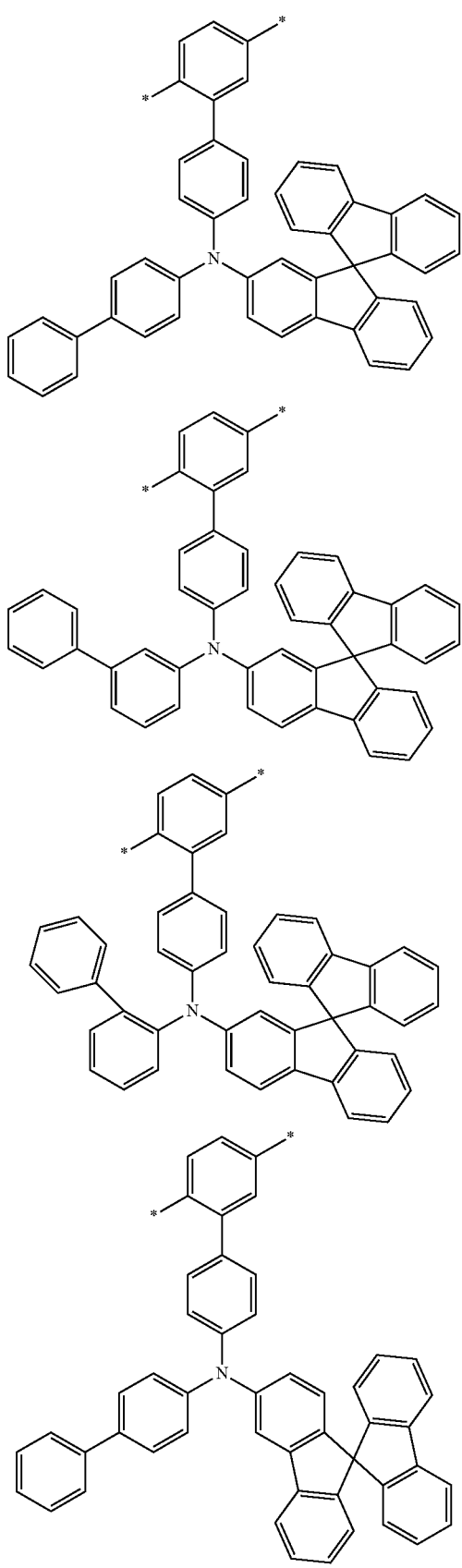
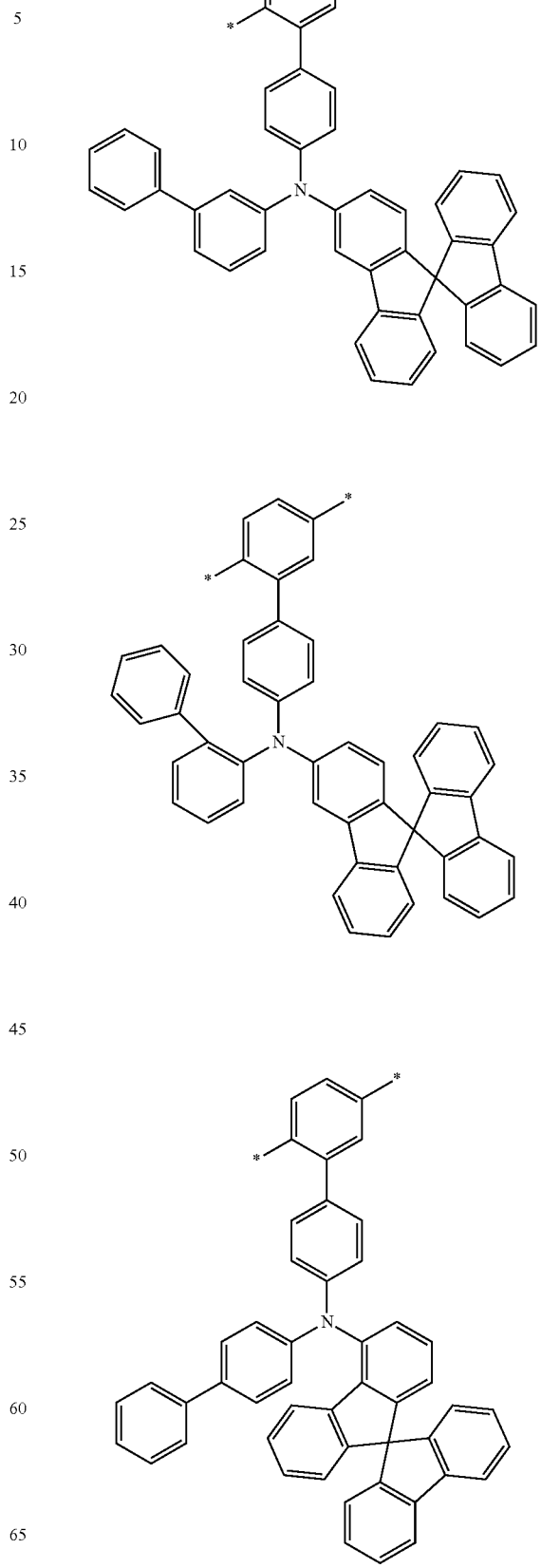

51
-continued
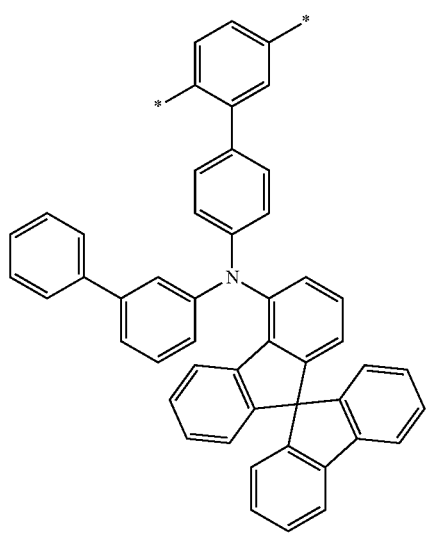
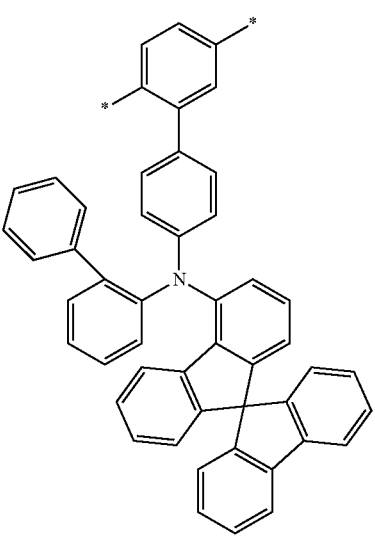
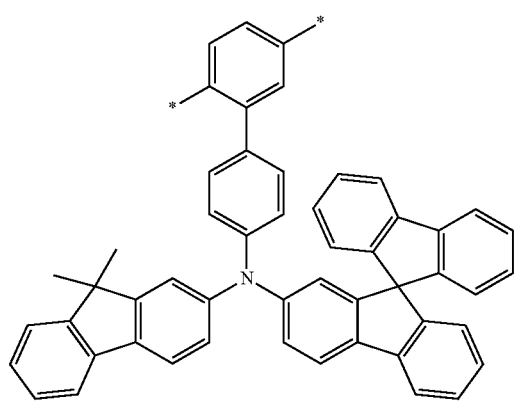
52
-continued
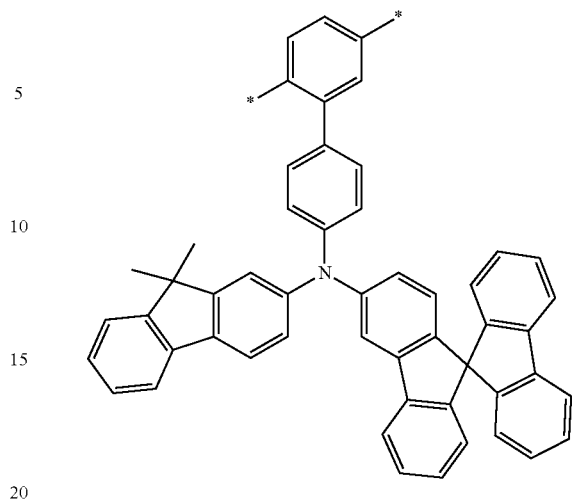
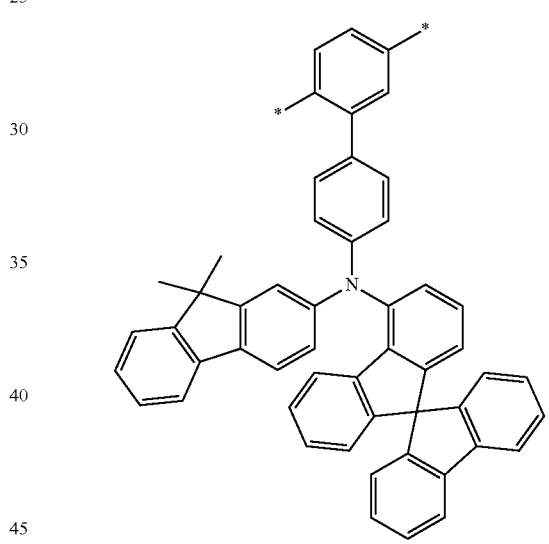
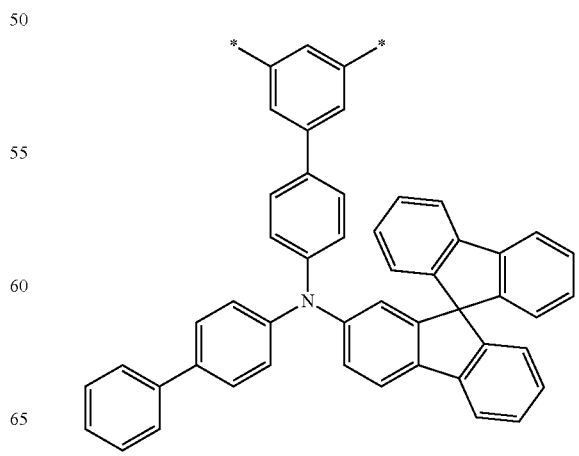

53
-continued
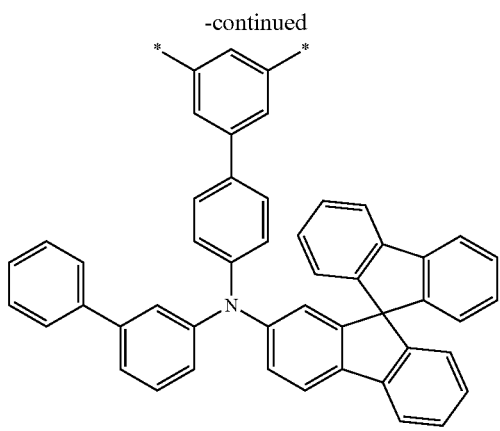
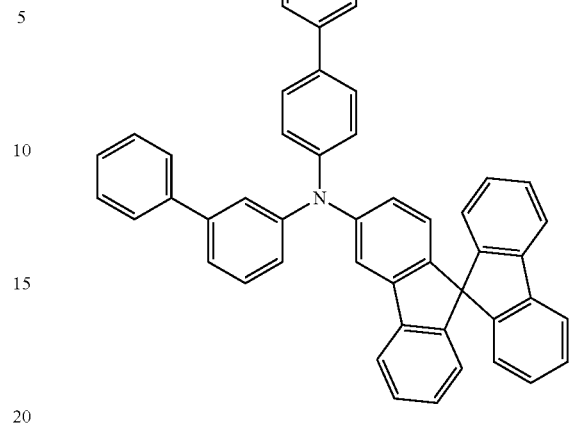
54
-continued
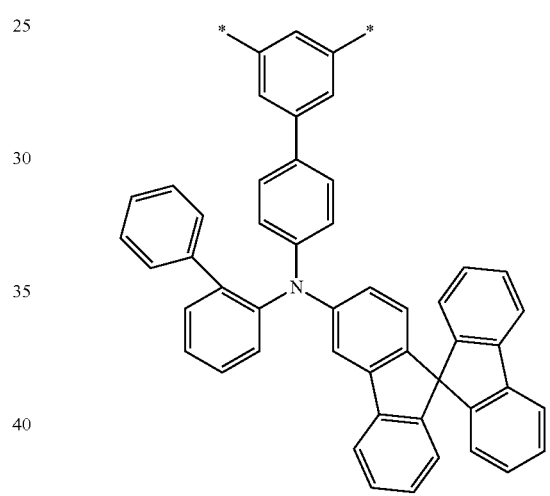
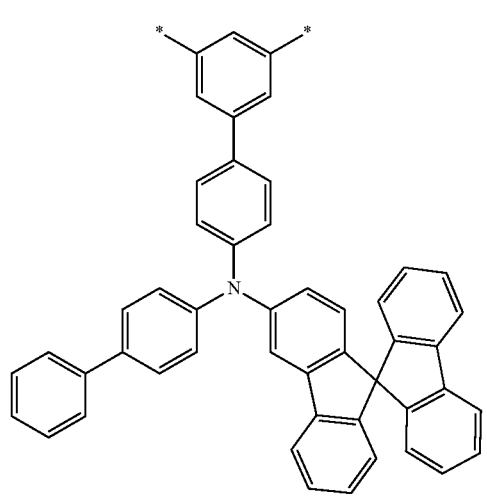
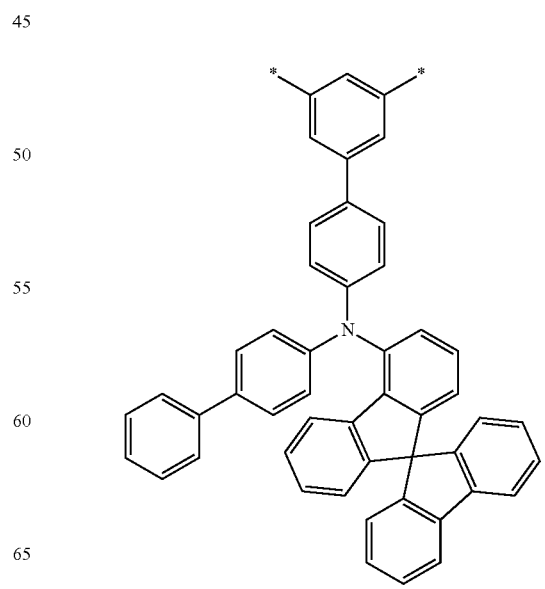

55
-continued
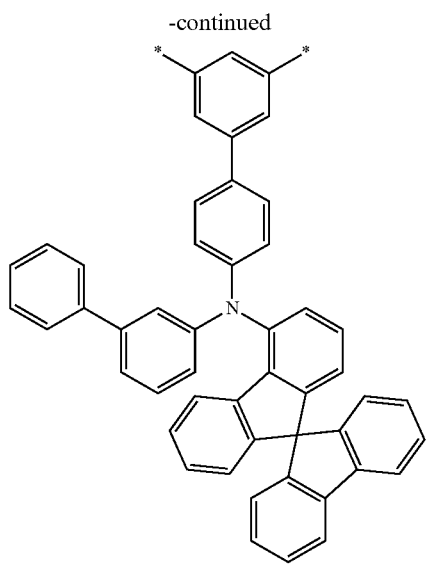
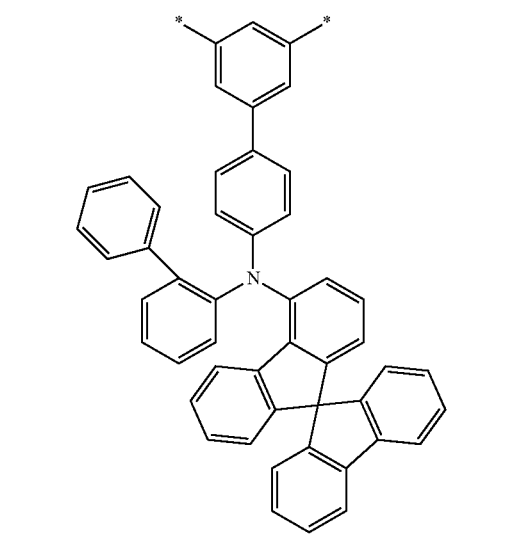
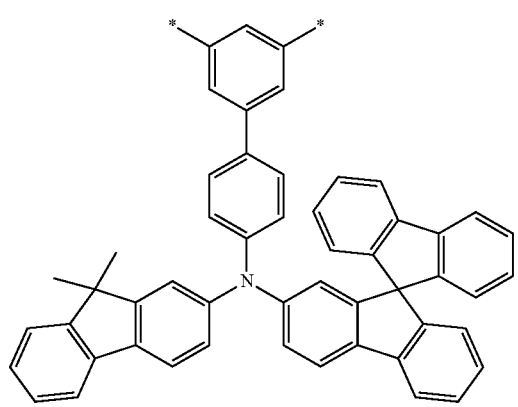
56
-continued
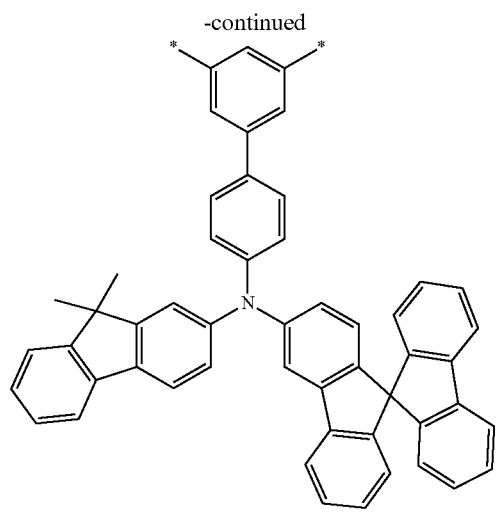
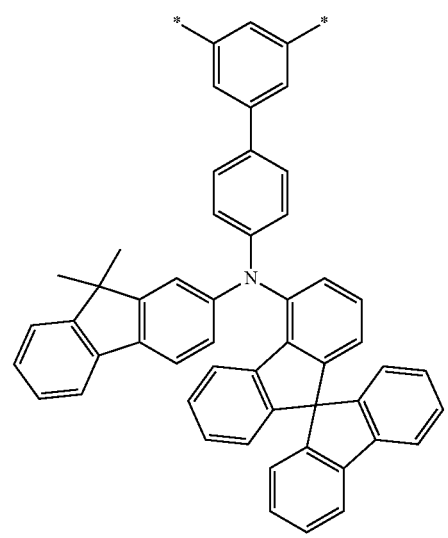
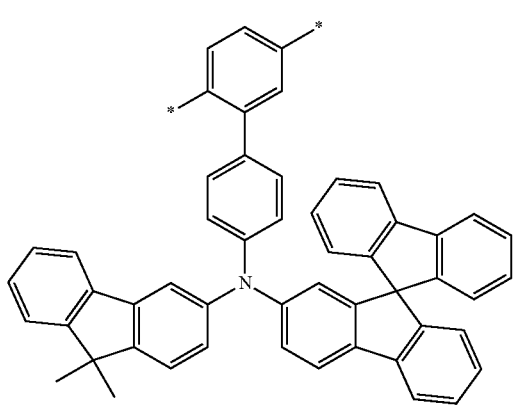

57
-continued
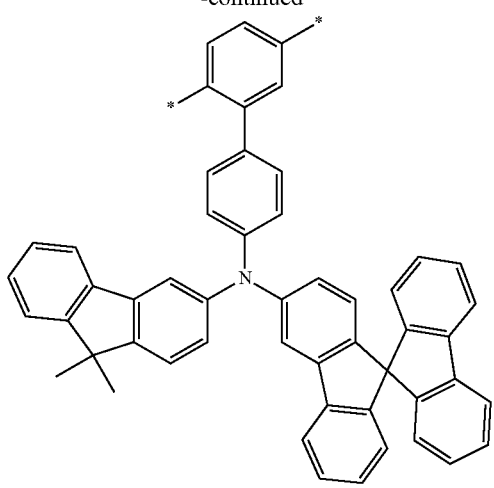
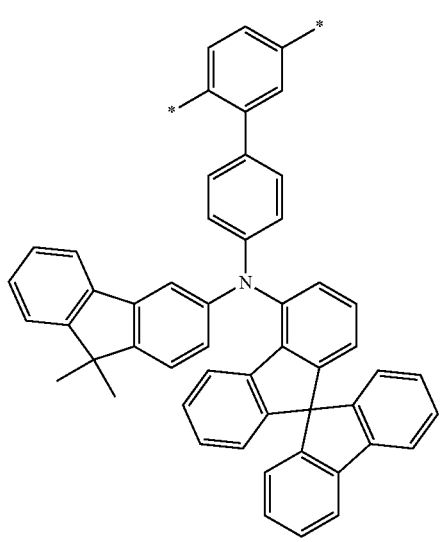
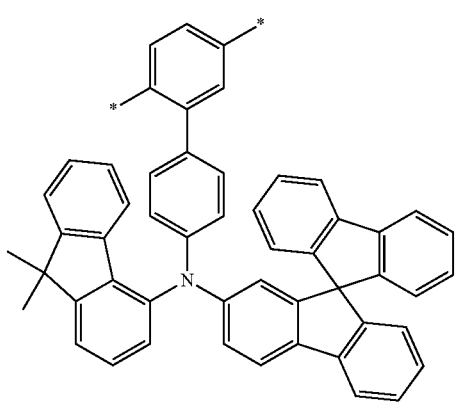
58
-continued
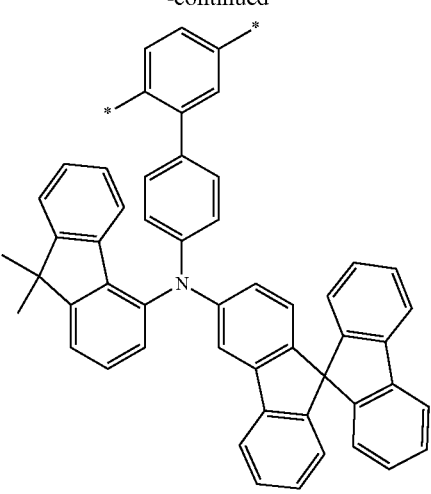
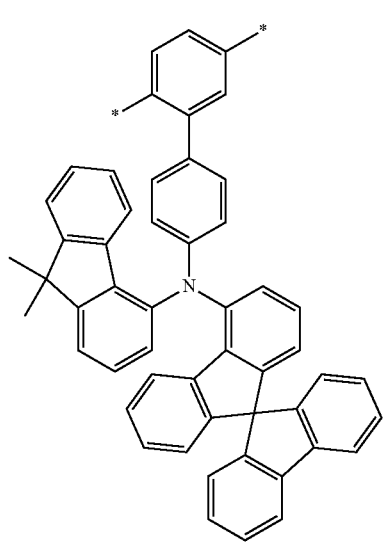
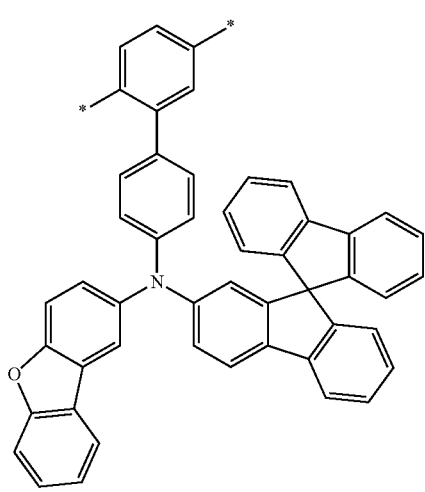

59
-continued
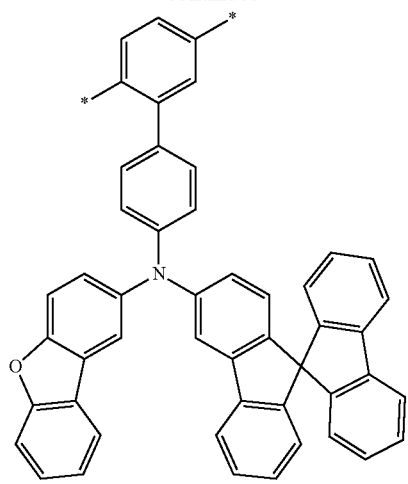
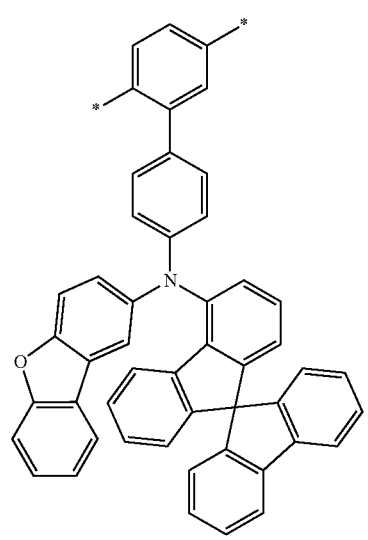
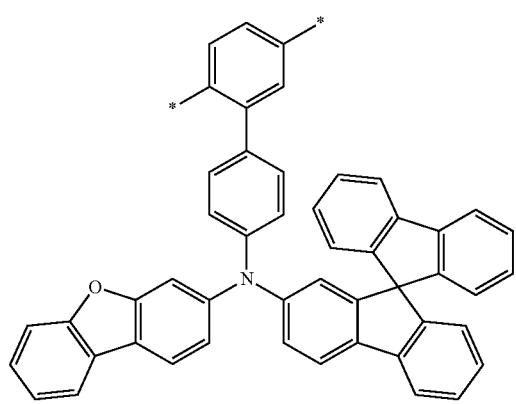
60
-continued
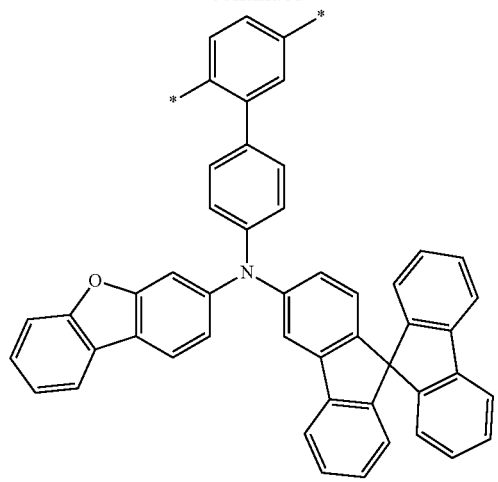
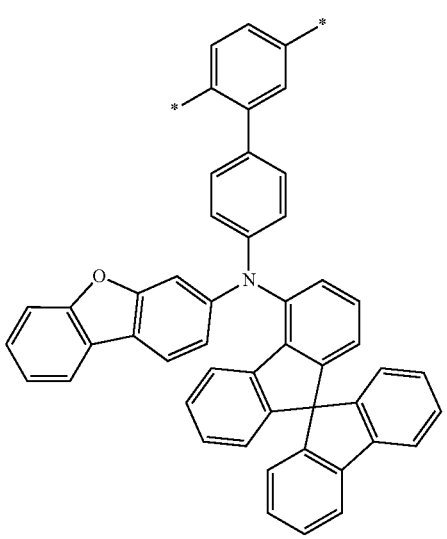
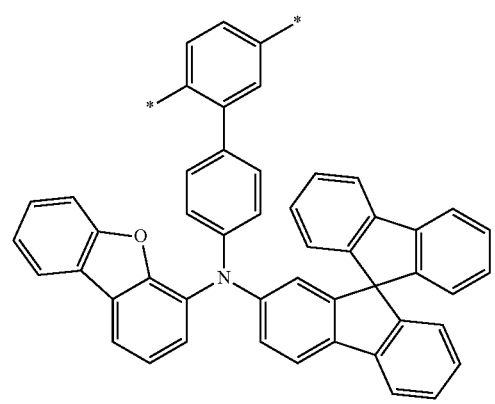

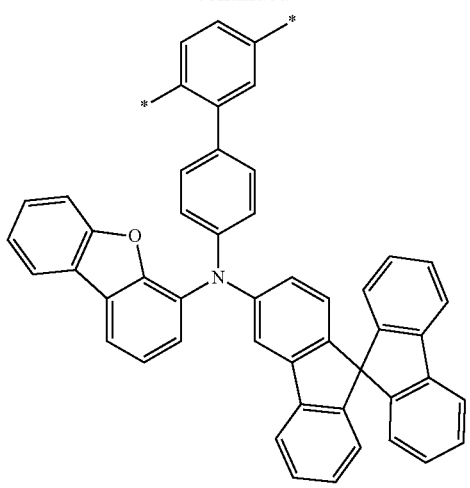
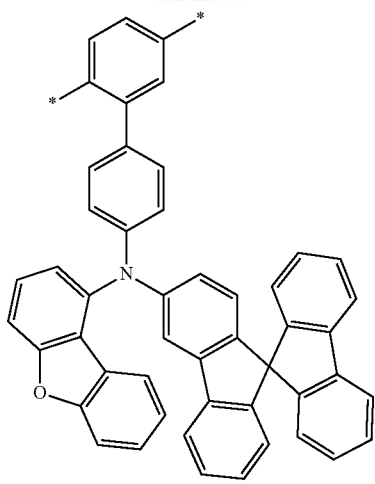
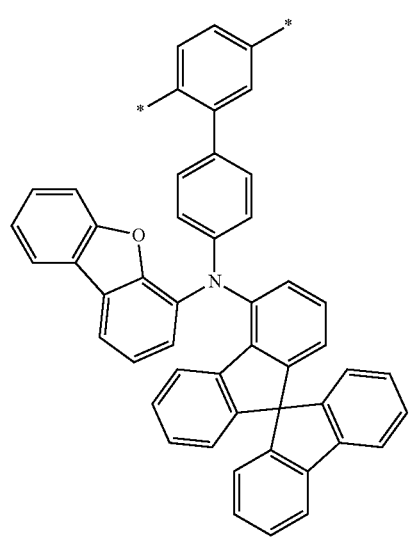
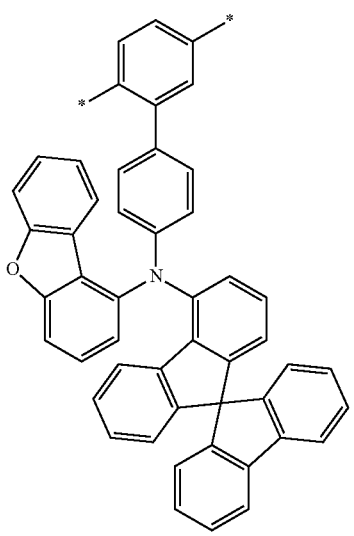
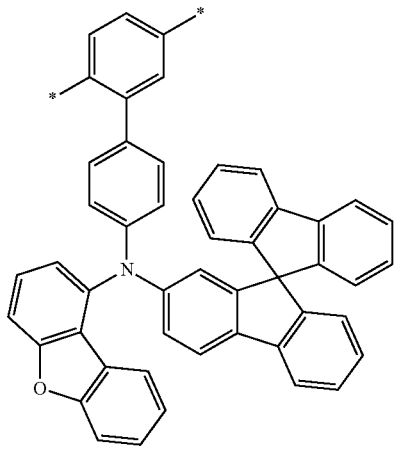
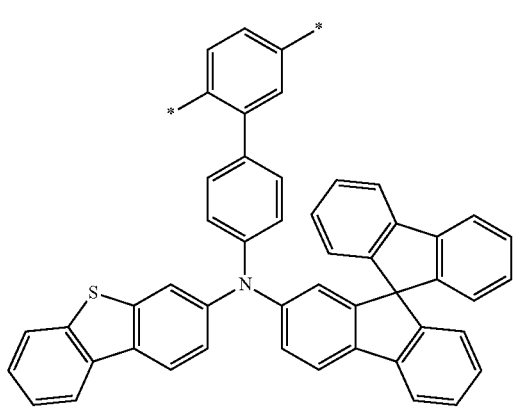

63
-continued
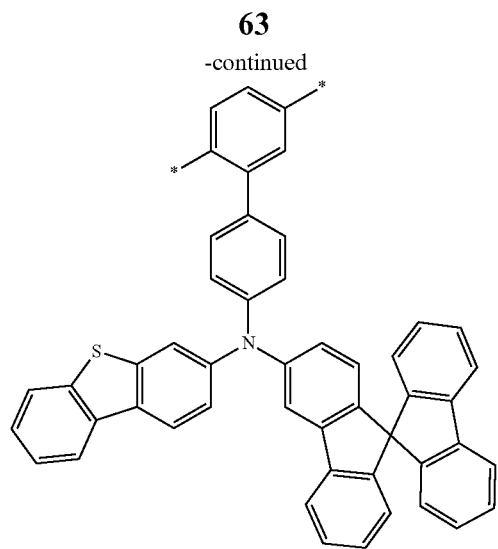
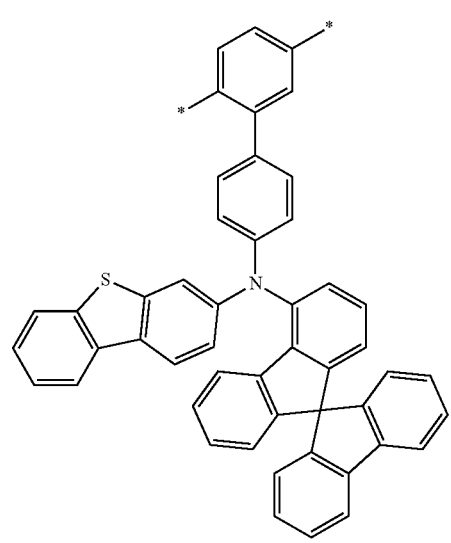
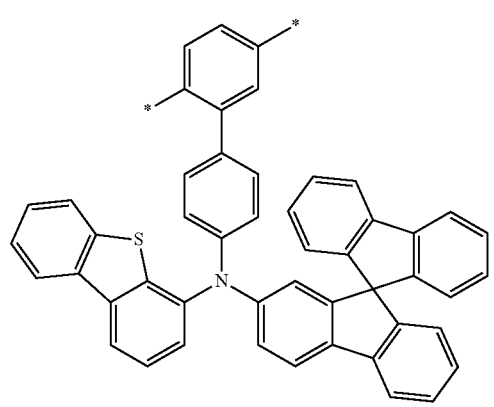
64
-continued
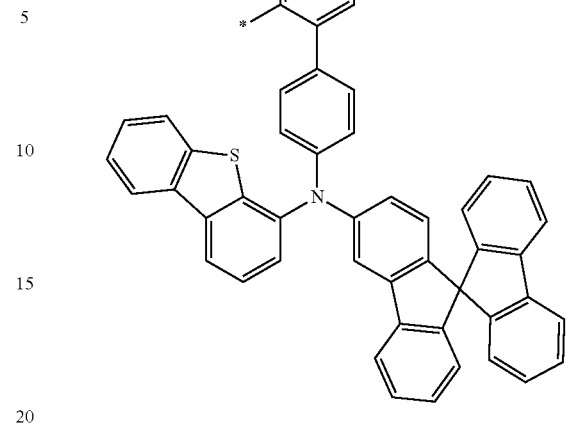
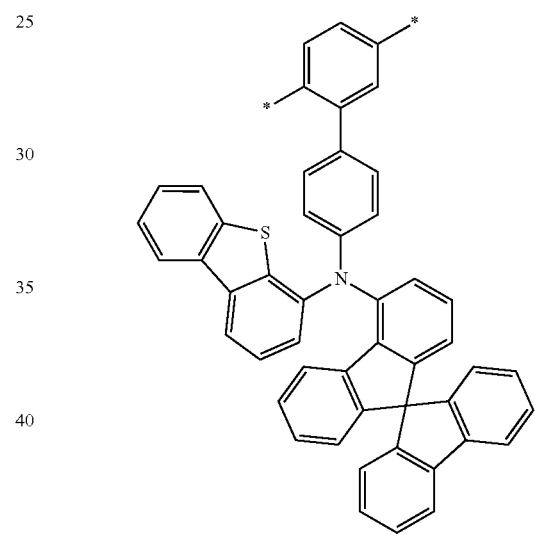
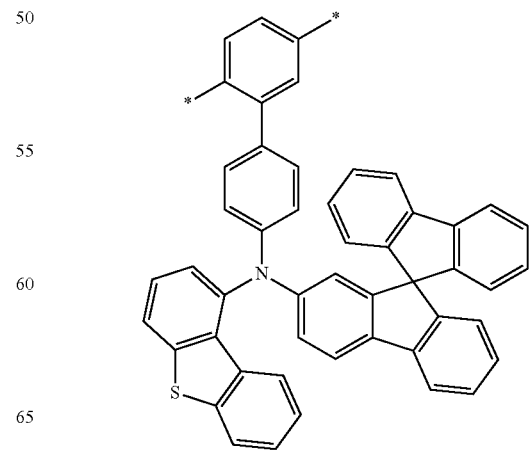

-continued
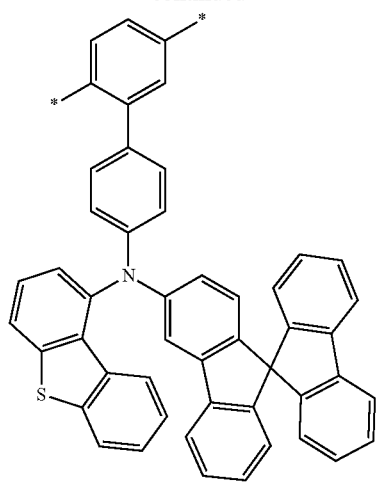
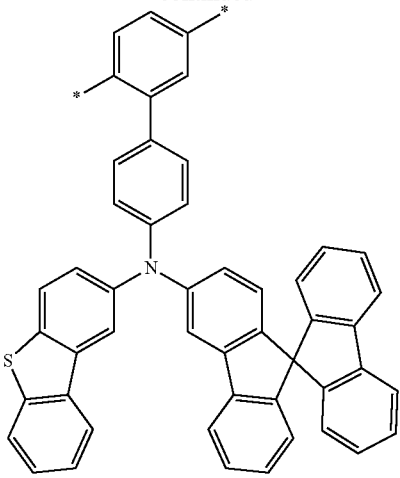
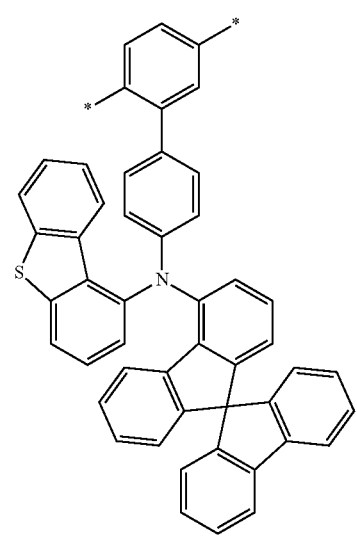
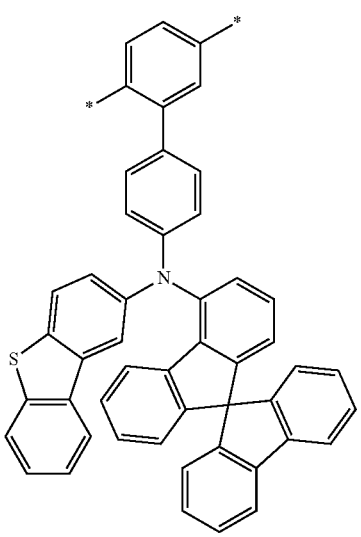
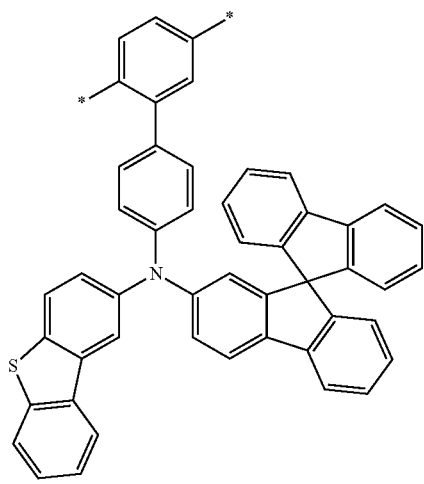
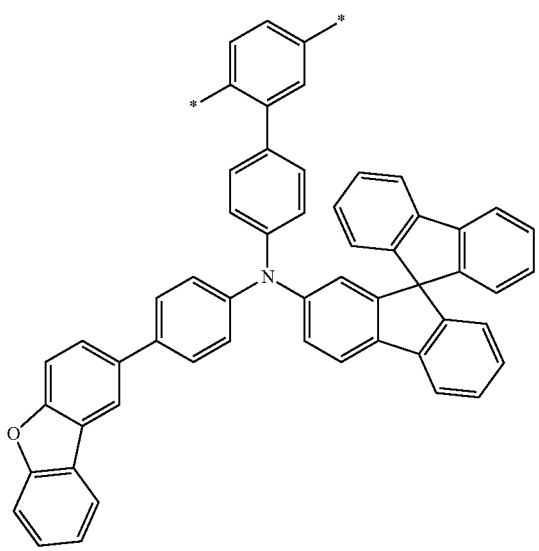

-continued
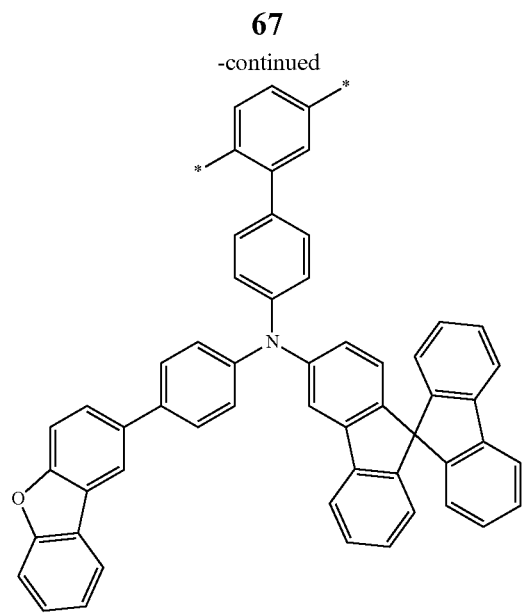
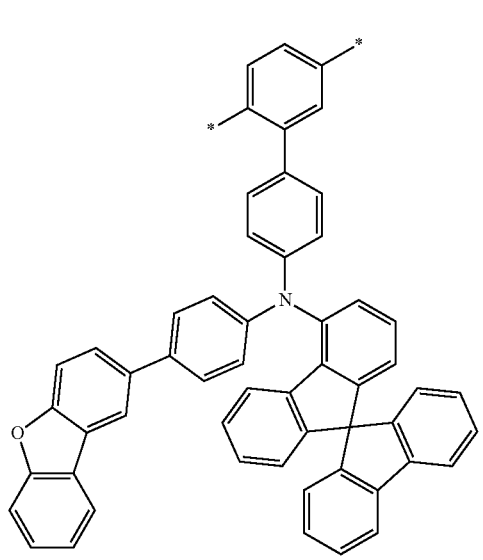
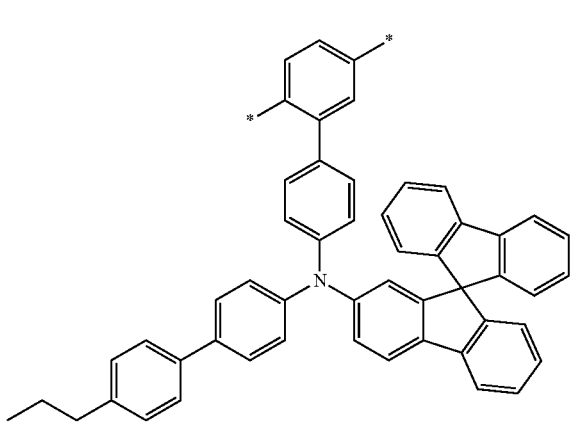
-continued
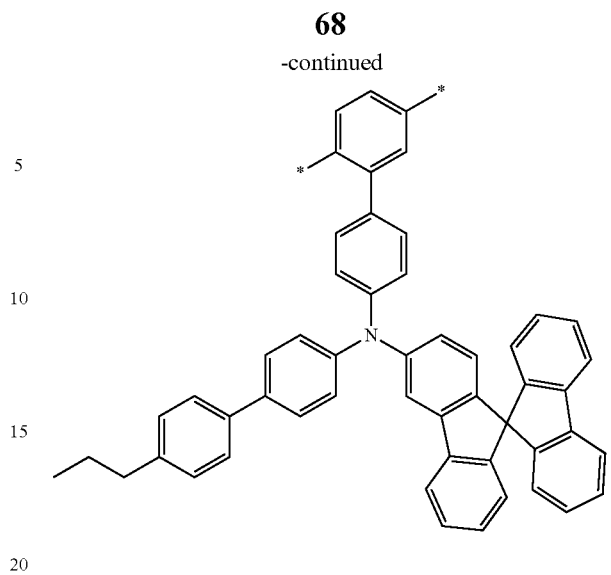
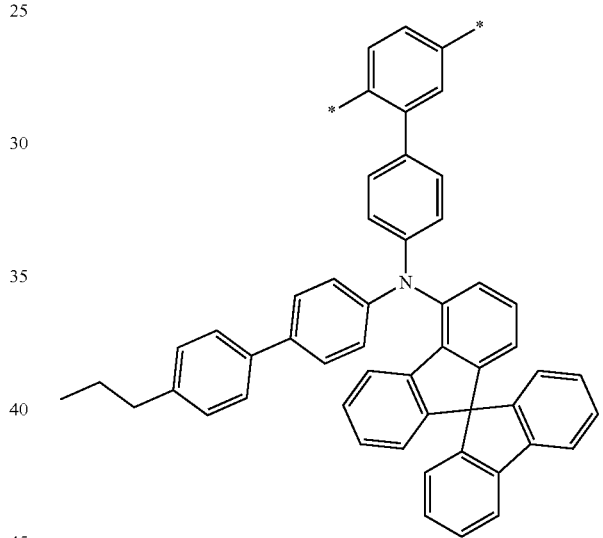
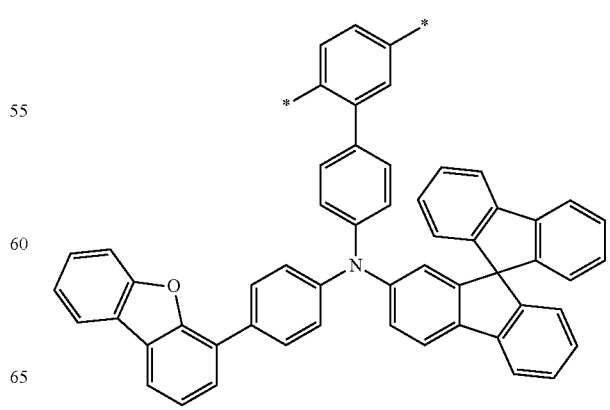

69
-continued
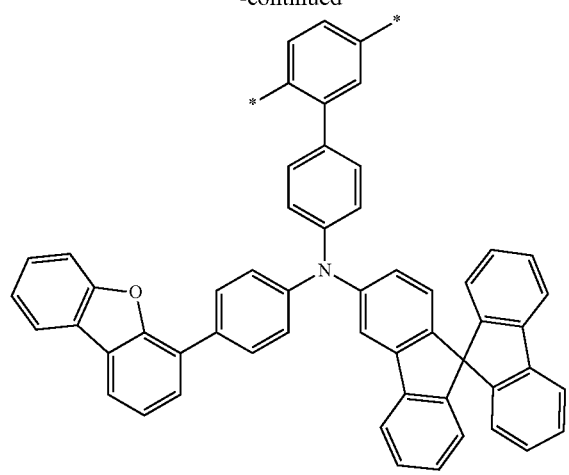
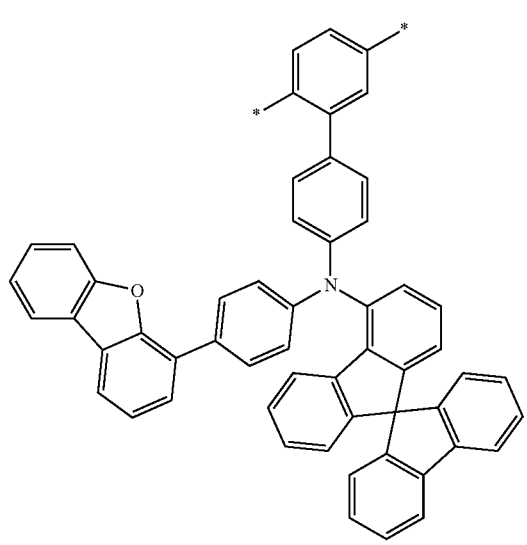
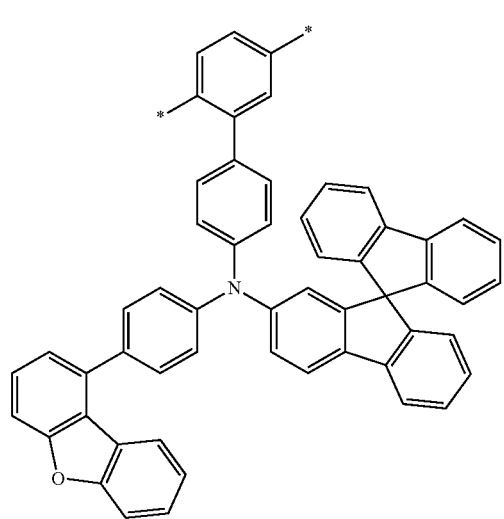
70
-continued
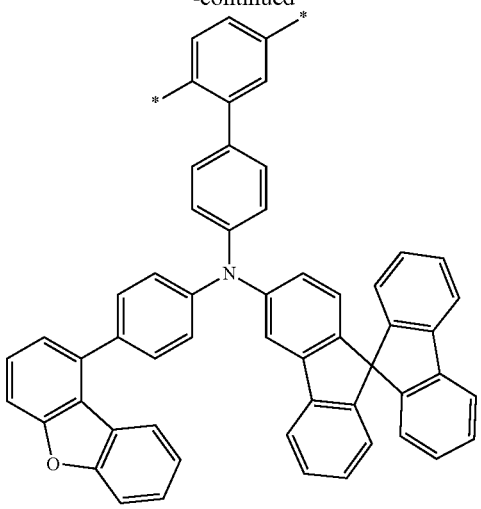
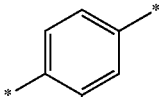
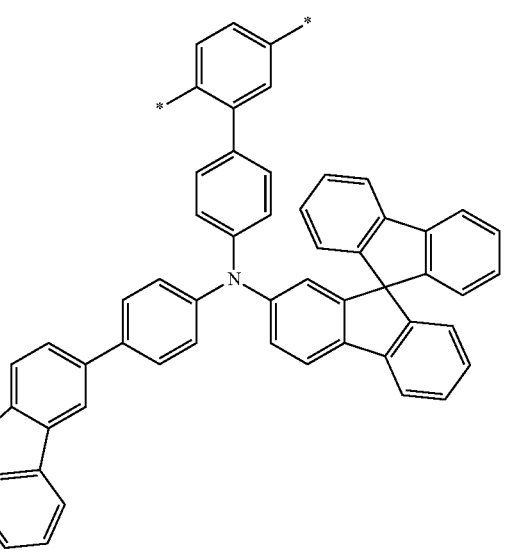

71
-continued
72
-continued
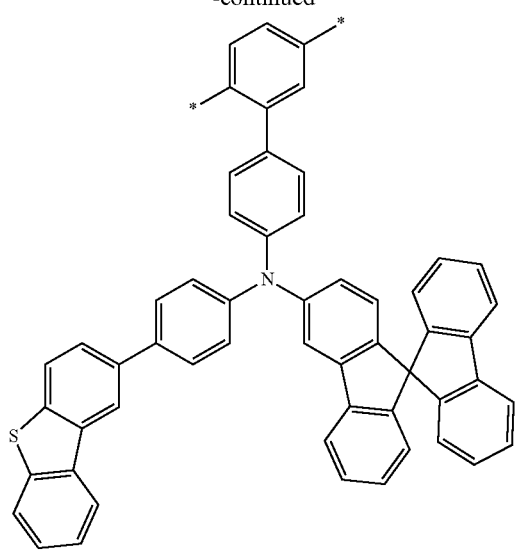
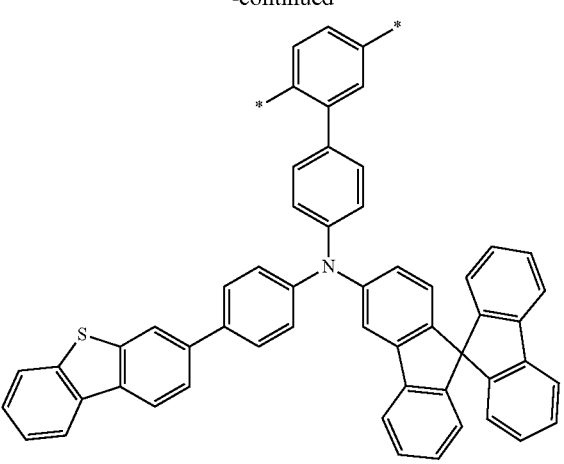
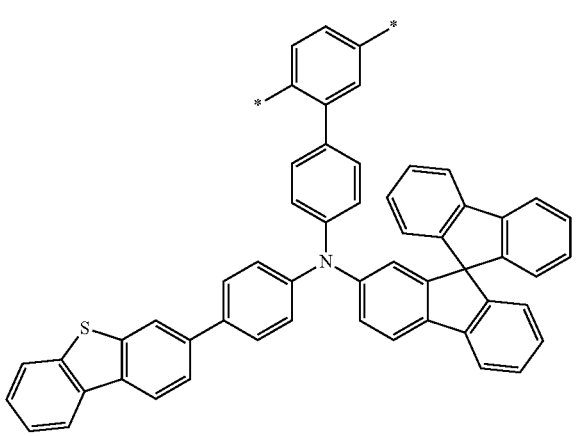
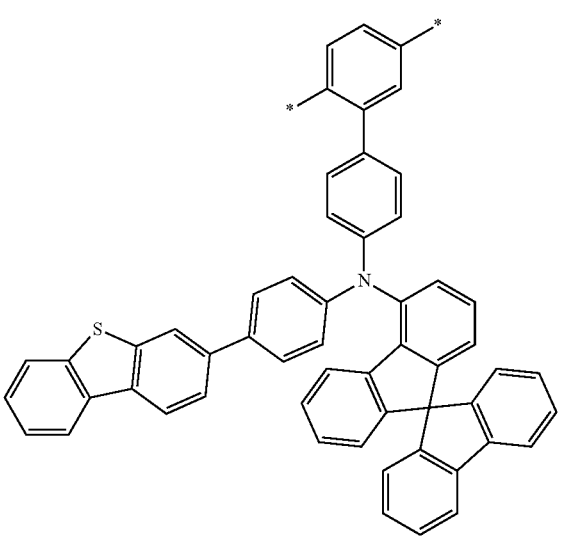
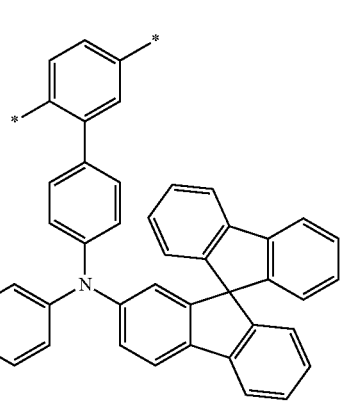

73
-continued
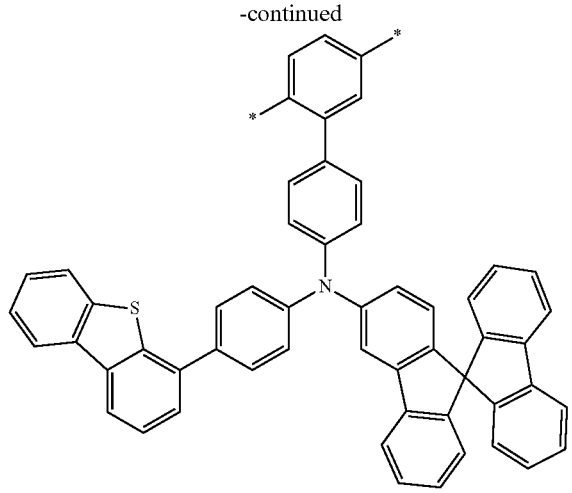
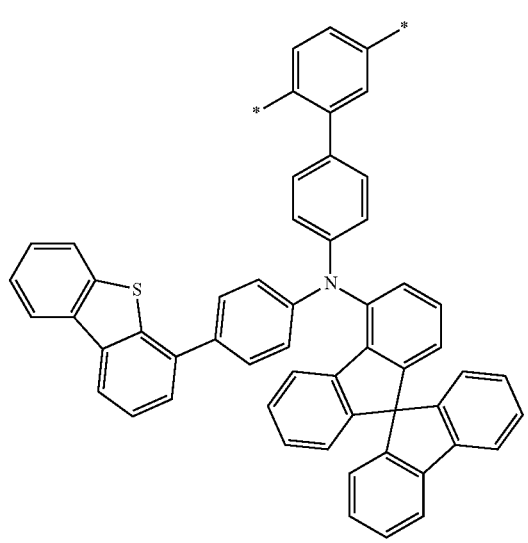
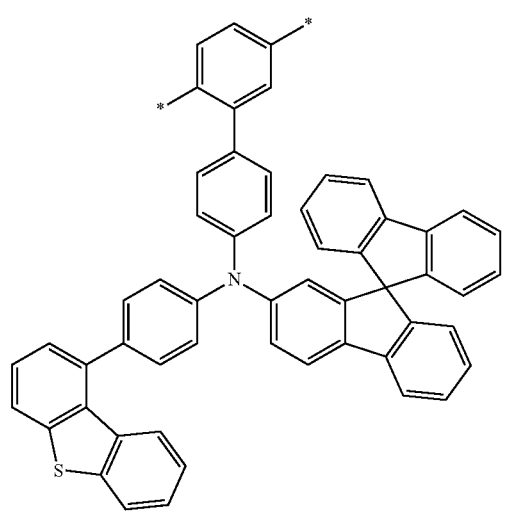
74
-continued
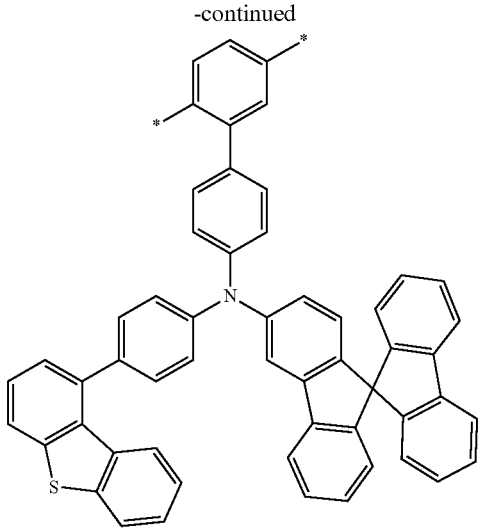
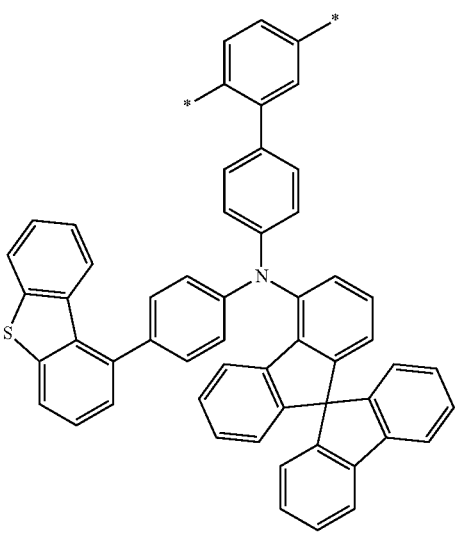
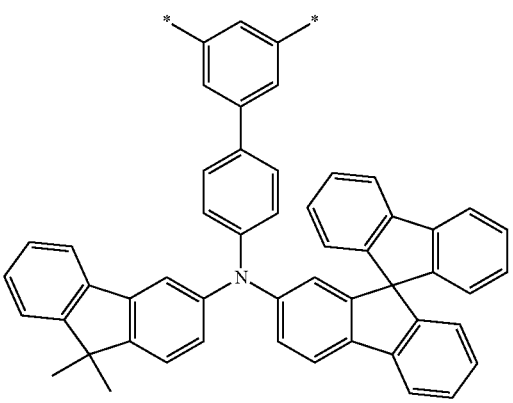

75
-continued
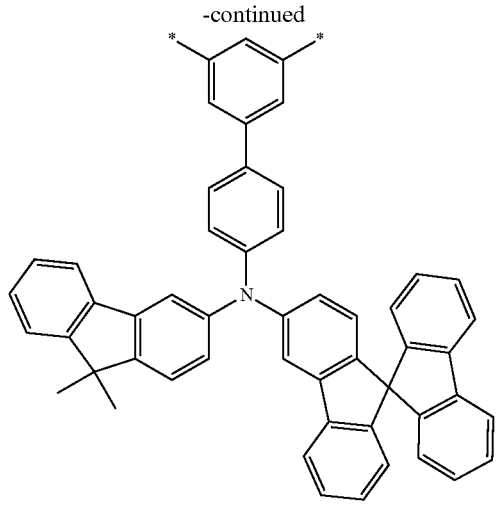
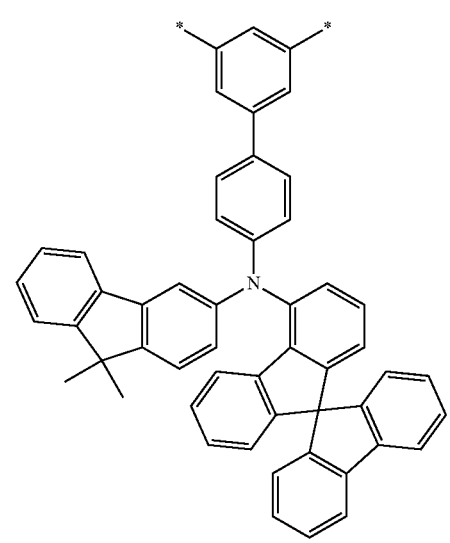
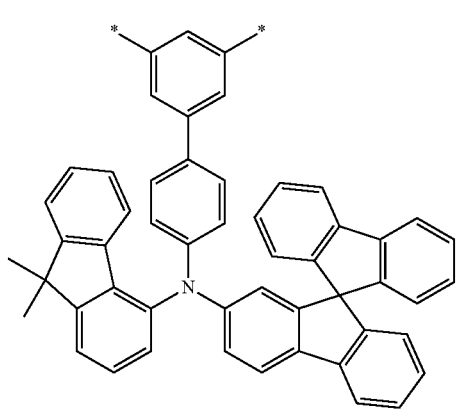
76
-continued
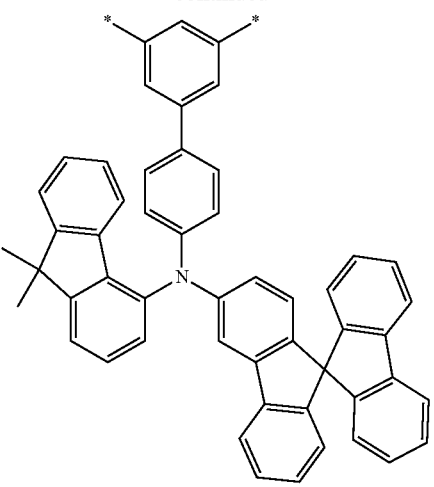
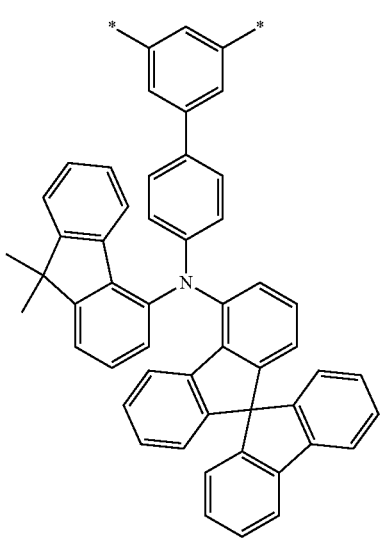
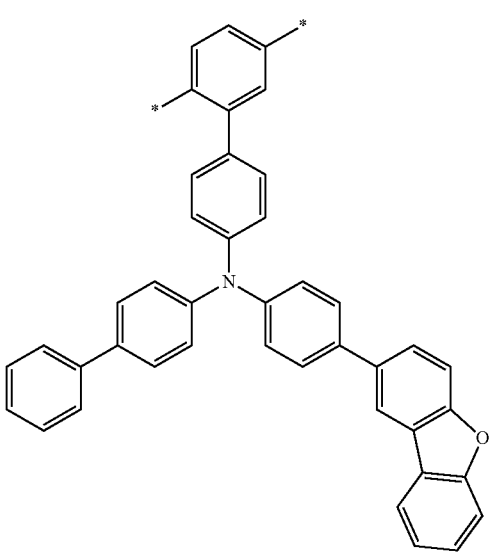

77
-continued
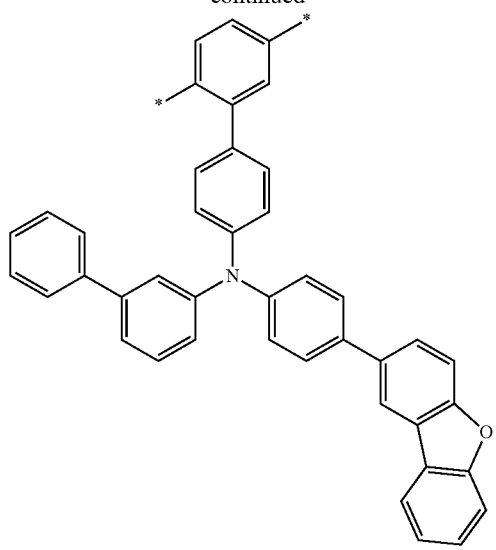
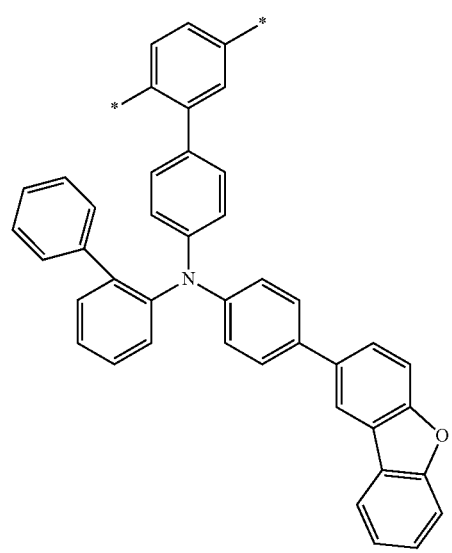
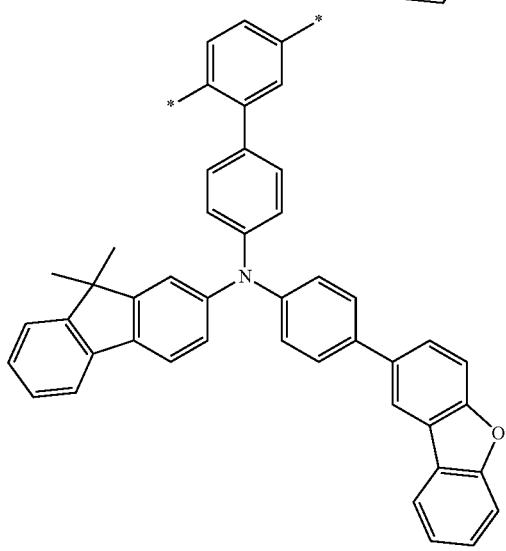
78
-continued
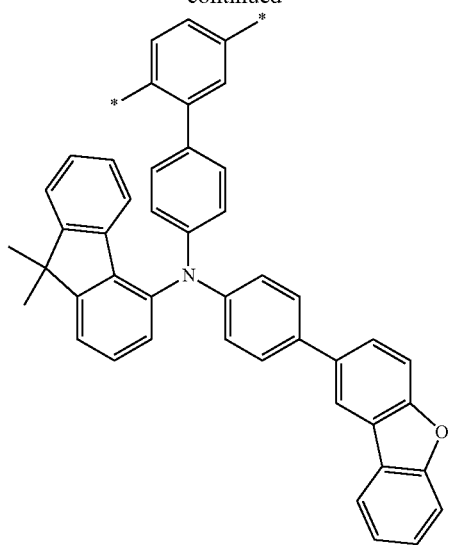
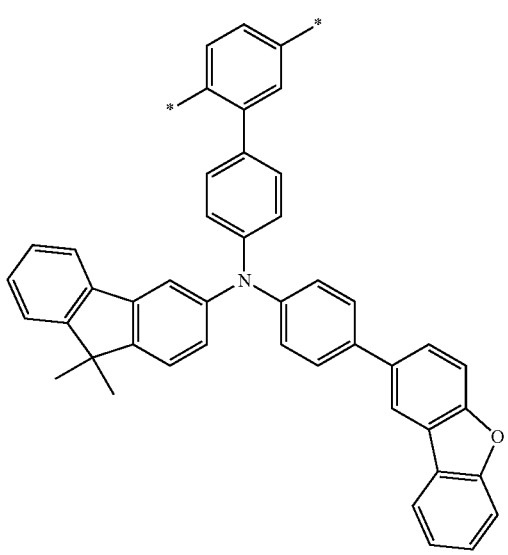
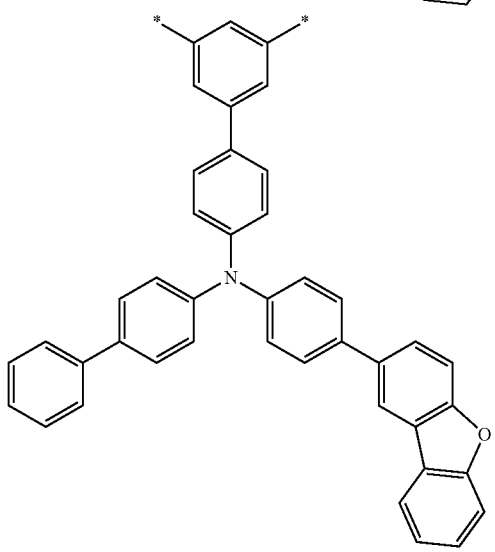

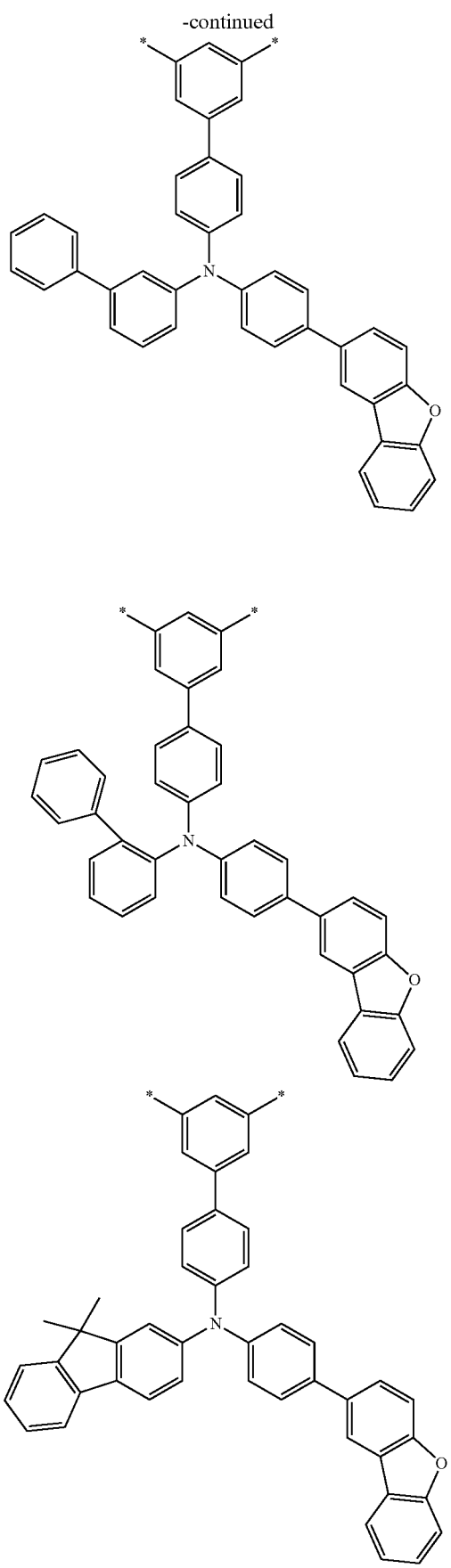
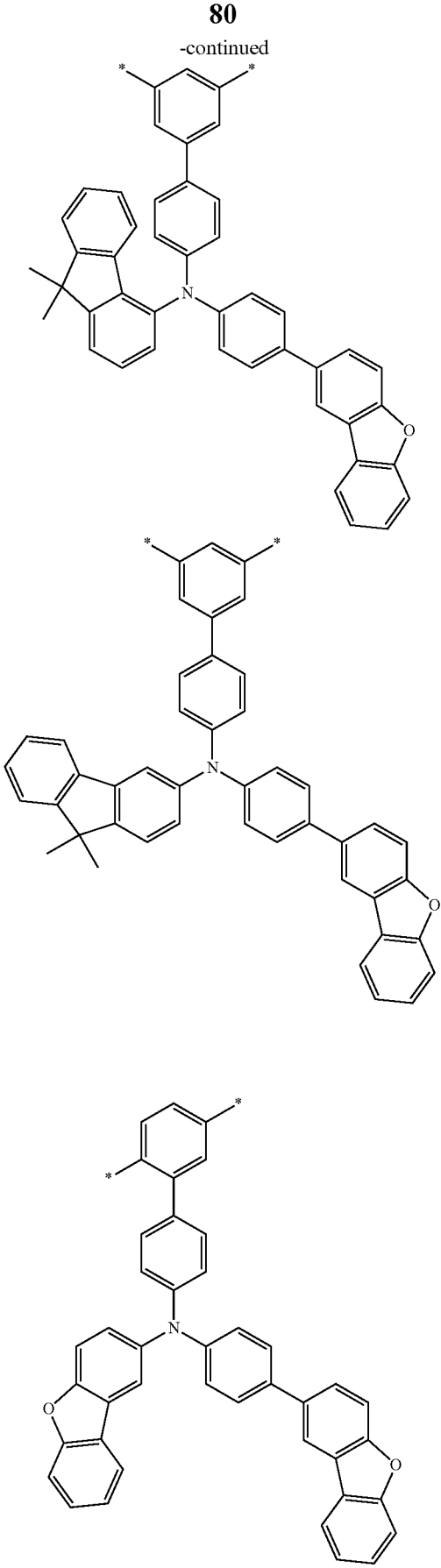

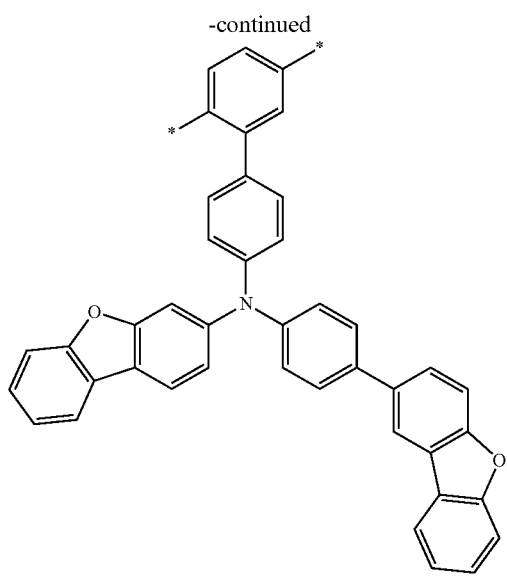
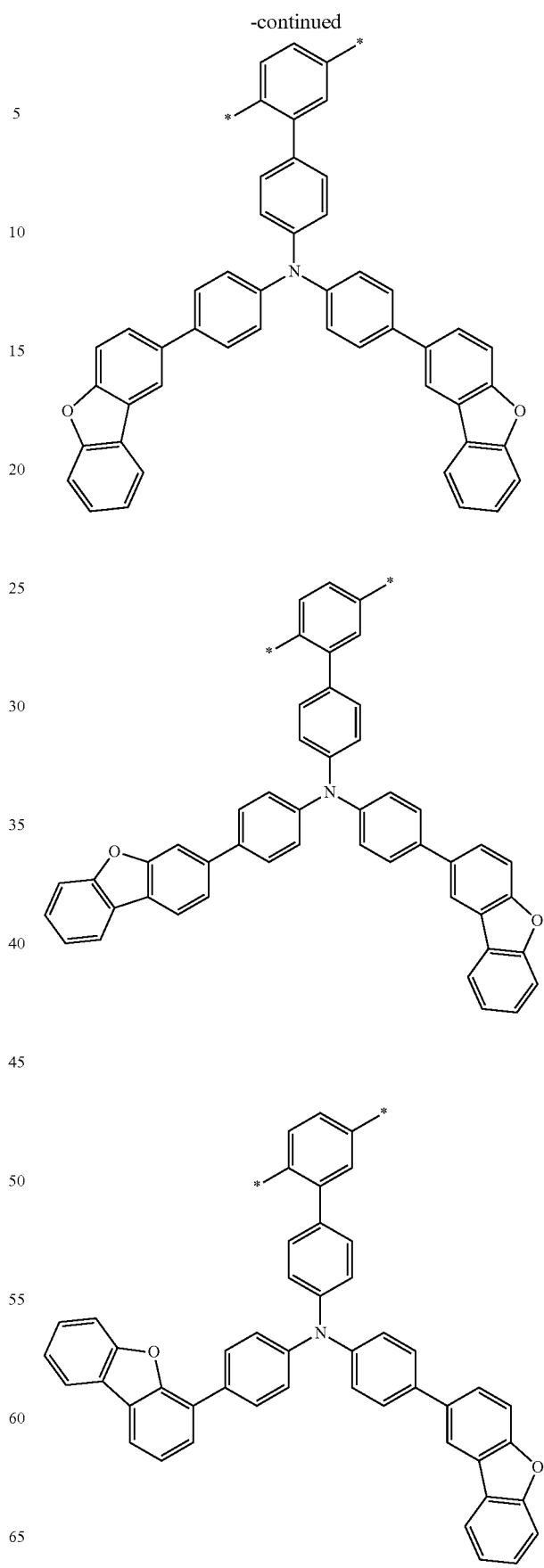

83
-continued
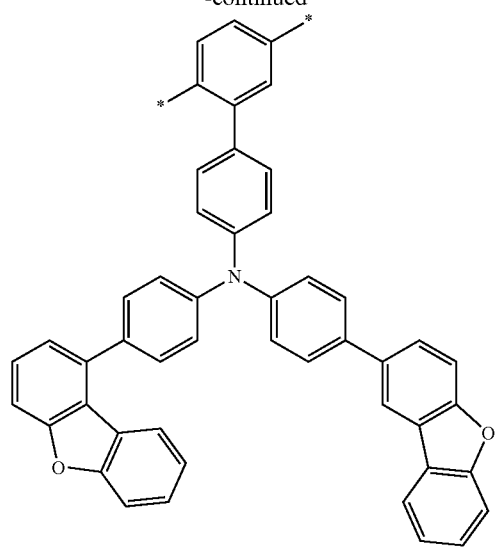
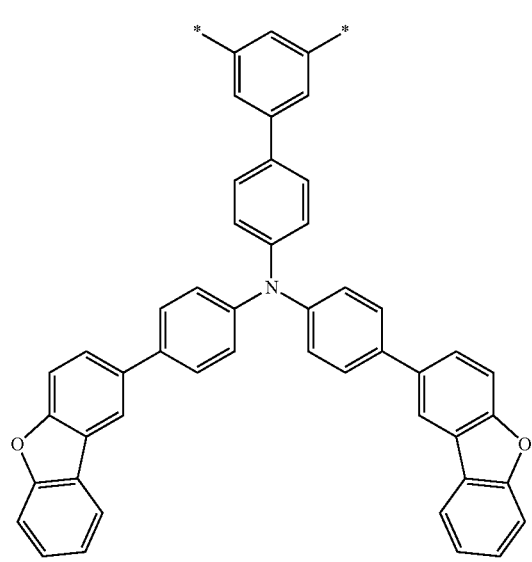
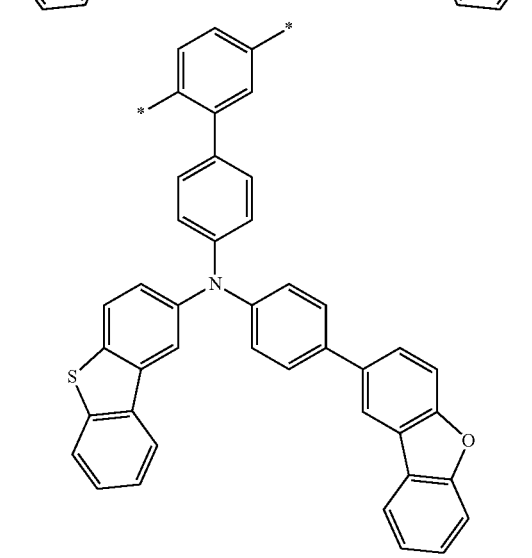
84
-continued
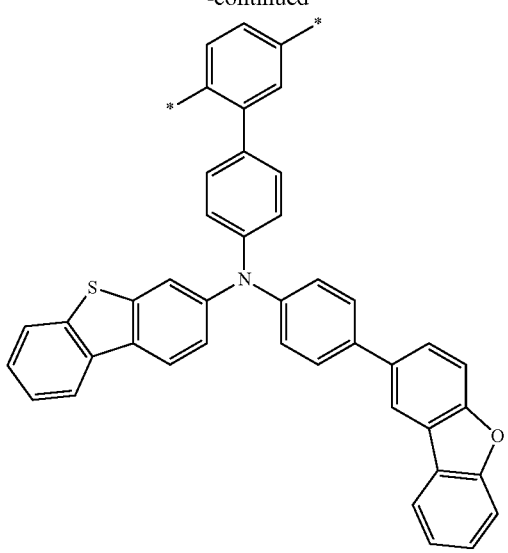
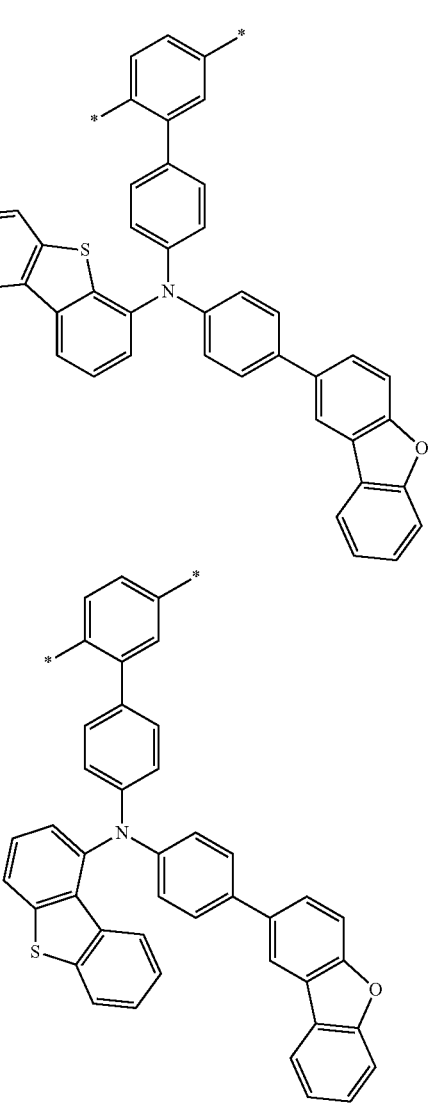

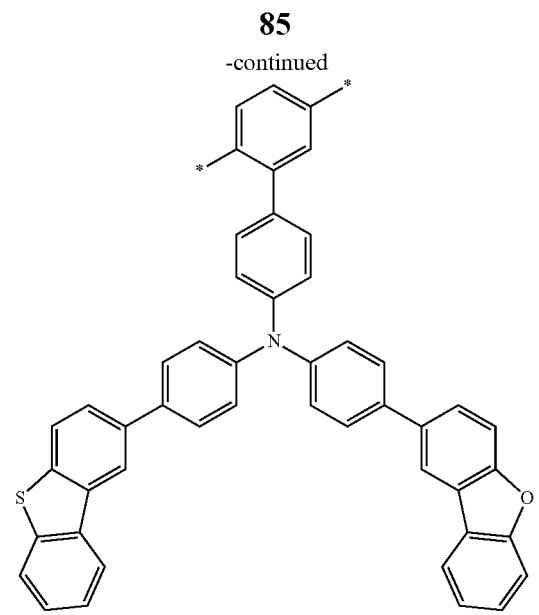
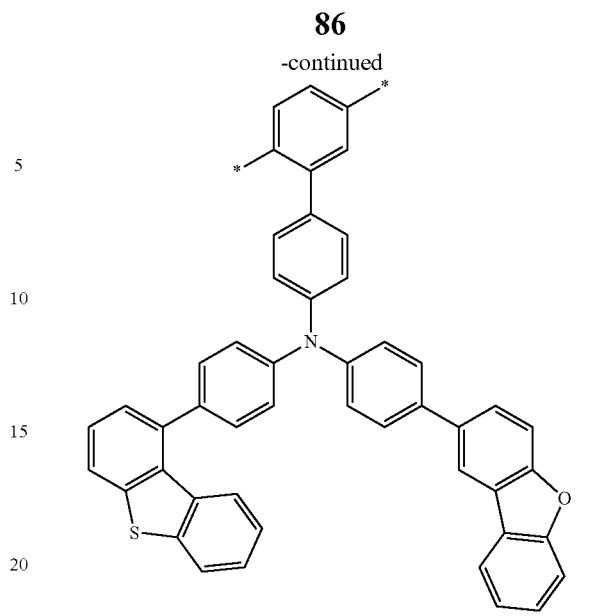
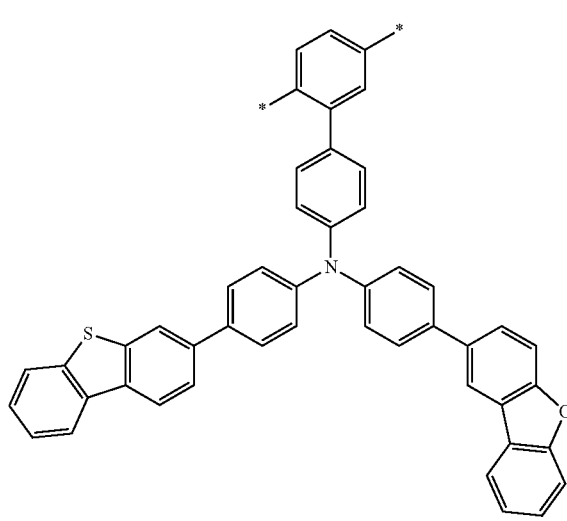
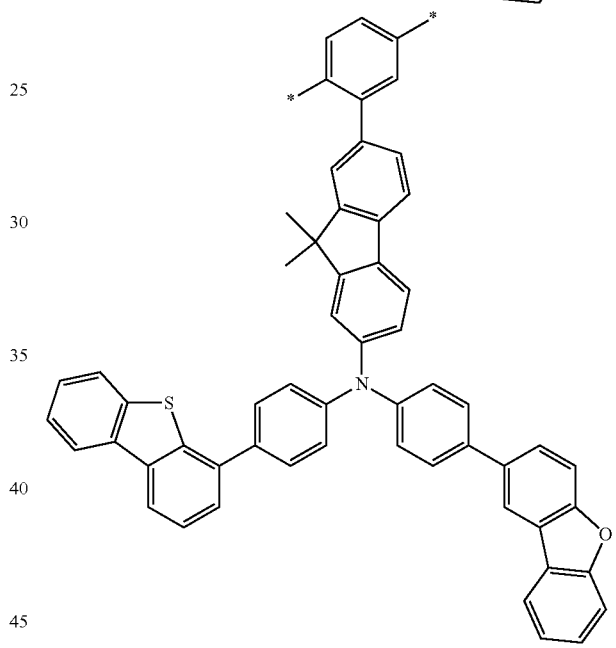
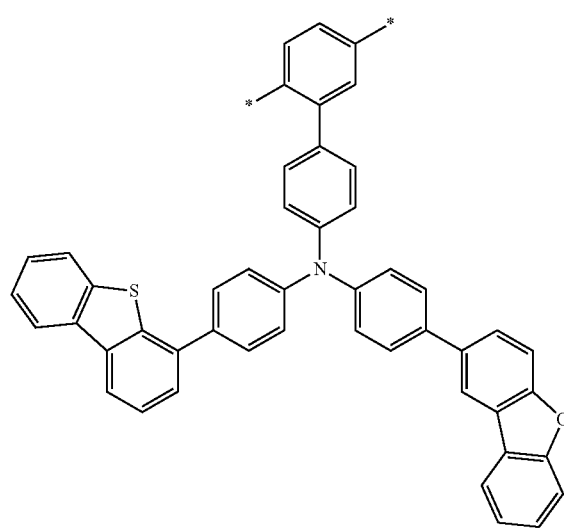
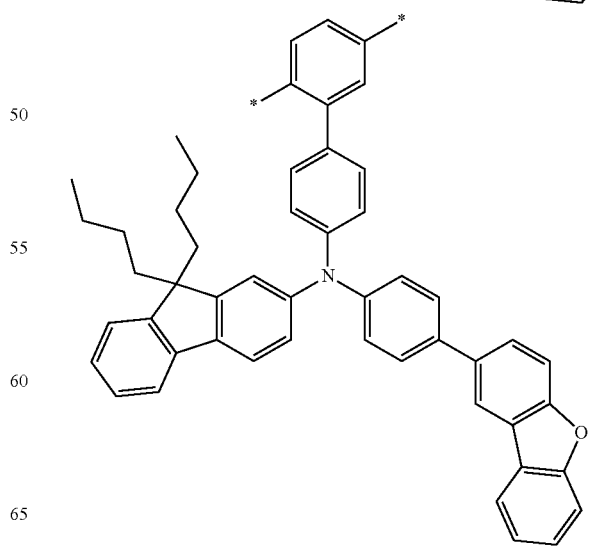

87
-continued
88
-continued
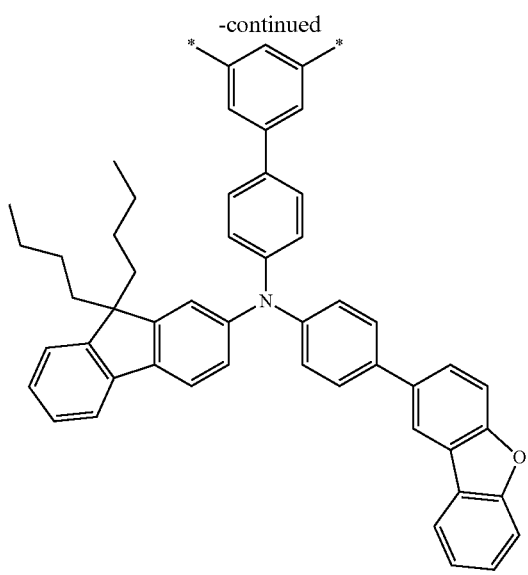
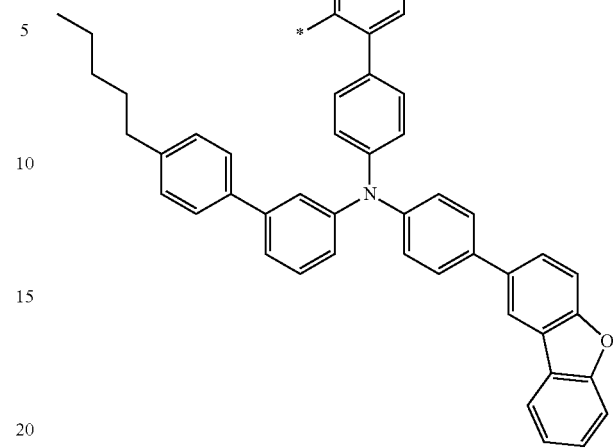
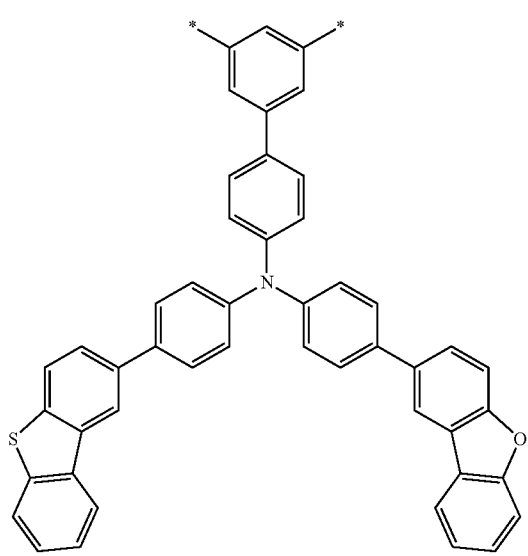
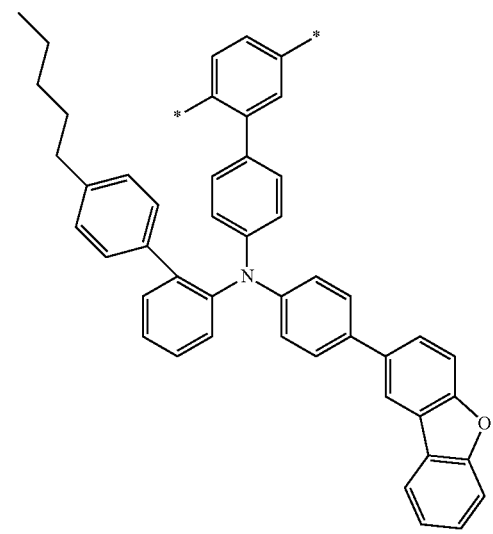
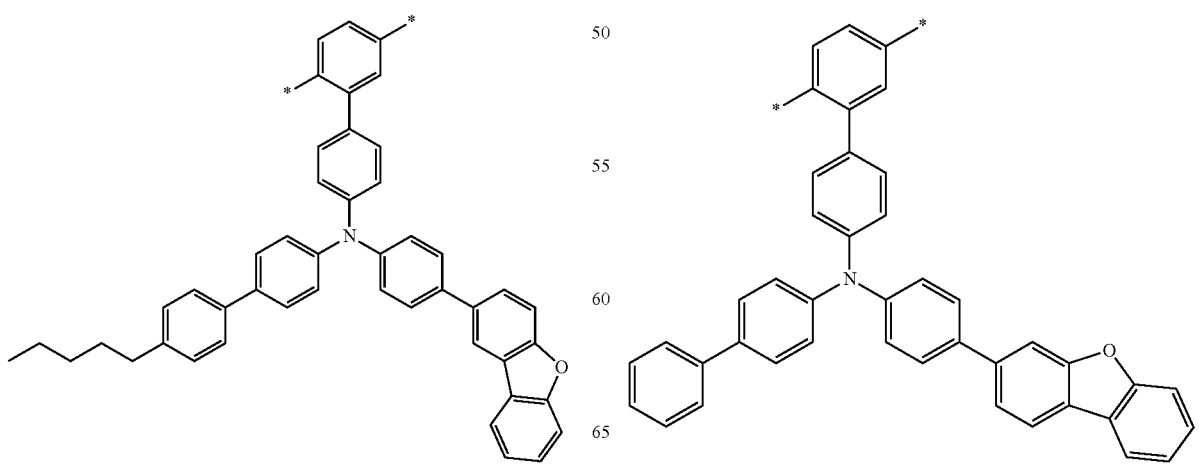

89
-continued
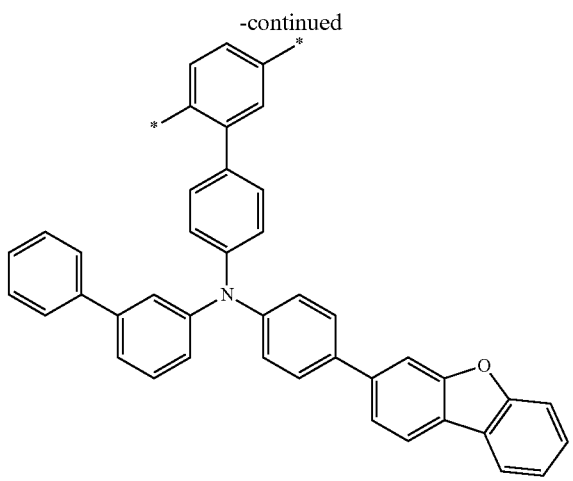
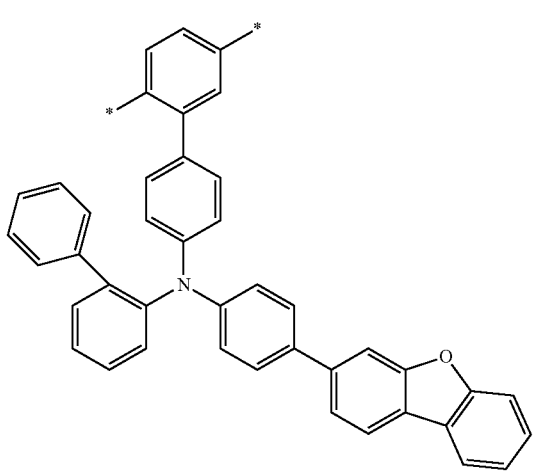
90
-continued
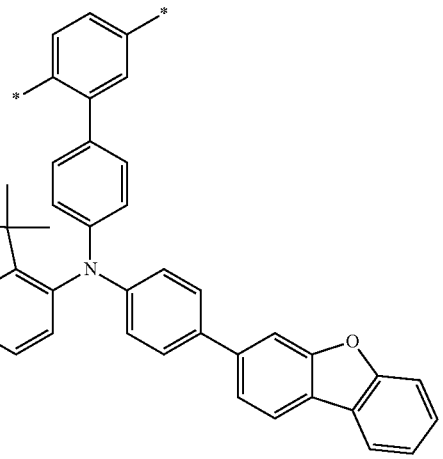
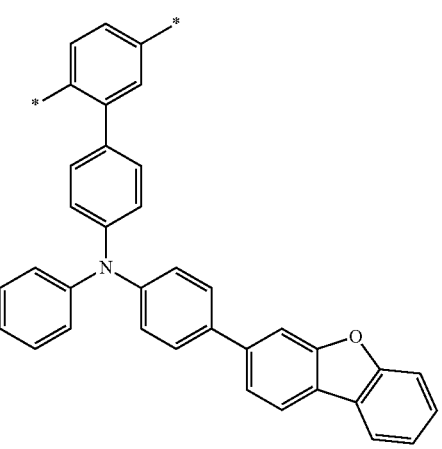
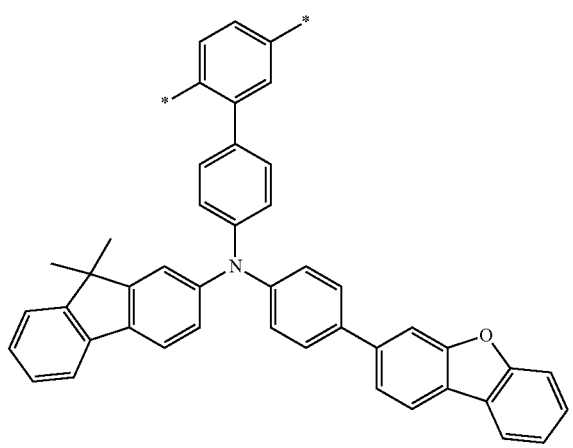
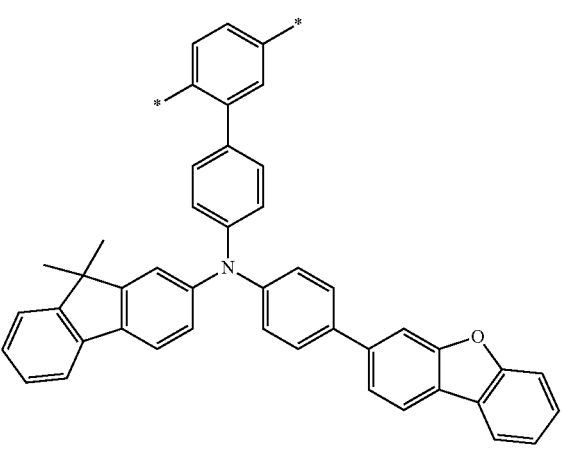

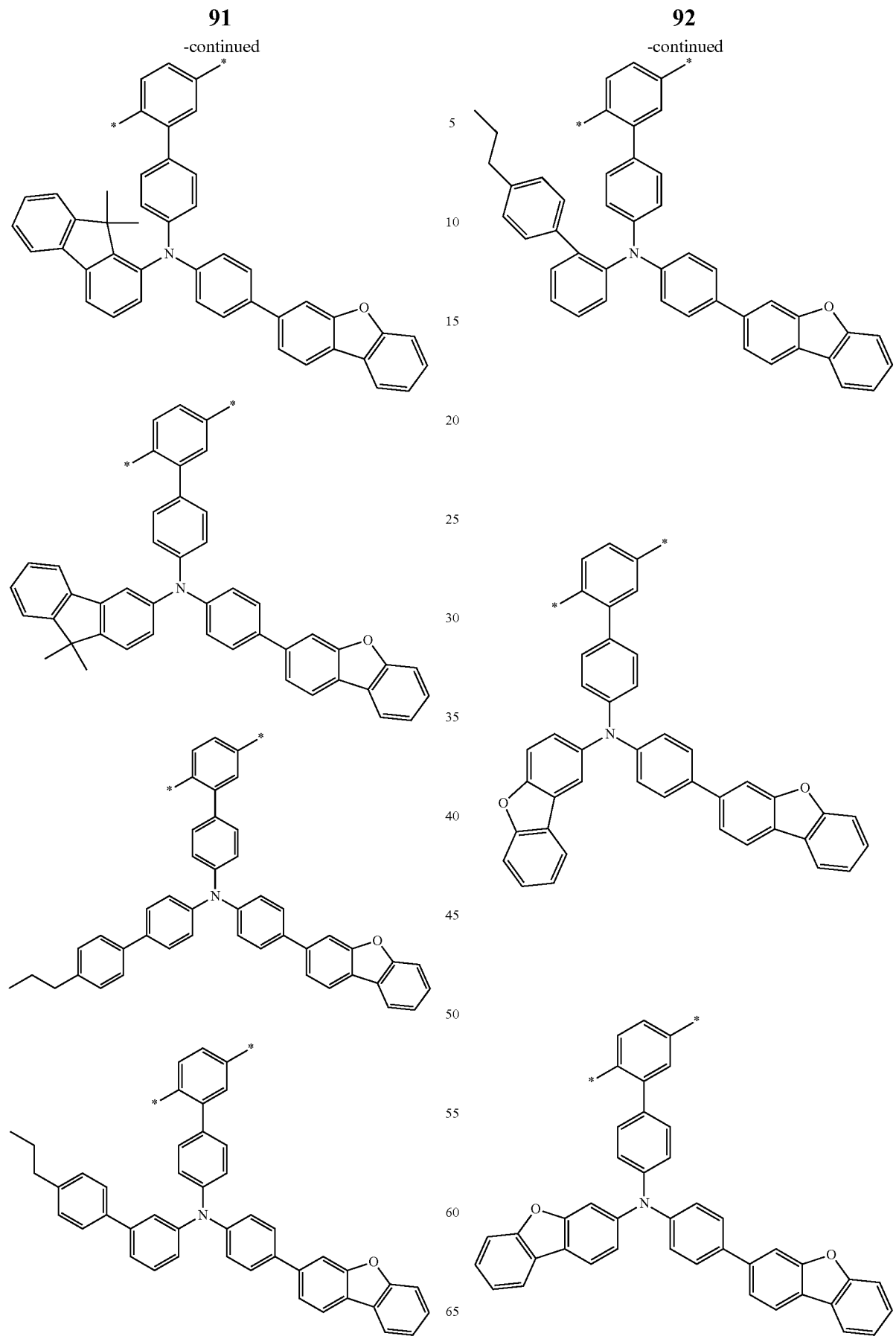

93
-continued
94
-continued
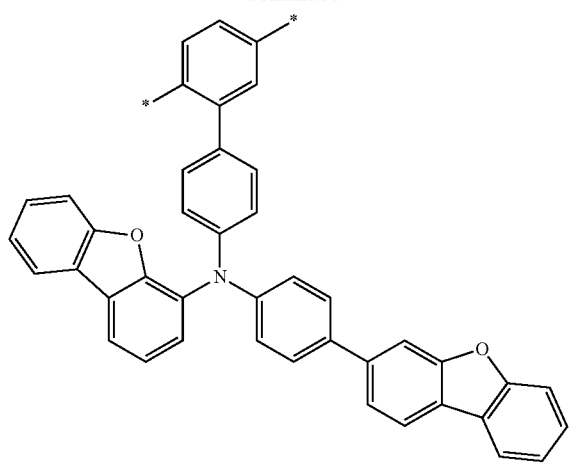
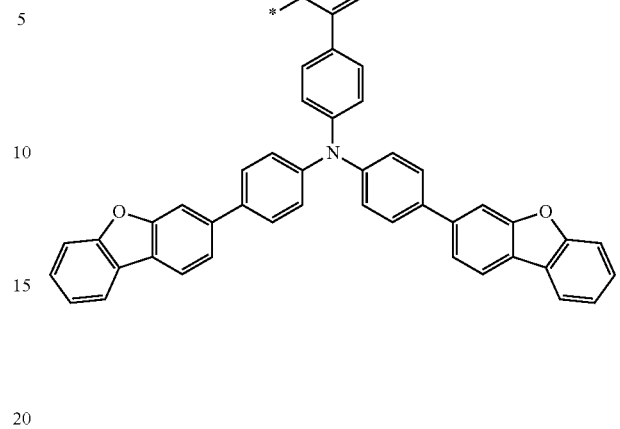
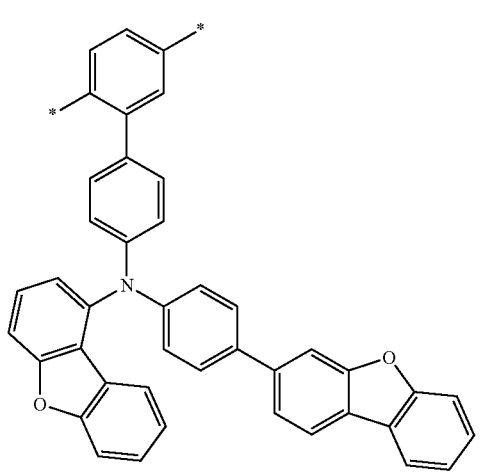
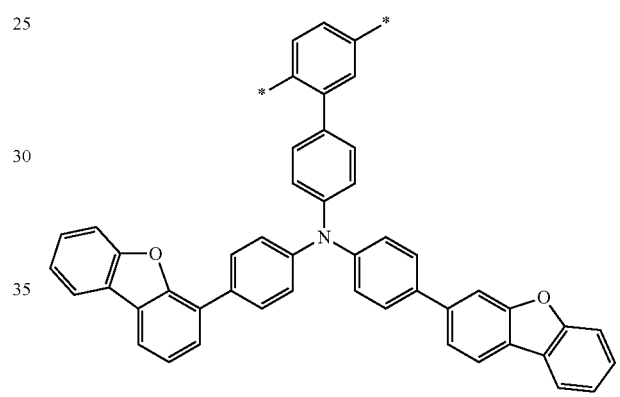
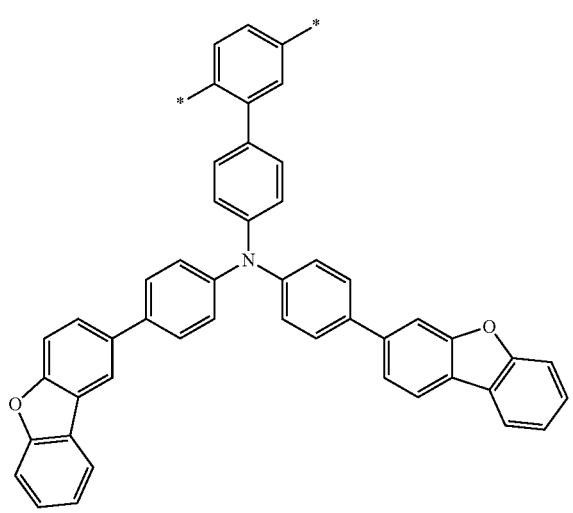
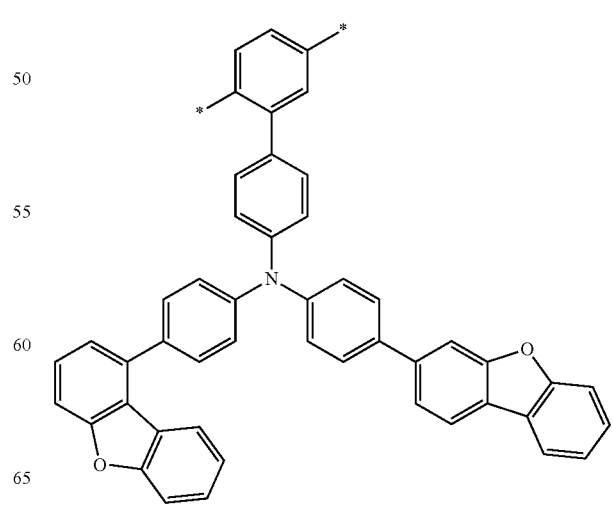

95
-continued
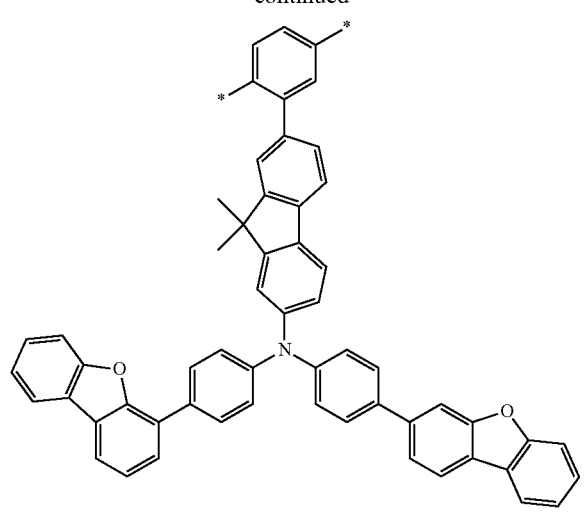
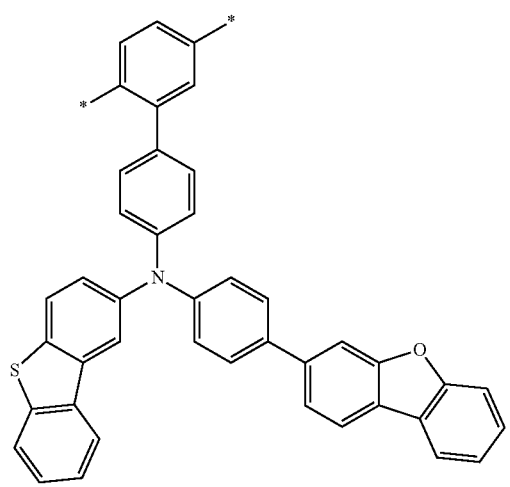
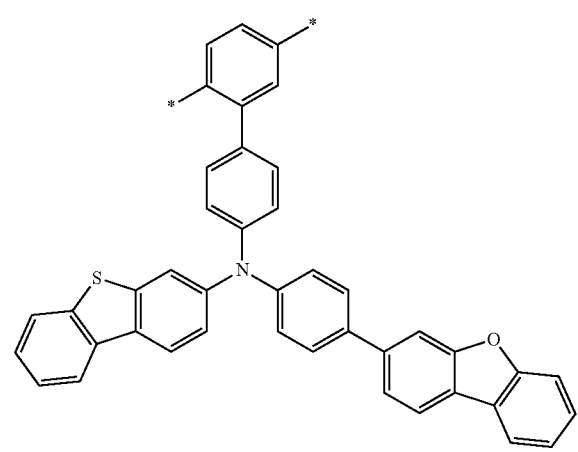
96
-continued
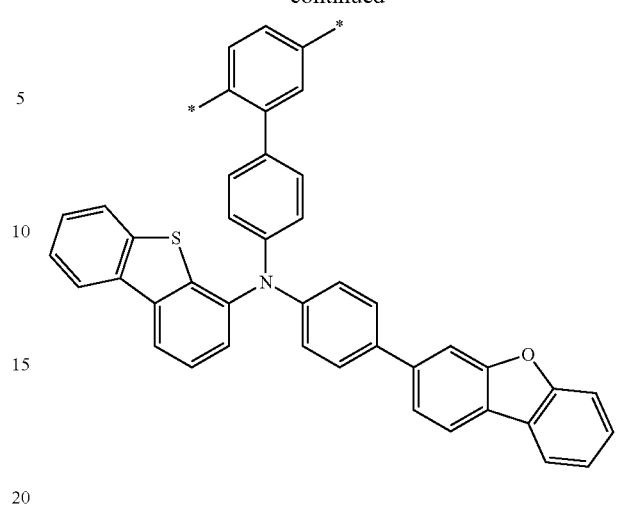
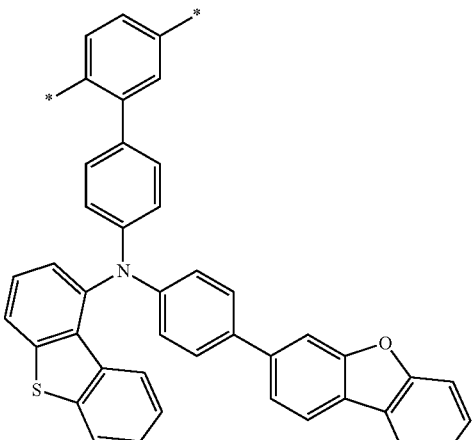
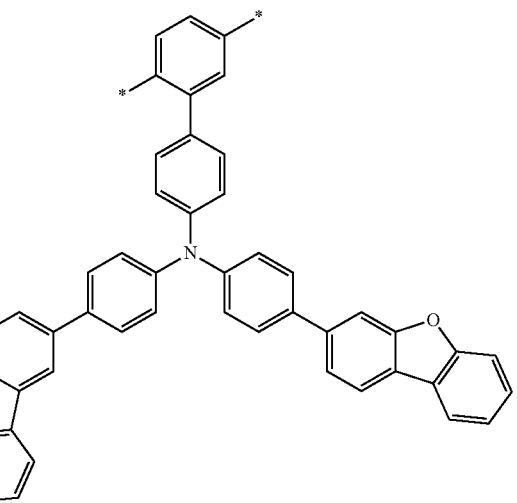

97
-continued
98
-continued
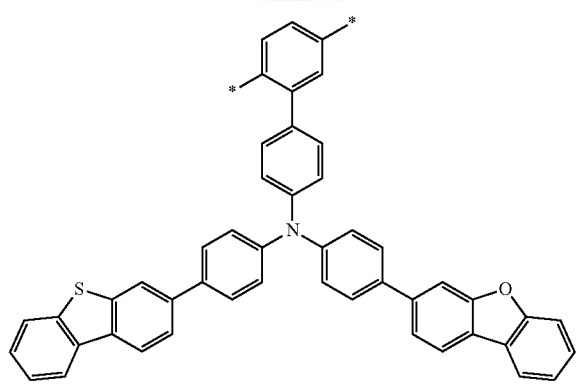
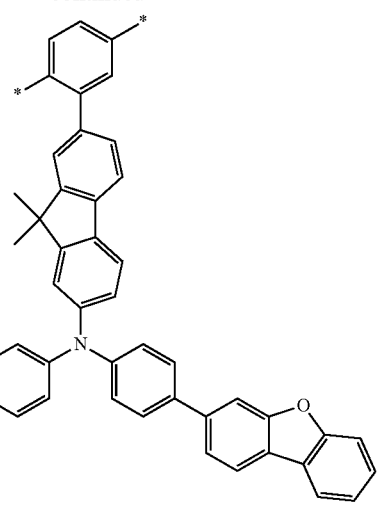
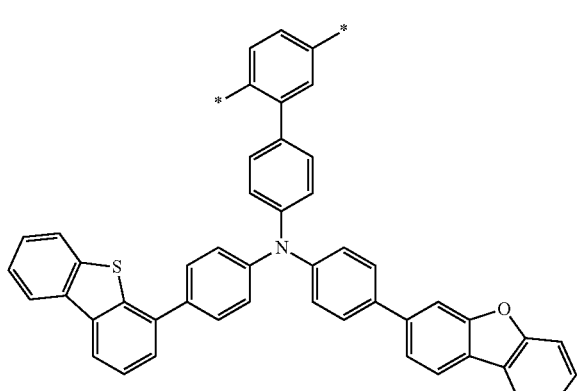
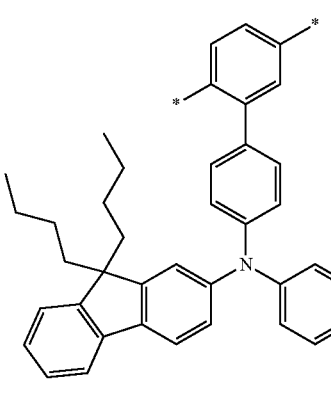
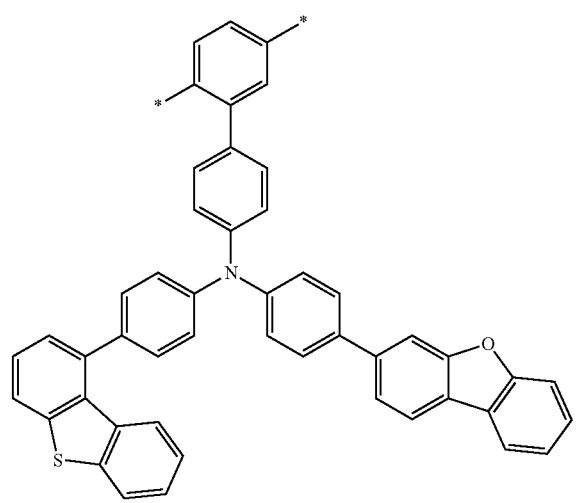
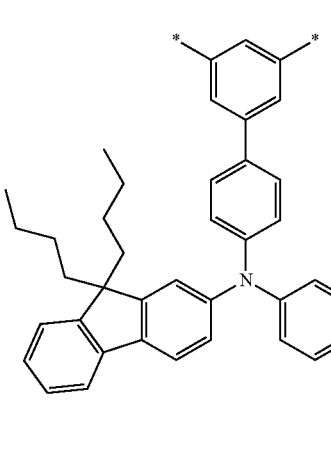

99
-continued
100
-continued
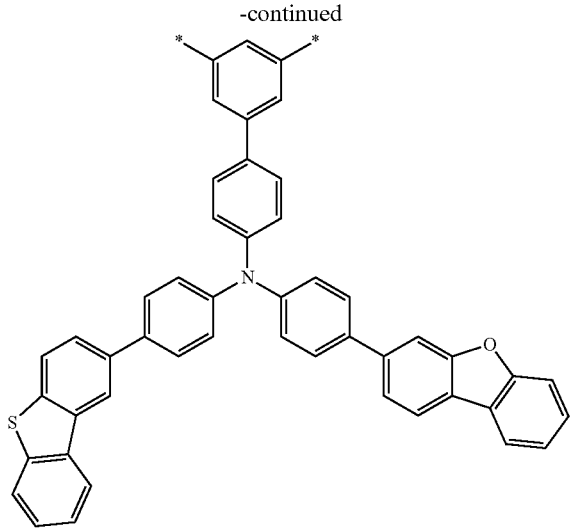
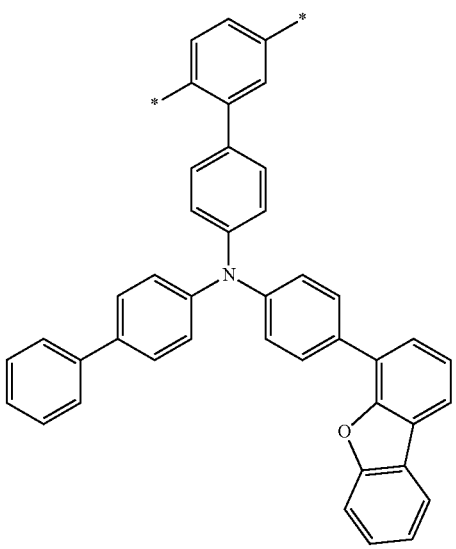

101
-continued
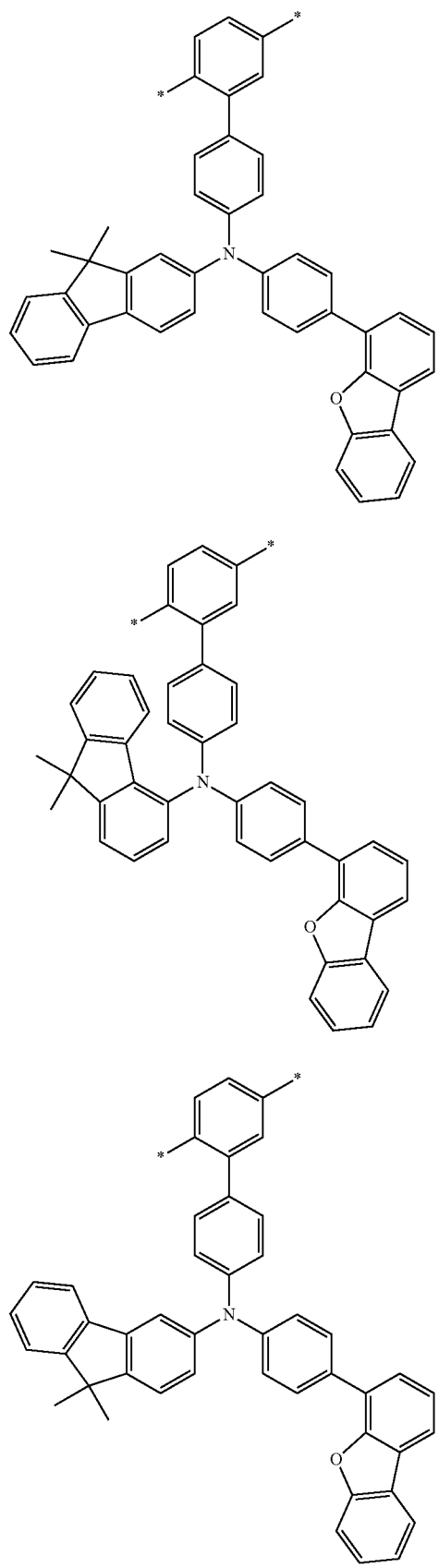
102
-continued
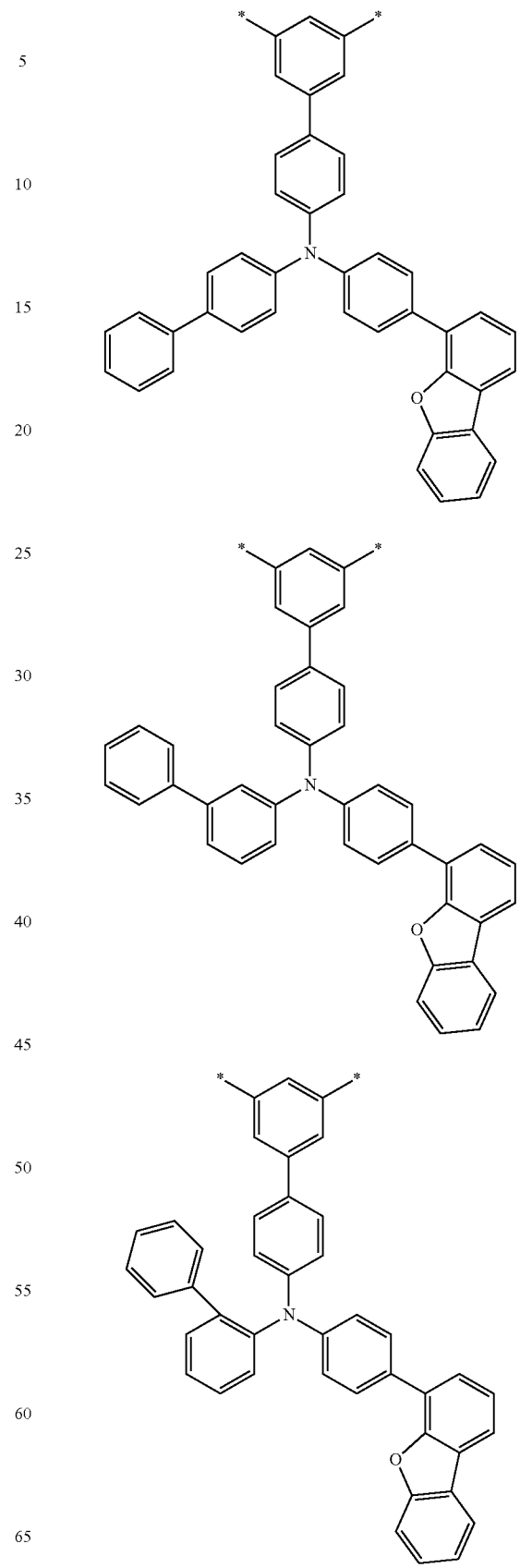

103
-continued
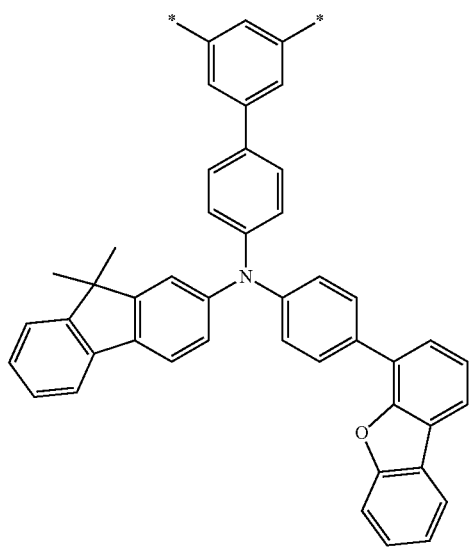
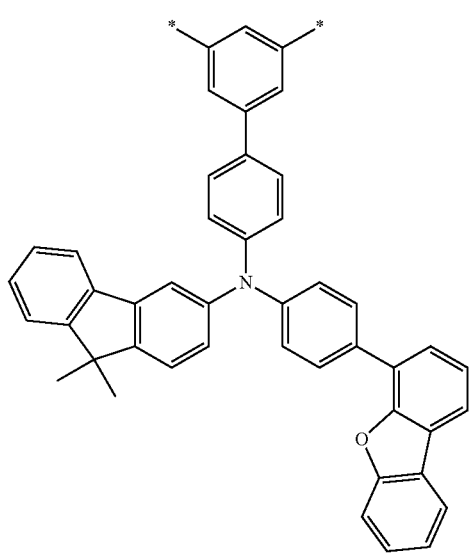
104
-continued
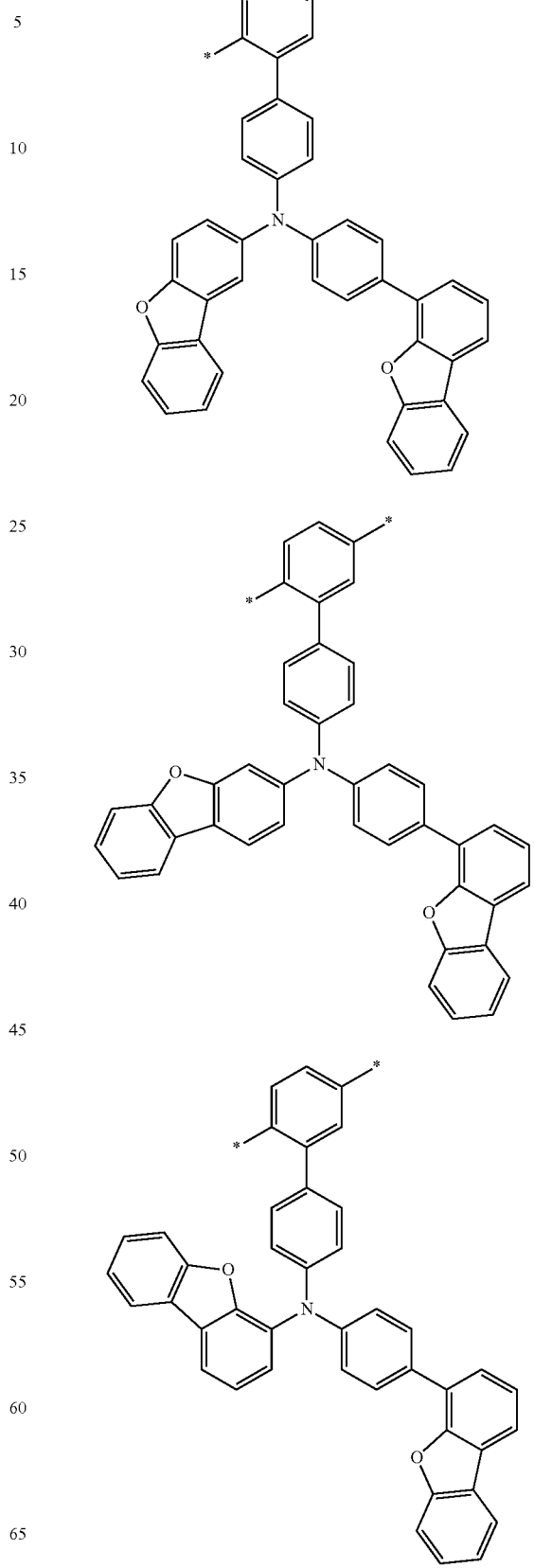

105
-continued
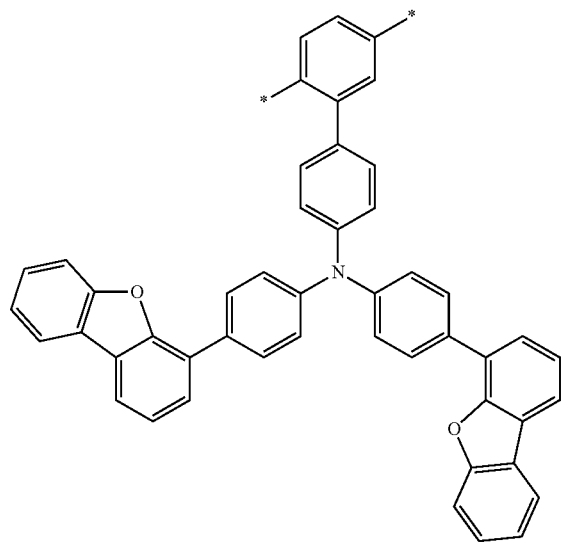
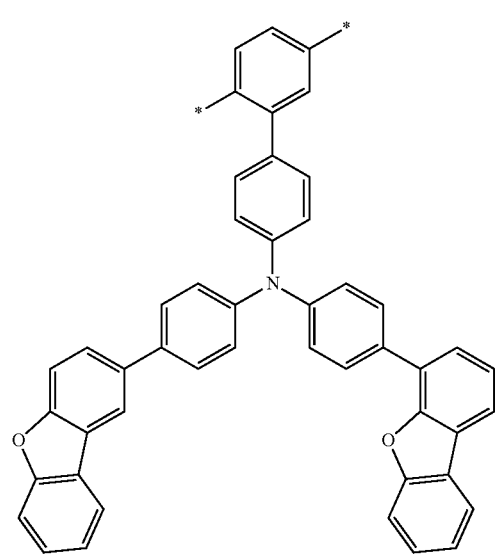
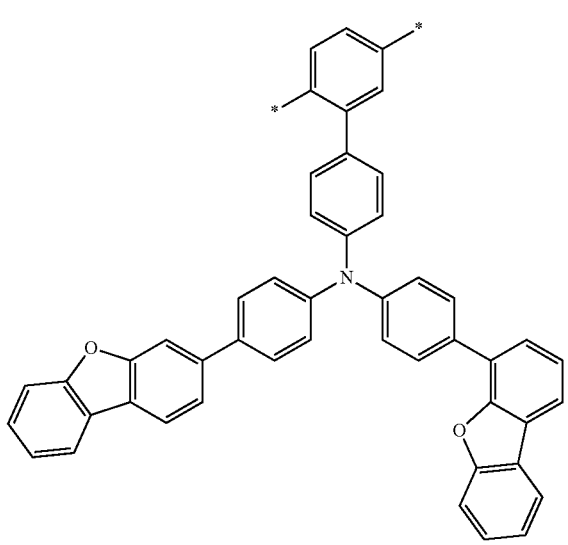
106
-continued
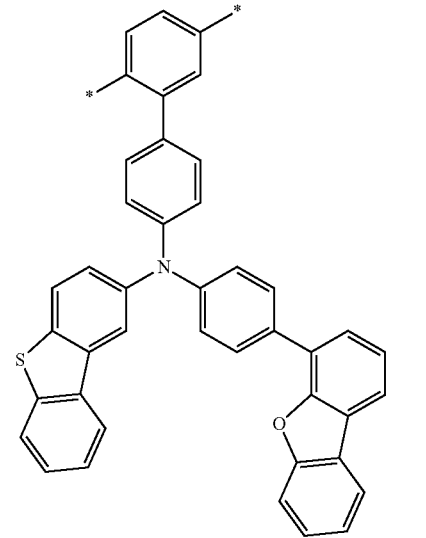
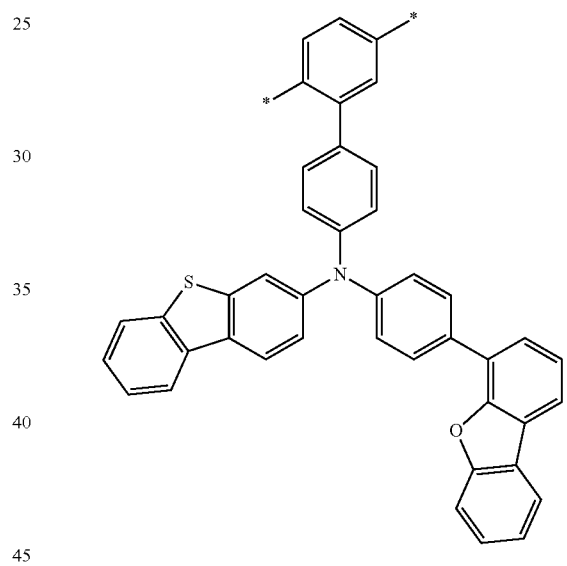
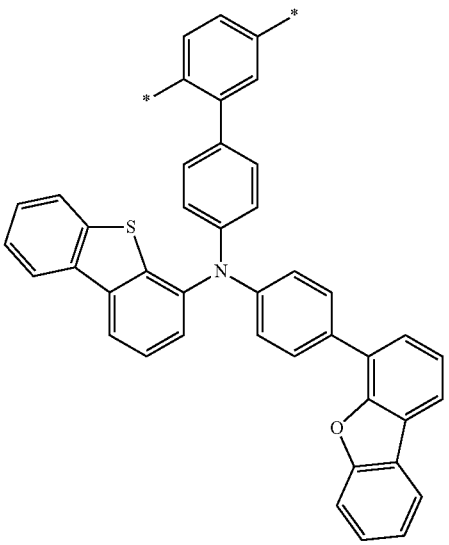

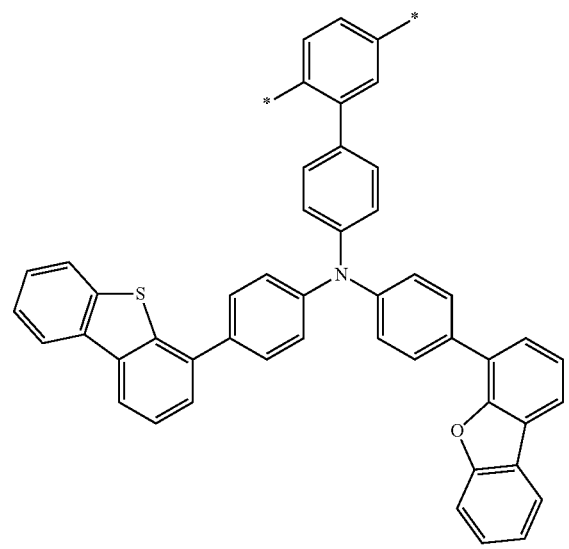
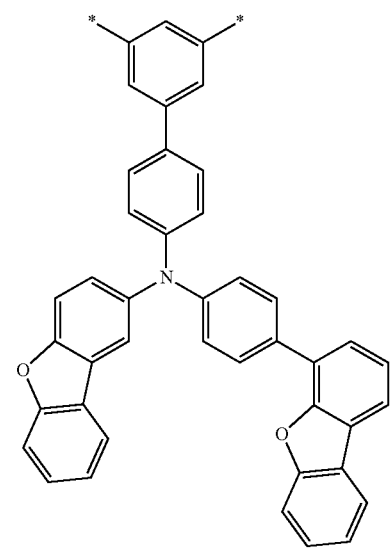
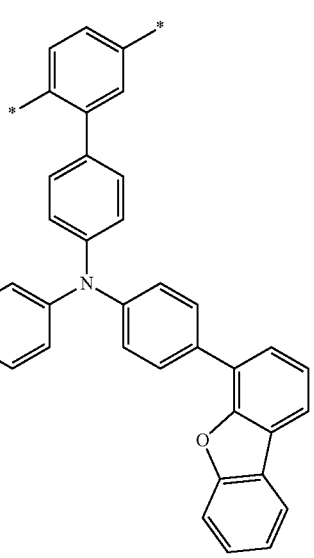
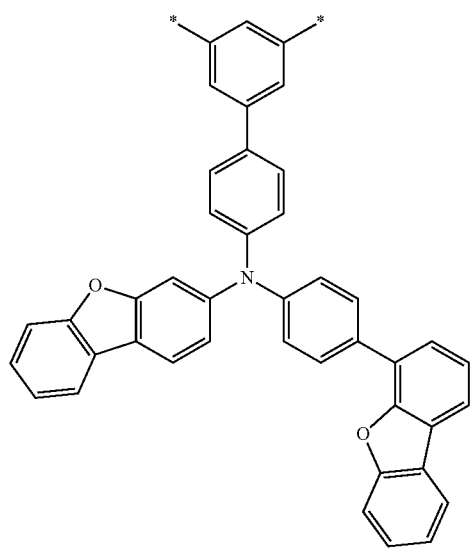
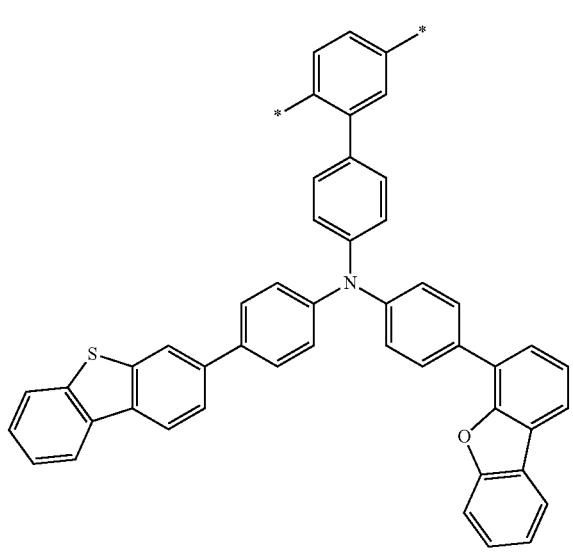
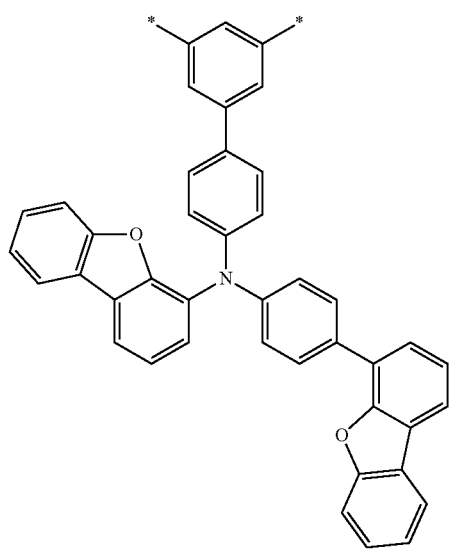

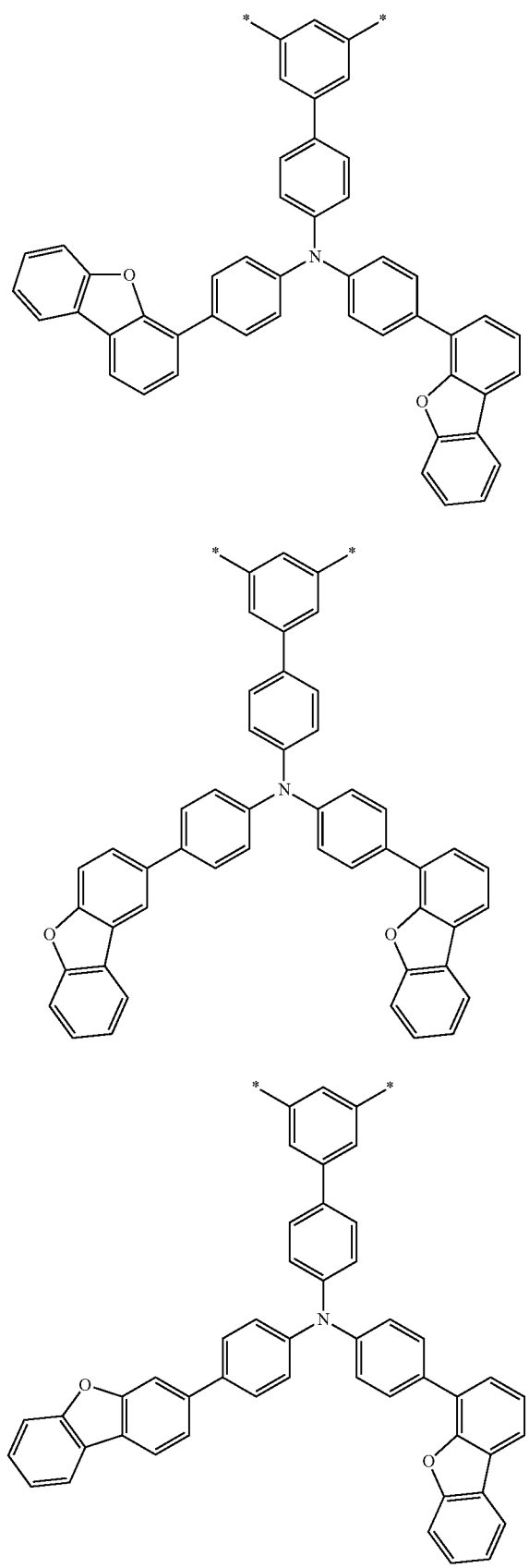
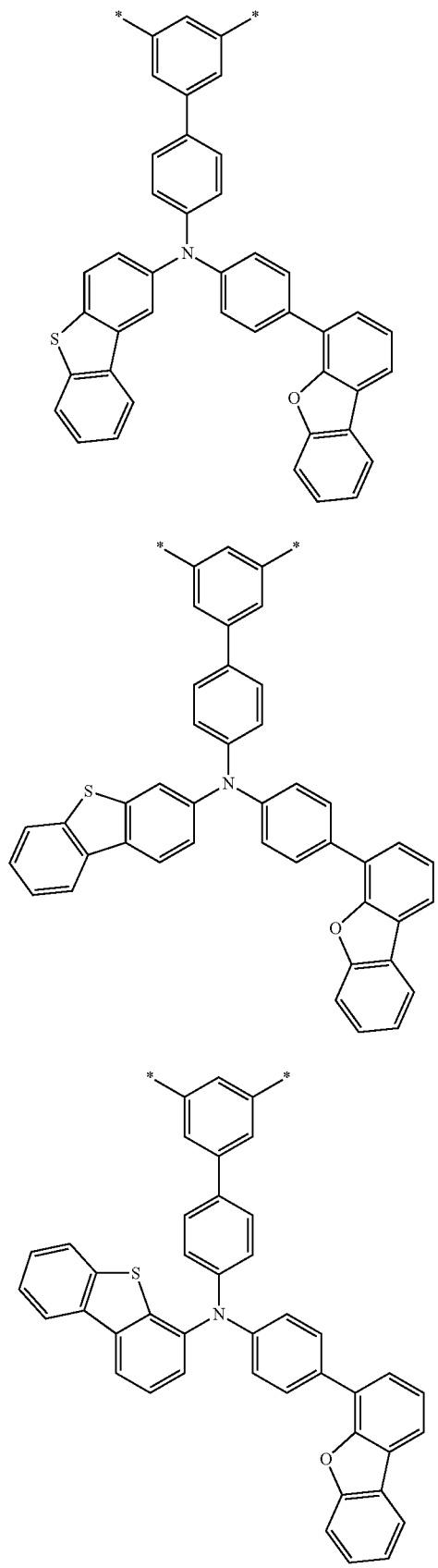

111
-continued
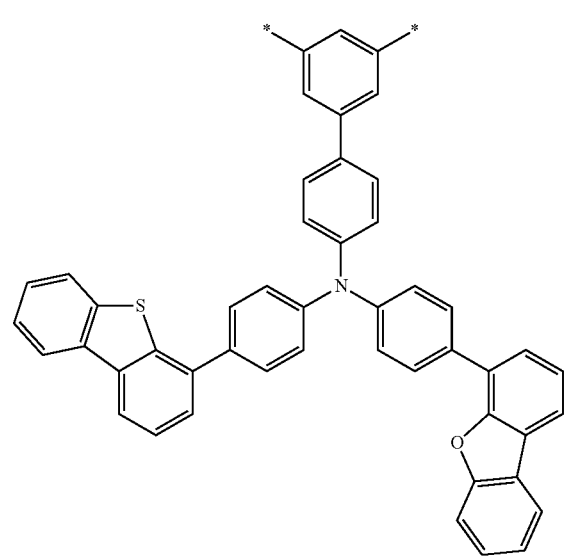
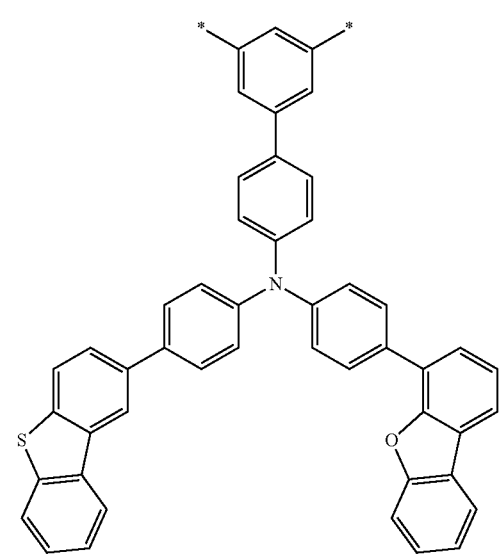
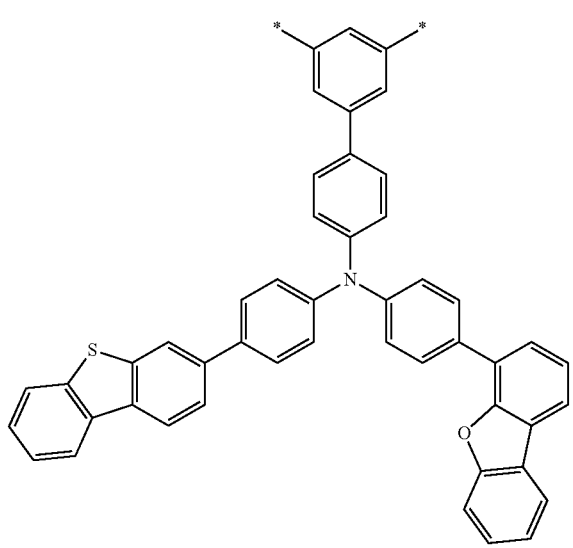
112
-continued
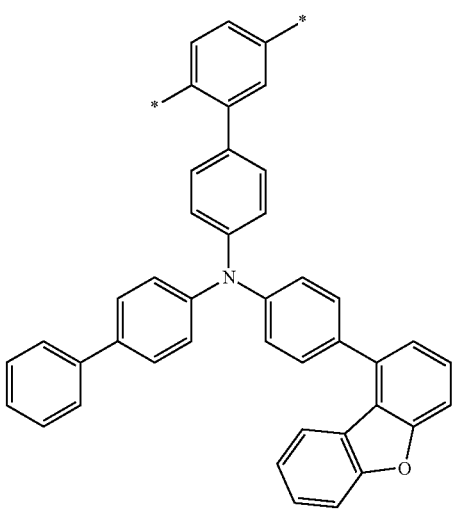
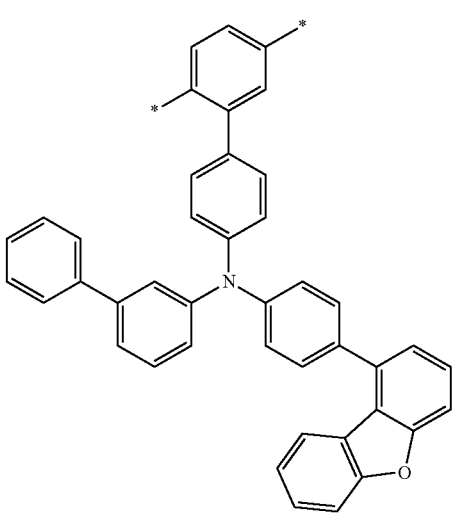
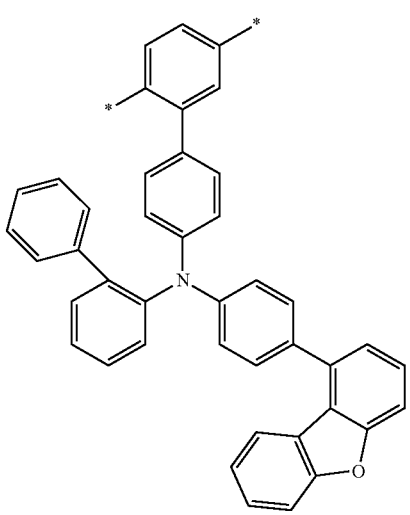

-continued
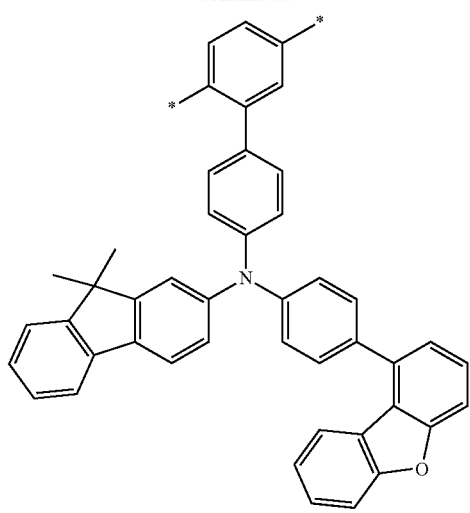
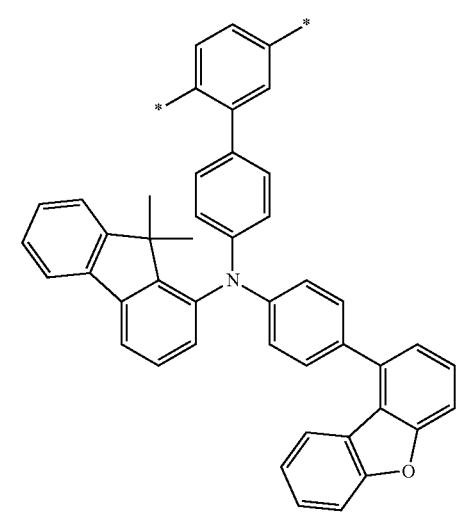
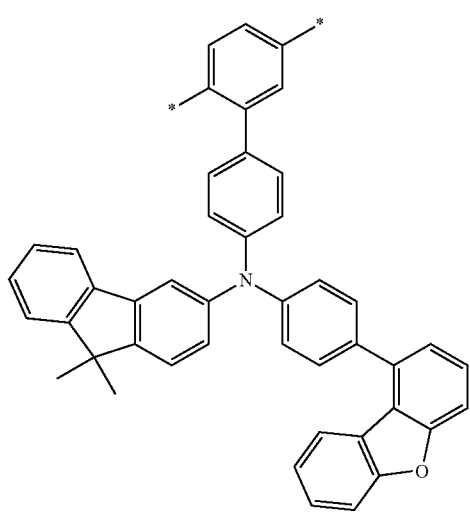
-continued
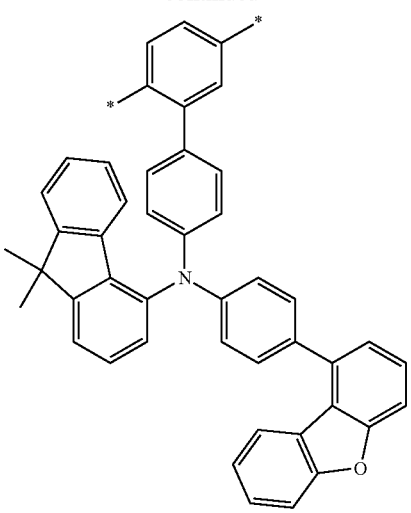
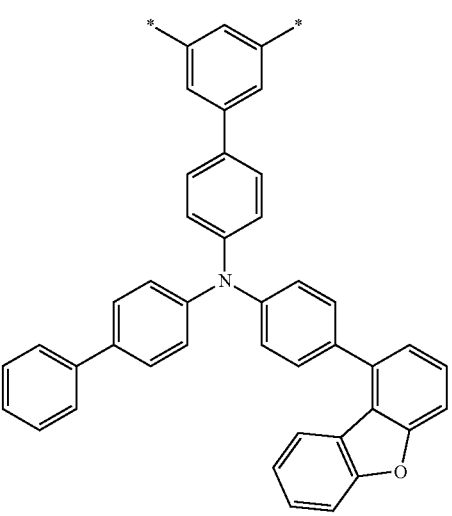
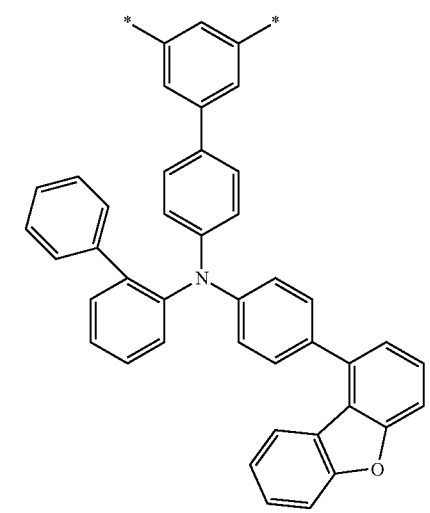

115
-continued
116
-continued
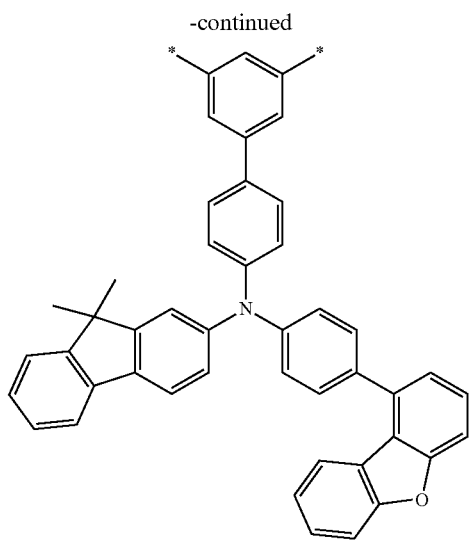
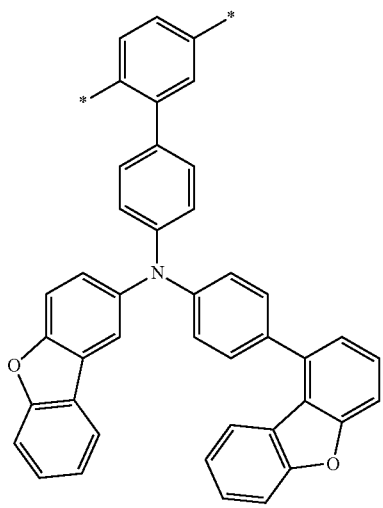
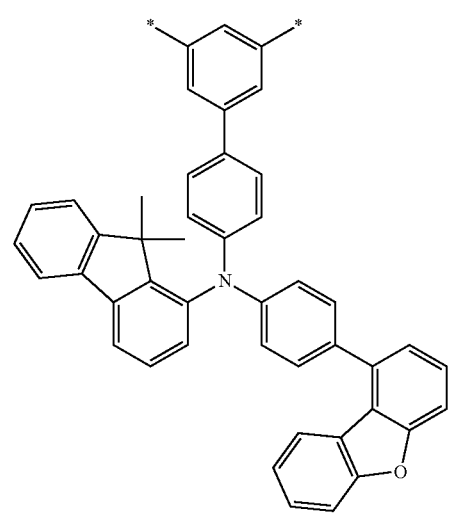
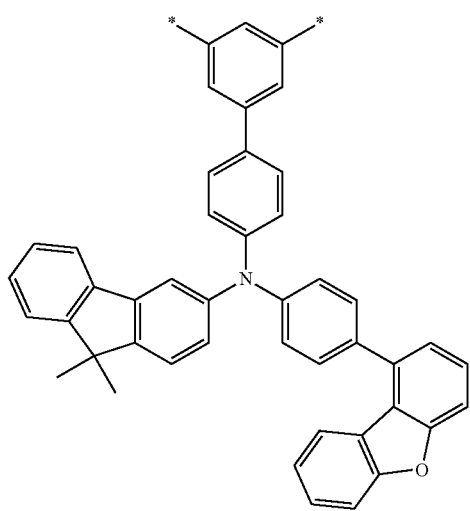
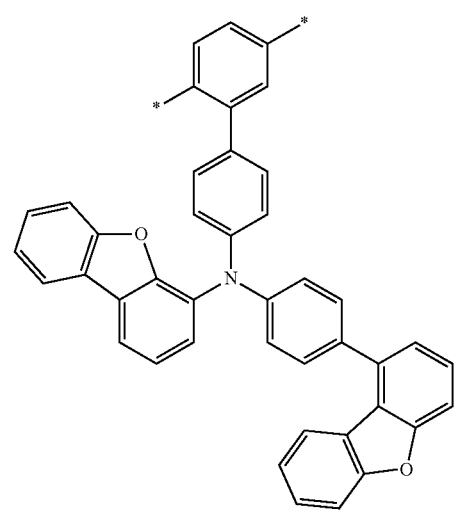

117
-continued
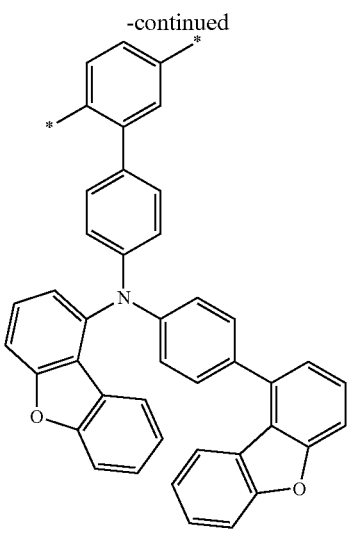
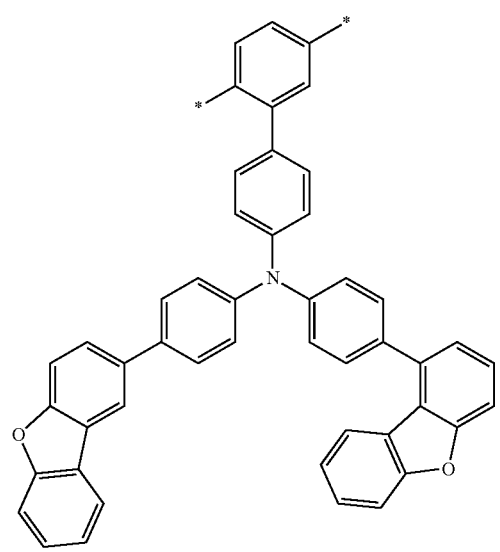
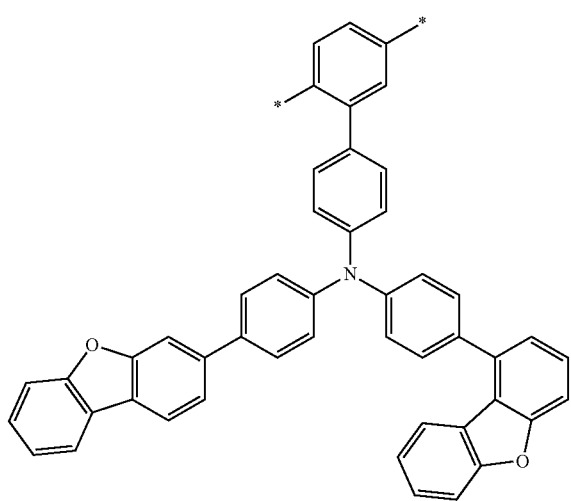
118
-continued
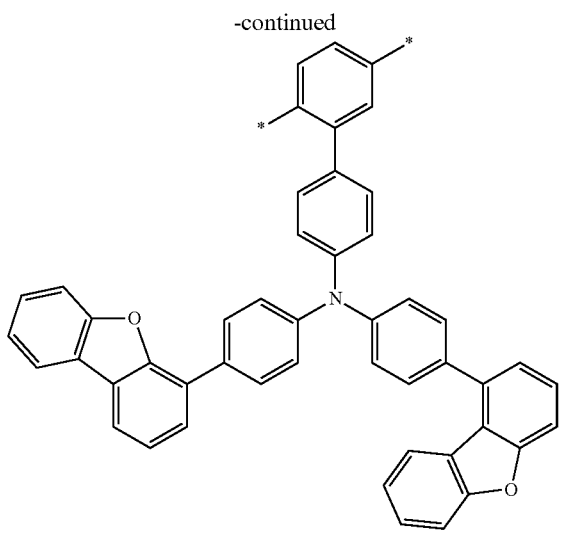
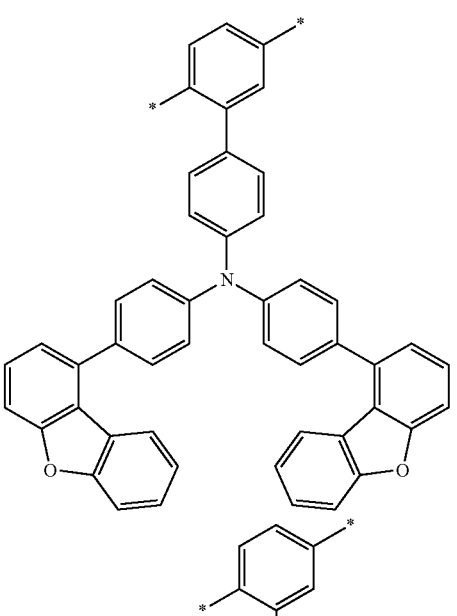

119
-continued
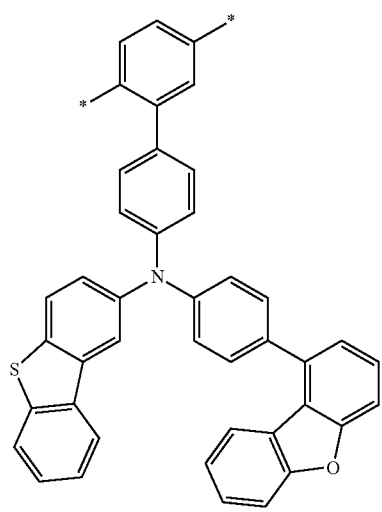
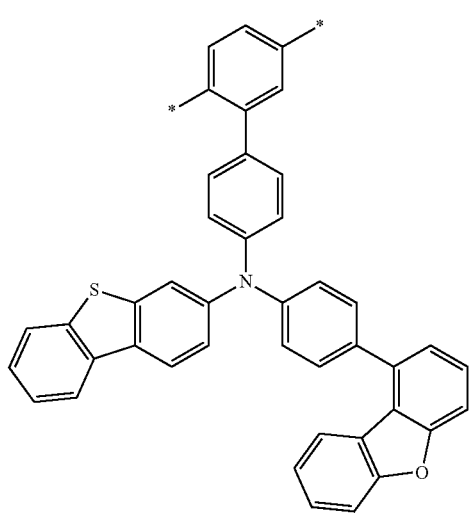
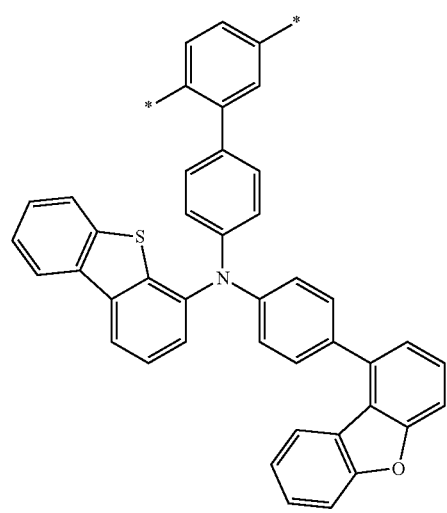
120
-continued
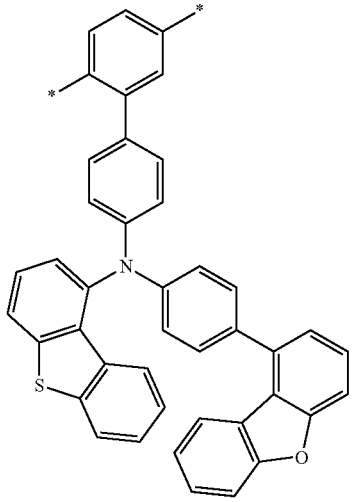
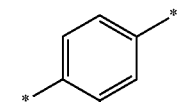
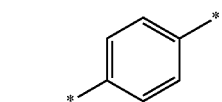
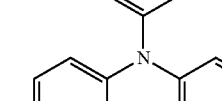
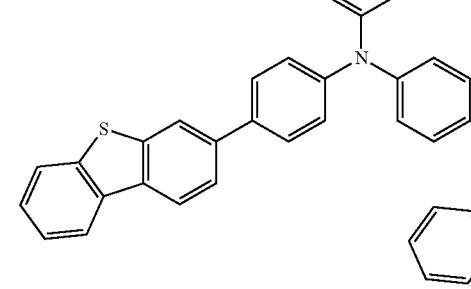

121
-continued
122
-continued
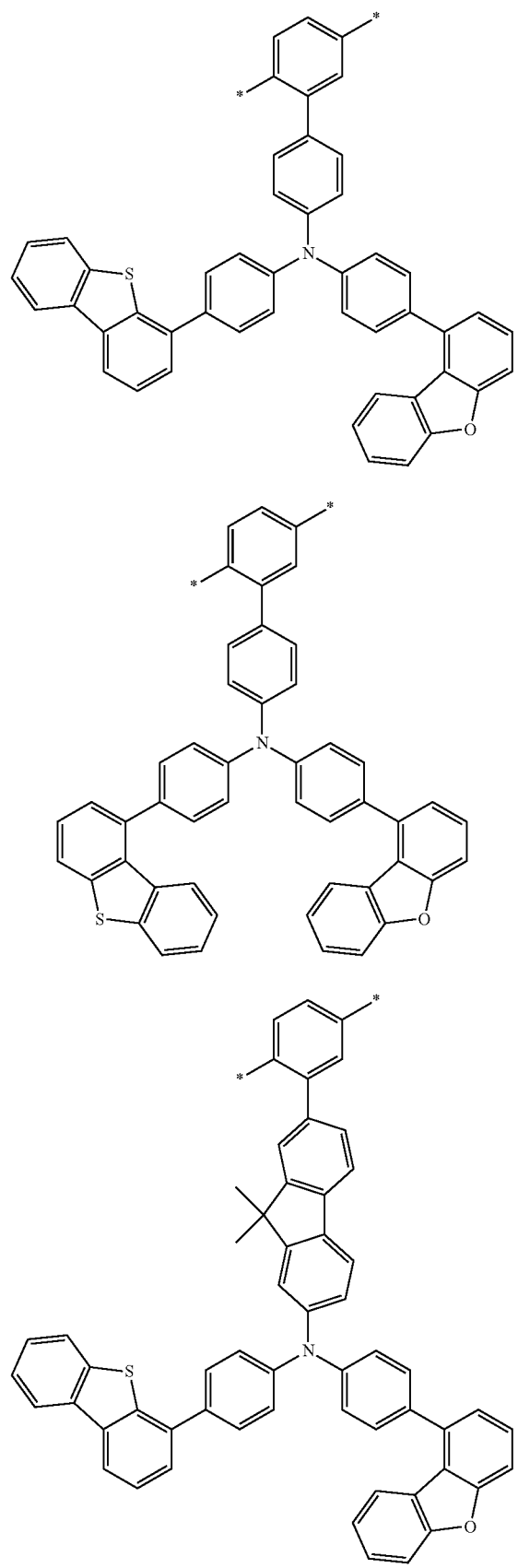 [SMILES: *c1ccc(*)c(-c2ccc(N(c3ccc(-c4cccc5c4sc4ccccc45)cc3)c3ccc(-c4cccc5oc6ccccc6c45)cc3)cc2)c1 ; *c1ccc(*)c(-c2ccc(N(c3ccc(-c4cccc5oc6ccccc6c45)cc3)c3ccc(-c4cccc5sc6ccccc6c45)cc3)cc2)c1 ; *c1ccc(*)c(-c2ccc3c(c2)C(C)(C)c2cc(N(c4ccc(-c5cccc6c5sc5ccccc56)cc4)c4ccc(-c5cccc6oc7ccccc7c56)cc4)ccc2-3)c1]
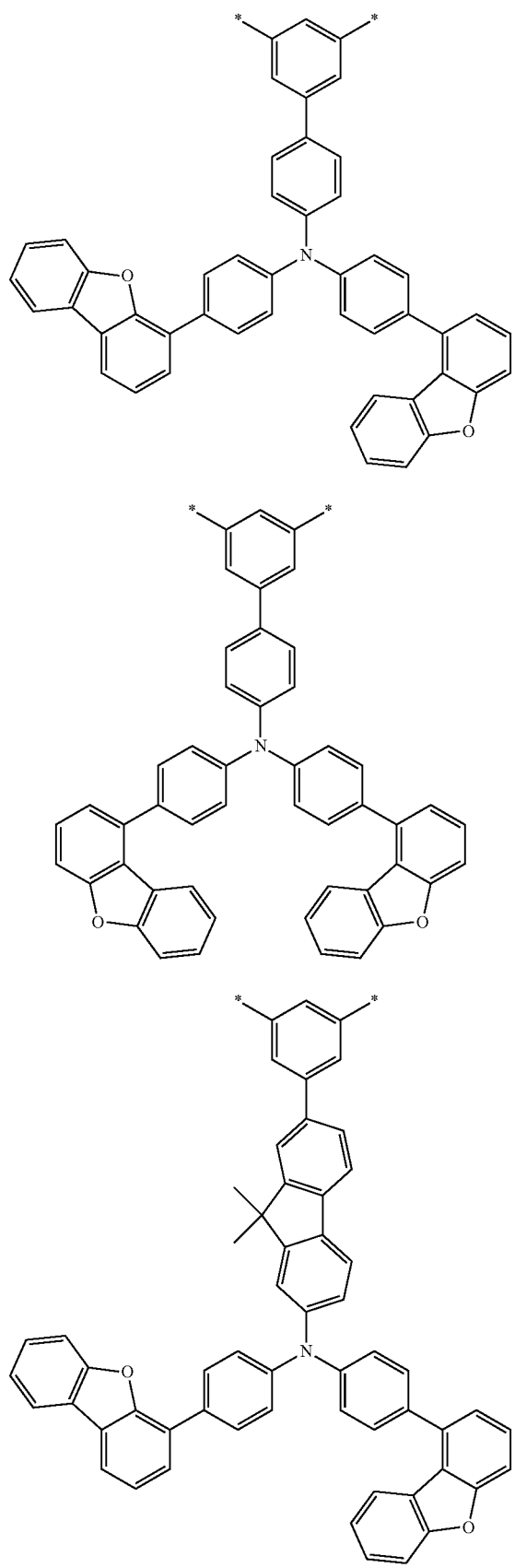

123
-continued
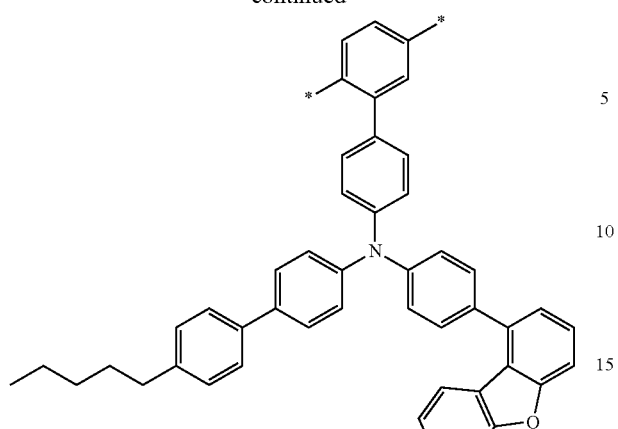
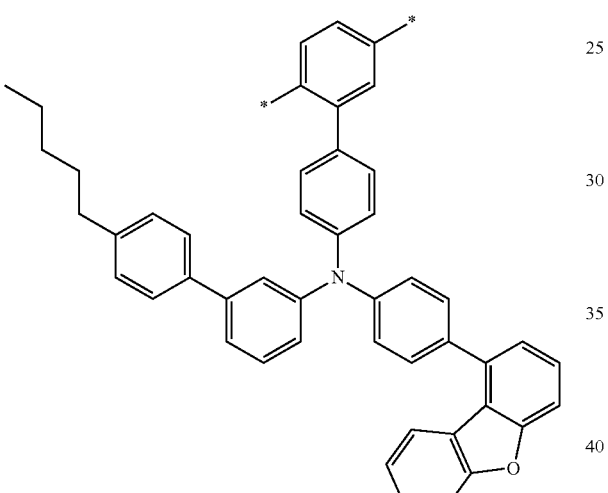
124
-continued
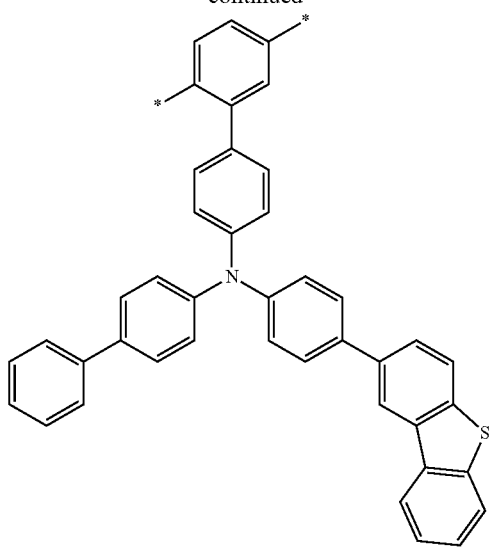
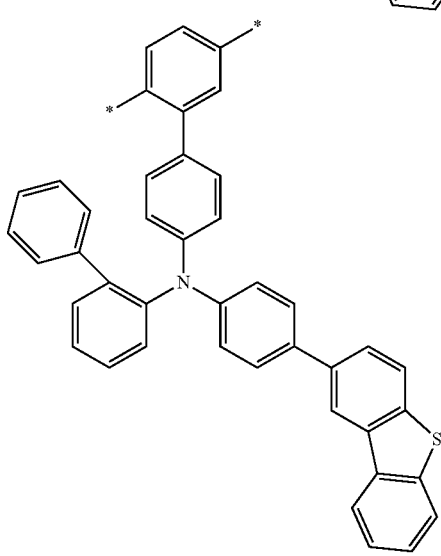

125
-continued
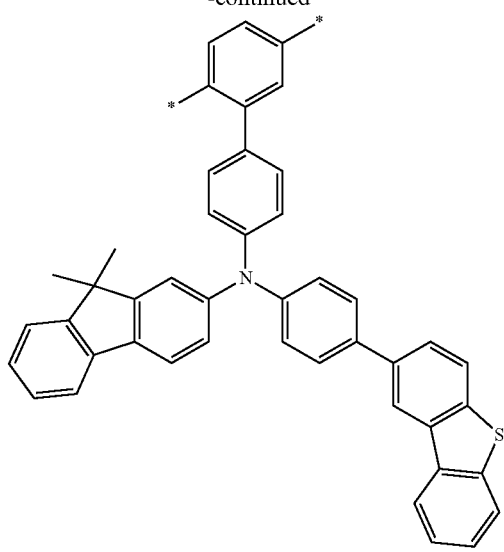
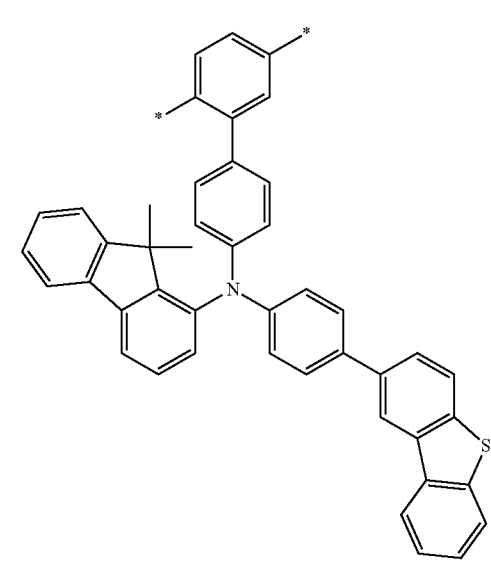
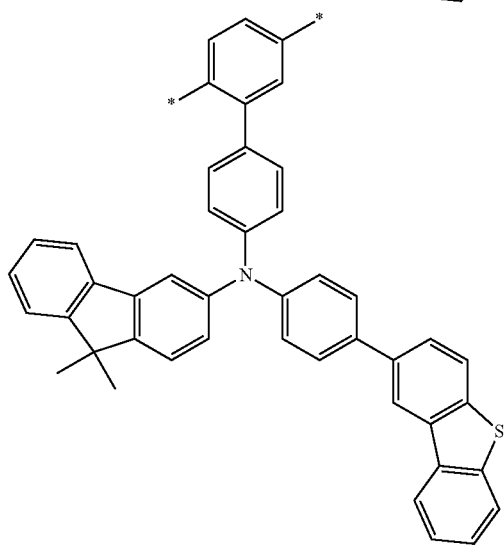
126
-continued
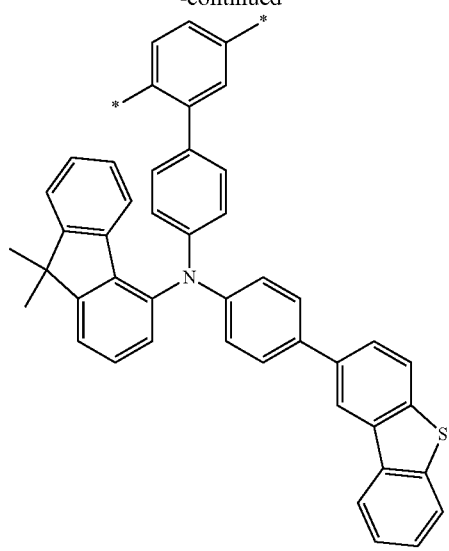
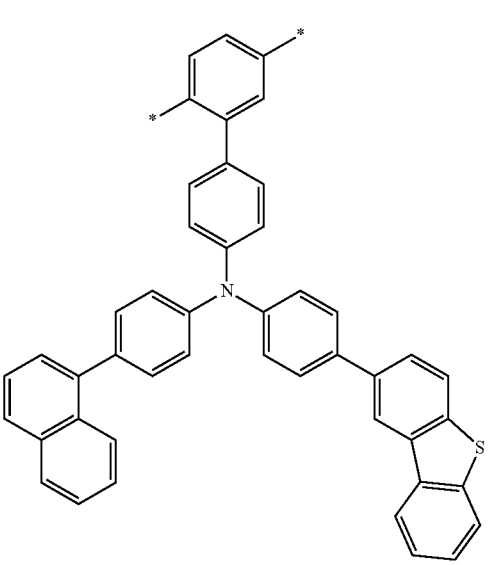
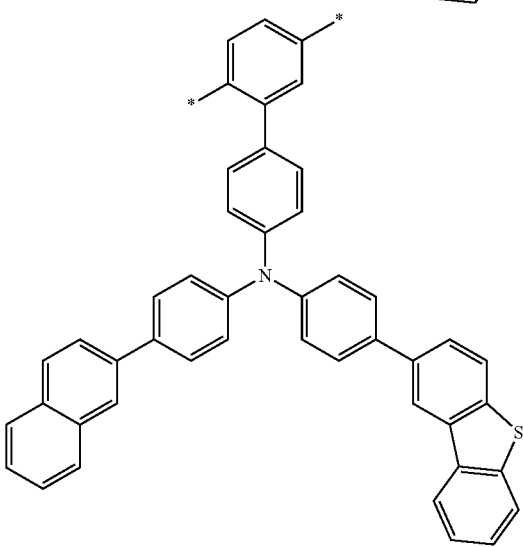

127
-continued
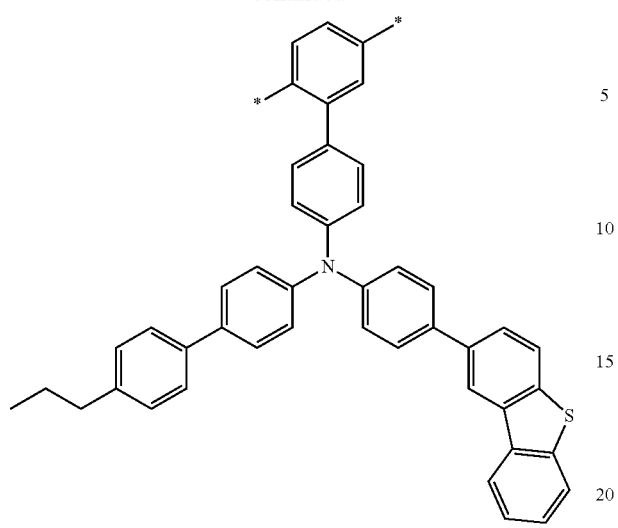
128
-continued
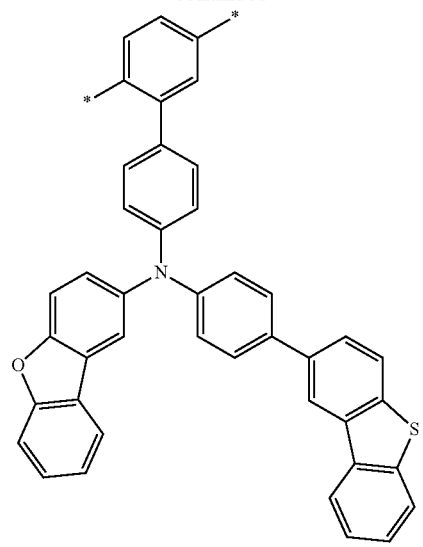
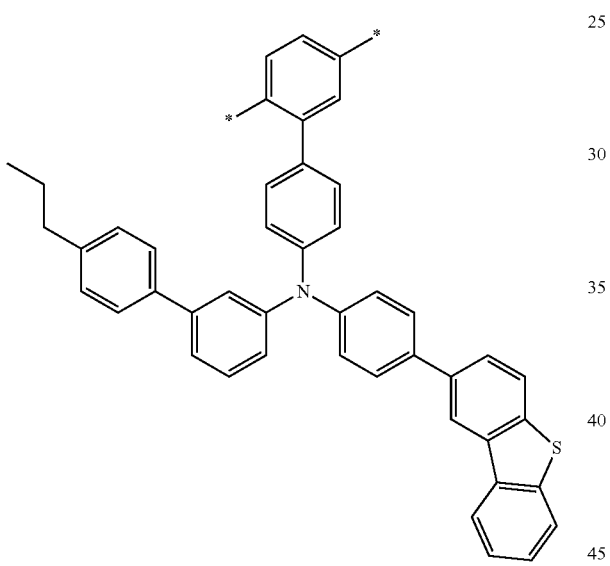
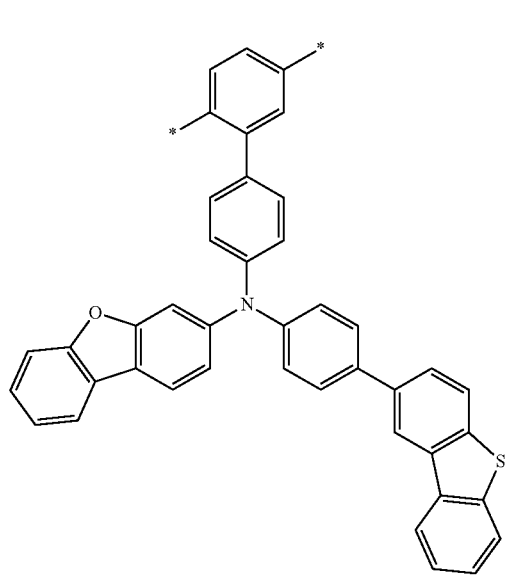
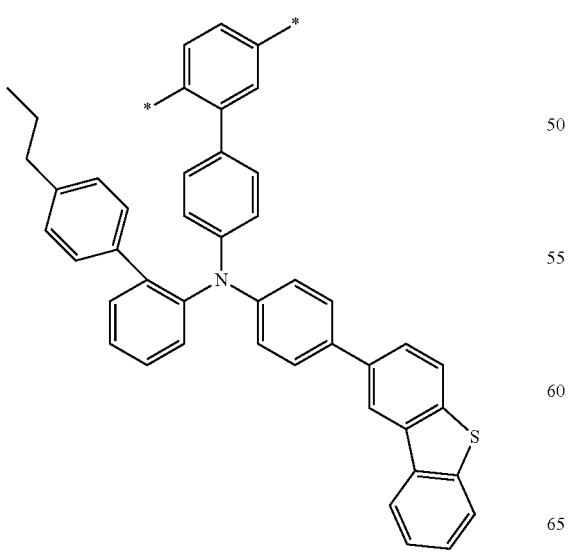
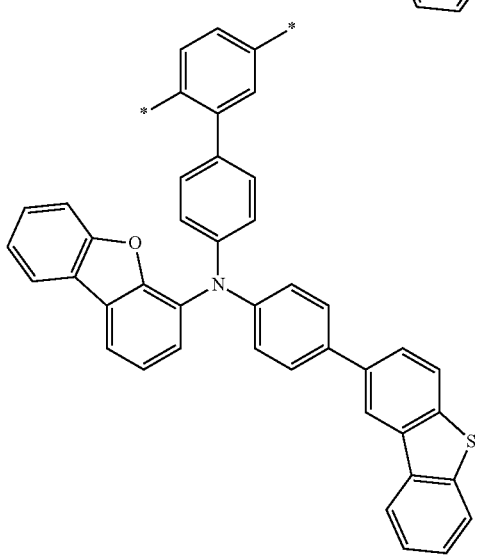

| 129 -continued | 130 -continued |
|---|---|
| 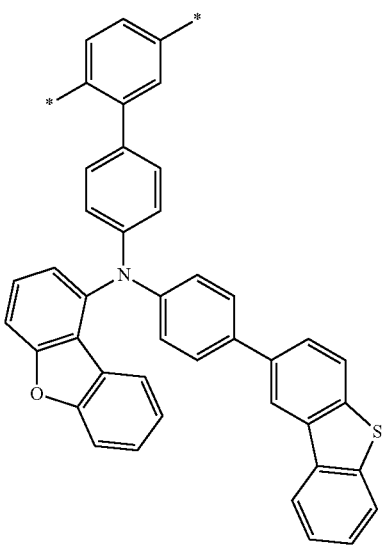 | 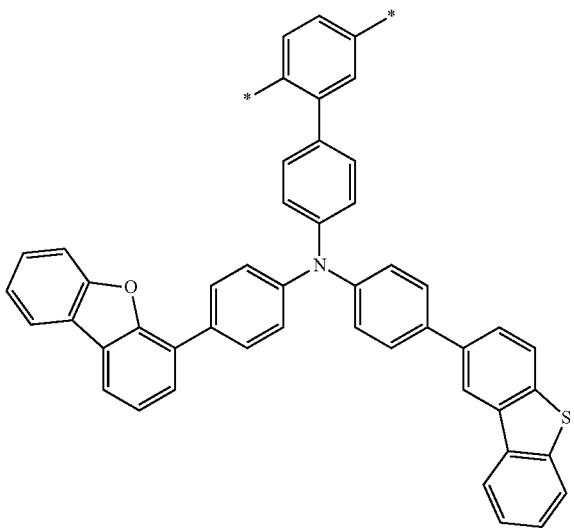 |
| 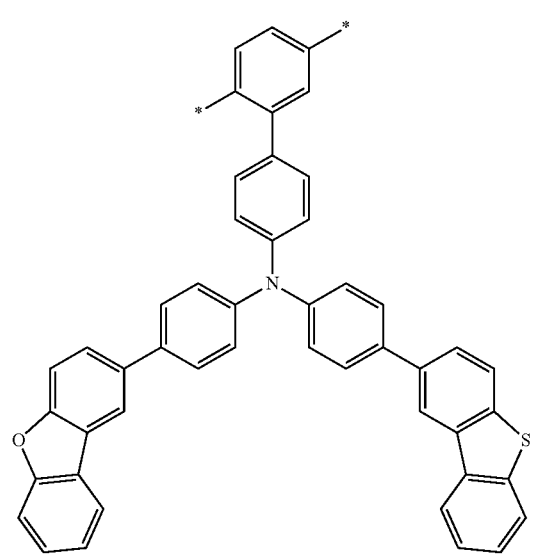 | 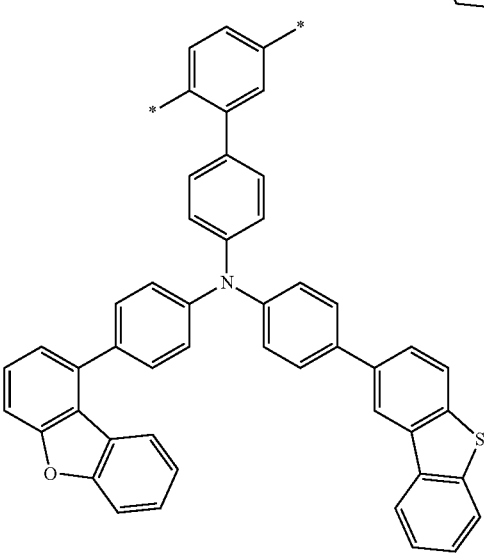 |
| 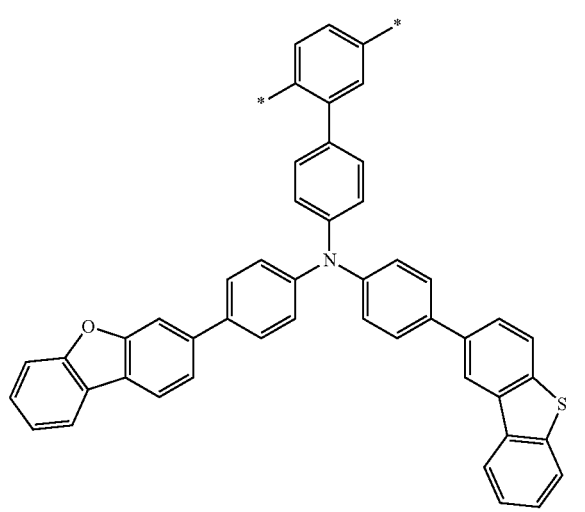 | 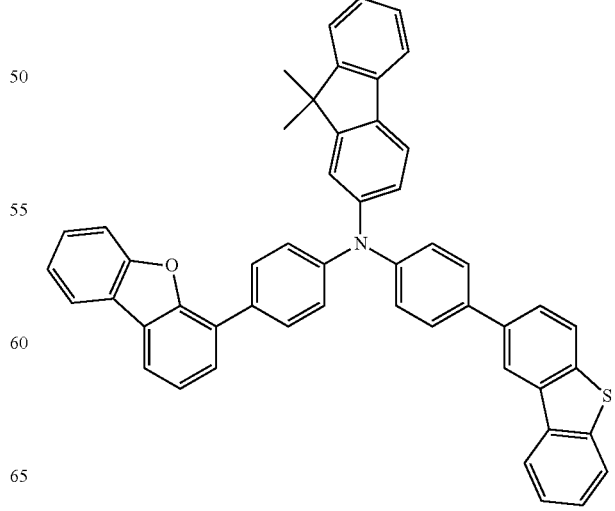 |

131
-continued
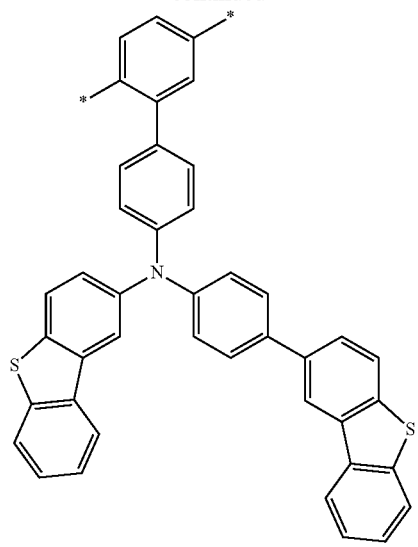
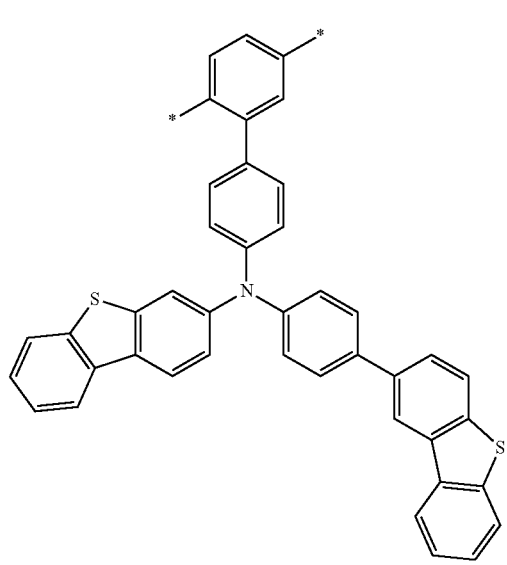
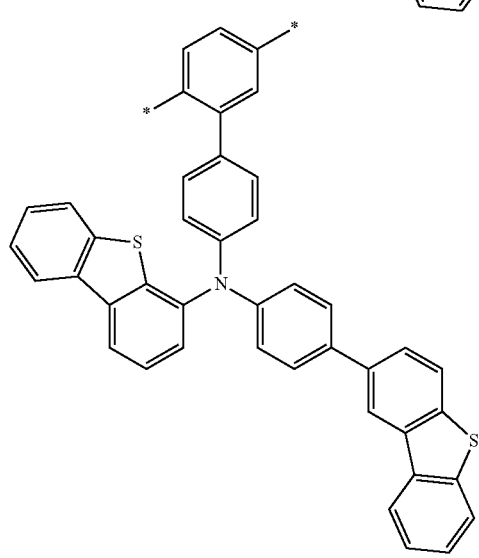
132
-continued
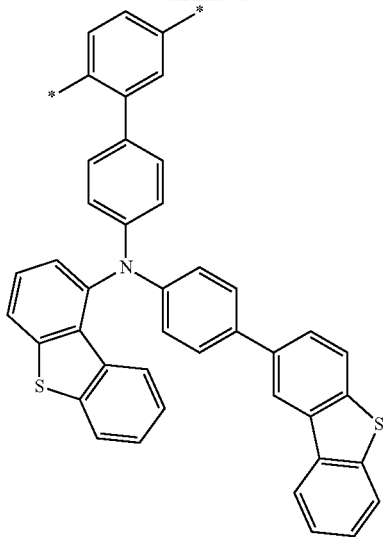
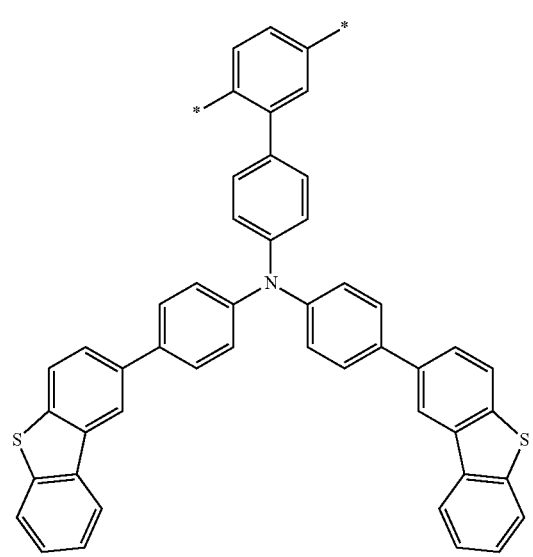
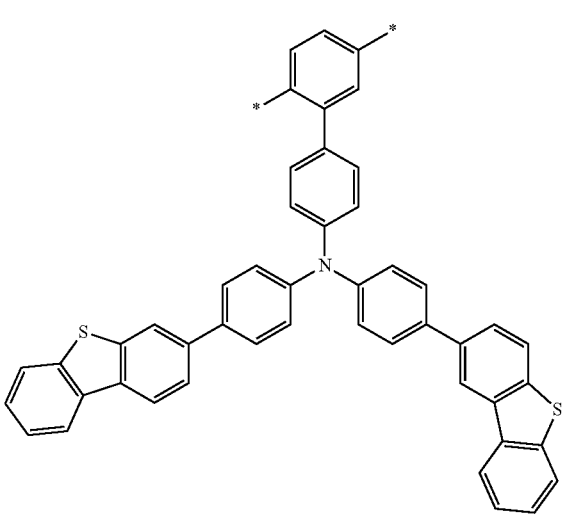

133
-continued
134
-continued
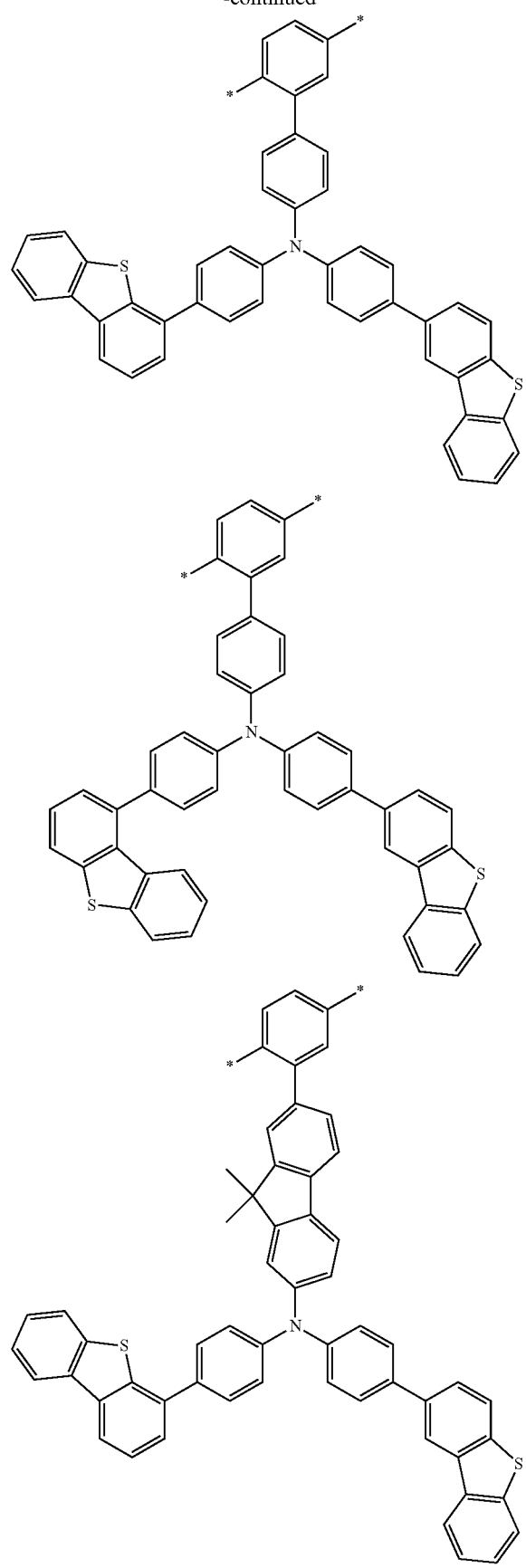
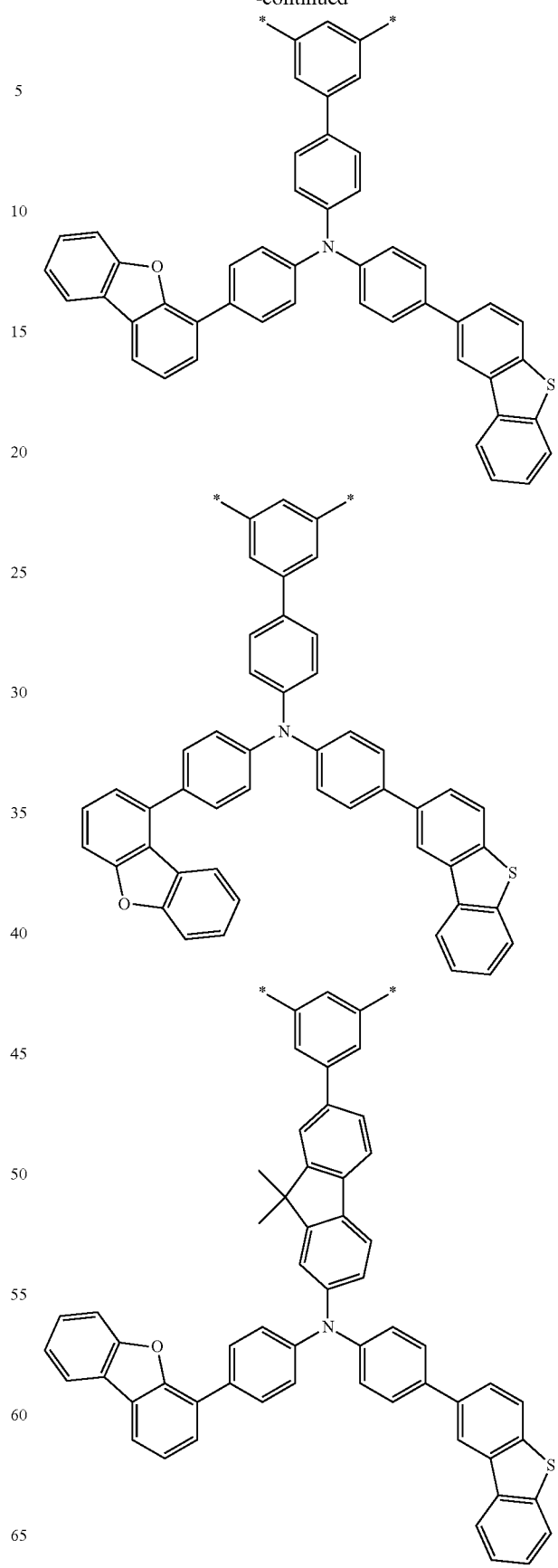

135
-continued
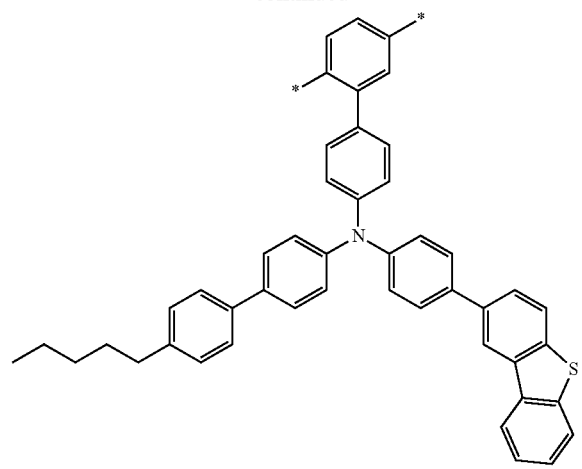
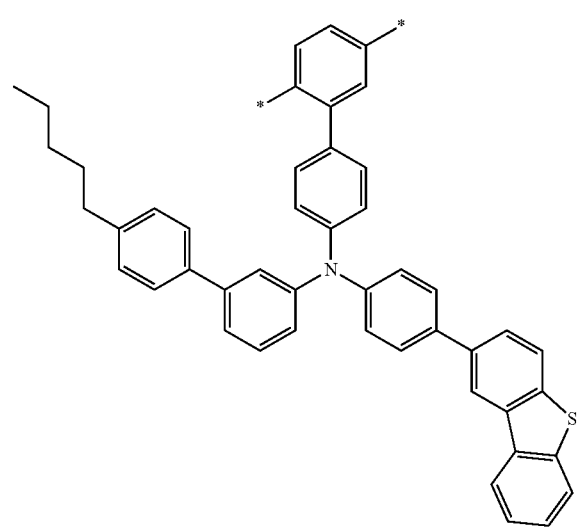
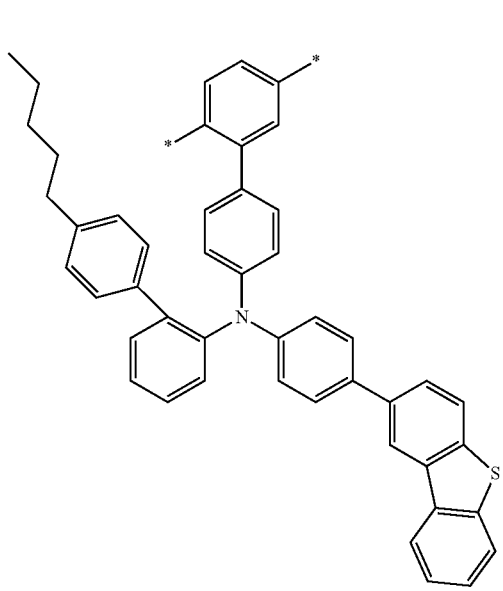
136
-continued
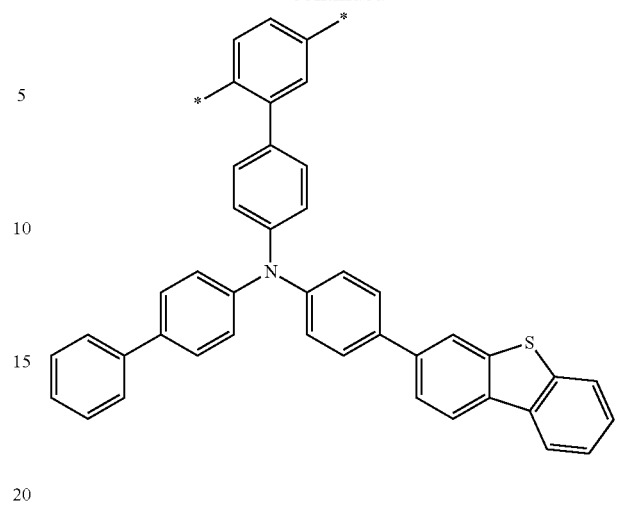
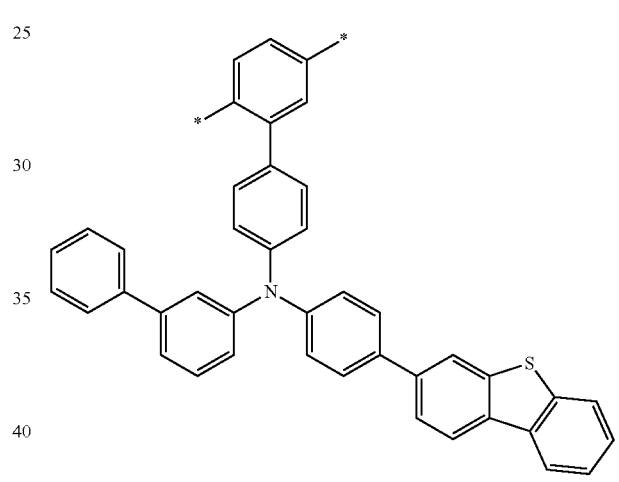
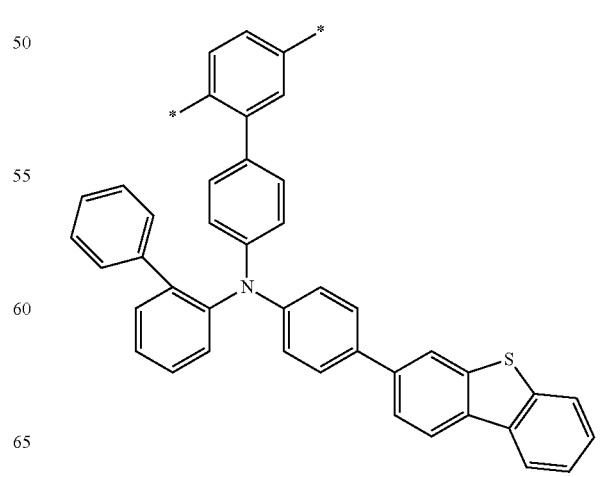

137
-continued
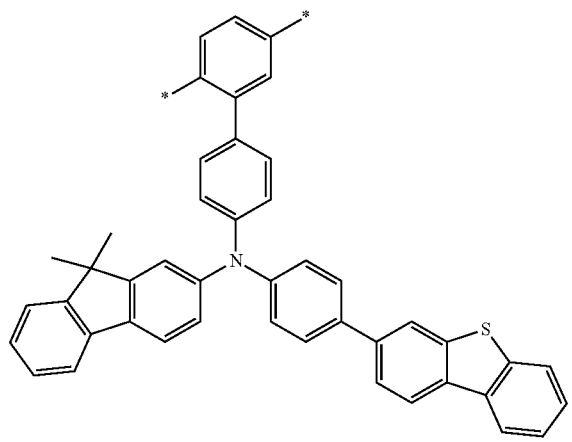
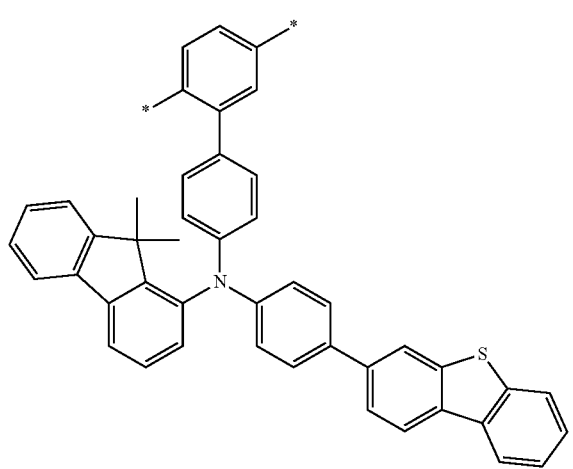
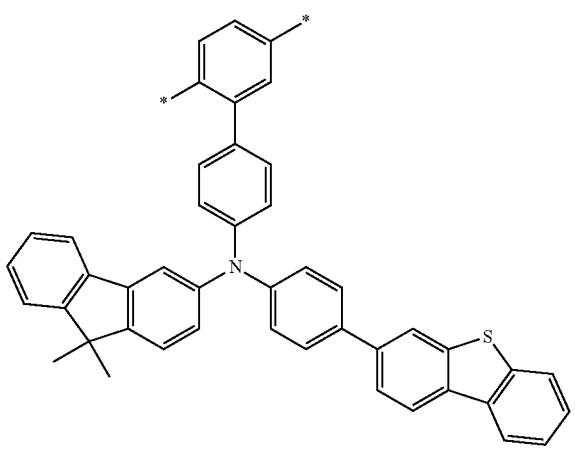
138
-continued
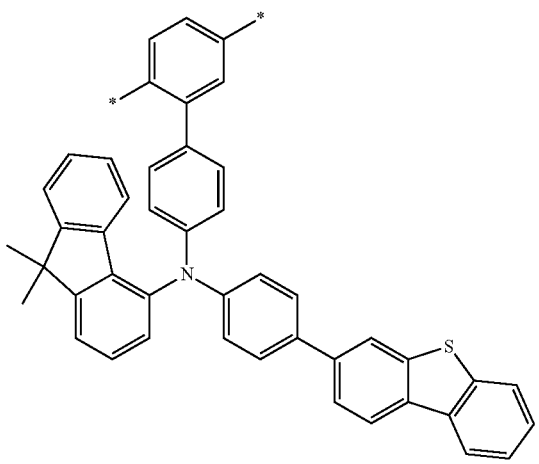
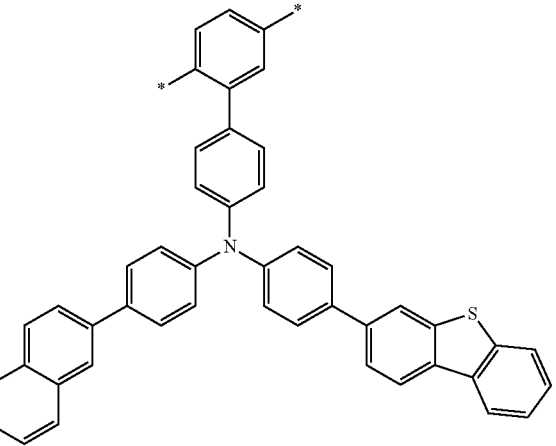

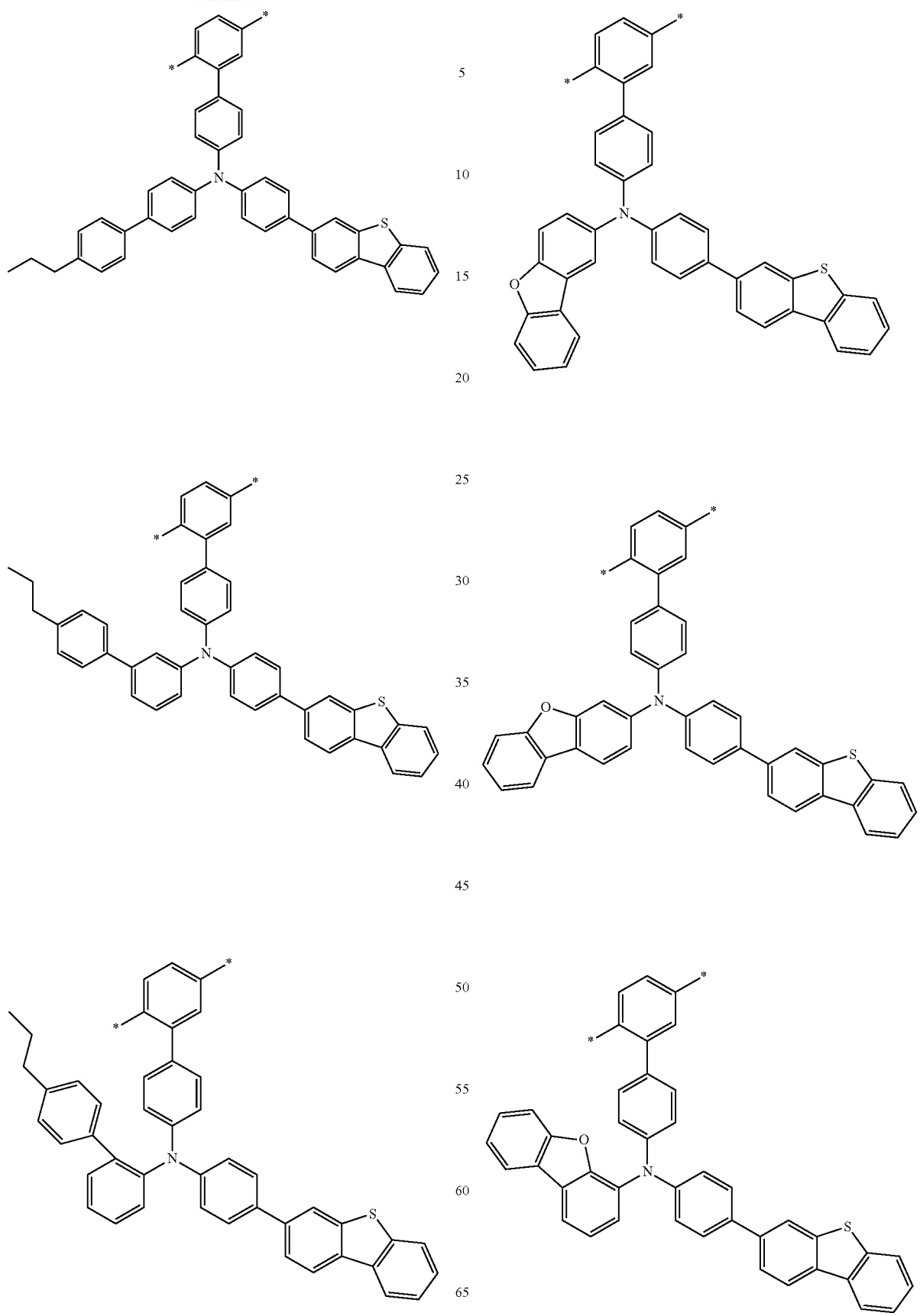

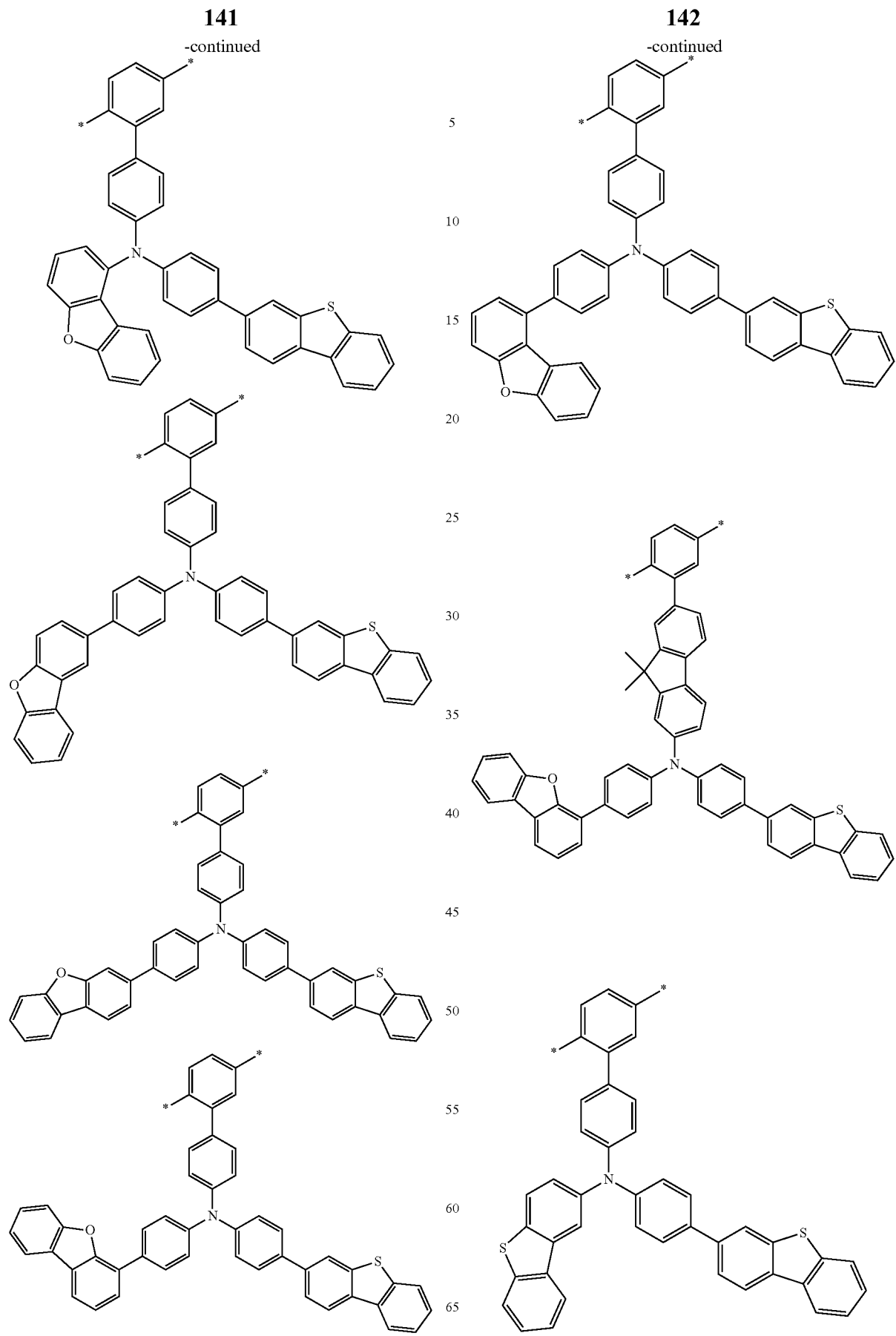

143
-continued
144
-continued
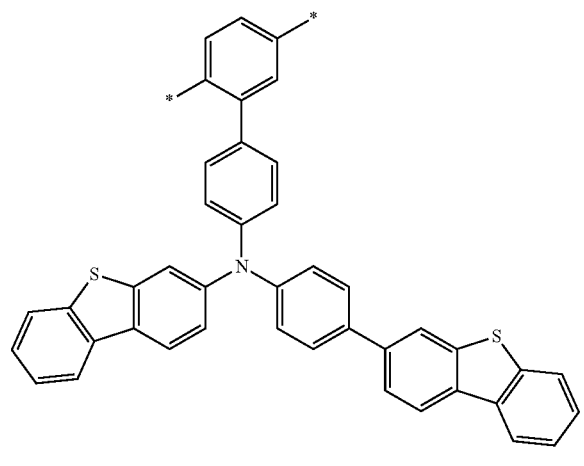
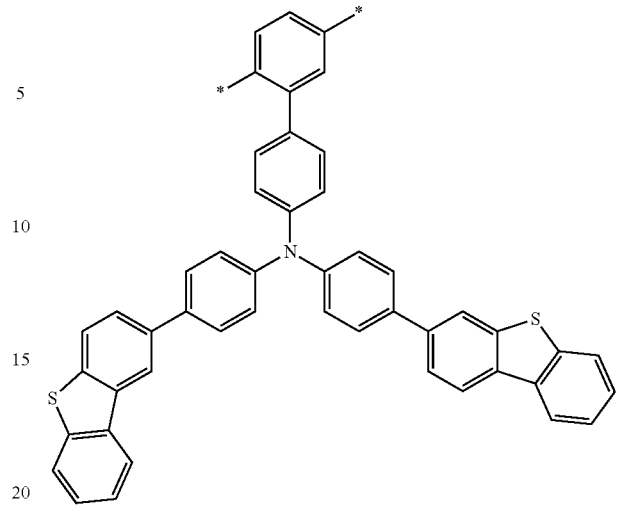
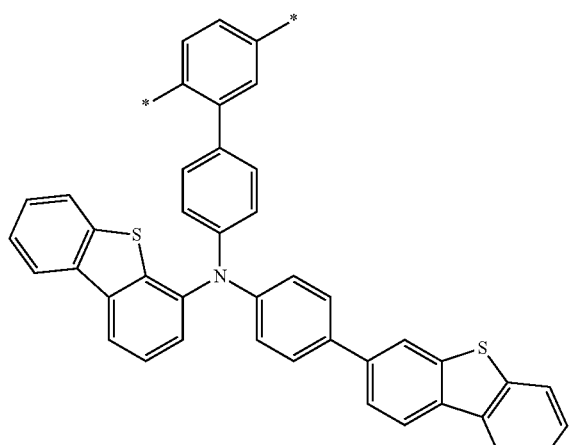
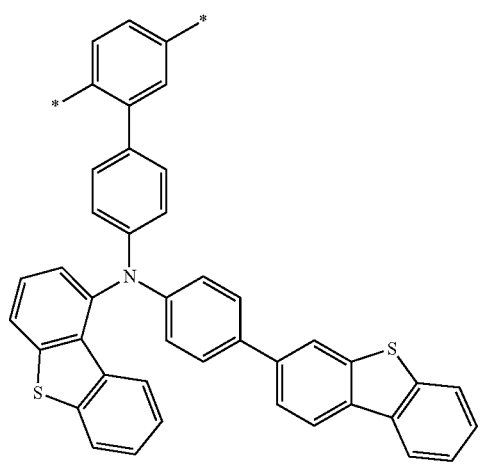
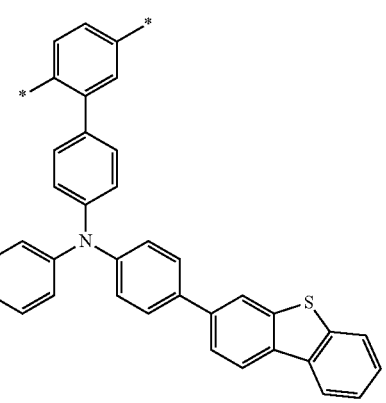

145
-continued
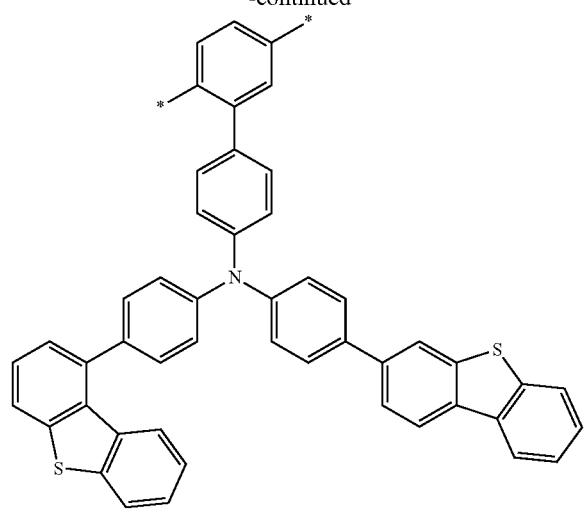
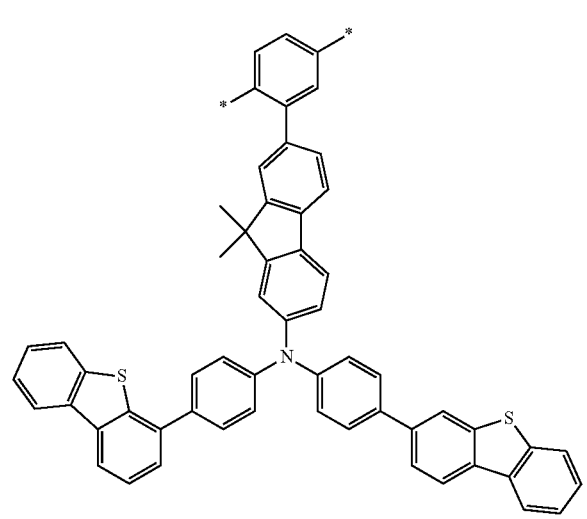
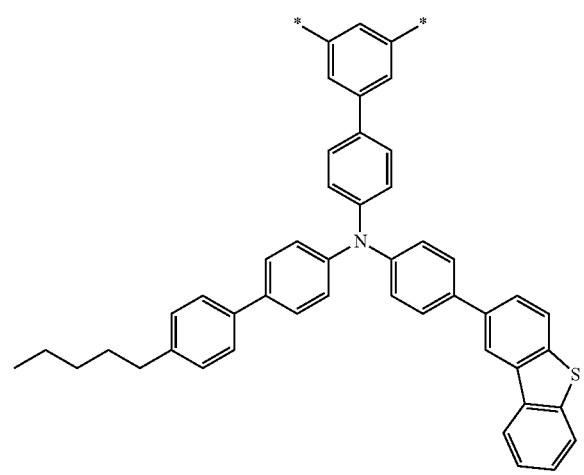
146
-continued
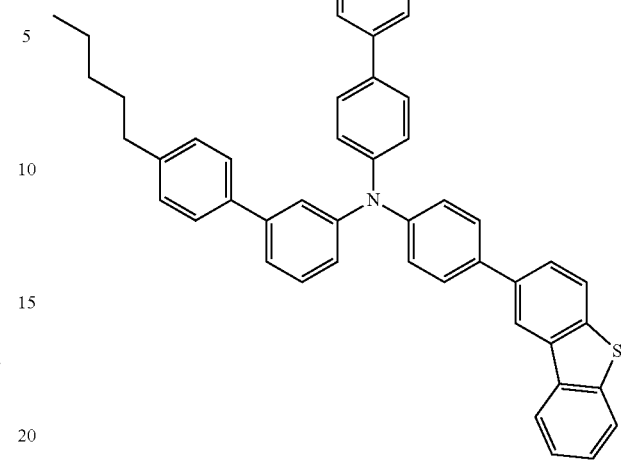
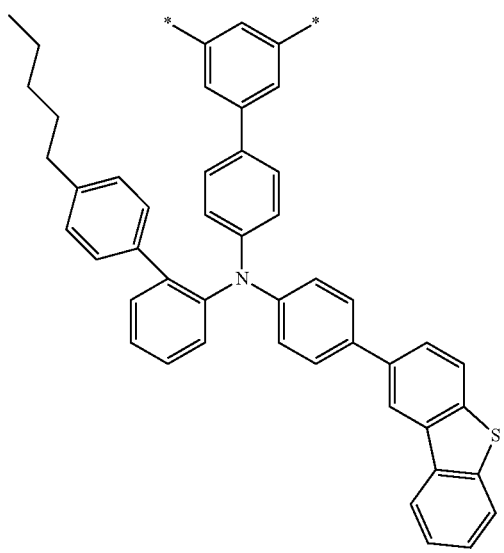
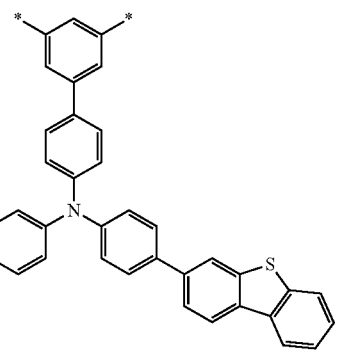

147
-continued
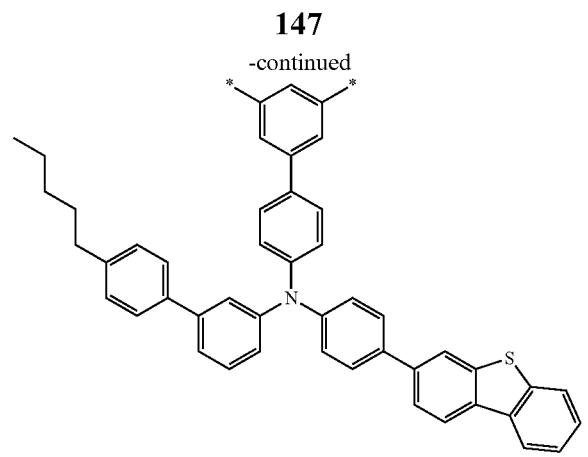
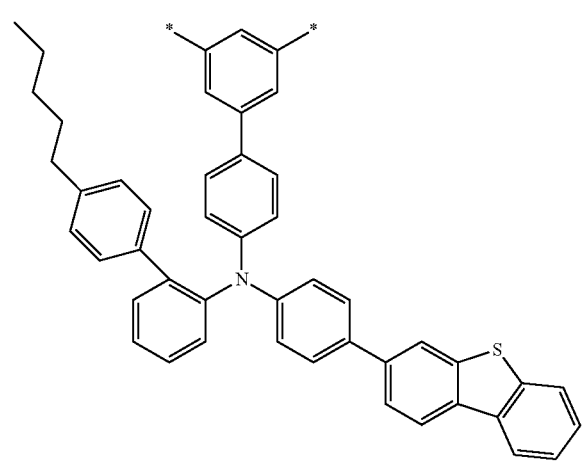
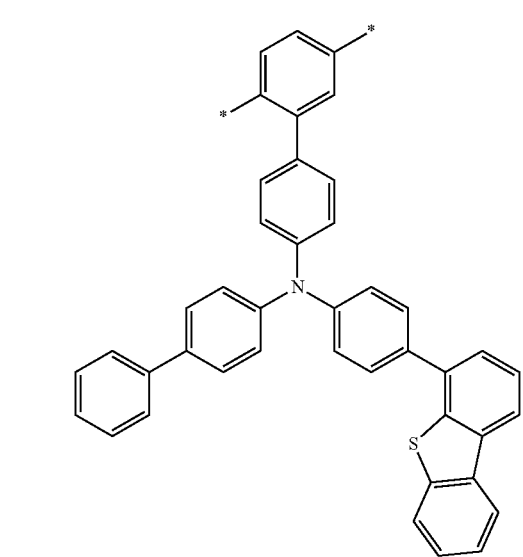
148
-continued
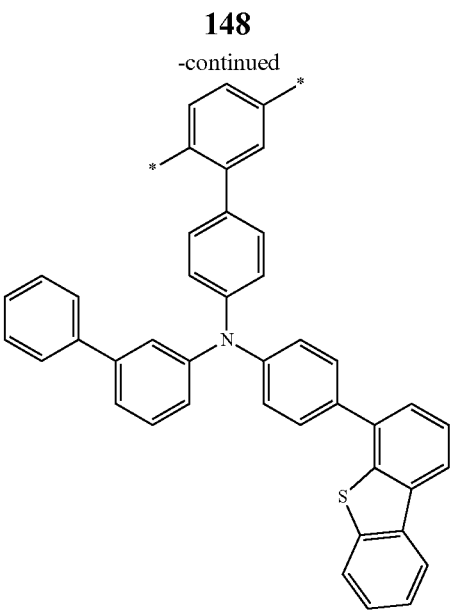
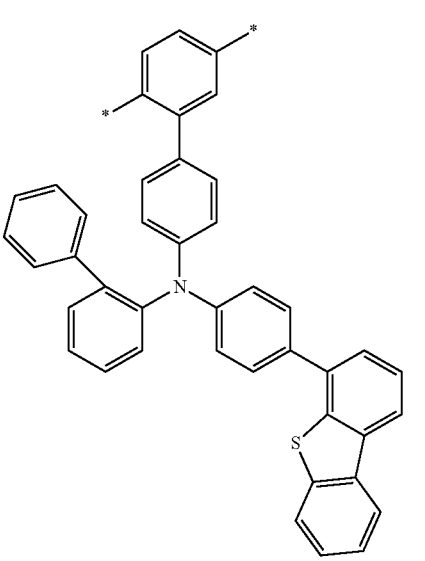
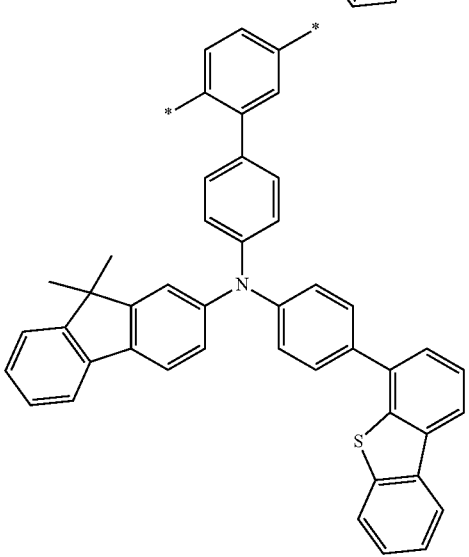

149
-continued
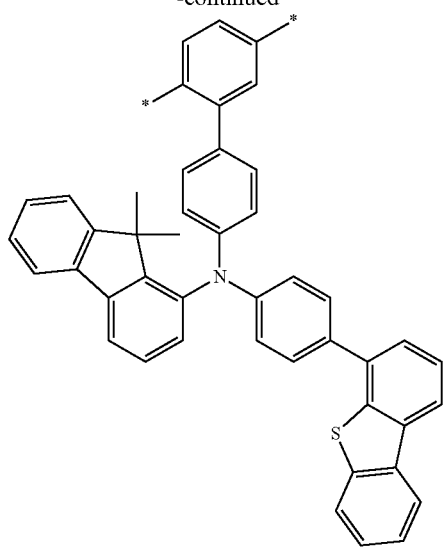
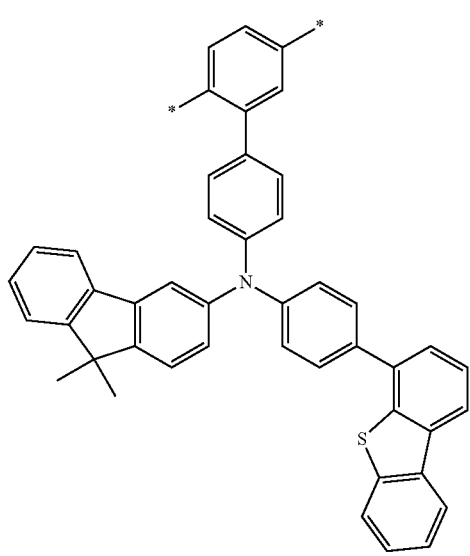
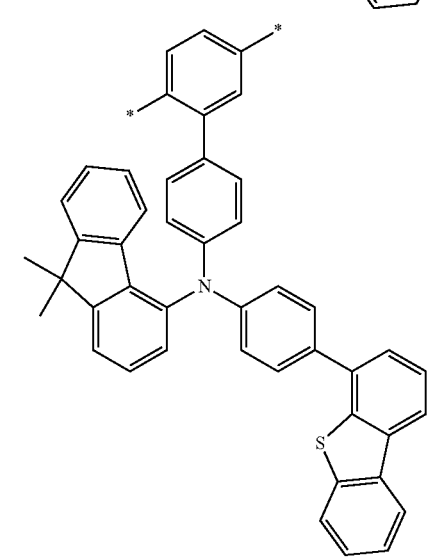
150
-continued
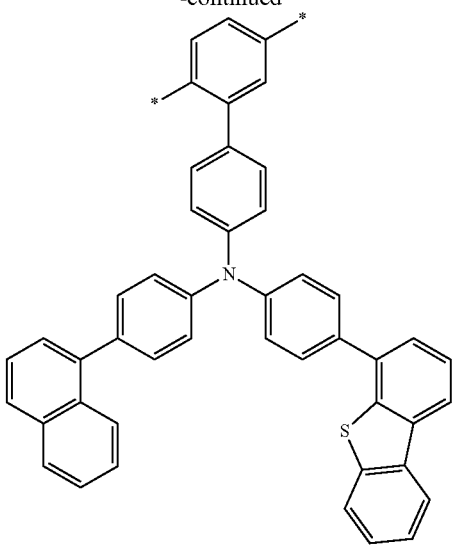
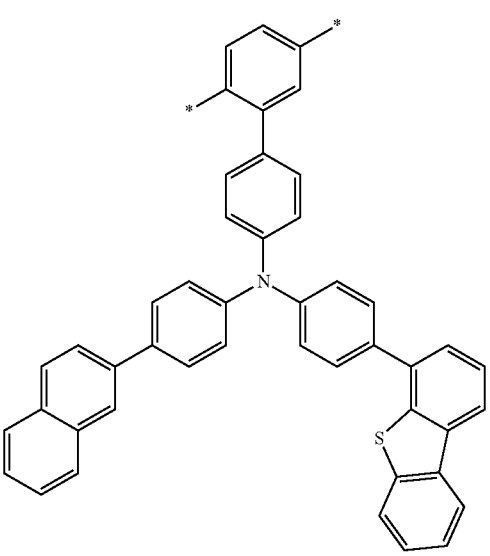
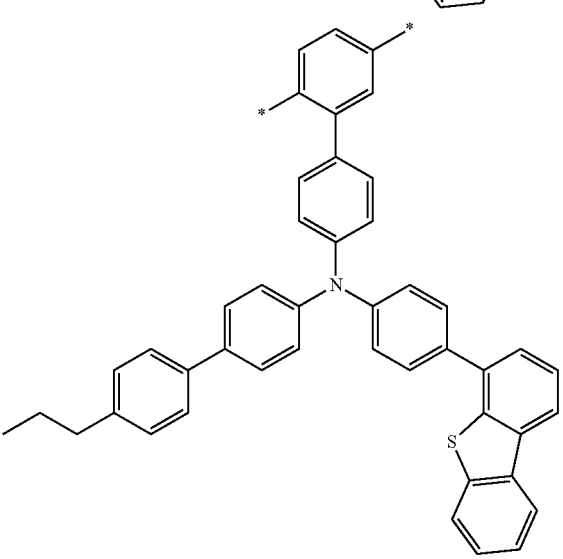

151
-continued
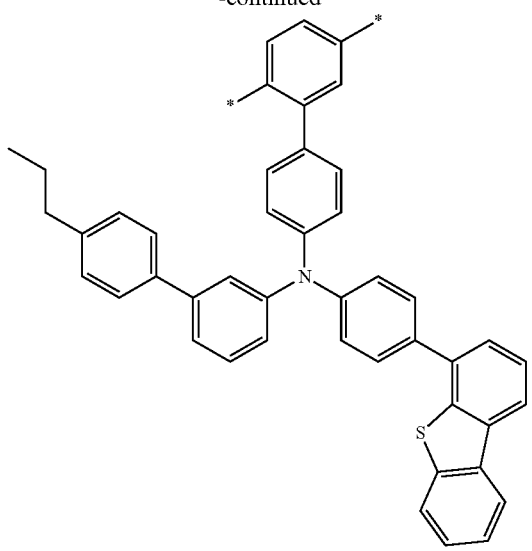
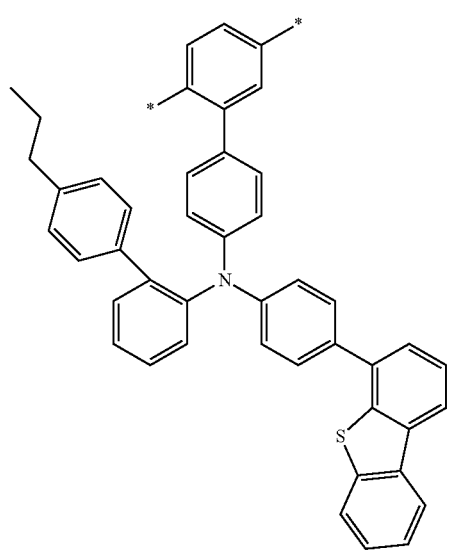
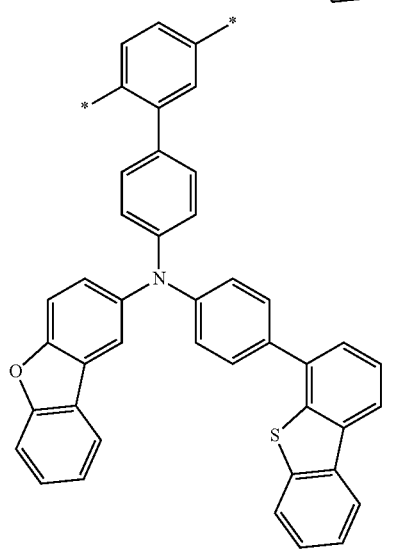
152
-continued
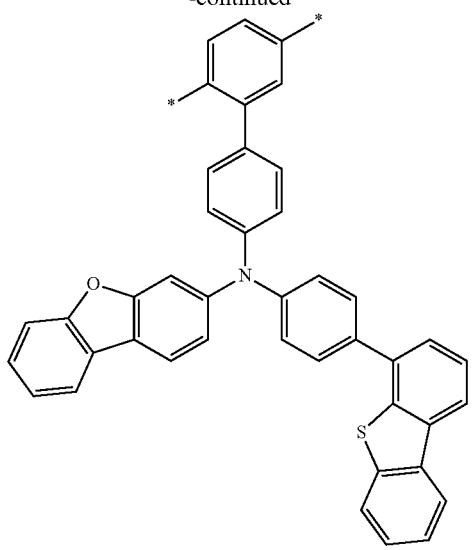
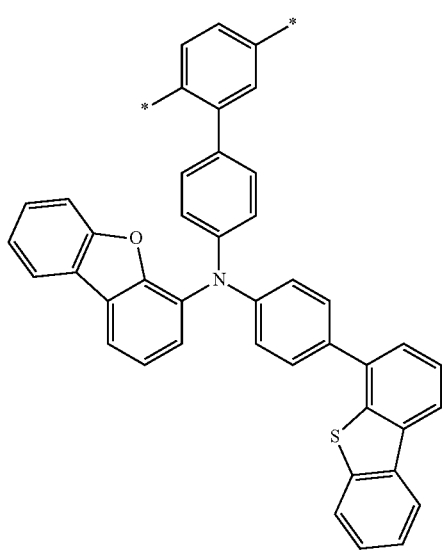
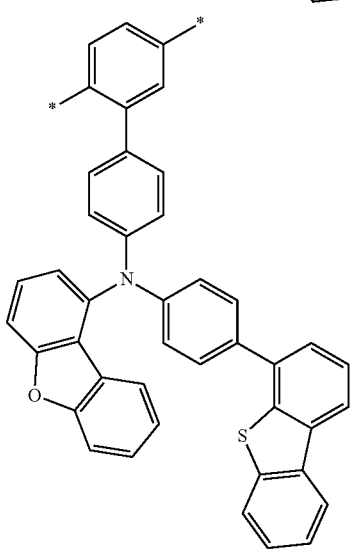

153
-continued

154
-continued

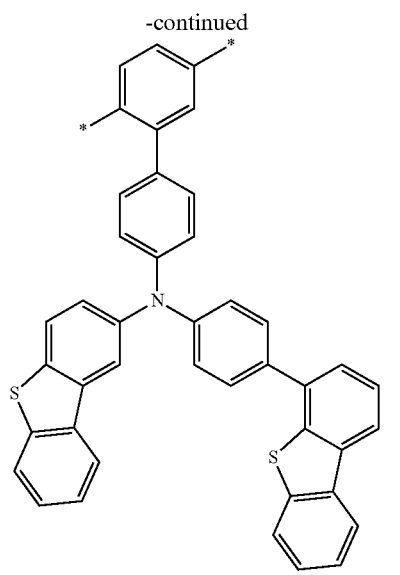
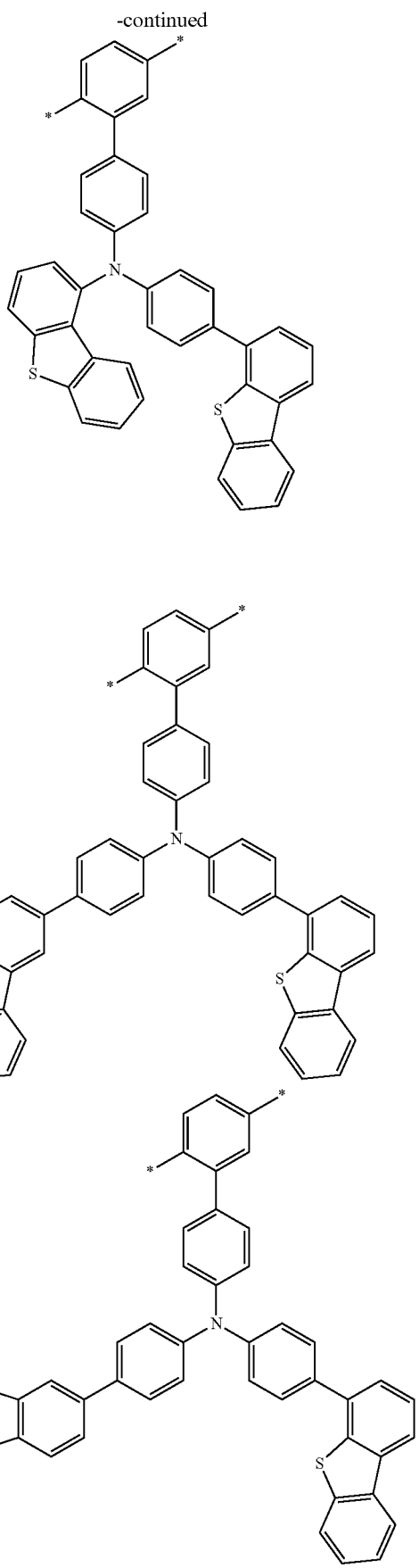

157
-continued
158
-continued
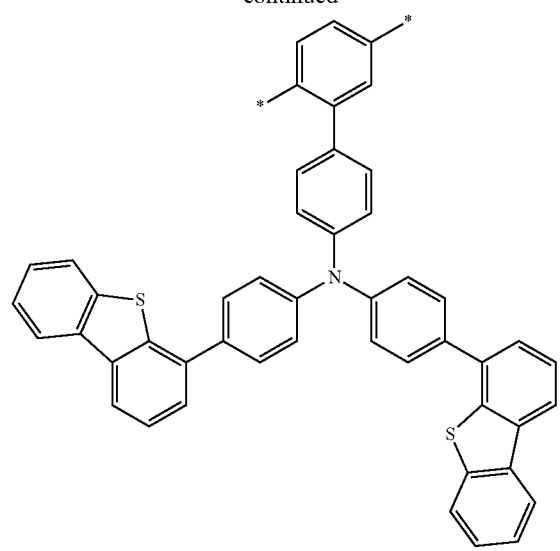
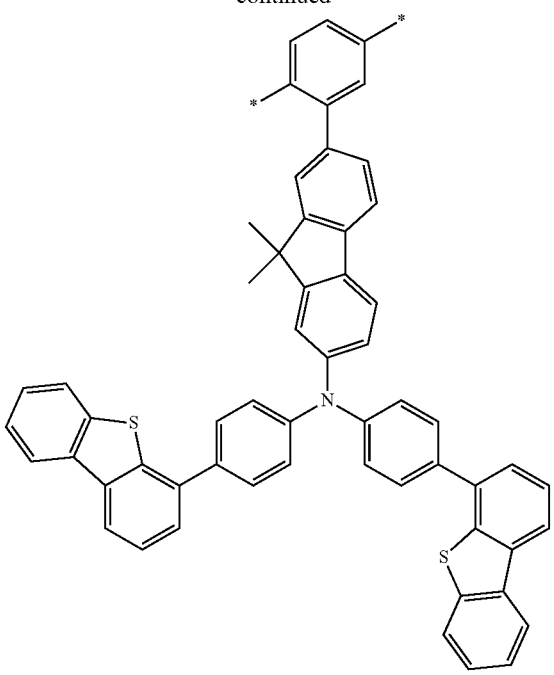

159
-continued
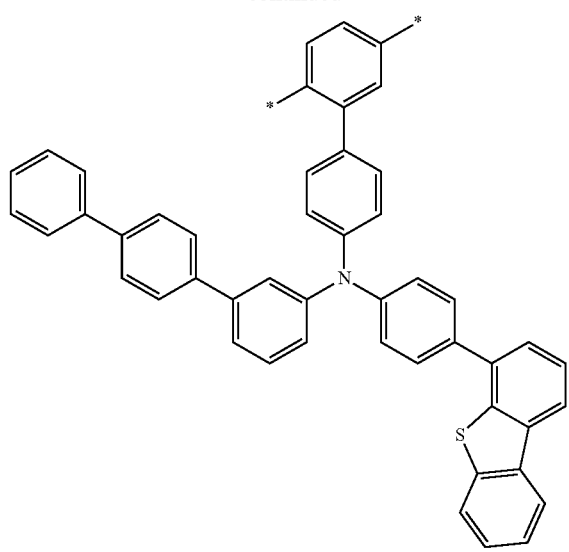
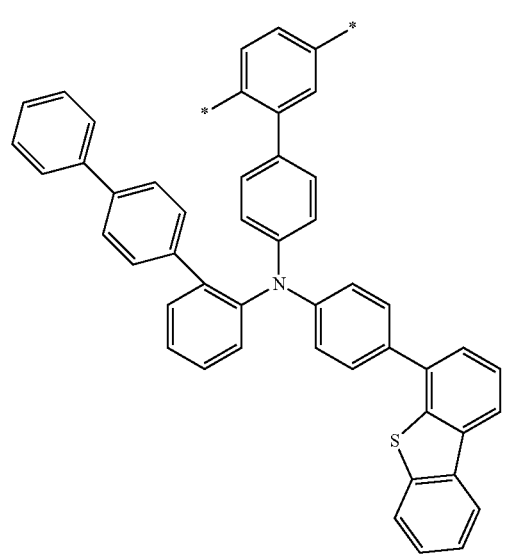
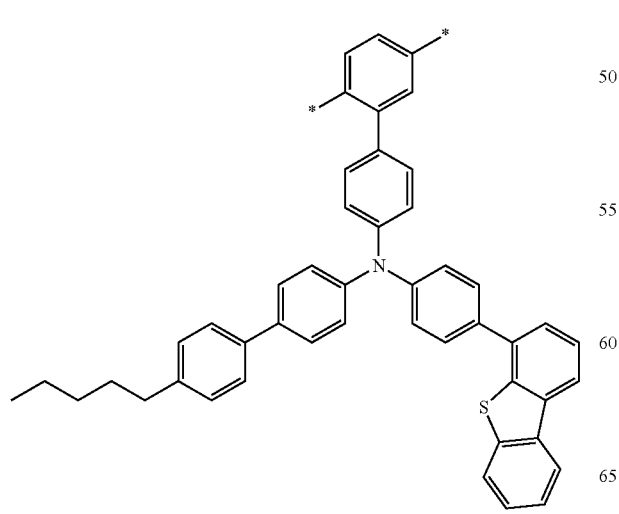
160
-continued
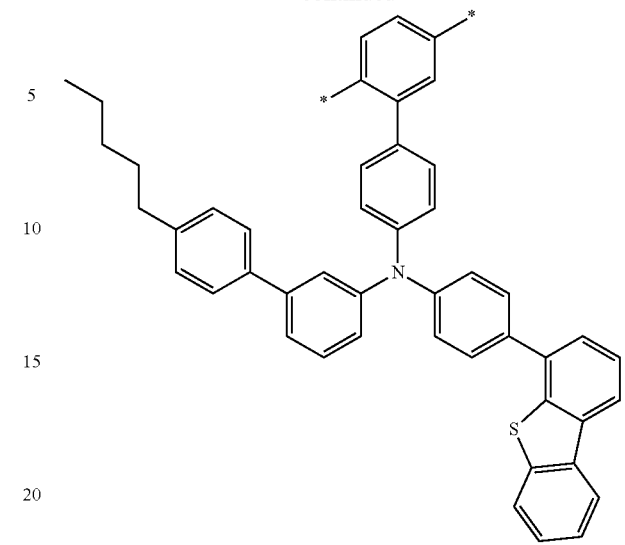
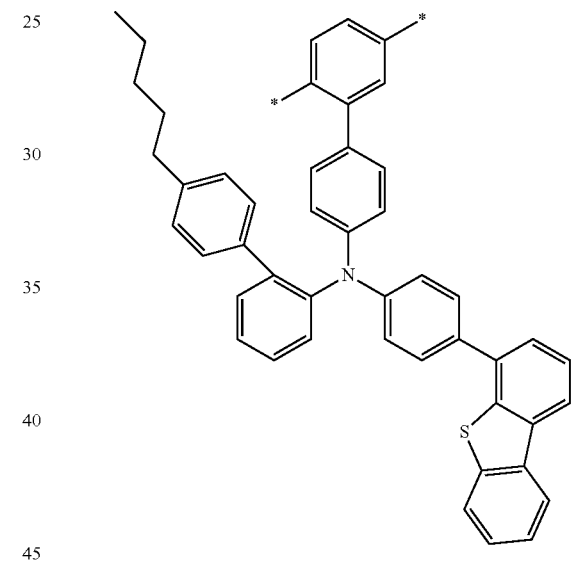
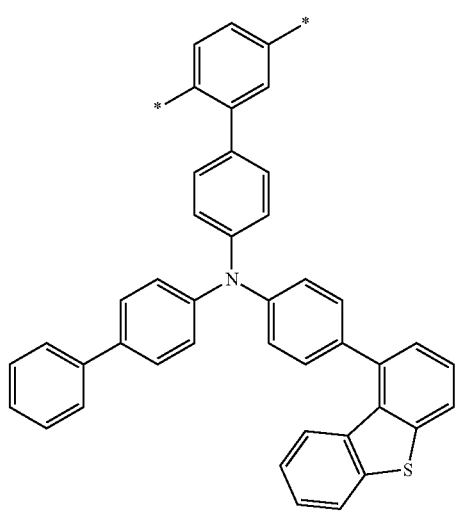

-continued
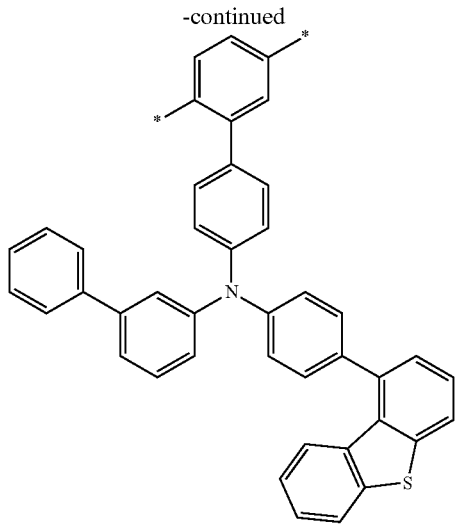
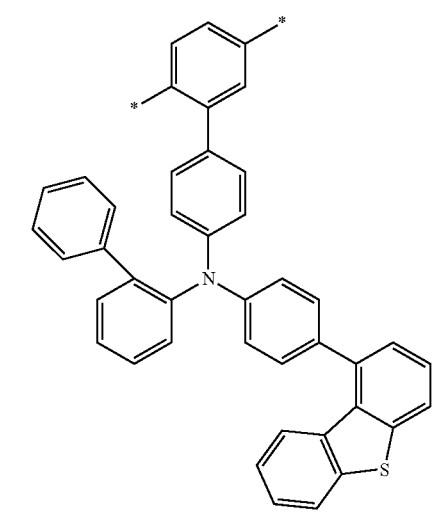
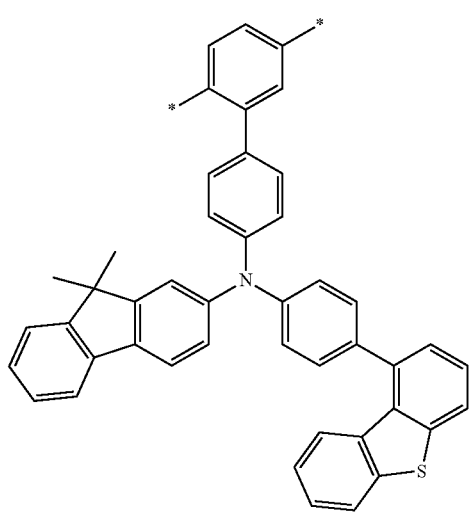
-continued
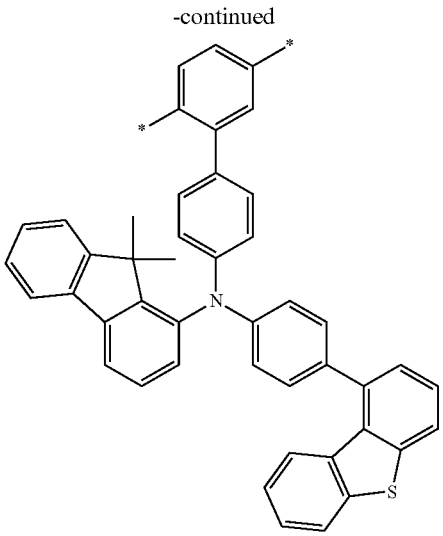
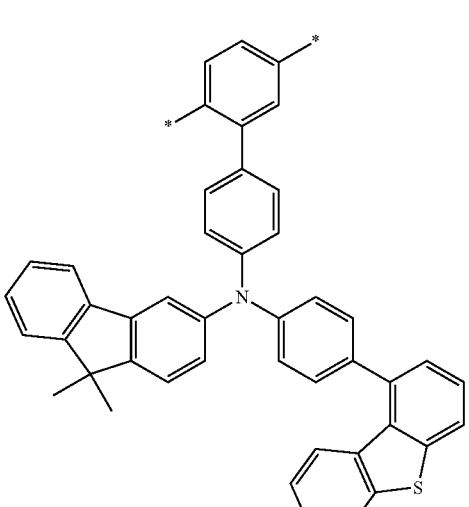
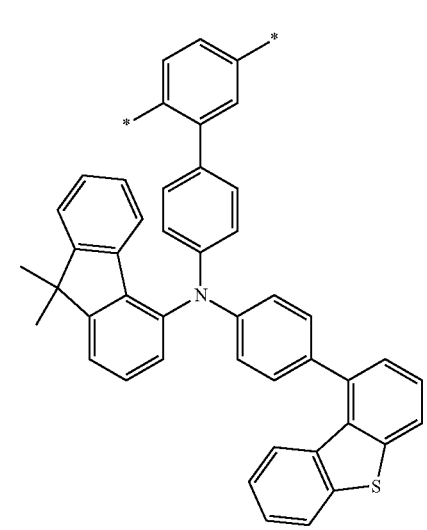

163
-continued
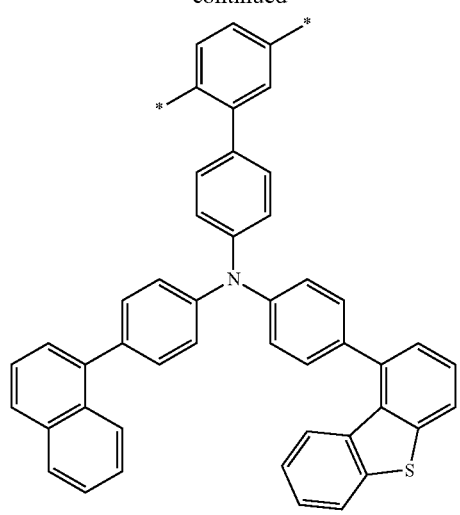
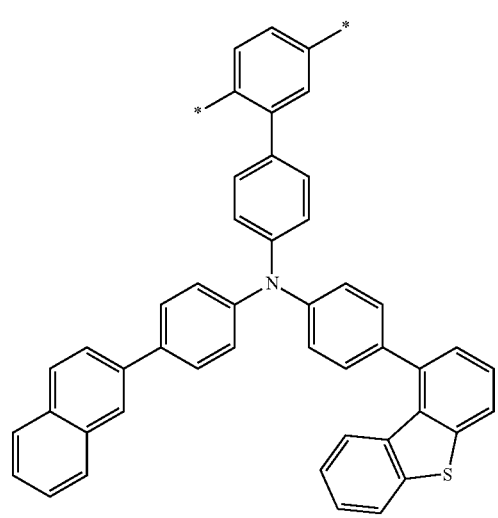
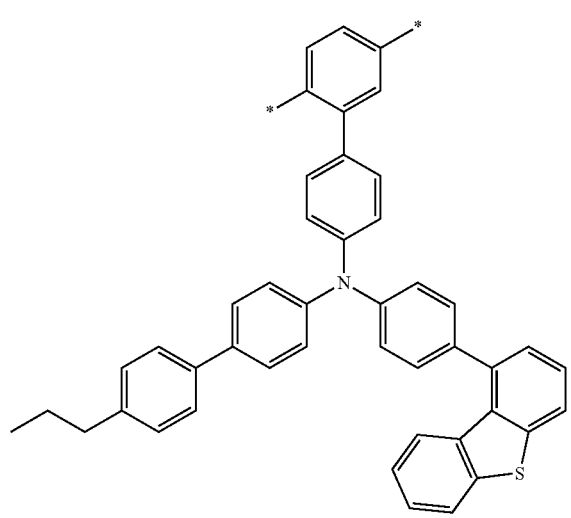
164
-continued
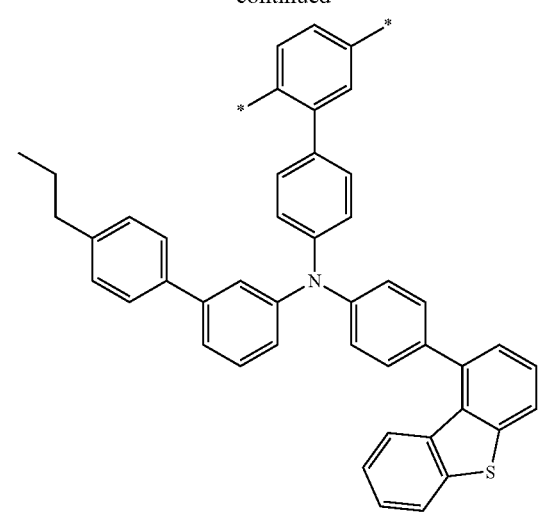
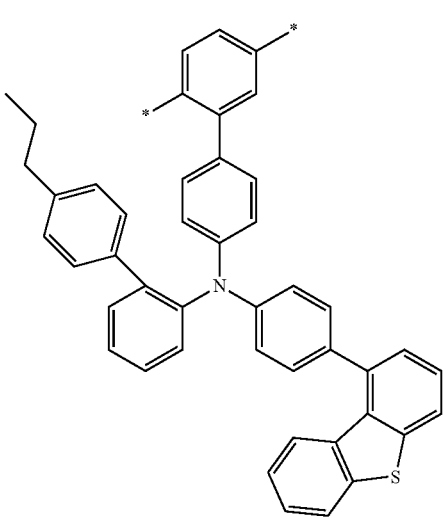
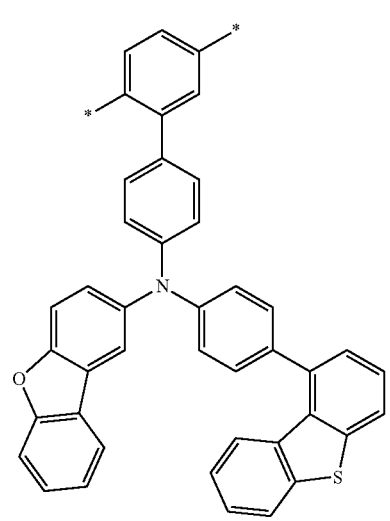

165
-continued
166
-continued
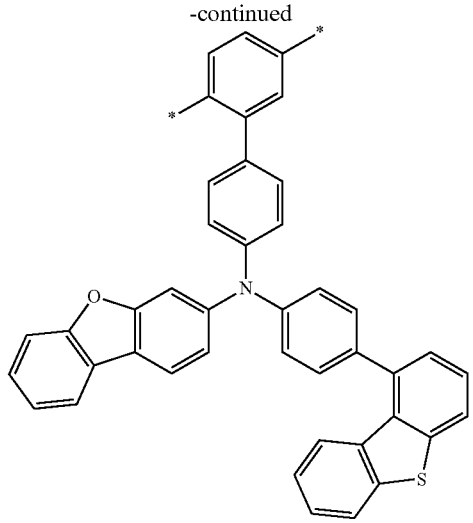
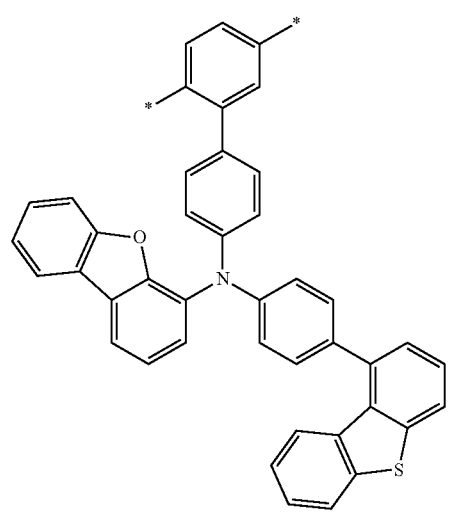
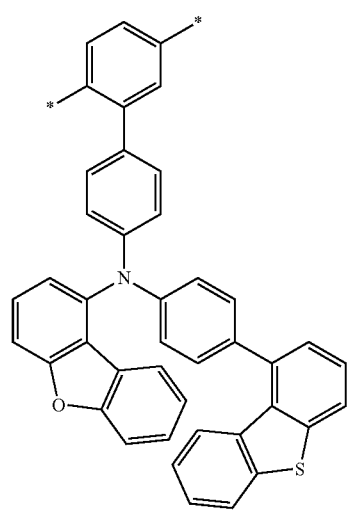
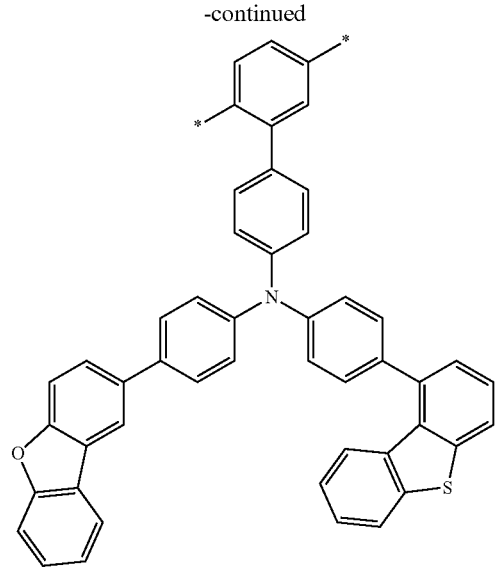
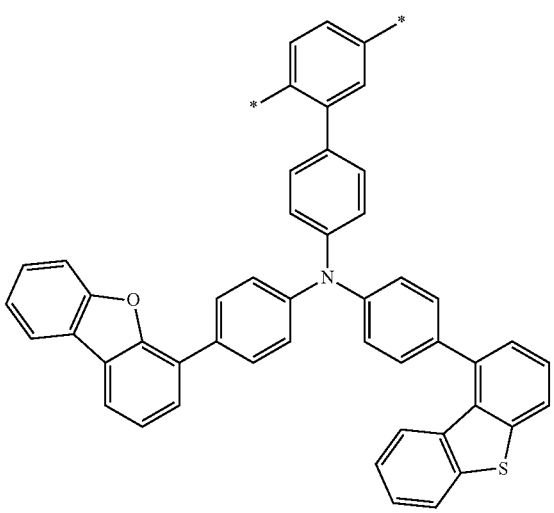

167
-continued
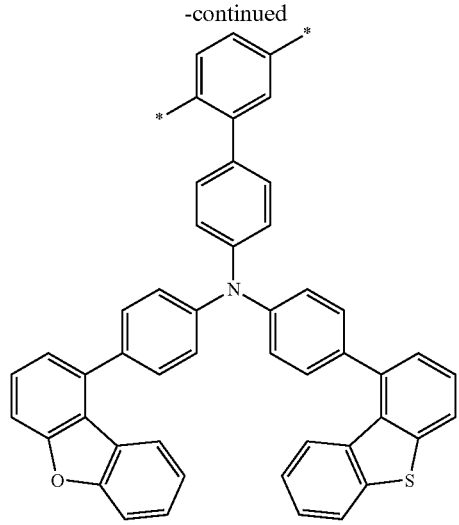
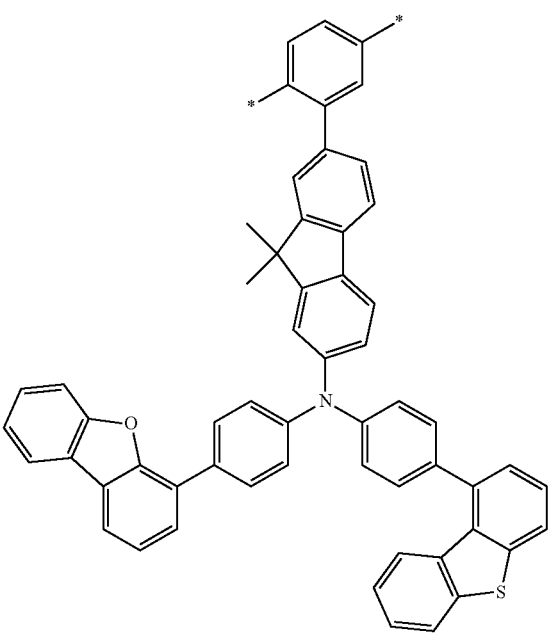
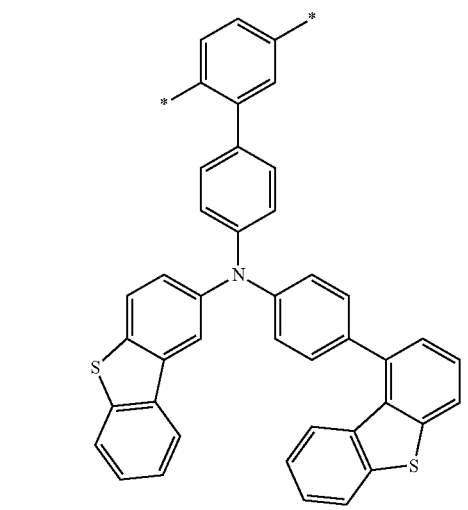
168
-continued
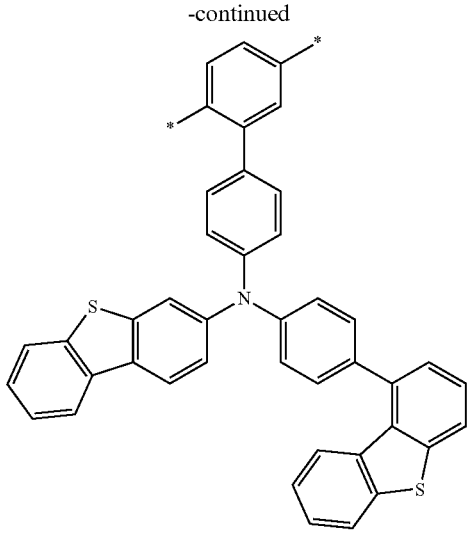
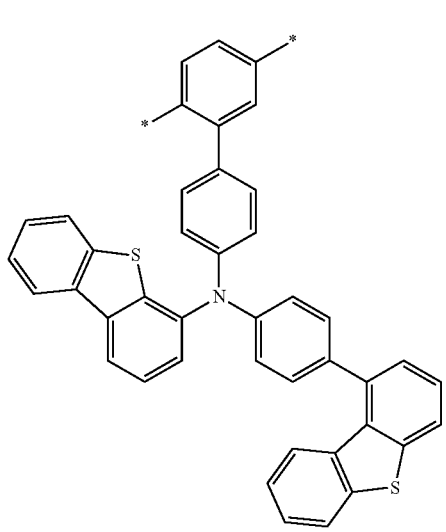
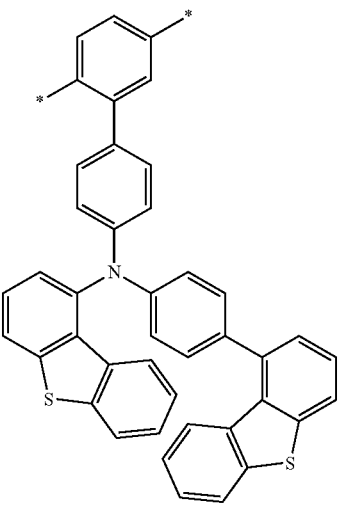

169
-continued
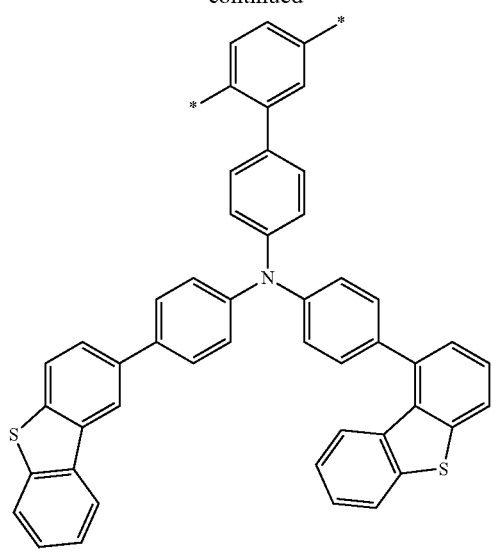
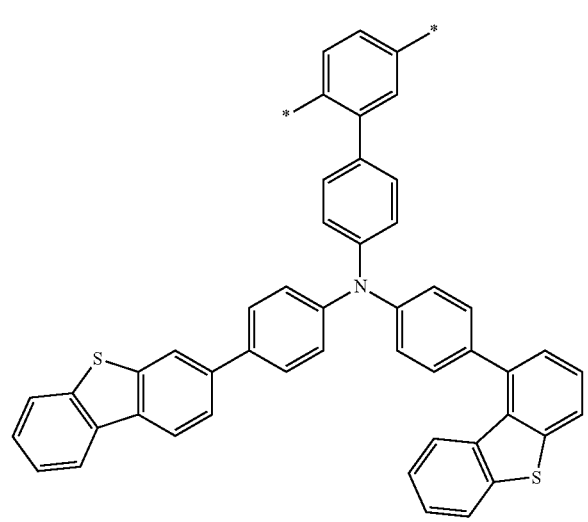
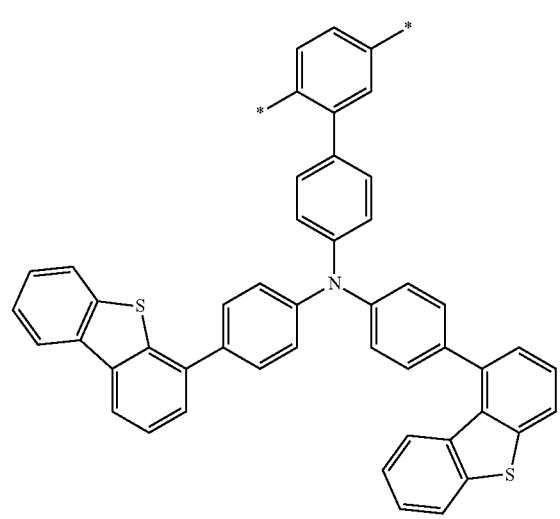
170
-continued
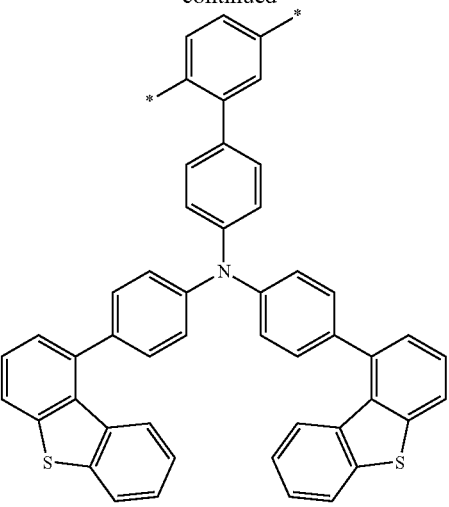
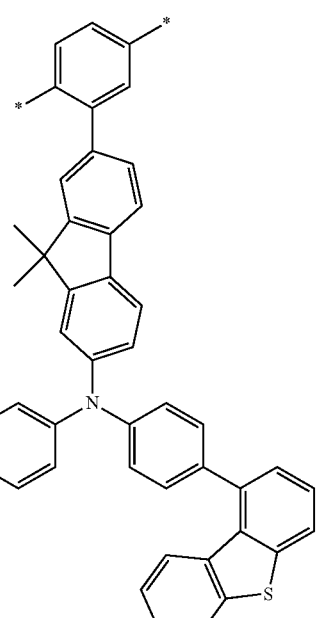
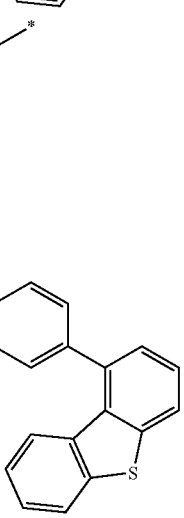

171
-continued
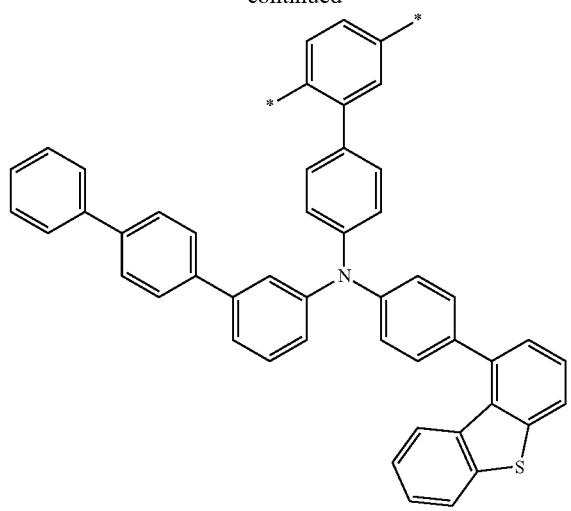
172
-continued
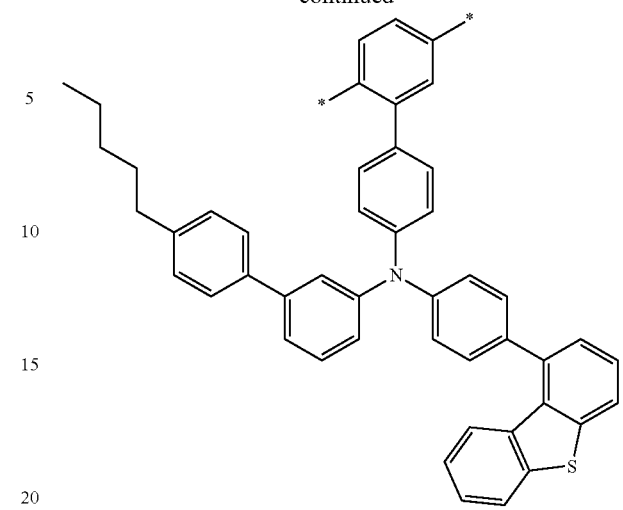
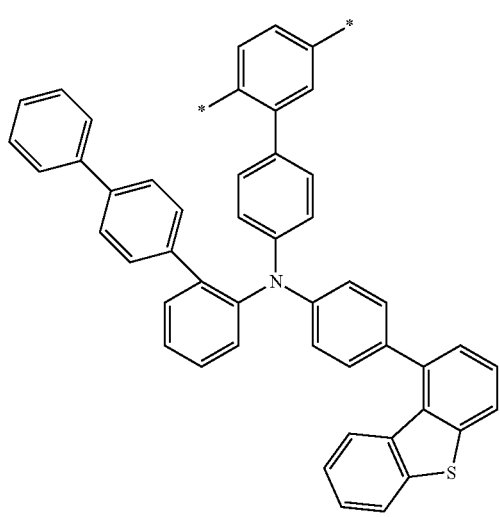
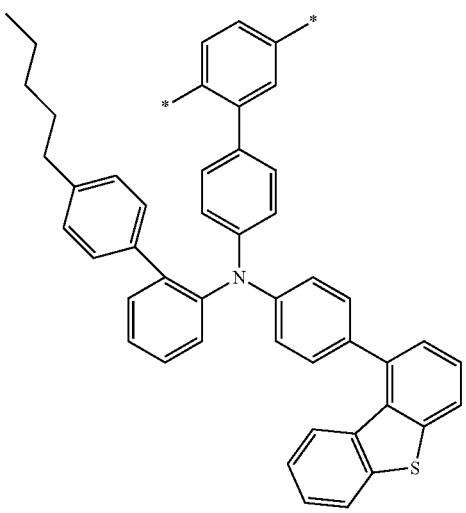
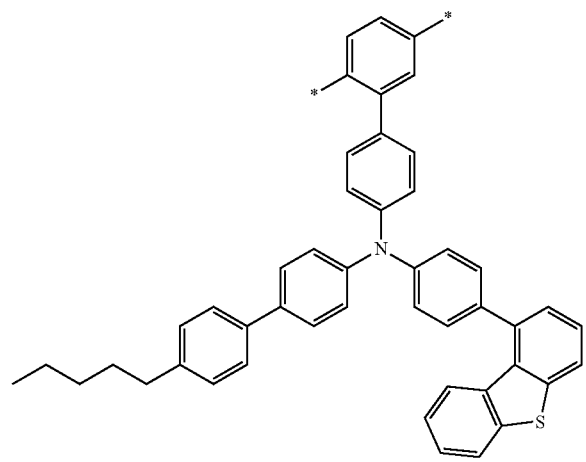
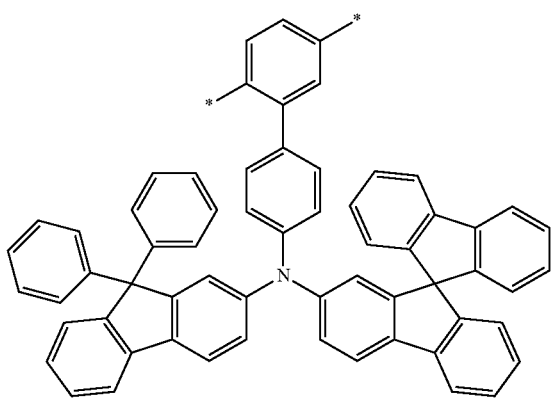

173
-continued
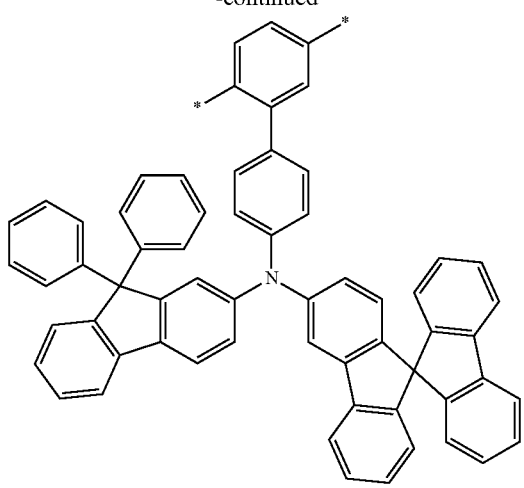
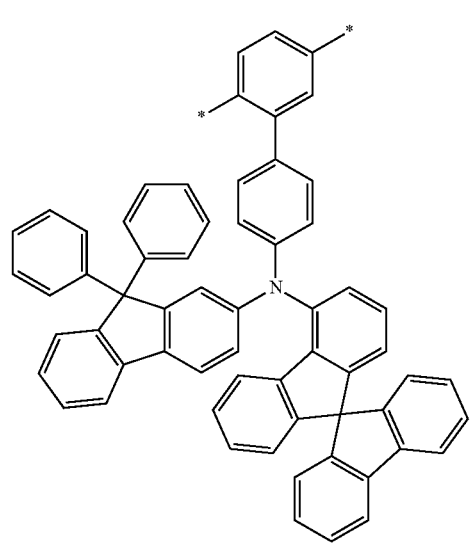
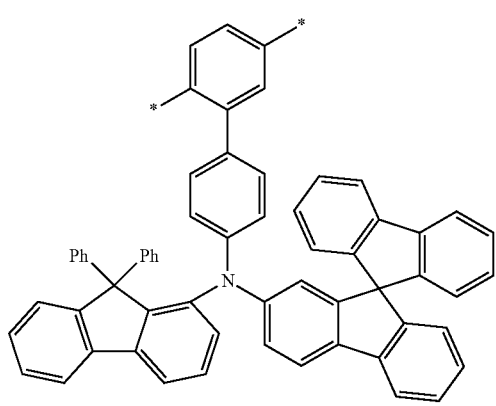
174
-continued
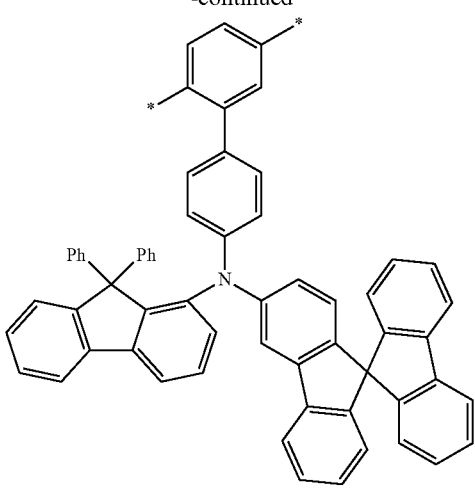
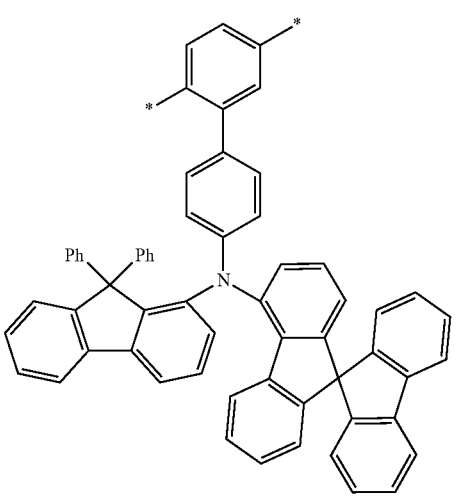
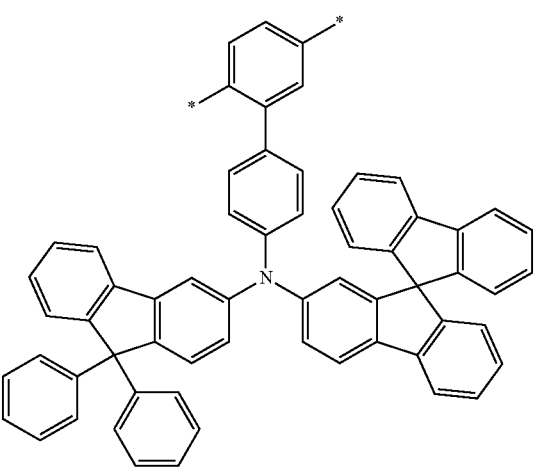

175
-continued
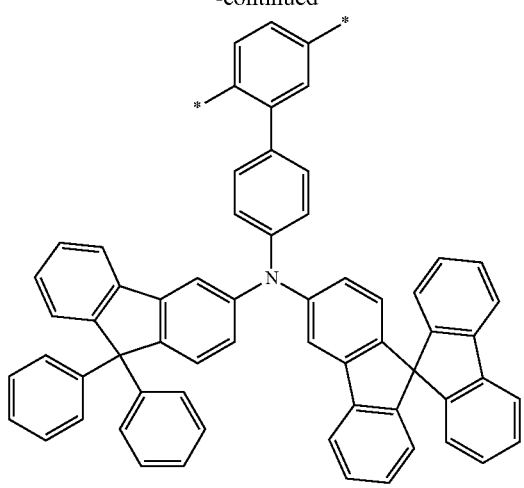
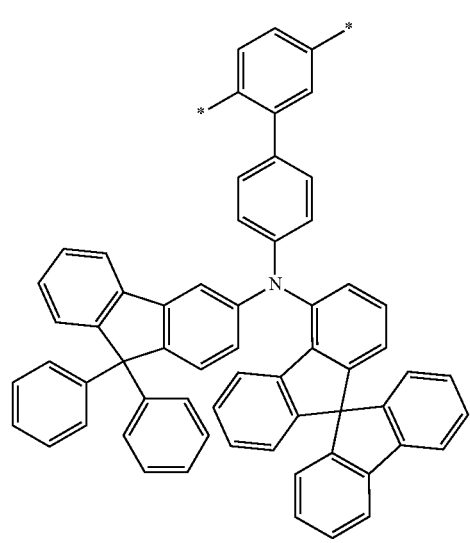
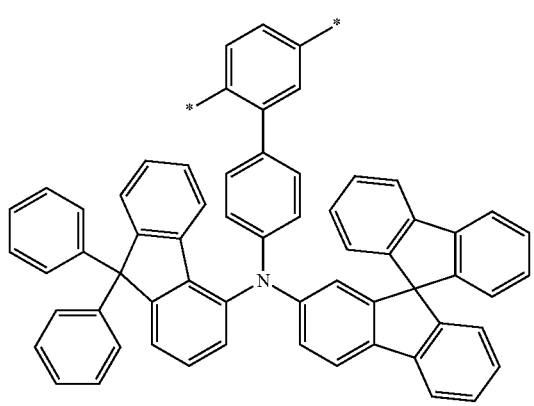
176
-continued
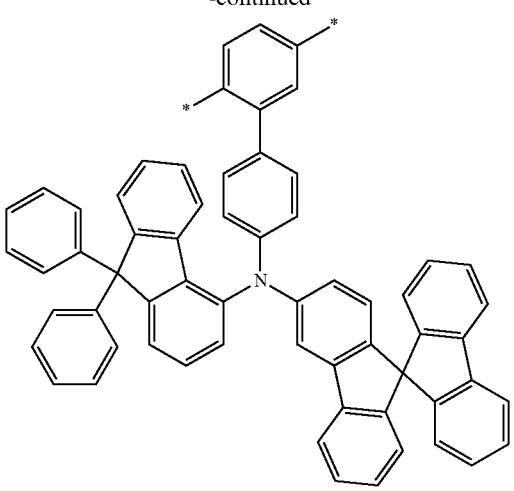
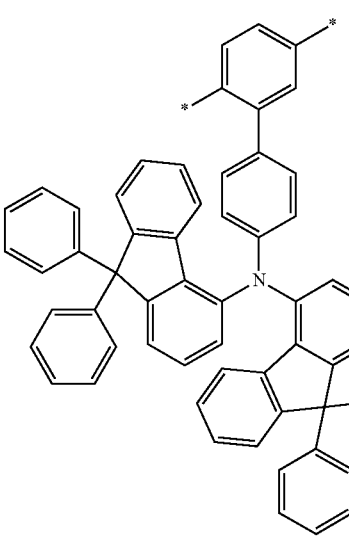
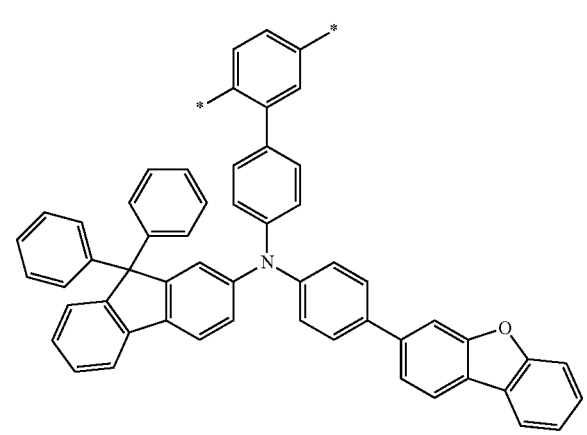

177
-continued
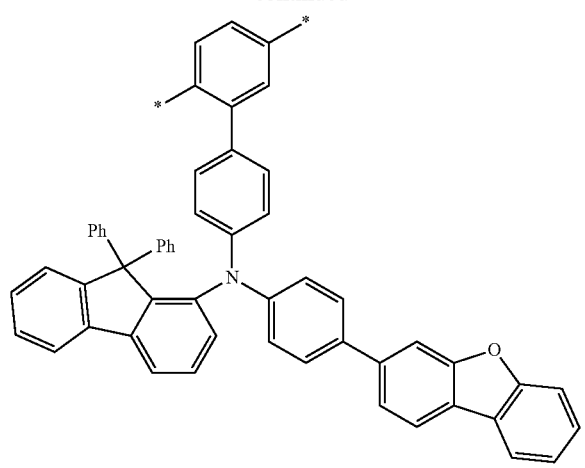
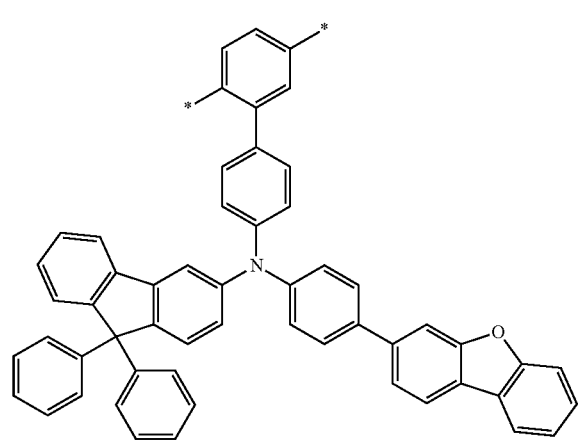
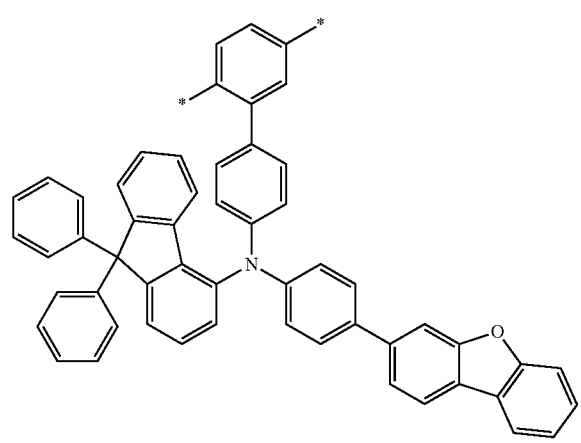
178
-continued
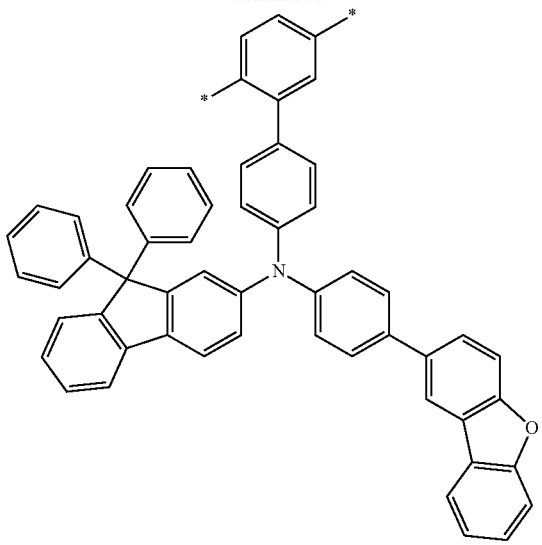
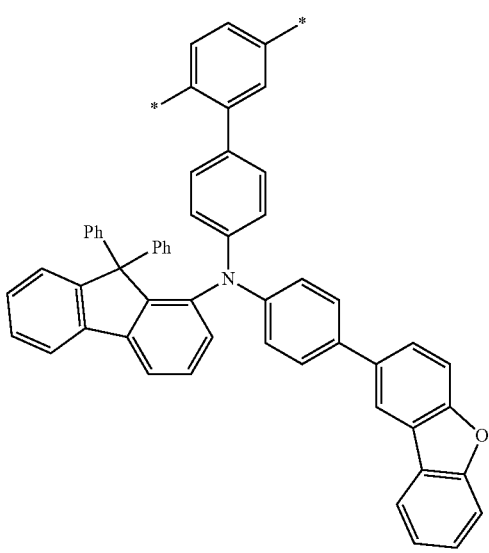
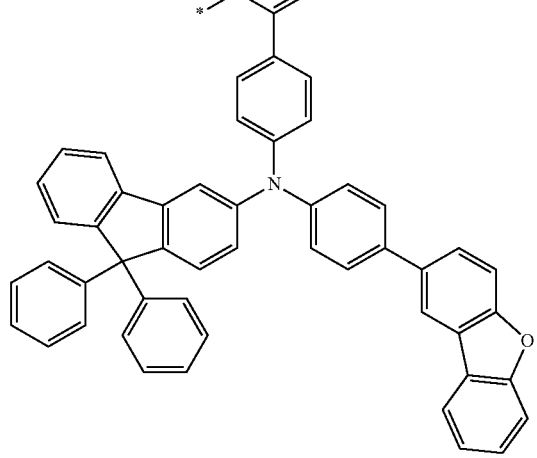

179
-continued
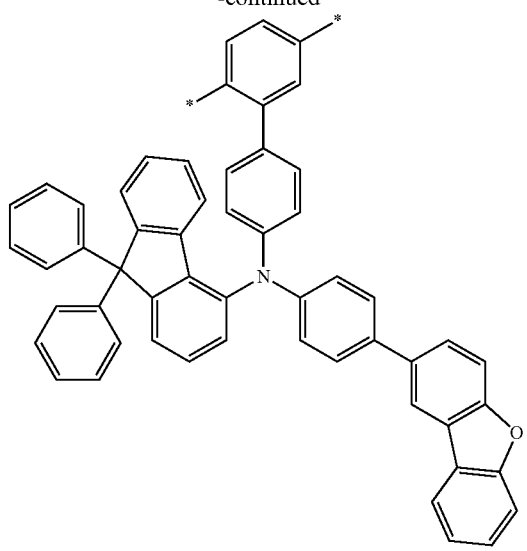
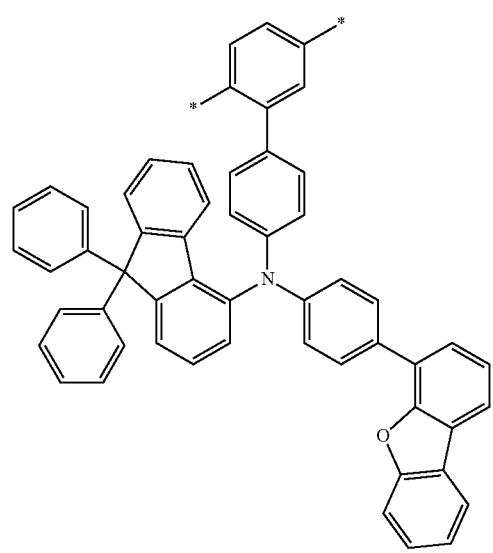
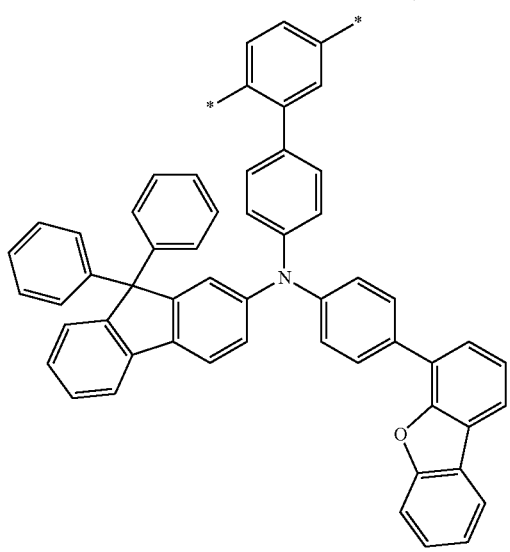
180
-continued
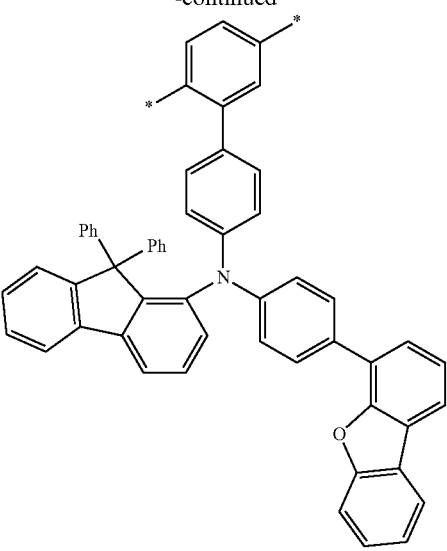
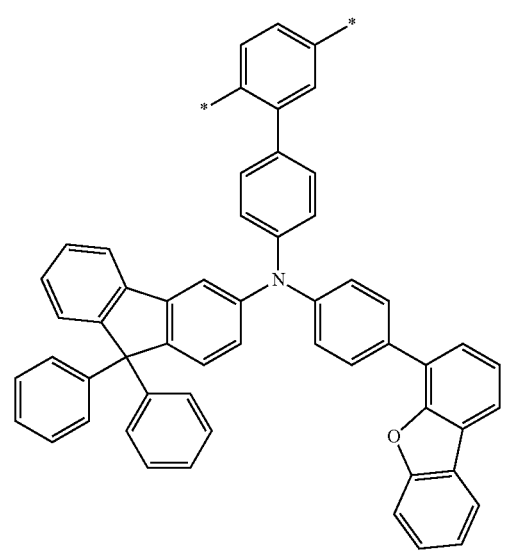
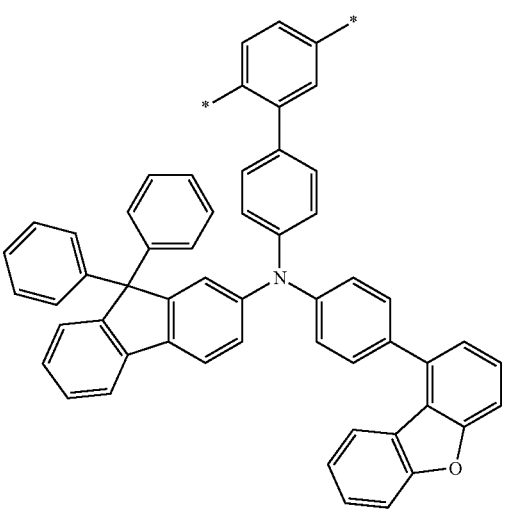

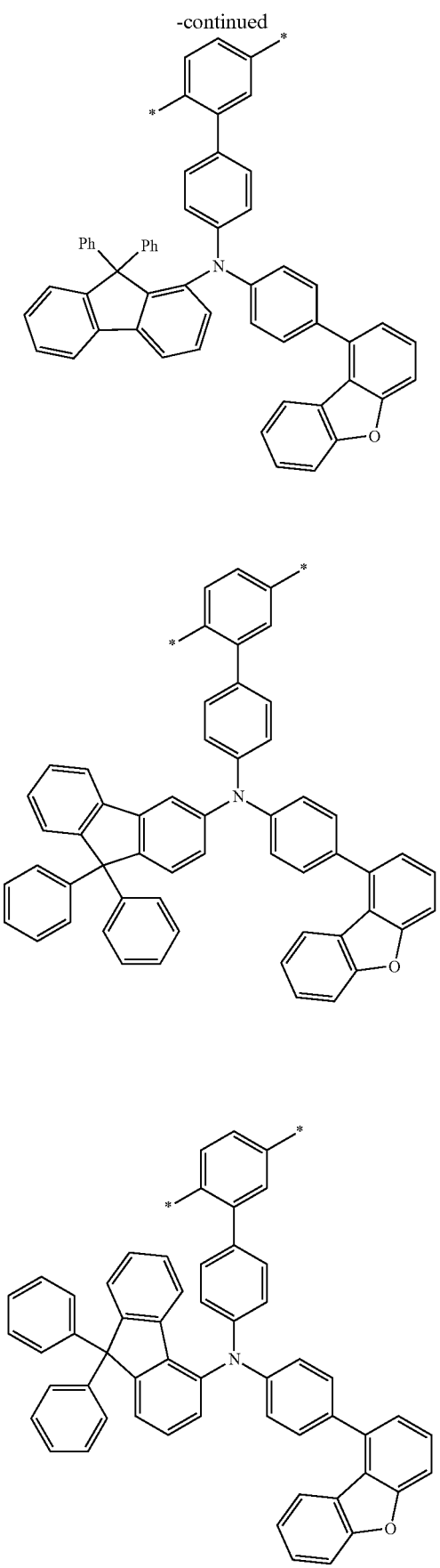
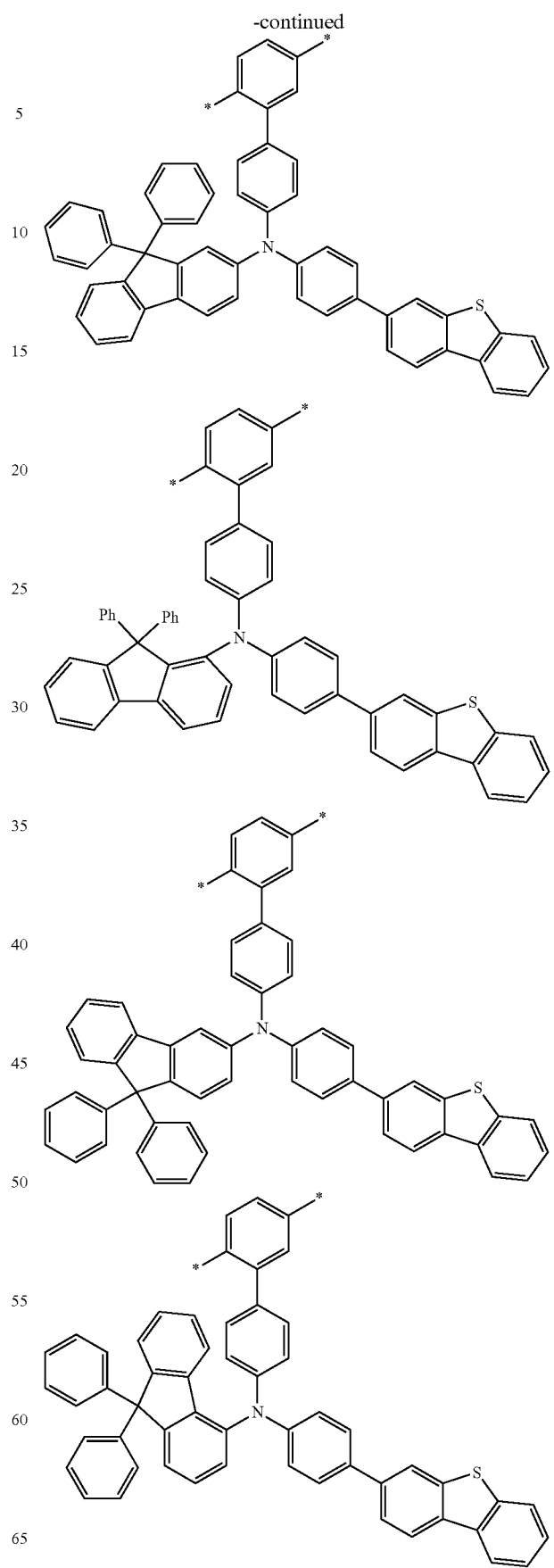

183
-continued
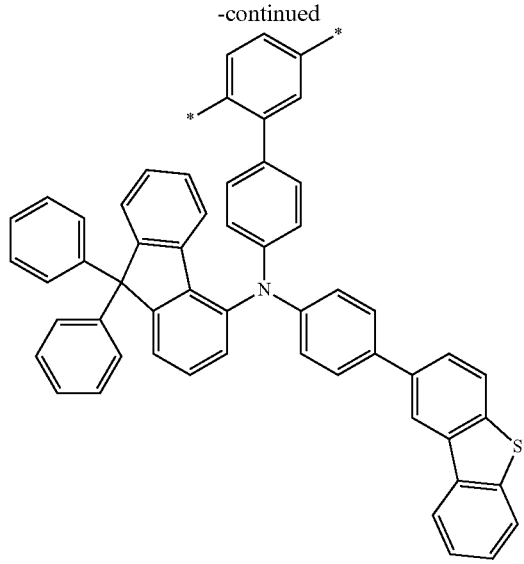
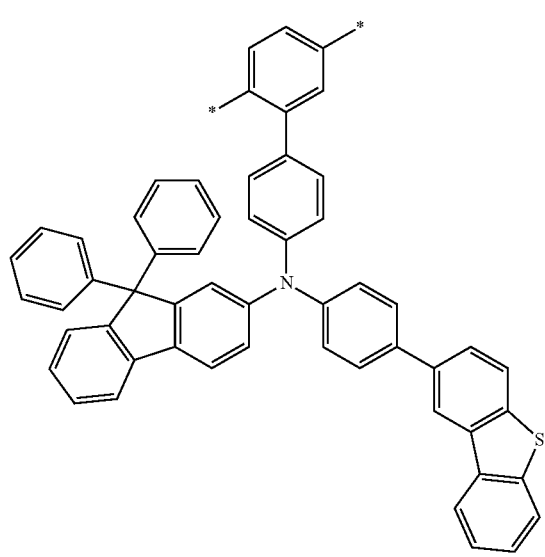
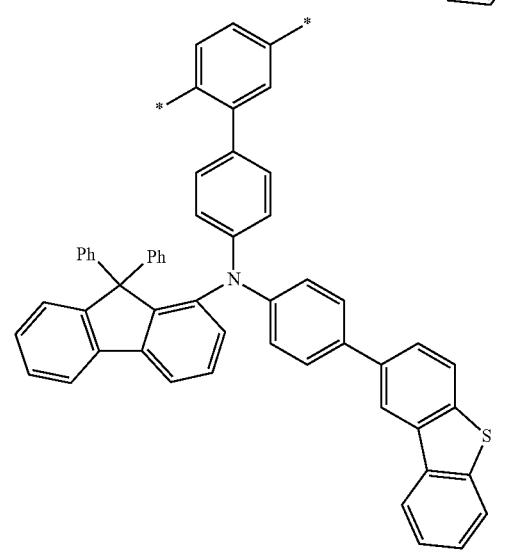
184
-continued
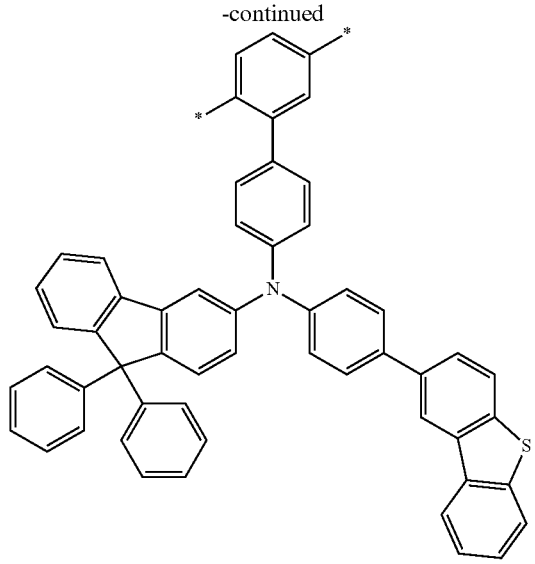
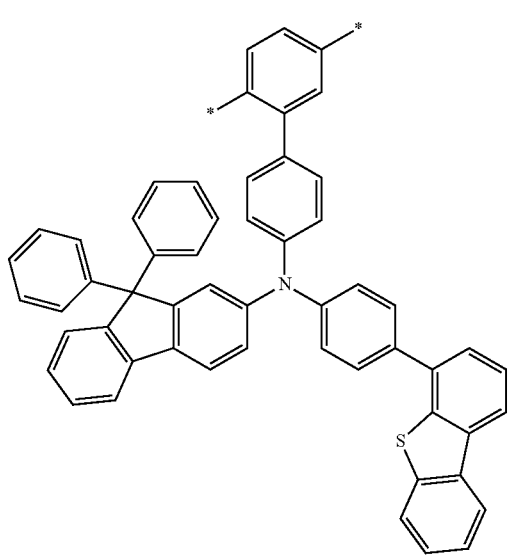
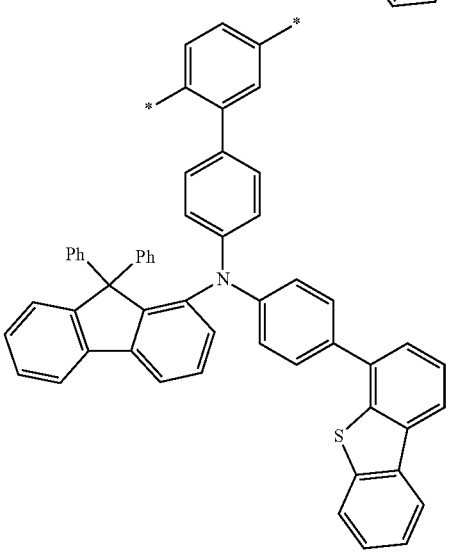

185
-continued
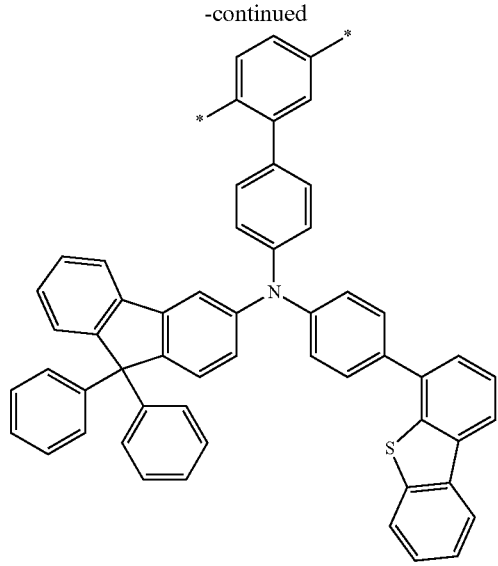
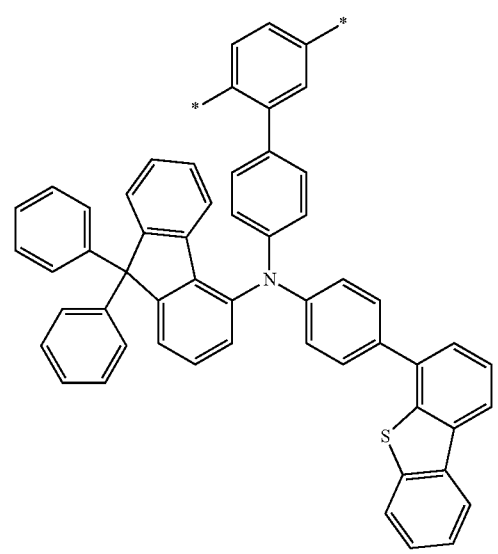
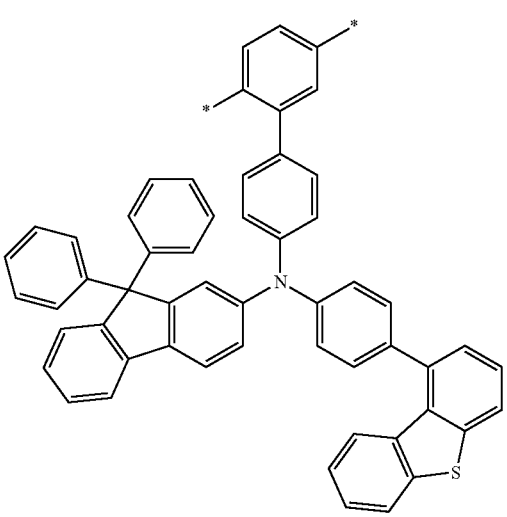
186
-continued
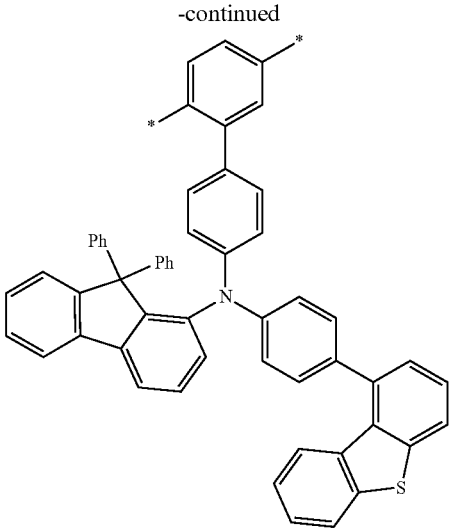
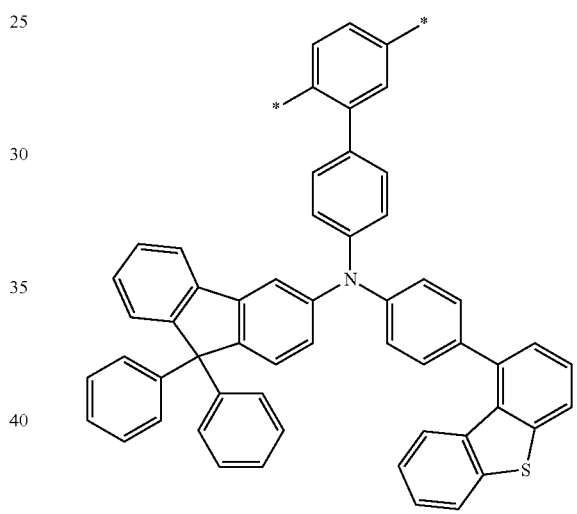
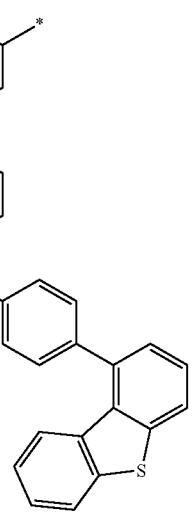

187
-continued
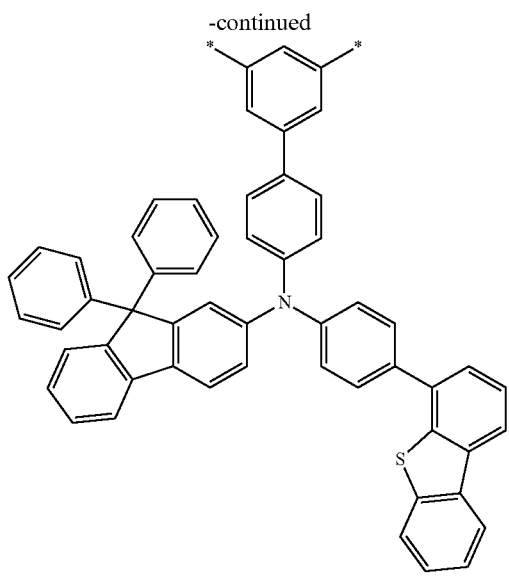
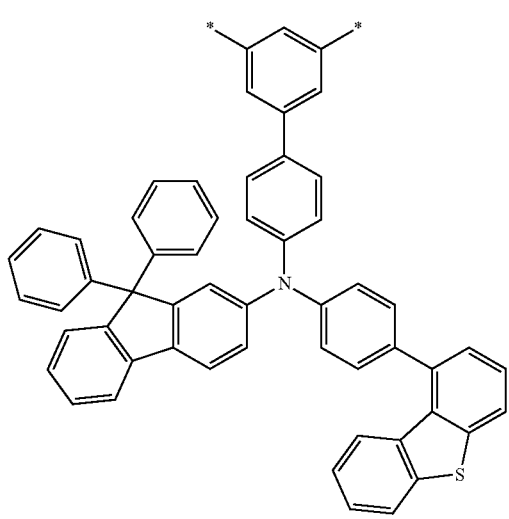
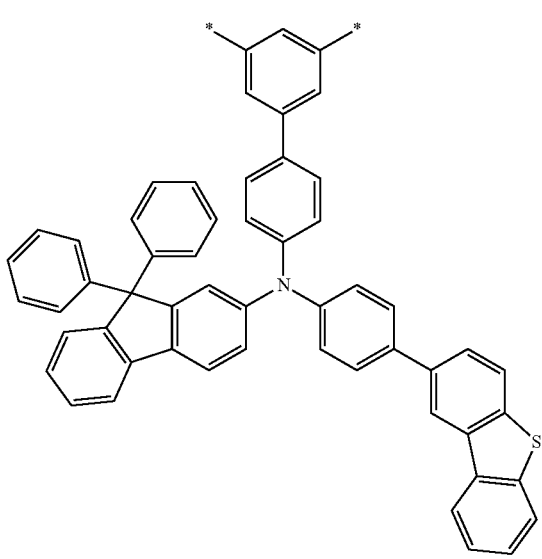
188
-continued
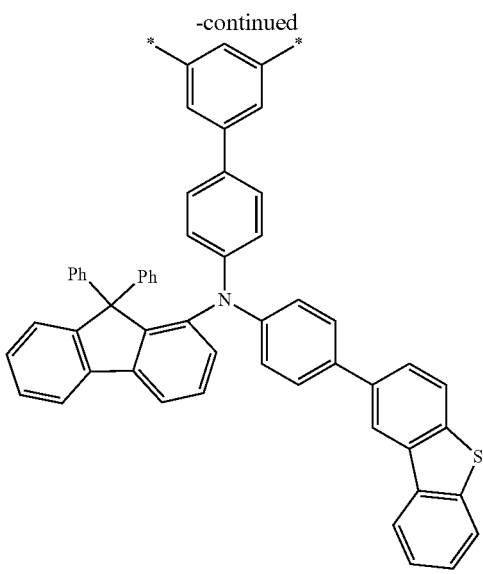
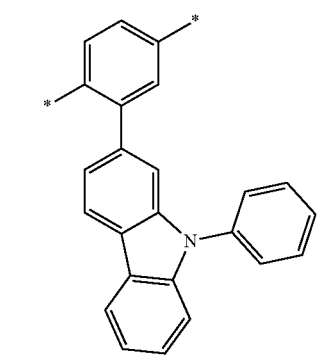
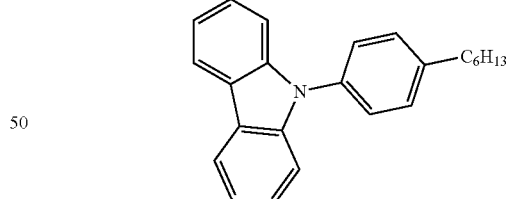
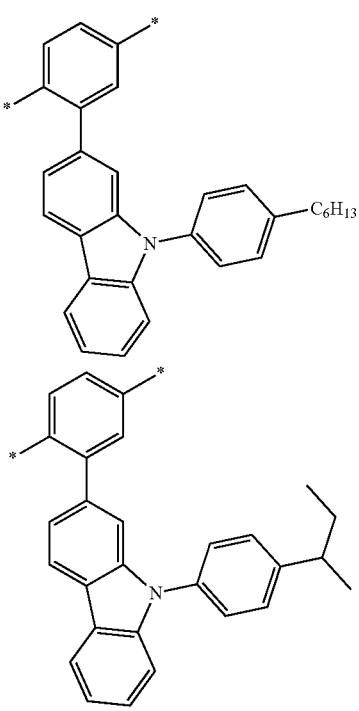

189
-continued
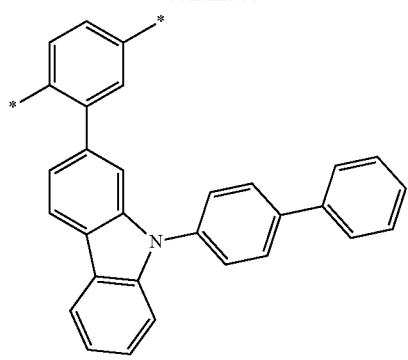
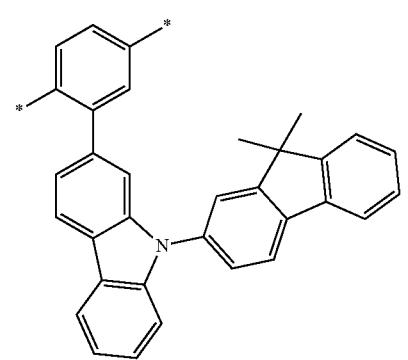
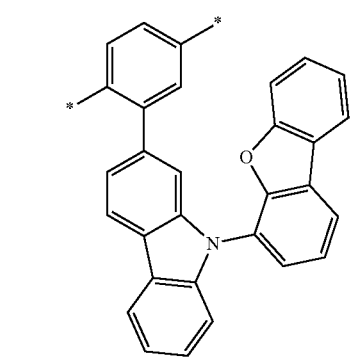
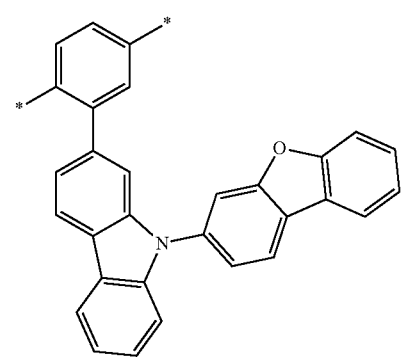
190
-continued
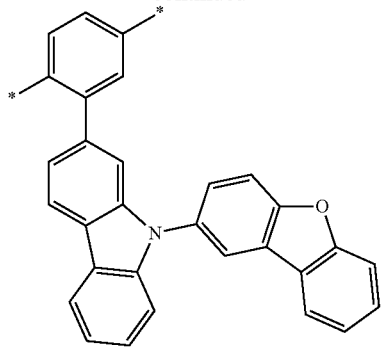
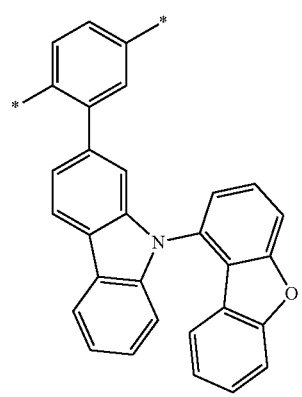
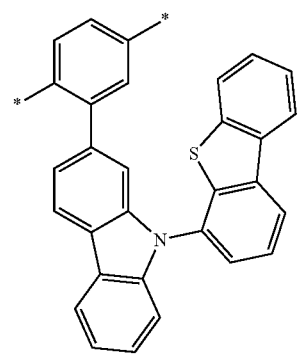
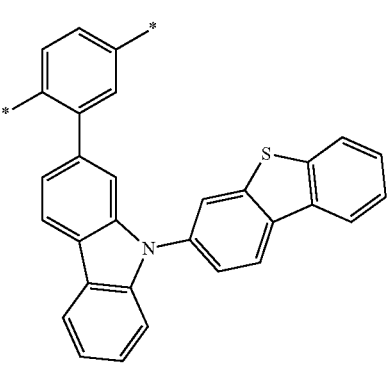

191
-continued
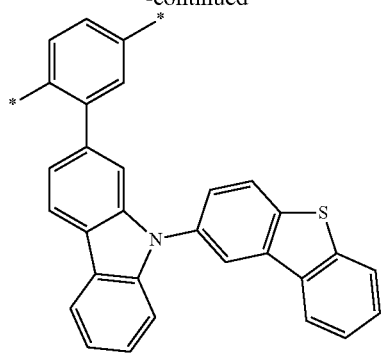
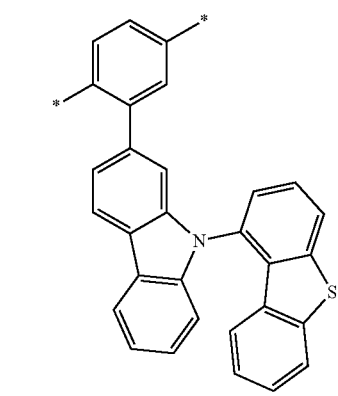
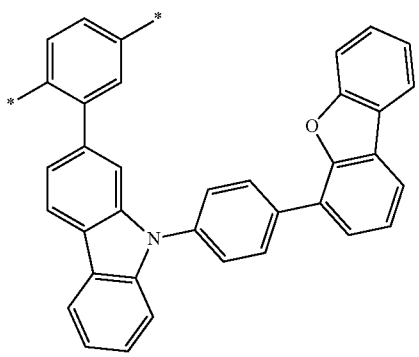
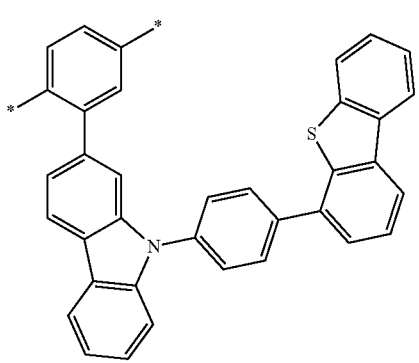
192
-continued
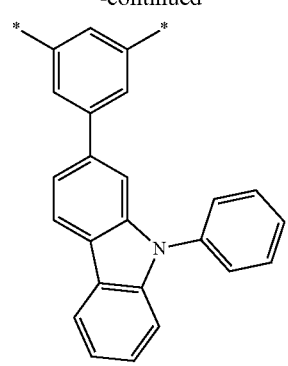
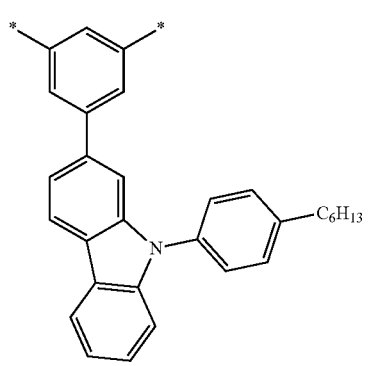
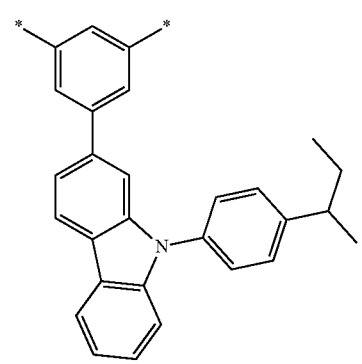
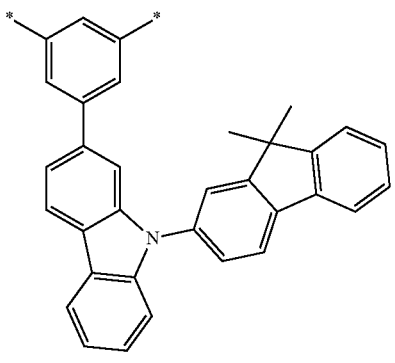

193
-continued
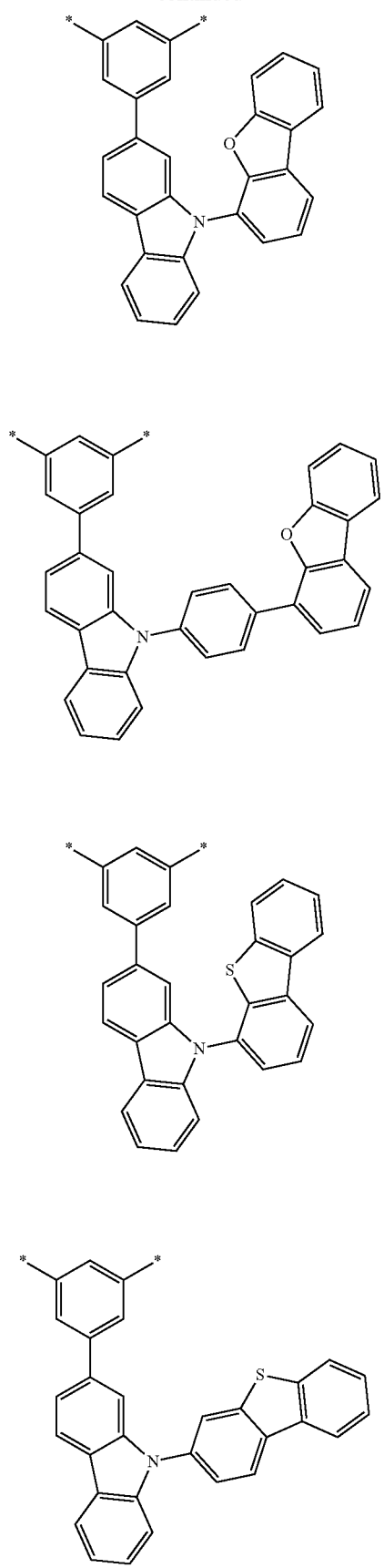
194
-continued
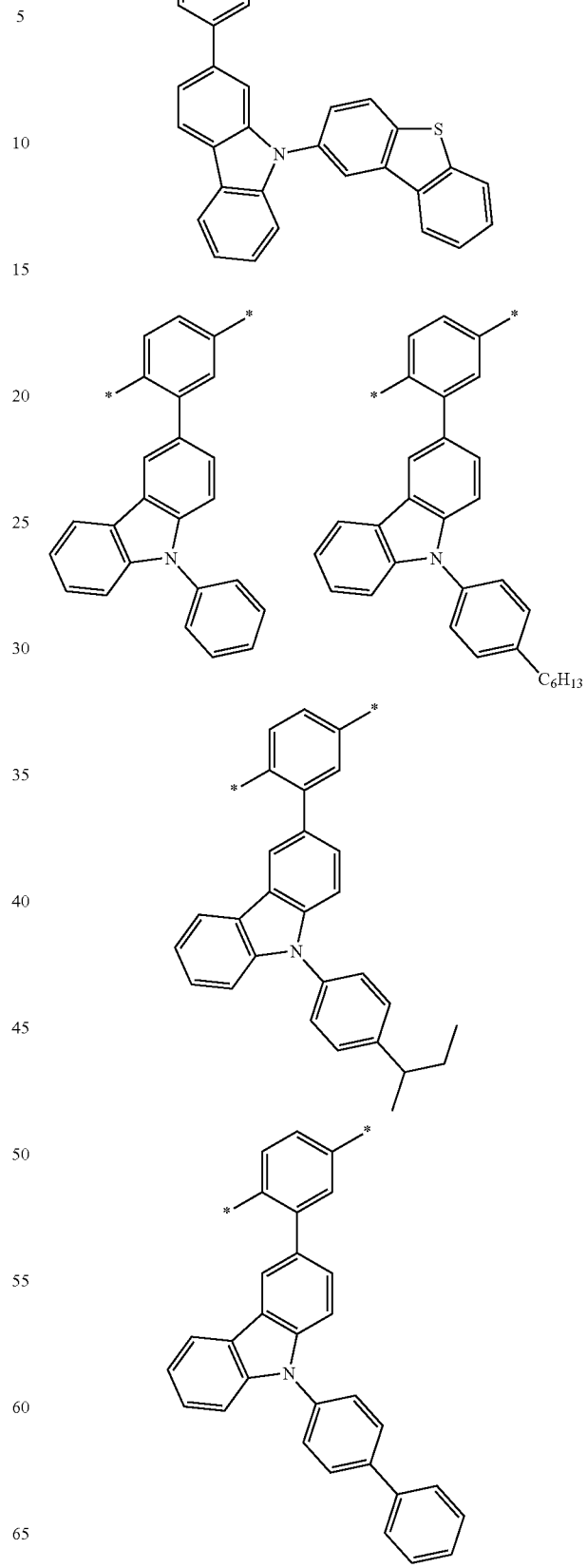

195
-continued
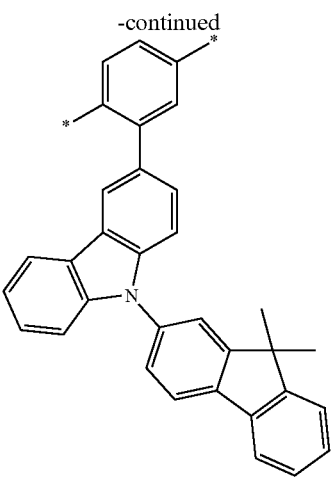
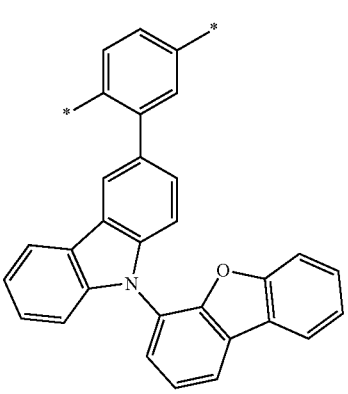
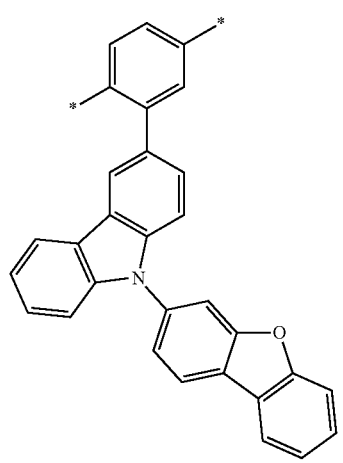
196
-continued
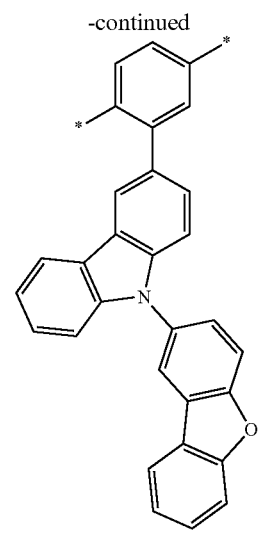
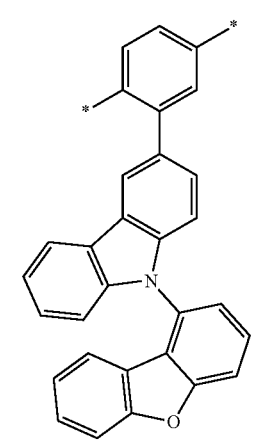
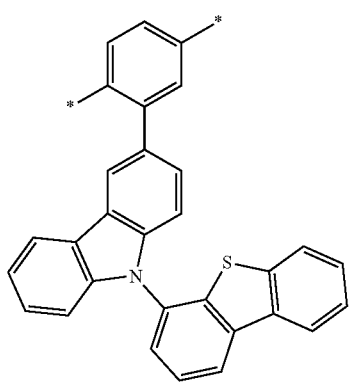

197
-continued
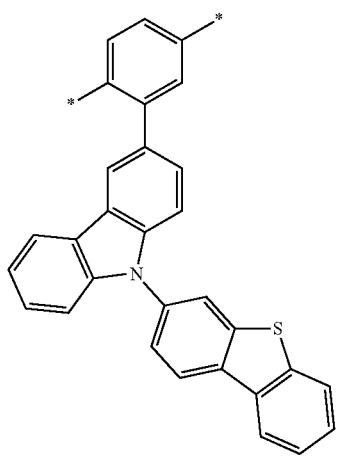
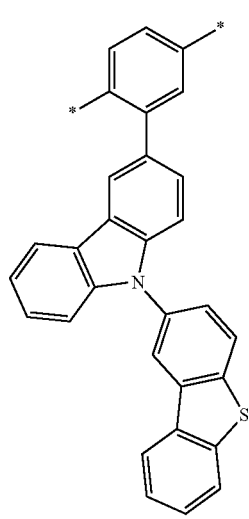
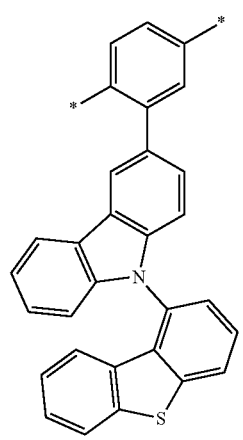
198
-continued
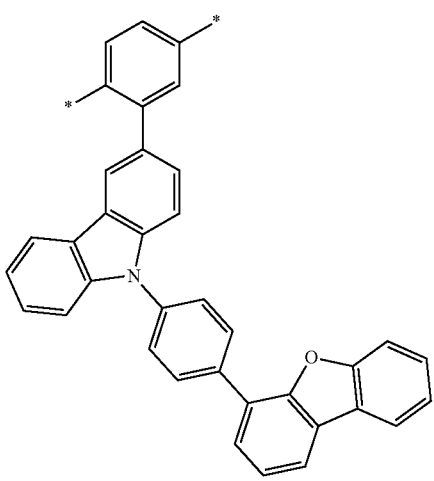
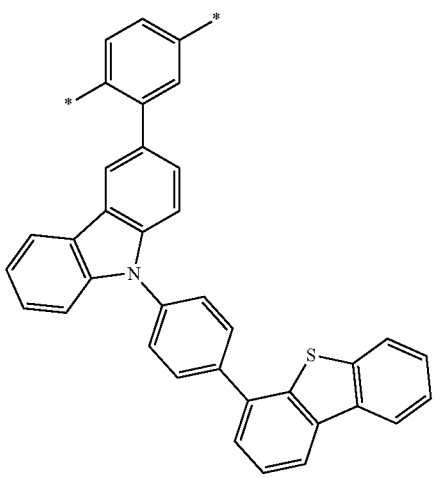
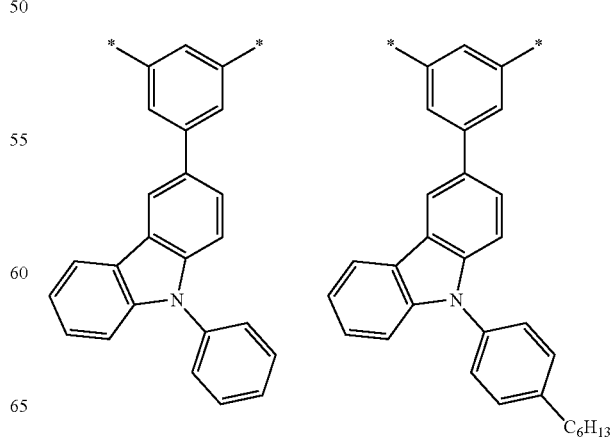

199
-continued
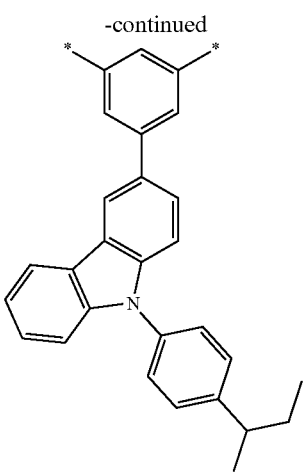
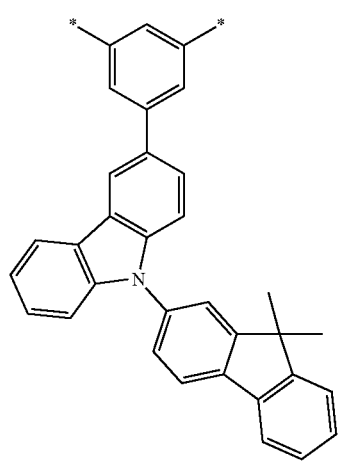
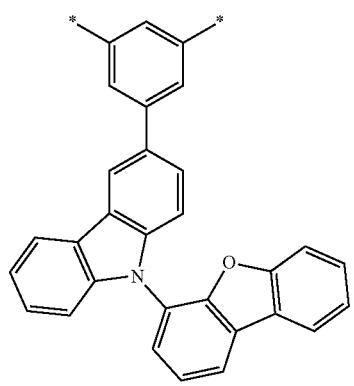
200
-continued
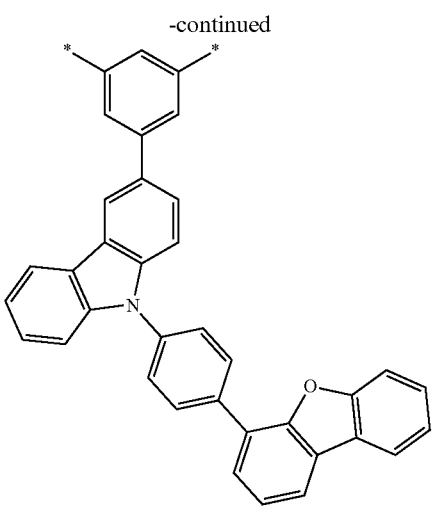
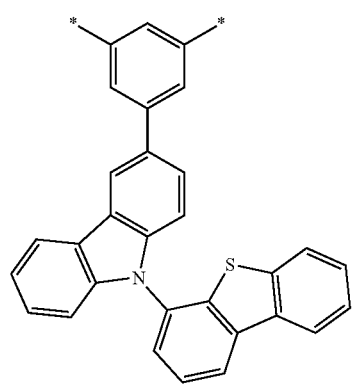
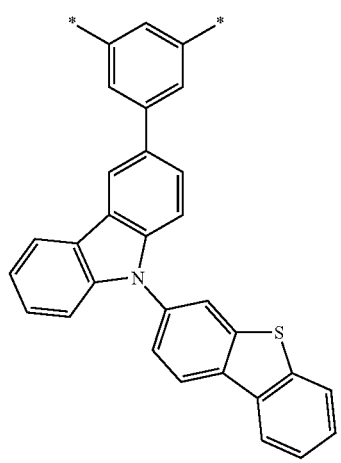

201
-continued
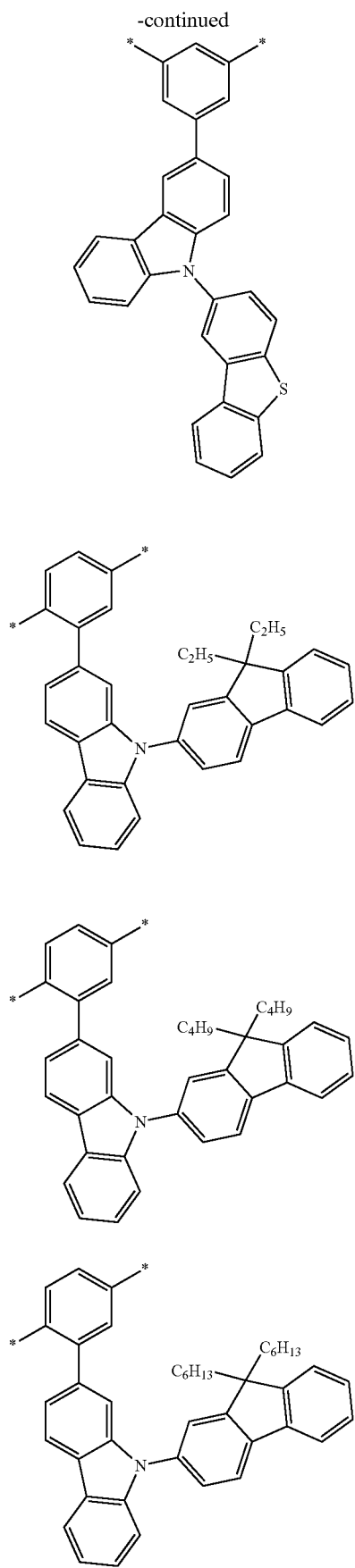
202
-continued
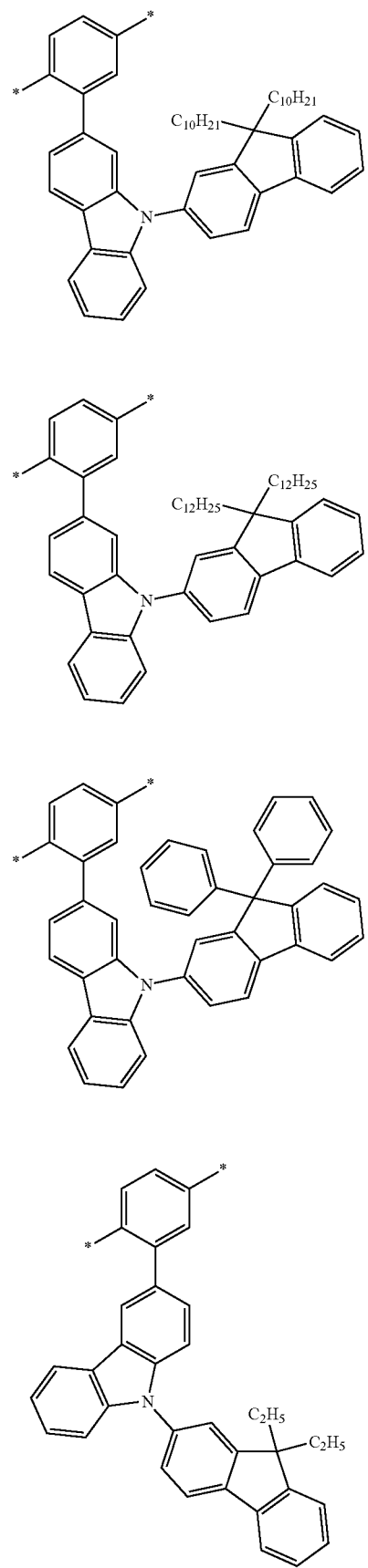

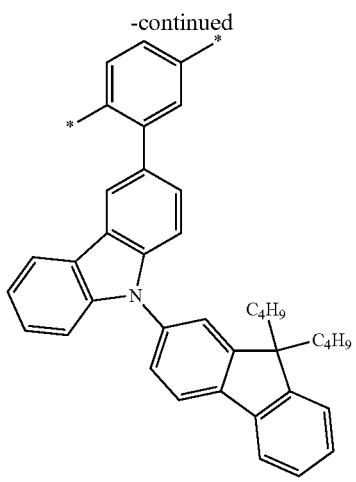

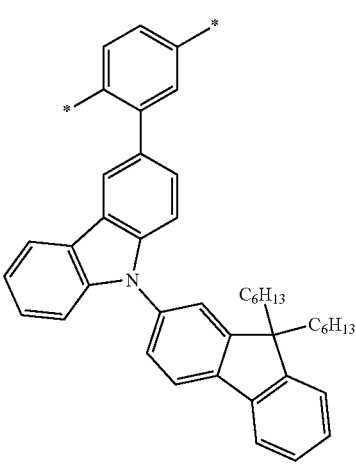

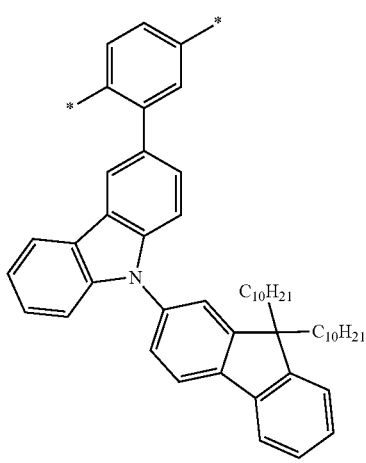

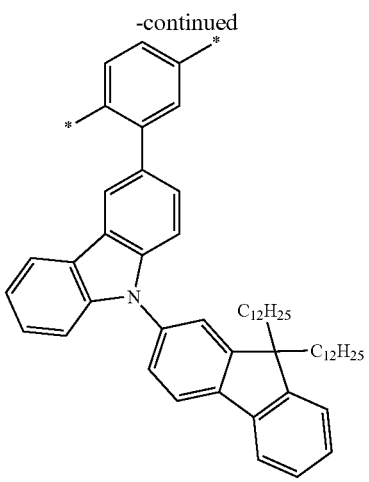

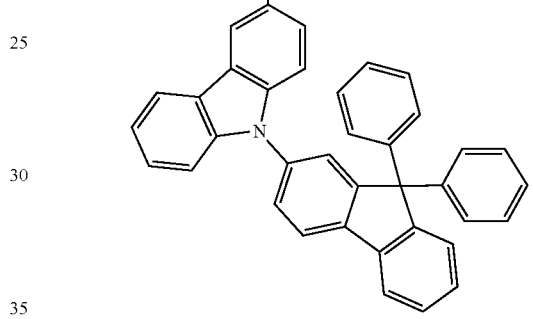

In Group 3,

Ph is a substituted or unsubstituted phenyl group, and a hydrogen atom of the aromatic ring may be replaced by a linear or branched hydrocarbon group having 1 to 14 carbon atoms (a C1 to C14 alkyl group, for example a C1 to C12 alkyl group), or an aromatic hydrocarbon group having 6 to 28 carbon atoms (a C6 to C28 aryl group, for example a C6 to C20 aryl group).

In the copolymer according to an exemplary embodiment, a composition of Structural Unit (1) is not particularly limited. When the durability (luminescence life-span) of a layer (for example, a hole injection layer (HIL), a hole transport layer (HTL)) formed by using the copolymer and also, new improvement effects of luminous efficiency or hole transport ability are considered, Structural Unit (1) may be included desirably in an amount of greater than or equal to about 10 mol % and less than or equal to about 100 mol %, more desirably greater than about 50 mol % and less than or equal to about 100 mol %, or more desirably, about 100 mol % based on total structural units constituting the copolymer. In other words, in an embodiment, Structural Unit (1) may be included in a ratio of greater than or equal to about 10 mol % and less than or equal to about 100 mol % based on the total structural units. In an embodiment, Structural Unit (1) may be included in a ratio of greater than about 50 mol % and less than or equal to about 100 mol % based on the total structural units. In an embodiment, the copolymer may be composed of Structural Unit (1) (i.e., a ratio of Structural Unit (1) to the total structural units=100 mol %). On the other hand, when the copolymer includes two or more types of Structural Units (1), a content of Structural Unit (1) means a total amount of Structural Units (1).

As described above, the copolymer according to an exemplary embodiment may be composed of Structural Unit (1) alone. Alternatively, the copolymer according to an exemplary embodiment may further include other structural units in addition to Structural Unit (1). Other structural units are not particularly limited as long as they do not impair the effect of the copolymer (especially high triplet energy level and low driving voltage). Specifically, a structural unit may be one of Group 4. Meanwhile, hereinafter, the structural unit represented in Group 4 is also referred to as "Structural Unit (2)."

[Group 4]

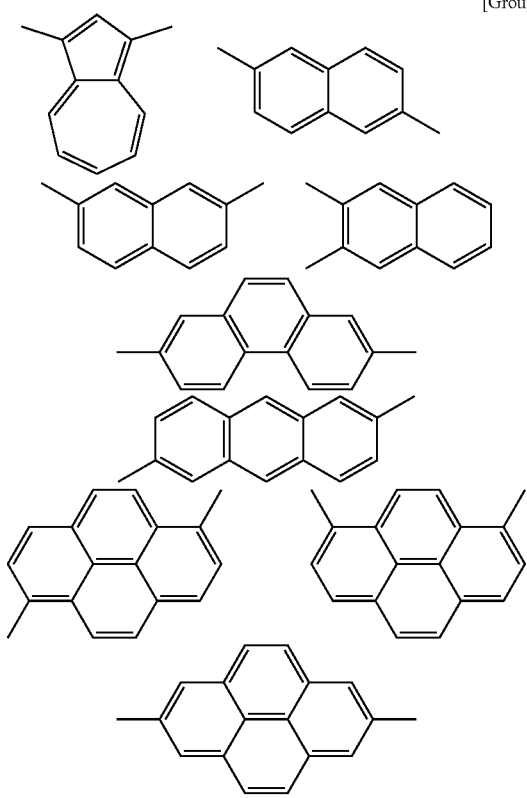

In Group 4,
a hydrogen atom of the aromatic ring may be replaced by a linear or branched hydrocarbon group having 1 to 14 carbon atoms (a C1 to C14 alkyl group, for example a C1 to C12 alkyl group), or an aromatic hydrocarbon group having 6 to 28 carbon atoms (a C6 to C28 aryl group, for example a C6 to C20 aryl group).

The composition of Structural Unit (2) in the copolymer of an exemplary embodiment is not particularly limited. In consideration of the ease of film forming by the obtained polymer compound and the new improvement effect of film strength, Structural Unit (2) may be included in an amount of greater than or equal to about 1 mol % and less than or equal to about 10 mol % based on the total structural units constituting the copolymer. On the other hand, when the copolymer includes two or more Structural Units (2), the content of Structural Unit (2) means the total amount of Structural Units (2).

The weight average molecular weight (Mw) of the copolymer is not particularly limited as long as the desired effect of the present disclosure is obtained. The weight average molecular weight (Mw) may be, for example, about 5,000 to about 300,000. With such a weight average molecular weight, it is possible to appropriately adjust the viscosity of the coating solution for forming a layer including the copolymer (for example, a hole injection layer, a hole transport layer), and to form a layer having a uniform film thickness.

The number average molecular weight (Mn) of the copolymer is not particularly limited as long as the desired effect of the present disclosure is obtained. The number average molecular weight (Mn) may be, for example, about 3,000 to about 100,000. With such a number average molecular weight, it is possible to appropriately adjust the viscosity of the coating liquid for forming a layer (for example, a hole injection layer, a hole transport layer) formed using the copolymer and to form a layer having a uniform film thickness.

In addition, a polydispersity (weight average molecular weight/number average molecular weight) of the copolymer of an exemplary embodiment may be, for example, about 1.2 to about 8.0.

Herein, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method. The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the copolymer are measured under the following conditions by SEC (Size Exclusion Chromatography) using polystyrene as a standard material.

Analysis equipment (SEC): Shimadzu Corporation, Prominence
Column: Polymer Laboratories, PLgel MIXED-B
Column temperature: 40° C.
Flow rate: 1.0 mL/min
Injection amount of sample solution: 20 μL (concentration: about 0.05 wt %)
Eluent: tetrahydrofuran (THF)
Detector (UV-VIS detector): Shimadzu Corporation, SPD-10AV
Standard sample: polystyrene.

The terminal end of the main chain of the copolymer of an exemplary embodiment is not particularly limited and is appropriately defined depending on the type of raw material used, but is usually a hydrogen atom.

The copolymer of an exemplary embodiment may be synthesized by using a known organic synthesis method. The specific synthesis method of the copolymer may be easily understood by a person of an ordinary skill in the art referring to the examples to be described later. Specifically, the copolymer of an exemplary embodiment may be prepared by a polymerization reaction using at least one monomer (1) represented by Chemical Formula 1', or a copolymerization reaction using one or more types of monomers (1) represented by Chemical Formula 1', and another monomer corresponding to the other structural unit (e.g., Structural Unit (2)).

[Chemical Formula 1']

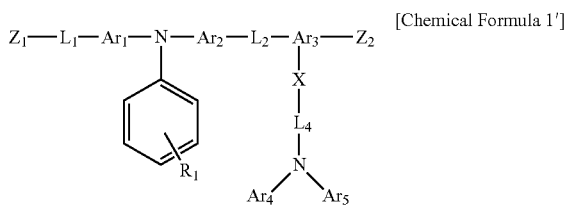

Alternatively, it may be prepared by a copolymerization reaction using one or more monomers (1-1) represented by Chemical Formula 1-1' and one or more monomers (1-2) represented by Chemical Formula 1-2' or a copolymerization reaction using one or more monomers (1-1) represented by Chemical Formula 1-1', one or more types of monomer (1-2) represented by Chemical Formula 1-2', and another monomer corresponding to the other structural unit (e.g., Structural Unit (2)).

[Chemical Formula 1-1']
[Chemical Formula 1-2']

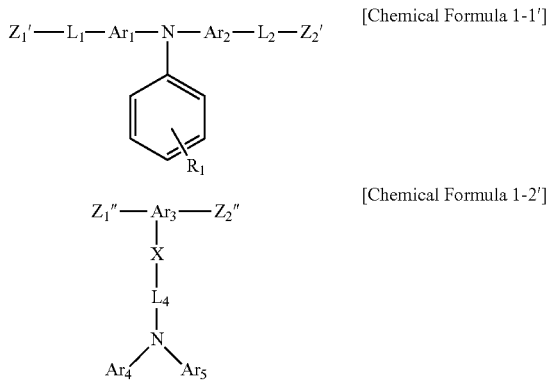

The monomers used for the polymerization of the copolymer according to the present disclosure may be synthesized by appropriately combining a known synthesis reaction, and their structures may be confirmed by known methods (for example, NMR, LC-MS, etc.).

In Chemical Formula 1', Chemical Formula 1-1', and Chemical Formula 1-2', $Ar_1$, $Ar_2$, $Ar_3$, $Ar_4$, $Ar_4$, $L_1$, $L_2$, X, $L_4$, and $R_1$ are the same as in Chemical Formula 1. $Z_1$, $Z_2$, $Z_1'$, $Z_2'$, $Z_1''$, and $Z_2''$ may each independently a halogen atom (a fluorine atom, a chlorine atom, a bromine atom, an iodine atom, particularly a bromine atom) or a functional group represented by Chemical Formula D. On the other hand, in Chemical Formula D, $R_A$ to $R_D$ may each independently be an alkyl group having 1 to 3 carbon atoms. In an embodiment, $R_A$ to $R_D$ may be a methyl group.

[Chemical Formula D]

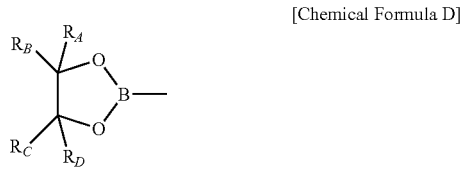

Meanwhile, $Z_1$ and $Z_2$ of Chemical Formula 1' may be the same or different from each other. Likewise, $Z_1'$ and $Z_2'$ in Chemical Formula 1-1' may be the same or different from each other. $Z_1''$ and $Z_2''$ in Chemical Formula 1-2' may be the same or different from each other. $Z_1''$ and $Z_2''$ of Chemical Formula 1-2' may be the same or different from each other. In an embodiment, $Z_1'$ and $Z_2'$ in Chemical Formula 1-1' may be the same; $Z_1''$ and $Z_2''$ in Chemical Formula 1-2' may be the same; and $Z_1'$ and $Z_2'$ of Chemical Formula 1-1' are different from $Z_1''$ and $Z_2''$ of Chemical Formula 1-2'.

The copolymer according to an exemplary embodiment has Structural Unit (1-1) and Structural Unit (1-2). Since the homopolymer of Structural Unit (1-1) exhibits a shallow HOMO level, the hole mobility from a hole injection layer (HIL) to a hole transport layer (HTL) may be improved. In addition, since the homopolymer of Structural Unit (1-2) exhibits a deep HOMO level, the hole mobility from the hole transport layer (HTL) to a light emitting layer may be improved. Accordingly, when the copolymer according to the embodiment is used as a hole transport material, excellent durability (luminescence life-span) may be accomplished. In addition, the copolymer according to an exemplary embodiment may have a high triplet energy level and simultaneously, a low driving voltage. Accordingly, when the copolymer according to an exemplary embodiment is used as a hole injection material or a hole transport material (particularly, a hole transport material), high hole mobility may be achieved even at a low driving voltage. Accordingly, an electroluminescent device (particularly, QLED) manufactured by using the copolymer according to the embodiment may exhibit excellent luminous efficiency.

The copolymer according to an exemplary embodiment may have a HOMO level of greater than or equal to about −5.7 eV and less than or equal to about −5.4 eV. In addition, the homopolymer of Structural Unit (1-1) according to an exemplary embodiment may have a HOMO level of greater than or equal to about −5.7 eV and less than or equal to about −5.4 eV. The homopolymer of Structural Unit (1-2) according to an exemplary embodiment may have a HOMO level of greater than or equal to about −6.1 eV and less than or equal to about −5.6 eV.

Herein, in one copolymer, the HOMO level of the homopolymer of Structural Unit (1-2) is deeper than that of the homopolymer of Structural Unit (1-1). In an electroluminescent device (particularly, a quantum dot electroluminescent device) using the copolymer having a segment in which Structural Unit (1-1) and Structural Unit (1-2) are alternately present is used for a hole transport layer (HTL), the hole transport ability from a hole injection layer (HIL) to a light emitting layer (accordingly, durability (luminescence life-span)) may be improved. In the present specification, the HOMO level employs a value measured by a method described in the following examples.

Electroluminescent Device Material

The copolymer according to an exemplary embodiment may be used as an electroluminescent device material. According to the above embodiment, an electroluminescent device material having excellent durability (luminescence life-span) is provided. Due to the copolymer of an exemplary embodiment, an electroluminescent device material having improved luminous efficiency, a high triplet energy level (current efficiency) and a low driving voltage is also provided.

In addition, the copolymer according to an exemplary embodiment exhibits high solubility in a solvent and high heat resistance. Therefore, the copolymer may be easily made into a film (thin film) by the wet (coating) method. Accordingly, in another embodiment, an electroluminescent device material including the aforementioned copolymer is provided.

In addition, the use of the copolymer as electroluminescent device material is provided.

Electroluminescent Device

As described above, the copolymer according to an exemplary embodiment may be used for an electroluminescent device. In other words, an electroluminescent device includes a pair of electrodes and one or more organic layers between the electrodes and including the copolymer or the electroluminescent device material of an exemplary embodiment. Such an electroluminescent device may exhibit improved luminous efficiency (especially excellent luminous efficiency with a low driving voltage). Moreover, such an electroluminescent device may exhibit high luminous efficiency (especially excellent luminous efficiency with a low drive voltage).

Accordingly, according to an embodiment, an electroluminescent device includes a first electrode and a second electrode, and one or more organic layers between the first electrode and the second electrode, wherein at least one layer of the organic layer includes the aforementioned copolymer. The purpose (or effect) of the present disclosure may also be achieved by the electroluminescent device according to an exemplary embodiment. In an embodiment, the electroluminescent device further includes a light emitting layer between the electrodes and including a light emitting material capable of emitting light from triplet excitons. On the other hand, the electroluminescent device of an exemplary embodiment may be an example of the electroluminescent device according to the present disclosure.

In addition, an exemplary embodiment provides a method of manufacturing an electroluminescent device that includes a pair of electrodes and at least one organic layer disposed between the electrodes and including the copolymer according to an exemplary embodiment. At least one layer of the organic layer is formed by a coating method. In addition, by this method, an exemplary embodiment provides an electroluminescent device in which at least one layer of the organic layer is formed by a coating method.

The aforementioned copolymer, and electroluminescent device material (EL device material) according to an exemplary embodiment (hereinafter collectively, also referred to as "copolymer/EL device material") may have improved solubility in an organic solvent. For this reason, the copolymer/EL device material according to an exemplary embodiment may be used for manufacturing devices (especially thin films) by a coating method (wet process). An exemplary embodiment provides a liquid composition including the copolymer and a solvent or a dispersion medium. Such a liquid composition is an example of the liquid composition according to the present disclosure.

In addition, as described above, the electroluminescent device material according to the embodiment may be used for the manufacture of devices (particularly thin films) by a coating method (wet process). In view of the above, an exemplary embodiment provides a thin film including the aforementioned copolymer. Such a thin film is an example of the thin film according to the present disclosure.

Further, the EL device material according to an exemplary embodiment has improved hole injection properties and hole mobility. For this reason, it may be also desirably used in the formation of any one organic layer of a hole injection material, a hole transport material, or a light emitting material (host). Among them, from the viewpoint of hole transportability, it may be used as a hole injection material or a hole transport material, and particularly a hole transport material.

In other words, an exemplary embodiment provides a composition including the copolymer and at least one material of a hole transport material, an electron transport material, a light emitting material, or a combination thereof. Herein, the light emitting material included in the composition is not particularly limited, and may include an organometallic complex (luminescent organometallic complex compound) or semiconductor nanoparticles (semiconductor inorganic nanoparticles).

Hereinafter, referring to FIG. 1, an electroluminescent device according to an exemplary embodiment is described in detail. FIG. 1 is a schematic view showing an electroluminescent device according to an exemplary embodiment. In addition, in this specification, an "electroluminescent device" may be abbreviated as "EL device."

As shown in FIG. 1, the EL device 100 according to an exemplary embodiment includes a substrate 110, a first electrode 120 on the substrate 110, a hole injection layer 130 on the first electrode 120, a hole transport layer 140 on the hole injection layer 130, a light emitting layer 150 on hole transport layer 140, an electron transport layer 160 on the light emitting layer 150, an electron injection layer 170 on the electron transport layer 160, and a second electrode 180 on the electron injection layer 170.

Herein, the copolymer/EL device material according to an exemplary embodiment is included in, for example, any one organic layer (organic film) disposed between the first electrode 120 and the second electrode 180. Specifically, the copolymer/EL device material may be included in the hole injection layer 130 as a hole injection material, in the hole transport layer 140 as a hole transport material, or in the light emitting layer 150 as a light emitting material (host). The copolymer/EL device material may be included in the hole injection layer 130 as a hole injection material or in the hole transport layer 140 as a hole transport material. The copolymer/EL device material may be included in the hole transport layer 140 as a hole transport material. That is, in an embodiment, the organic layer including the copolymer/EL device material may be a hole transport layer, a hole injection layer, or a light emitting layer. In an embodiment, the organic layer including the copolymer/EL device material may be a hole transport layer or a hole injection layer. In an embodiment, the organic layer including the copolymer/EL device material may be a hole transport layer.

In addition, the organic layer including the copolymer according to an exemplary embodiment/EL device material may be formed by a coating method (solution coating method). Specifically, the organic layer may be formed by a solution coating method such as a spin coating method, a casting method, a micro gravure coating method, a gravure coating method, a bar coating method, a roll coating method, a wire bar coating method, a dip coating method, a spray coating method, a screen-printing method, a flexographic printing method, an offset printing method, an inkjet printing method, and the like.

As the solvent used in the solution coating method, any solvent may be used as long as it is capable of dissolving the copolymer/EL device material, and the solvent may be appropriately selected according to types of the copolymer. For example, the solvent may be toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the copolymer may desirably be greater than or equal to about 0.1 wt % and less than or equal to about 10 wt %, or greater than or equal to about 0.5 wt % and less than or equal to about 5 wt %.

In addition, the film-formation method of layers other than the organic layer including the copolymer/EL device material/is not specifically limited. The layers other than the organic layer including the copolymer/EL device material according to an exemplary embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, the first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, the hole injection layer 130 is formed. The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]biphenyl-4,4'-diamine (DNTPD), copper phthalocyanine, 4,4',4''-tris(3-methylphenylphenylamino)triphenylamine (m-MTDATA), N,N'-di(1-naphthyl)-N,N'-diphenylbenzidine (NPB), 4,4',4''-tris(diphenylamino)triphenylamine (TDATA), 4,4',4''-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

On the hole injection layer 130, the hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the copolymer according to an exemplary embodiment. According to this method, the durability (luminescence life-span) of EL device 100 may be extended. In addition, the performance (luminous efficiency) of the EL device 100 may be improved. In addition, since the hole transport layer may be formed by the solution coating method, a large area may be formed efficiently. However, when one organic layer of the EL device 100 includes the copolymer according to an exemplary embodiment, the hole transport layer 140 may be formed of a known hole transport material. The known hole transport material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4''-tris(N-carbazolyl) triphenylamine (TCTA), and N,N'-di(1-naphthyl)-N,N'-diphenylbenzidine (NPB).

On the hole transport layer 140, the light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. The light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving life-span of the EL device 100 may be further improved.

The light emitting layer 150 is not particularly limited and may have a known configuration. In an embodiment, the light emitting layer may include a semiconductor nanoparticle or an organometallic complex. That is, in an embodiment of the present disclosure, the organic layer may include a light emitting layer including semiconductor nanoparticles or organometallic complexes. When the light emitting layer includes semiconductor nanoparticles, the EL device may be a quantum dot electroluminescent device (QLED) or a quantum dot light emitting diode. In addition, when the light emitting layer includes an organometallic complex, the EL device is an organic electroluminescent device (OLED).

When the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organometal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may include a semiconductor material of a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound of CdSe, CdTe, ZnS, ZnSe, ZnTe, ZnO, HgS, HgSe, HgTe, or a mixture thereof; a ternary compound of CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a mixture thereof, a quaternary compound of CdZnSeS, CdZnSeTe, CdZnSTe, CdHgSeS, CdHgSeTe, CdHgSTe, HgZnSeS, HgZnSeTe, HgZnSTe, or a mixture thereof; or a combination thereof.

The Group III-V semiconductor compound is not particularly limited, but includes, for example, a binary compound of GaN, GaP, GaAs, GaSb, AlN, AlP, AlAs, AlSb, InN, InP, InAs, InSb, or a mixture thereof; a ternary compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof; or a combination thereof.

The Group IV-VI semiconductor compound is not particularly limited, but includes, for example, a binary compound of SnS, SnSe, SnTe, PbS, PbSe, PbTe, or a mixture thereof; a ternary compound of SnSeS, SnSeTe, SnSTe, PbSeS, PbSeTe, PbSTe, SnPbS, SnPbSe, SnPbTe, or a mixture thereof; a quaternary compound of SnPbSSe, SnPbSeTe, SnPbSTe, or a mixture thereof; or a combination thereof.

The Group IV element or compound is not particularly limited, but includes, for example, a single element compound of Si, Ge, or a mixture thereof; a binary compound of SiC, SiGe, or a mixture thereof; or a combination thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe)-shell (ZnS) structure is described. First, crystals are formed by injecting core (CdSe) precursor materials of (CH$_3$)$_2$Cd (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in embodiments (OLED) in which the light emitting layer includes an organometallic complex, the light emitting layer 150 may include, for example 6,9-diphenyl-9'-(5'-phenyl-[1,1':3',1''-terphenyl]-3-yl)3,3'-bi[9H-carbazole], 3,9-diphenyl-5-(3-(4-phenyl-6-(5'-phenyl-[1,1':3',1''-terphenyl]-3-yl)-1,3,5,-triazin-2-yl)phenyl)-9H-carbazole, 9,9'-diphenyl-3,3'-bi[9H-carbazole], tris(8-quinolinato)aluminum (Alq$_3$), 4,4'-bis(carbazol-9-yl)biphenyl (CBP), poly (n-vinyl carbazole (PVK), 9,10-di(naphthalene)anthracene (ADN), 4,4',4''-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)-2,2'-dimethyl-bipheny (dmCBP), and the like, as a host material.

In addition, the light emitting layer 150 may include, for example, perylene or a derivative thereof, rubrene or a derivative thereof, coumarin or a derivative thereof, 4-dicyanomethylene-2-(dimethylaminostyryl)-6-methyl-4H-pyran (DCM) or a derivative thereof, an iridium (Ir) complex such as bis[2-(4,6-difluorophenyl)pyridinate]picolinate iridium (III) (Flrpic)), bis(1-phenylisoquinoline) (acetylacetonate)iridium (III) (Ir(piq)$_2$(acac)), tris(2-phenylpyridine) iridium (III) r(ppy)$_3$), tris(2-(3-p-xylyl)phenyl)pyridine iridium (III), an osmium (Os) complex, a platinum complex, and the like, as a dopant material. Among these, it is desirable that the light emitting material is a light emitting organometallic complex compound.

A method for forming the light emitting layer is not particularly limited. It may be formed by coating (solution coating method) a coating liquid including a semiconductor nanoparticle or an organometallic complex. At this time, it is desirable to select a solvent which does not dissolve the materials (hole transport material, particularly the copolymer or polymeric composition) in the hole transport layer as the solvent constituting the coating liquid.

On the light emitting layer 150, the electron transport layer 160 is formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate, Liq), tris(8-quinolinato) aluminum (Alq3) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1, 3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene (TPBI). The electron transport material may be used alone or as a mixture of two or more thereof.

On the electron transport layer 160, the electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide (Li$_2$O), or barium oxide (BaO).

On the electron injection layer 170, the second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 is may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide (In$_2$O$_3$—SnO$_2$), and indium zinc oxide (In$_2$O$_3$—ZnO).

The EL device 100 has been described above as an example of the electroluminescent device. The EL device 100 according to an exemplary embodiment may further improve durability (luminescence life-span) by including an organic layer (particularly a hole transport layer or a hole injection layer) including the copolymer. In addition, the luminous efficiency (current efficiency) may be further improved and the driving voltage may be reduced.

The stacked structure of the EL device 100 according to an exemplary embodiment is not limited to the above embodiments. The EL device 100 according to an exemplary embodiment may have another known stacked structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the copolymer according to an exemplary embodiment may be applied to electroluminescent devices other than the QLED or OLED. Other electroluminescent devices including the copolymer according to an exemplary embodiment may include, but are not particularly limited to, for example, organic inorganic perovskite light emitting devices.

EXAMPLES

The embodiments are described in more detail using the following examples and comparative examples. However, the technical range of the present disclosure is not limited to the following examples. In the following examples, unless specifically described, each operation was performed at room temperature (25° C.). In addition, unless specifically stated, "%" and "a part" mean "wt %" and "a part by weight", respectively.

Synthesis Example 1

Synthesis of Intermediate 1-1

Intermediate 1-1 is synthesized according to Reaction Scheme 1-1.

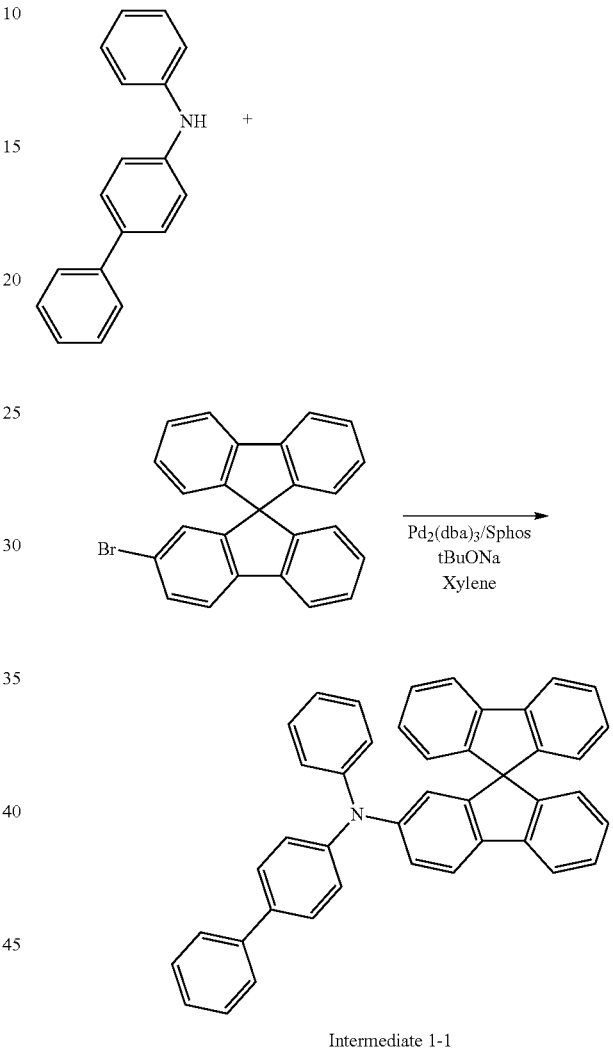

[Reaction Scheme 1-1]

Intermediate 1-1

Under an argon atmosphere, 2-bromo-9,9'-spirobi[9H-fluorene] (Tokyo Chemical Industry Co., Ltd.) (5.0 g, 12.6 mmol), N-phenyl-4-biphenyl amine (3.1 g, 12.6 mmol), sodium tert-butoxide (tBuONa) (2.42 g, 25.2 mmol), and anhydrous xylene (100 mL) are placed in a reactor and then, stirred for 30 minutes. Subsequently, tris(dibenzylideneacetone)dipalladium (Pd$_2$(dba)$_3$) (0.173 g, 0.189 mmol) and 2-dicyclohexylphosphino-2',6'-dimethoxy biphenyl (SPhos) (0.155 g, 0.378 mmol) are added thereto and then, heated and stirred under reflux for 4 hours.

When a reaction is completed, the reaction mixture is cooled down to room temperature and filtered through CELITE, and a filtrate therefrom is concentrated. The concentrated residue is twice washed by adding 2-propanol thereto, obtaining 7.1 g of a solid (Intermediate 1-1) (Yield: 99%).

Synthesis of Intermediate 1-2

Intermediate 1-2 is synthesized according to Reaction Scheme 1-2.

[Reaction Scheme 1-2]

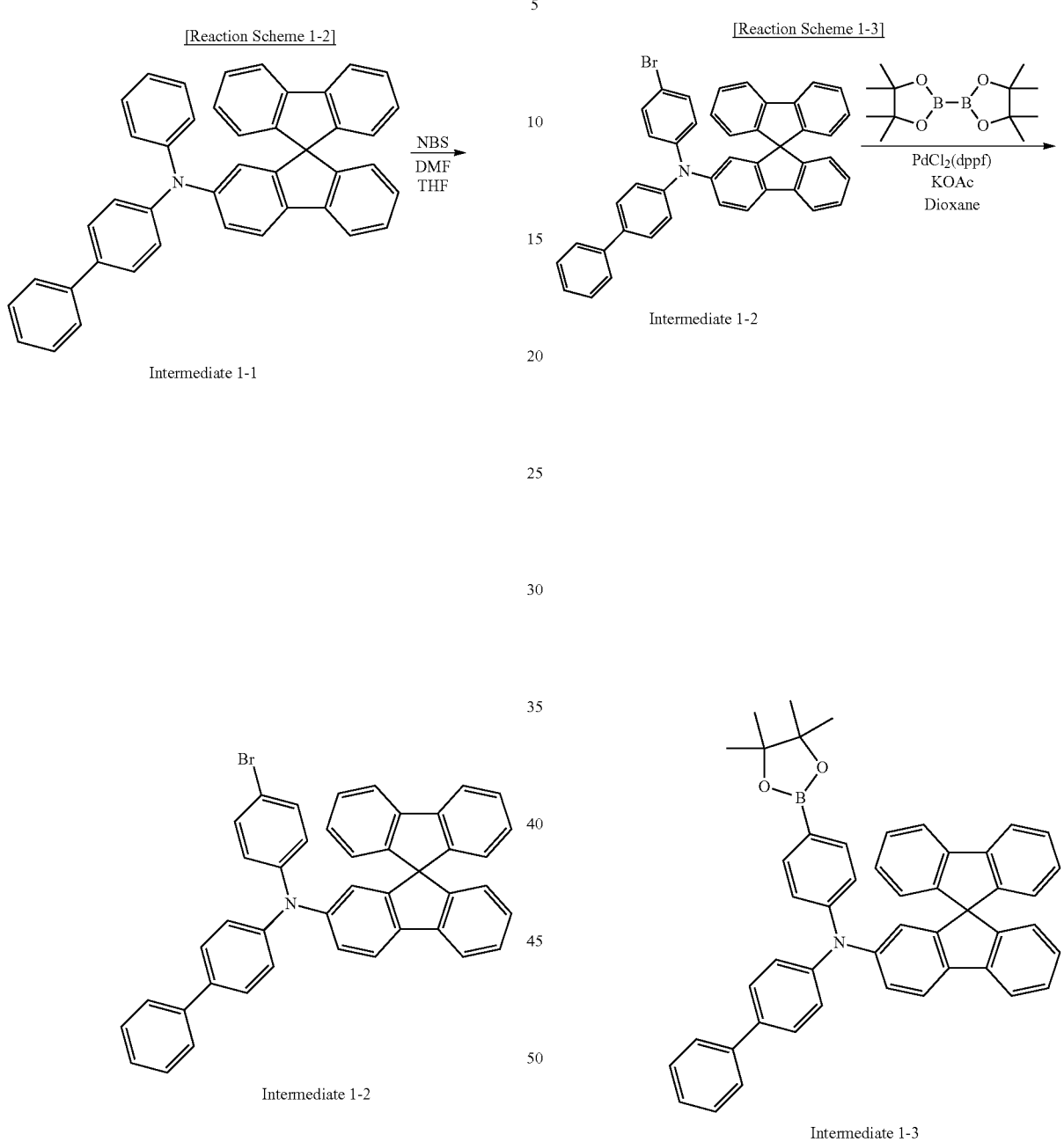

Intermediate 1-1

Intermediate 1-2

Under an argon atmosphere, Intermediate 1-1 (11.0 g, 20.5 mmol), N,N-dimethyl formamide (DMF) (200 mL), and tetrahydrofuran (THF) (200 mL) are placed in a reactor and then, stirred at room temperature. N-bromosuccinimide (NBS) (3.7 g, 20.5 mmol) dissolved in DMF (200 mL) is added thereto and then, stirred for 14 minutes. Subsequently, after adding toluene (100 mL) thereto, the mixture is washed with water (200 mL) and dried with magnesium sulfate. After distilling off a solvent therefrom under a reduced pressure, the residue is purified with column chromatography, obtaining 10.6 g of a solid (Intermediate 1-2) (Yield: 80%).

Synthesis of Intermediate 1-3

Intermediate 1-3 is synthesized according to Reaction Scheme 1-3.

[Reaction Scheme 1-3]

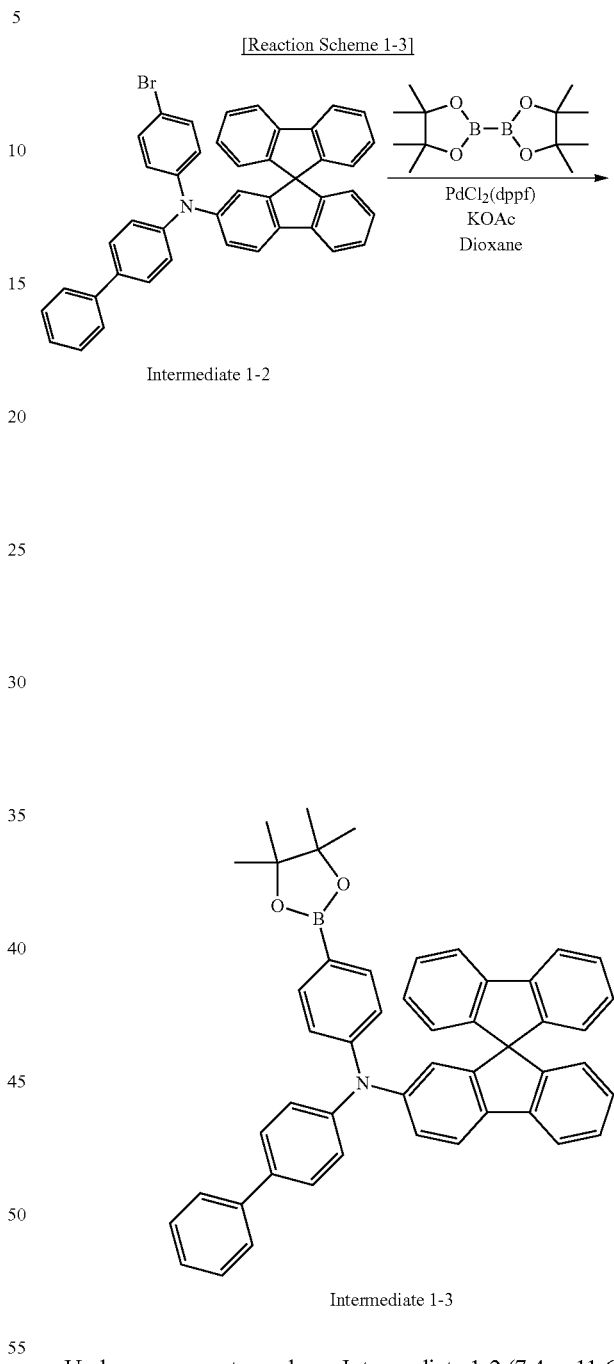

Intermediate 1-2

Intermediate 1-3

Under an argon atmosphere, Intermediate 1-2 (7.4 g, 11.6 mmol), bis(pinacolato)diboron (8.8 g, 34.8 mmol), potassium acetate (3.0 g, 34.7 mmol), [bis(diphenyl phosphino) ferrocene]dichloro palladium (PdCl$_2$(dppf)) (0.25 g, 0.35 mmol), and 1,4-dioxane (70 mL) are placed in a reactor and then mixed. After stirring the mixture under reflux for 6 hours, when a reaction is completed, the reaction mixture is allowed to cool down to room temperature. Subsequently, the reaction mixture is filtered with CELITE to separate impurities therefrom. After distilling off a solvent from the filtrate, the residue is purified by column chromatography, obtaining Intermediate 1-3 (7.8 g, Yield: 98%).

Synthesis of Compound 1

Compound 1 is synthesized according to Reaction Scheme 1-4.

[Reaction Scheme 1-4]

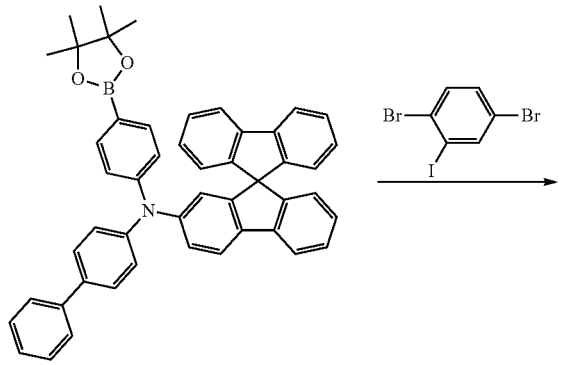

Intermediate 1-3

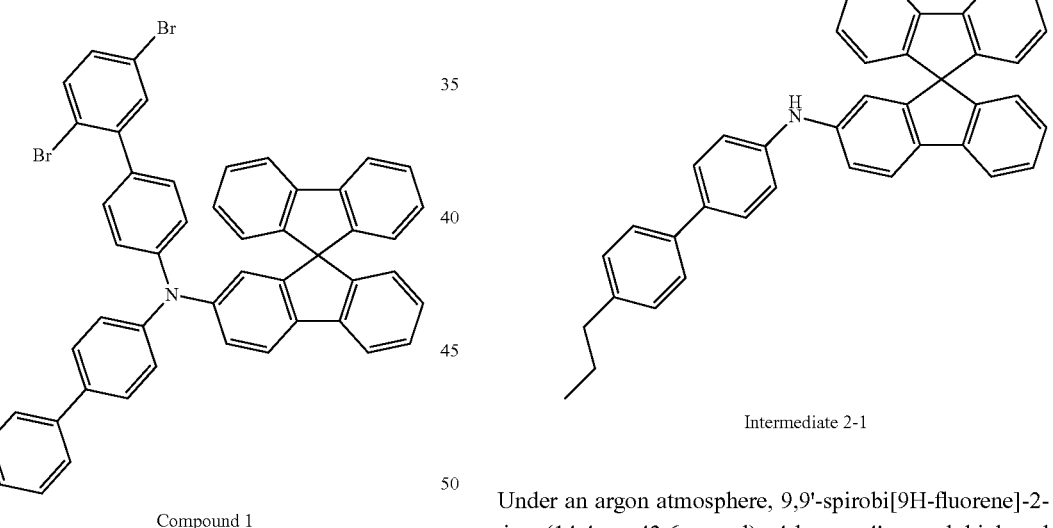

Compound 1

Under an argon atmosphere, Intermediate 1-3 (7.8 g, 11.4 mmol), 1,4-dibromo-2-iodo benzene (7.0 g, 19.3 mmol), sodium carbonate (2.0 g, 19.3 mmol), 1,4-dioxane (160 mL), and water (80 mL) are placed in a reactor and then stirred for 30 minutes. Subsequently, tetrakis(triphenylphosphine)palladium (0) (Pd[PPh$_3$]$_4$) (0.65 g, 0.57 mmol) is added thereto and then, heated and stirred under reflux for 7 hours. When a reaction is completed, after cooling down to room temperature, the sample is transferred to a separatory funnel and extracted with toluene. An organic layer therefrom is dried with MgSO$_4$, filtered, and concentrated. The concentrated residue is purified by silica gel column chromatography, obtaining 3.1 g of a white solid (Compound 1) (Yield: 34%).

Synthesis Example 2

Synthesis of Intermediate 2-1

Intermediate 2-1 is synthesized according to Reaction Scheme 2-1.

[Reaction Scheme 2-1]

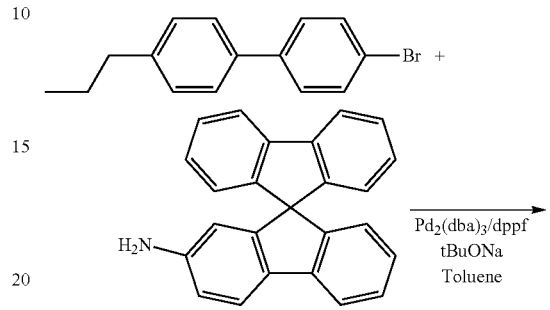

Intermediate 2-1

Under an argon atmosphere, 9,9'-spirobi[9H-fluorene]-2-amine (14.4 g, 43.6 mmol), 4-bromo-4'-propyl biphenyl (10.0 g, 36.3 mmol), sodium tert-butoxide (tBuONa) (3.5 g, 36.3 mmol), and 200 mL of anhydrous toluene are placed in a reactor and then, stirred for 30 minutes.

Then, tris(dibenzylideneacetone)dipalladium (Pd$_2$(dba)$_3$) (0.332 g, 0.363 mmol), and 1,1'-bis(diphenyl phosphino) ferrocene (dppf) (0.40 g, 0.727 mmol) are added thereto and then, heated and stirred under reflux for 5 hours.

When a reaction is completed, the reaction mixture is allowed to cool down to room temperature. Subsequently, the reaction mixture is filtered with CELITE to separate impurities. After distilling off a solvent therefrom, a filtrate therefrom is purified through column chromatography, obtaining Intermediate 2-1 (16.5 g, Yield: 86%).

Synthesis of Intermediate 2-2

Intermediate 2-2 is synthesized according to Reaction Scheme 2-2.

[Reaction Scheme 2-2]

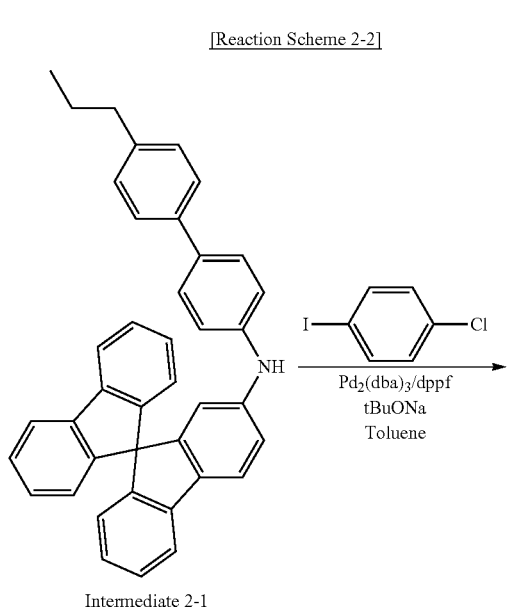

Intermediate 2-1

Intermediate 2-2

Under an argon atmosphere, Intermediate 2-1 (12.0 g, 22.8 mmol), iodo chlorobenzene (10.9 g, 45.6 mmol), sodium tert-butoxide (tBuONa) (2.4 g, 25.1 mmol), and anhydrous toluene (200 mL) are placed in a reactor and then, stirred for 30 minutes. Subsequently, tris(dibenzylideneacetone)dipalladium ($Pd_2(dba)_3$) (1.05 g, 1.14 mmol) and 1,1'-bis(diphenyl phosphino)ferrocene (dppf) (1.27 g, 2.28 mmol) are added thereto and then, heated and stirred under reflux for 9 hours.

When a reaction is completed, the reaction mixture is cooled down to room temperature and filtered with CELITE, and a filtrate therefrom is concentrated. The concentrated residue is purified by silica gel column chromatography, obtaining 11.3 g of a solid (Intermediate 2-2) (Yield: 78%).

Synthesis of Intermediate 2-3

Intermediate 2-3 is synthesized according to Reaction Scheme 2-3.

[Reaction Scheme 2-3]

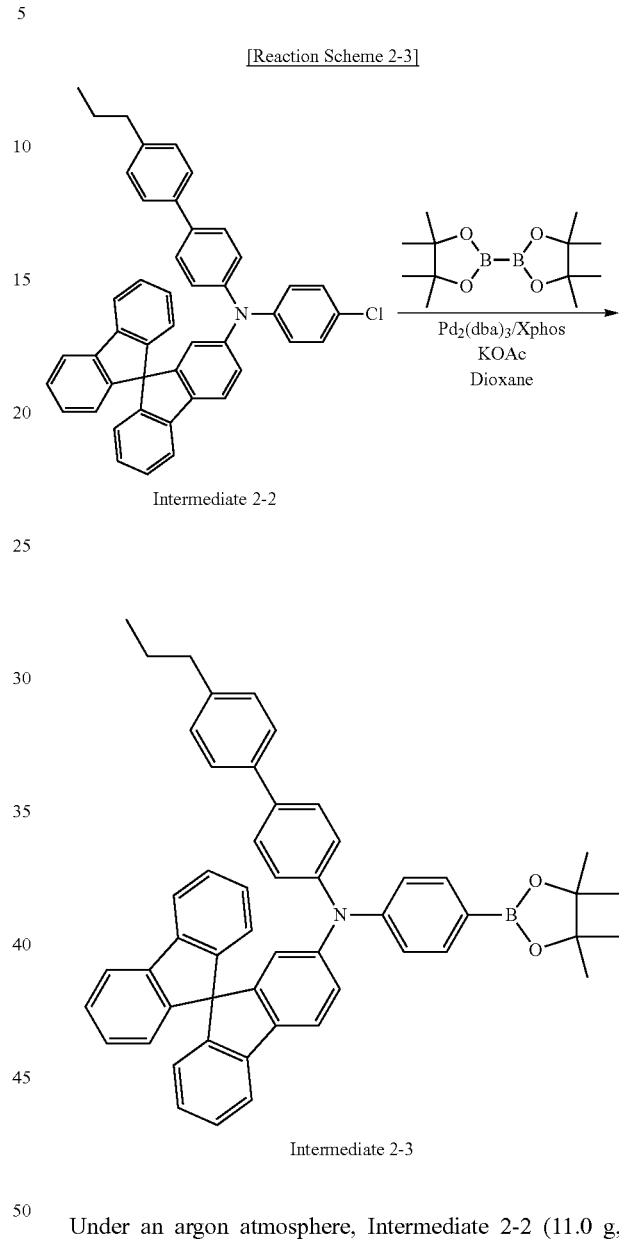

Intermediate 2-2

Intermediate 2-3

Under an argon atmosphere, Intermediate 2-2 (11.0 g, 17.3 mmol), bis(pinacolato)diboron (8.8 g, 34.6 mmol), potassium acetate (5.1 g, 51.9 mmol), and dioxane (80 mL) are placed in a reactor and stirred for 30 minutes. Subsequently, tris(dibenzylideneacetone)dipalladium ($Pd_2(dba)_3$) (0.47 g, 0.52 mmol), and 2-dicyclohexylphosphino-2',4',6'-triisopropylbiphenyl (2-dicyclohexylphosphino-2',4',6'-triisopropylbiphenyl) (Xphos) (0.99 g, 2.08 mmol) are added thereto and then, heated and stirred under reflux for 8 hours.

When the reaction is completed, the reaction mixture is allowed to cool down to room temperature. Then, the reaction mixture is filtered with CELITE to separate impurities.

After distilling off a solvent therefrom, the residue is purified by column chromatography, obtaining Intermediate 2-3 (4.6 g, Yield: 37%).

Synthesis of Compound 2

Compound 2 is synthesized according to Reaction Scheme 2-4.

[Reaction Scheme 2-4]

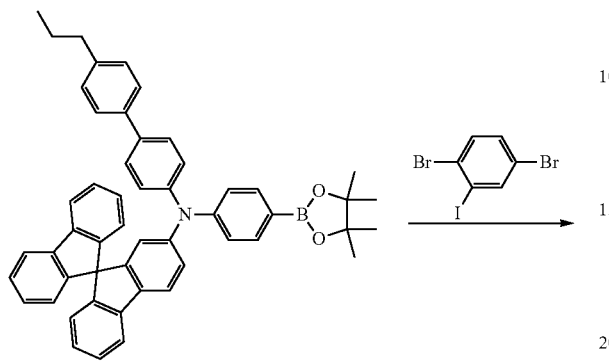

Intermediate 2-3

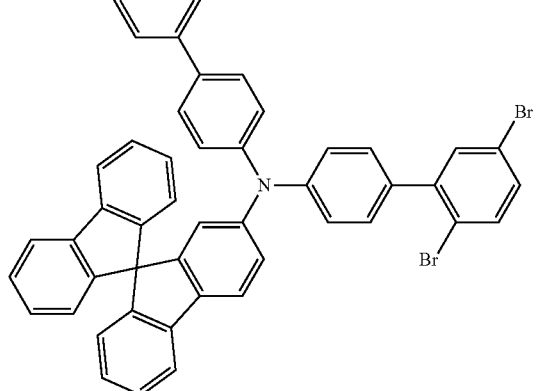

Compound 2

Under an argon atmosphere, Intermediate 2-3 (4.6 g, 6.3 mmol), 1,4-dibromo-2-iodo benzene (3.4 g, 9.5 mmol), sodium carbonate (1.0 g, 9.5 mmol), dioxane (60 mL), and water (30 mL) are placed in a reactor and then stirred for 30 minutes. Subsequently, tetrakis(triphenylphosphine)palladium (0) (Pd[PPh$_3$]$_4$) (0.36 g, 0.32 mmol) is added thereto and then, heated and stirred under reflux for 13 hours.

When a reaction is completed, the reaction mixture is cooled down to room temperature, and a sample is transferred to a separatory funnel and extracted with toluene. An organic layer therefrom is dried with MgSO$_4$, filtered, and concentrated. The concentrated residue is purified by silica gel column chromatography, obtaining 4.2 g of a white solid (Compound 2) (Yield: 75%).

Synthesis Example 3

Synthesis of Intermediate 3-1

Intermediate 3-1 is synthesized according to Reaction Scheme 3-1.

[Reaction Scheme 3-1]

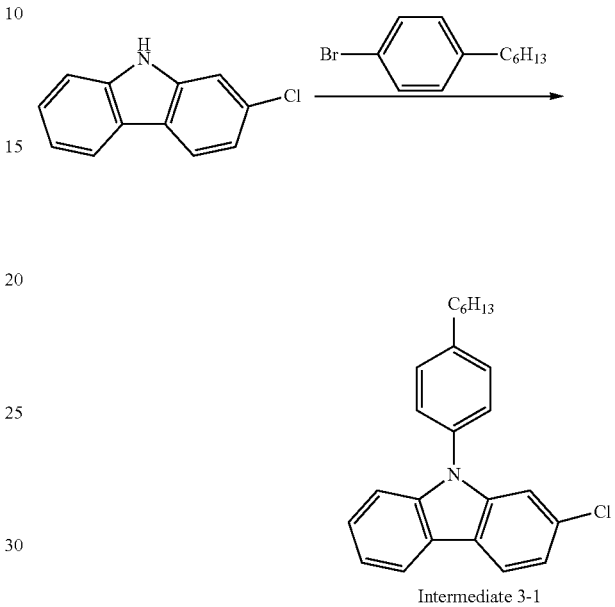

Intermediate 3-1

2-chloro-carbazole (42.2 g, 0.209 mol), 4-bromohexyl-benzene (50.2 g, 0.208 mol), tris(dibenzylideneacetone)dipalladium (Pd$_2$(dba)$_3$) (9.57 g), tri-tert-butylphosphonium tetrafluoroborate (t-Bu$_3$P·BF$_4$) (4.55 g), sodium tert-butoxide (tBuONa) (40.2 g), and toluene (500 mL) are placed in a 1 L four-necked flask and then, heated and stirred at 100° C. under a nitrogen atmosphere for 8 hours.

The resultant is cooled down to room temperature (25° C.) and filtered with CELITE. After distilling off a solvent from the filtrate under a reduced pressure, the residue is purified by column chromatography, obtaining Intermediate 3-1 (56.8 g, 0.157 mol).

Synthesis of Intermediate 3-2

Intermediate 3-2 is synthesized according to Reaction Scheme 3-2.

[Reaction Scheme 3-2]

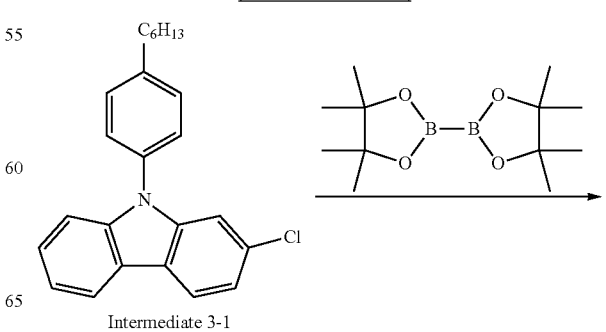

Intermediate 3-1

-continued

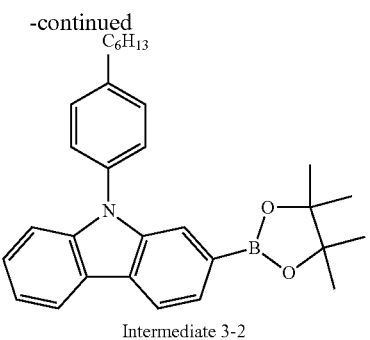

Intermediate 3-2

Under an argon atmosphere, Intermediate 3-1 (6.3 g, 17.3 mmol), bis(pinacolato)diboron (8.8 g, 34.6 mmol), potassium acetate (5.1 g, 51.9 mmol), and dioxane (80 mL) are placed in a reactor and stirred for 30 minutes. Subsequently, tris(dibenzylideneacetone)dipalladium ($Pd_2(dba)_3$) (0.47 g, 0.52 mmol), and 2-dicyclohexylphosphino-2',4',6'-triisopropylbiphenyl (Xphos) (0.99 g, 2.08 mmol) are added thereto and then, heated and stirred under reflux for 8 hours.

When a reaction is completed, the reaction mixture is allowed to cool down to room temperature. Then, the reaction mixture is filtered with CELITE to separate impurities.

After distilling off a solvent from the filtrate, the residue is purified by column chromatography, obtaining Intermediate 3-2 (4.7 g, Yield: 60%).

Synthesis of Compound 3

Compound 3 is synthesized according to Reaction Scheme 3-2.

[Reaction Scheme 3-2]

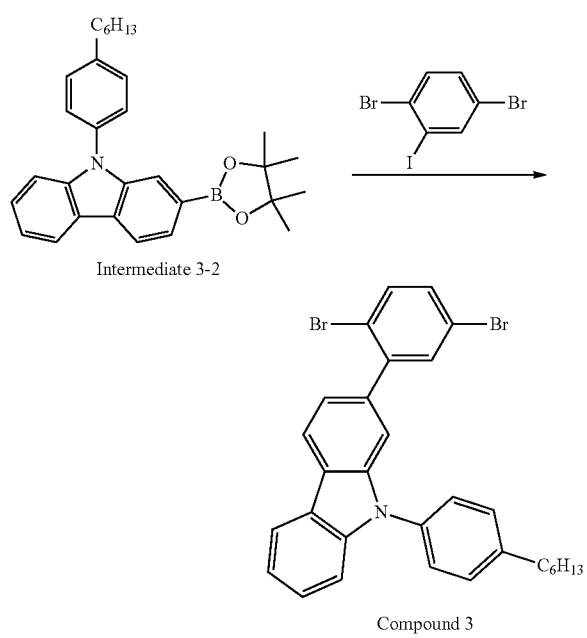

Compound 3

Under an argon atmosphere, Intermediate 3-2 (5.0 g, 11.0 mmol), 1,4-dibromo-2-iodo benzene (6.0 g, 16.5 mmol), sodium carbonate (1.75 g, 16.5 mmol), dioxane (60 mL), and water (30 mL) are placed in a reactor and stirred for 30 minutes. Subsequently, tetrakis(triphenylphosphine)palladium (0) ($Pd[PPh_3]_4$) (0.64 g, 0.55 mmol) is added thereto and then, heated and stirred under reflux for 21 hours.

When a reaction is completed, after cooling down to room temperature, the sample is transferred to a separatory funnel and then extracted with toluene. An organic layer therefrom is dried with $MgSO_4$, filtered, and concentrated. The concentrated residue is purified by silica gel column chromatography, obtaining 4.5 g of a white solid (Compound 3) (Yield: 72%).

Synthesis Example 4

Synthesis of Compound 4

Compound 4 is synthesized according to Reaction Scheme 4-1.

[Reaction Scheme 4-1]

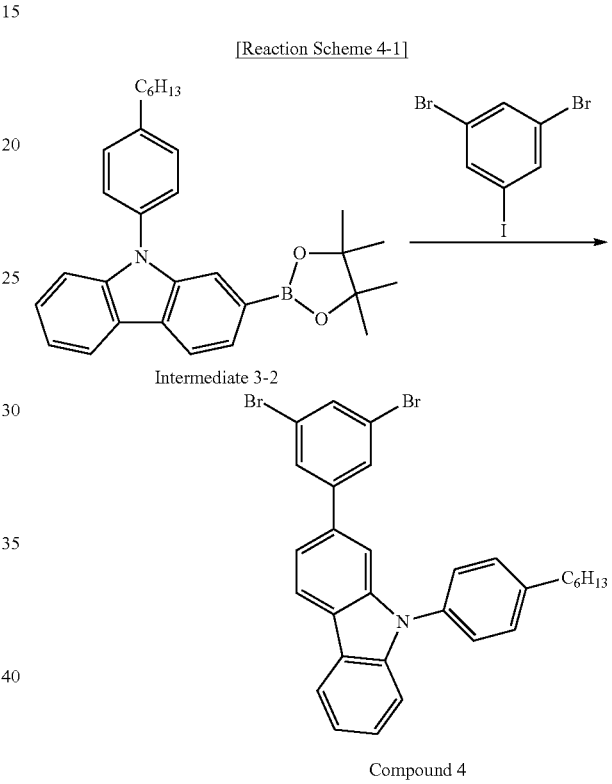

Compound 4

Under an argon atmosphere, Intermediate 3-2 (5.0 g, 11.0 mmol), 1,5-dibromo-3-iodo benzene (6.0 g, 16.5 mmol), sodium carbonate (1.75 g, 16.5 mmol), dioxane (60 mL), and water (30 mL) are placed in a reactor and then stirred for 30 minutes. Subsequently, tetrakis(triphenylphosphine)palladium (0) ($Pd[PPh_3]_4$) (0.64 g, 0.55 mmol) is added thereto and then, heated and stirred under reflux for 21 hours.

When a reaction is completed, after cooling down to room temperature, the sample is transferred to a separatory funnel and extracted with toluene. An organic layer therefrom is dried with $MgSO_4$, filtered, and concentrated. The concentrated residue is purified by silica gel column chromatography, obtaining 4.9 g of a white solid (Compound 4) (Yield: 79%).

Example 1

Synthesis of Copolymer A-1

Under an argon atmosphere, Compound 1 (1.697 g) synthesized in Synthesis Example 1, 4-(1-methylpropyl)-N,N-bis[4-(4,4,5,5-tetramethyl-1,3,2-dioxaborolan-2-yl)phenyl]-benzenamine (1.183 g), palladium acetate (9.6 mg), tris(2-methoxy phenyl)phosphine (28.8 mg), toluene (58 mL), and a 20 wt % tetraethylammonium hydroxide aqueous solution (11.0 2 g) are placed in a reactor and then refluxed for 8 hours.

Subsequently, phenyl boronic acid (260 mg), bis(triphenylphosphine)palladium (II) dichloride (90.1 mg), and a 20 wt % tetraethylammonium hydroxide aqueous solution (11.02 g) are added thereto and then, heated under reflux for 7 hours.

Subsequently, after removing an aqueous layer, sodium N,N-diethyldithiocarbamate trihydrate (6.86 g) and ion exchanged water (40 mL) are added thereto and then, stirred at 85° C. for 2 hours. After separating an organic layer from the aqueous layer, the organic layer is washed with water, a 3 wt % acetic acid aqueous solution, and water. The organic layer is added dropwise to methanol to precipitate a polymer compound, and then the polymer compound is filtered and dried, obtaining a solid.

This solid is dissolved in toluene and passed through a column charged with silica gel/alumina, and a solvent is distilled off therefrom under a reduced pressure. The obtained liquid is added dropwise to methanol, and a solid precipitated therein is filtered and dried, obtaining Copolymer A-1 (1.48 g).

Copolymer A-1 is measured with respect to a weight average molecular weight (Mw) and polydispersity (Mw/Mn) by size exclusion chromatography (SEC). As a result, the weight average molecular weight (Mw) and the polydispersity (Mw/Mn) of Copolymer A-1 are respectively 72,800 and 3.17.

The copolymer A-1 includes a structural unit of Chemical Formula A-1 from an input ratio of the monomers and is presumed to be a polymer compound in which Structural Unit (1-1) and Structural Unit (1-2) are alternately present.

[Chemical Formula A-1]

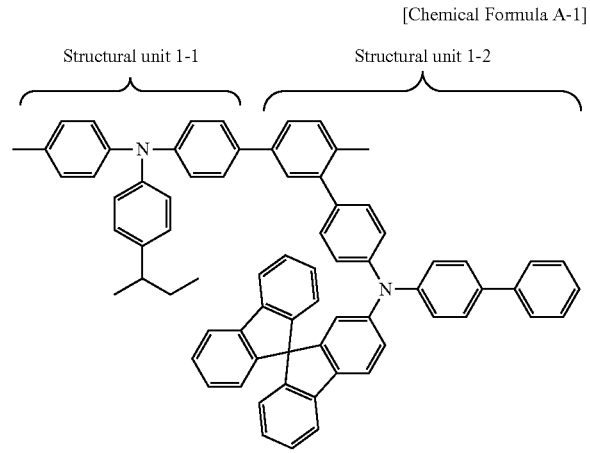 [SMILES: CCC(C)c1ccc(N(c2ccc(C)cc2)c2ccc(-c3ccc(C)c(-c4ccc(N(c5ccc(-c6ccccc6)cc5)c5ccc6c(c5)C5(c7ccccc7-c7ccccc75)c5ccccc5-6)cc4)c3)cc2)cc1]

Example 2

Synthesis of Copolymer A-2

Under an argon atmosphere, Compound 2 (1.710 g) synthesized in Synthesis Example 2, 4-(1-methylpropyl)-N,N-bis[4-(4,4,5,5-tetramethyl-1,3,2-dioxaborolan-2-yl)phenyl]-benzenamine (1.132 g), palladium acetate (9.2 mg), and tris(2-methoxy phenyl)phosphine (43.3 mg), toluene (57 mL), and a 20 wt % tetraethylammonium hydroxide aqueous solution (10.55 g) are placed in a reactor and refluxed for 8 hours.

Subsequently, phenyl boronic acid (248 mg), bis(triphenylphosphine)palladium (II) dichloride (86.2 mg), and a 20 wt % tetraethylammonium hydroxide aqueous solution (10.55 g) are added thereto and then heated under reflux for 7 hours.

Subsequently, after removing an aqueous layer, sodium N,N-diethyldithiocarbamate trihydrate (6.86 g) and ion exchanged water (40 mL) are added thereto and then, stirred at 85° C. for 2 hours. After separating an organic layer from the aqueous layer, the organic layer is washed with water, a 3 wt % acetic acid aqueous solution, and water. The organic layer is added dropwise to methanol to precipitate a polymer compound and then filtered and dried, obtaining a solid. This solid is dissolved in toluene and then, passed through a column charged with silica gel/alumina, and a solvent is distilled off under a reduced pressure.

The obtained liquid is added dropwise to methanol, and the precipitated solid is filtered and dried, obtaining Copolymer A-2 (1.14 g).

Copolymer A-2 is measured with respect to a weight average molecular weight (Mw) and polydispersity (Mw/Mn) by SEC. As a result, the weight average molecular weight (Mw) and polydispersity (Mw/Mn) of Copolymer A-2 are respectively 55,300 and 2.35.

Copolymer A-2 has the following structural unit from an input ratio of the monomers and is presumed to be a polymer compound in which Structural Unit (1-1) and Structural Unit (1-2) are alternately present.

[Chemical Formula A-2]

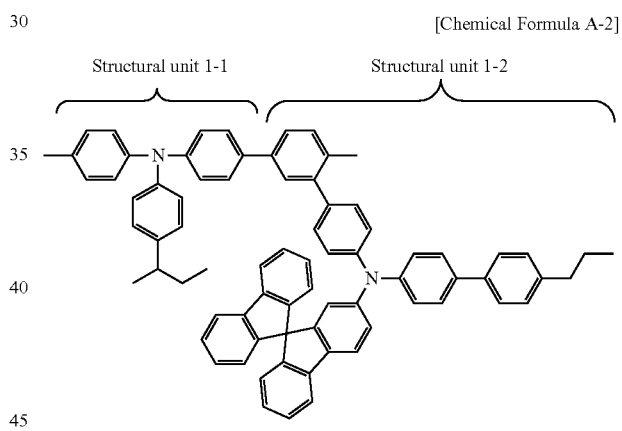

Example 3

Synthesis of Copolymer A-3

Under an argon atmosphere, Compound 3 (1.597 g) synthesized in Synthesis Example 3, 4-(1-methylpropyl)-N,N-bis[4-(4,4,5,5-tetramethyl-1,3,2-dioxaborolan-2-yl)phenyl]-benzenamine (1.574 g), palladium acetate (12.8 mg), tris(2-methoxy phenyl)phosphine (60.1 mg), toluene (63 mL), and a 20 wt % tetraethylammonium hydroxide aqueous solution (14.66 g) are placed in a reactor and then, refluxed for 8 hours.

Subsequently, phenyl boronic acid (344 mg), bis(triphenylphosphine)palladium (II) dichloride (119 mg) and s 20 wt % tetraethylammonium hydroxide aqueous solution (14.66 g) are added thereto and then, heated under reflux for 7 hours.

After removing an aqueous layer, sodium N,N-diethyldithiocarbamate trihydrate (6.86 g) and ion exchanged water (40 mL) are added thereto and then, stirred at 85° C. for 2 hours.

After separating an organic layer from the aqueous layer, the organic layer is washed with water, a 3 wt % acetic acid aqueous solution, and water. The organic layer is added dropwise to methanol to precipitate a polymer compound and then, filtered and dried, obtaining a solid. This solid is dissolved in toluene and passed through a column charged with silica gel/alumina, and a solvent is distilled off under a reduced pressure. The obtained liquid is added dropwise to methanol, and the precipitated solid is filtered and dried, obtaining Copolymer A-3 (1.00 g).

Copolymer A-3 is measured with respect to a weight average molecular weight (Mw) and polydispersity (Mw/Mn) by SEC. As a result, the weight average molecular weight (Mw) and the polydispersity (Mw/Mn) of Copolymer A-3 are respectively 66,400 and 6.54.

Copolymer A-3 has the following repeating unit from an input ratio of the monomers and is presumed to be a polymer compound in which Structural Unit (1-1) and Structural Unit (1-2) are alternately present.

[Chemical Formula A-3]

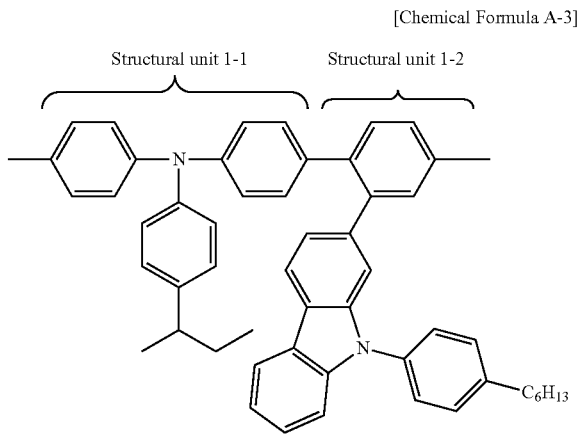

Example 4

Synthesis of Copolymer A-4

Under an argon atmosphere, Compound 4 (1.597 g) synthesized in Synthesis Example 4, 4-(1-methylpropyl)-N,N-bis[4-(4,4,5,5-tetramethyl-1,3,2-dioxaborolan-2-yl)phenyl]-benzenamine (1.574 g), palladium acetate (12.8 mg), tris(2-methoxy phenyl)phosphine (60.1 mg), toluene (63 mL), and a 20 wt % tetraethylammonium hydroxide aqueous solution (14.66 g) are placed in a reactor and refluxed for 8 hours.

Subsequently, phenyl boronic acid (344 mg), bis(triphenylphosphine)palladium (II) dichloride (119 mg), and a 20 wt % tetraethylammonium hydroxide aqueous solution (14.66 g) are added thereto and then, heated under reflux for 7 hours. After removing an aqueous layer, sodium N,N-diethyldithiocarbamate trihydrate (6.86 g) and ion exchanged water (40 mL) are added thereto and then, stirred at 85° C. for 2 hours. After separating an organic layer from the aqueous layer, the organic layer is washed with water, a 3 wt % acetic acid aqueous solution, and water. The organic layer is added dropwise to methanol to precipitate a polymer compound and then, filtered and dried, obtaining a solid. This solid is dissolved in toluene and then, passed through column chromatography charged with silica gel/alumina, and a solvent is distilled off therefrom under a reduced pressure.

The obtained liquid is added dropwise to methanol, and the precipitated solid is filtered and dried, obtaining Copolymer A-4 (0.52 g). Copolymer A-4 is measured with respect to a weight average molecular weight (Mw) and polydispersity (Mw/Mn) by SEC. As a result, the weight average molecular weight (Mw) and the polydispersity (Mw/Mn) of Copolymer A-4 are respectively 5,030 and 1.38.

Copolymer A-4 has the following structural unit from an input ratio of the monomers and is presumed to be a polymer compound in which Structural Unit (1-1) and Structural Unit (1-2) are alternately present.

[Chemical Formula A-4]

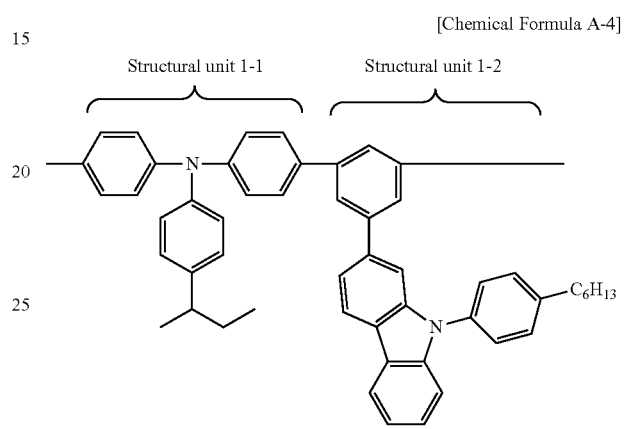

Copolymers A-1 to A-4 of Examples 1 to 4 and poly[(9,9-dioctyl fluorenyl-2,7-diyl)-co-(4,4'-(N-(4-sec-butyl phenyl)diphenyl amine)] (TFB) used as Comparative Example 1 are measured with respect to a HOMO level (eV), a LUMO level (eV), and glass transition temperature (Tg, ° C.) in the following methods.

In addition, a homopolymer of Structural Unit (1-1) and a homopolymer of Structural Unit (1-2) of Copolymers A-1 to A-4 of Examples 1 to 4 also are measured with respect to a HOMO level (eV) in the following method. The results are shown in Table 1.

On the other hand, in Table 1, the HOMO levels of the copolymers, the homopolymer of Structural Unit (1-1), and the homopolymer of Structural Unit (1-2) are respectively shown under HOMO level of "Copolymer", "Structural Unit (1-1)," and "Structural Unit (1-2)".

Measurement of HOMO Level

Each copolymer (or homopolymer) is dissolved in xylene at a concentration of 1 wt %, preparing a coating liquid. The coating liquid is spin-coated at 2000 rpm on a UV-cleaned and ITO-attached glass substrate and dried on a hot plate at 150° C. for 30 minutes, preparing samples. The samples are measured with respect to HOMO levels by using a photoelectron spectrometer (AC-3, Riken Keiki Co., Ltd.) in the air. Herein, the measurement results are used to calculate a rising tangent point of intersection, which is regarded as the HOMO levels (eV). The HOMO levels are usually a negative number.

Measurement of LUMO Level

Each polymer is dissolved in toluene at a concentration of 3.2 wt %, preparing a coating liquid. The coating liquid is spin-coated at 1600 rpm on a UV-cleaned and ITO-attached glass substrate and dried on a hot plate at 250° C. for 60 minutes, preparing samples (film thickness: about 70 nm). The obtained samples are cooled to 77K (−196° C.), and a photoluminescence (PL) spectra are measured. The LUMO level (eV) is calculated from the peak value on the shortest wavelength side of the PL spectrum.

Glass Transition Temperature (Tg)

The glass transition temperature (Tg, ° C.) of each copolymer is measured by using differential scanning calorimetry (DSC) (Trade name: DSC6000, Seiko Instruments, Inc.), increasing a temperature of a sample up to 300° C. at 10° C./min, maintaining the temperature for 10 minutes, decreasing the temperature down to 25° C. at 10° C./min, maintaining the temperature for 10 minutes, and then, increasing the temperature up to 300° C. at 10° C./min. When the measurement is completed, the sample is cooled down to room temperature (25° C.) at 10° C./min.

TABLE 1

| Copolymer | Structural unit | Mw (Mw/Mn) | HOMO (eV) Copolymer | HOMO (eV) Structural Unit (1-1) | HOMO (eV) Structural Unit (1-2) | LUMO (eV) | Tg (°C.) |
|---|---|---|---|---|---|---|---|
| Ex. 1 | A-1 | 72,800 (3.17) | 5.57 | 5.54 | 5.66 | 2.54 | 241 |
| Ex. 2 | A-2 | 55,300 (2.35) | 5.57 | 5.54 | 5.62 | 2.56 | 233 |
| Ex. 3 | A-3 | 66,400 (6.54) | 5.53 | 5.54 | 6.00 | 2.54 | 170 |
| Ex. 4 | A-4 | 5,030 (1.38) | 5.64 | '5.54 | 6.00 | 2.54 | 154 |

Example 5

Manufacture of Electroluminescent Device 1

As for a first electrode (an anode), a glass substrate adhered with indium tin oxide (ITO) which is patterned to have a film thickness of 150 nm is used. This ITO-adhered glass substrate is sequentially washed with a neutral detergent, deionized water, water, and isopropyl alcohol and then, treated with UV-ozone. Subsequently, on this ITO-adhered glass substrate, poly(3,4-ethylenedioxythiophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (dry film thickness) of 30 nm is formed on the ITO-adhered glass substrate.

Next, the copolymer A-1 (hole transport material) synthesized according to Example 1 is dissolved in toluene (solvent) at a concentration of 1 wt % to prepare a coating liquid (1) for forming a hole transport layer. On the hole injection layer, the coating liquid (1) for forming the hole transport layer is applied by spin coating so that the thickness (dry film thickness) may be 30 nm and then heated at 230° C. for 1 hour to form a hole transport layer having a thickness (dry film thickness) of 30 nm.

Figure 2:
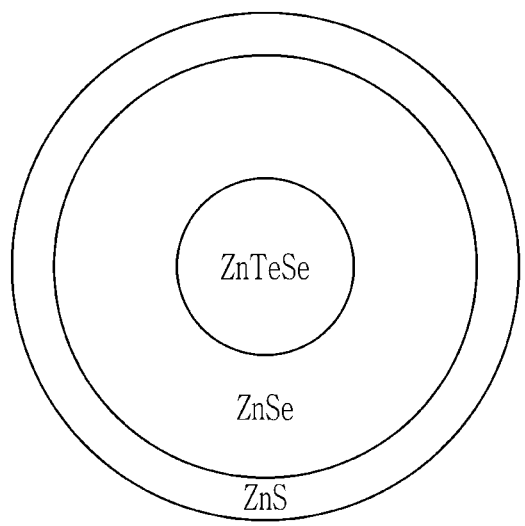
FIG. 2 is a cross-sectional view showing the structure of a quantum dot used in the examples.

Quantum dot dispersion is prepared by dispersing blue quantum dots of ZnTeSe/ZnSe/ZnS (core/shell/shell; an average diameter=about 10 nm) having a structure shown in FIG. 2 in cyclohexane at 1.0 wt %.

On the other hand, the hole transport layer (particularly, Copolymer A-1) is not dissolved in cyclohexane.

This quantum dot dispersion is spin-coated to have a dry film thickness of 30 nm on the hole transport layer (HTL) and dried. As a result, a quantum dot light emitting layer with a thickness (dry film thickness) of 30 nm is formed on the hole transport layer (HTL).

On the other hand, when the quantum dot dispersion is irradiated by ultraviolet (UV), light generated therefrom has a central wavelength of 462 nm and a full width at half maximum of 30 nm.

This quantum dot light emitting layer is completely dried. On this quantum dot light emitting layer, lithium quinolate (Liq) and 1,3,5-tris(N-phenylbenzimidazol-2-yl) benzene (TPBI) (Sigma-Aldrich Co., Ltd.) as an electron transport material are codeposited by using a vacuum deposition apparatus. As a result, a 36 nm-thick electron transport layer is formed on the quantum dot light emitting layer.

Using a vacuum deposition apparatus, (8-quinolato) lithium (lithium quinolate, Liq) is deposited on this electron transport layer. As a result, a 0.5 nm-thick electron injection layer is formed on the electron transport layer.

Using a vacuum deposition apparatus, aluminum (Al) is deposited on the electron injection layer. As a result, a 100 nm-thick second electrode (cathode) is formed on the electron injection layer.

Accordingly, electroluminescent device 1 (quantum dot electroluminescent device 1) is obtained.

Example 6

Manufacture of Electroluminescent Device 2

Electroluminescent device 2 (quantum dot electroluminescent device 2) is manufactured according to the same method as Example 5 except that Copolymer A-2 of Example 2 is used instead of Copolymer A-1 in Example 5.

Example 7

Manufacture of Electroluminescent Device 3

Electroluminescent device 3 (quantum dot electroluminescent device 3) is manufactured according to the same method as Example 5 except that Copolymer A-3 of Example 3 is used instead of Copolymer A-1 in Example 5.

Example 8

Manufacture of Electroluminescent Device 4

Electroluminescent device 4 (quantum dot electroluminescent device 4) is manufactured according to the same method as Example 5 except that Copolymer A-4 of Example 4 is used instead of Copolymer A-1 in Example 5.

Comparative Example 1

Manufacture of Comparative Electroluminescent Device 1

Comparative electroluminescent device 1 (Comparative quantum dot electroluminescent device 1) is manufactured according to the same method as Example 5 except that poly[(9,9-dioctyl fluorenyl-2,7-diyl)-co-(4,4'-(N-(4-sec-butyl phenyl)diphenyl amine)] (TFB) having the following structural unit (Luminescence Technology Corp.) is used instead of Copolymer A-1 in Example 5.

A weight average molecular weight (Mw) and polydispersity (Mw/Mn) of TFB are measured by SEC.

As a result, the weight average molecular weight (Mw) and the polydispersity (Mw/Mn) of TFB are respectively 359,000 and 3.40.

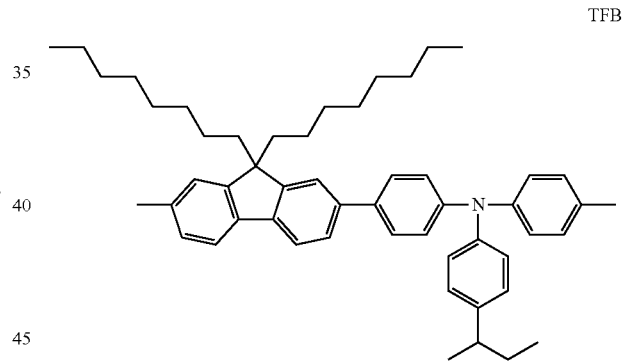

TFB

Evaluation of Electroluminescent Device

Electroluminescent devices 1 and 2 according to Examples 5 and 6 and Comparative electroluminescent device 1 according to Comparative Example 1 are evaluated with respect to luminous efficiency (EQE) and durability (LT50) in the following method.

The results are shown in Table 2.

In Table 2, durability (LT50) of Electroluminescent devices 1 and 2 are expressed as a relative value when LT50 of Comparative Example 1 is 1.0.

In addition, Copolymers A-1 and A-2 of Examples 1 and 2 and poly[(9,9-dioctyl fluorenyl-2,7-diyl)-co-(4,4'-(N-(4-sec-butyl phenyl)diphenyl amine)] (TFB) used as the Comparative Example 1 are evaluated with respect to hole current density@8 V in the following method.

The results are shown in Table 2.

Luminous Efficiency (EQE)

When a voltage is applied to each electroluminescent device, a current starts to flow at a constant voltage, and the electroluminescent device emits light.

A DC constant voltage power supply (a source meter, Keyence Corp.) is used to gradually increase a voltage, at which a current of each device is measured, and a luminance measuring device (SR-3, Topcom Technology Co., Ltd.) is used to measure luminance during the light emission. Herein, the measurement is completed, when the luminance starts to decline. An area of each device is used to calculate a current per unit area (current density), and the luminance (cd/m$^2$) is divided by the current density (A/m$^2$) to obtain current efficiency (cd/A).

In addition, from a spectral radiation luminance spectrum measured by a luminance-measuring device, assuming that Lambertian radiation is performed, external quantum efficiency (EQE) (%) at cd/A max is calculated, which is used to evaluate luminous efficiency.

Hole Current Density@8 V

As for a first electrode (an anode), a glass substrate adhered with indium tin oxide (ITO) which is patterned to have a film thickness of 150 nm is used.

This ITO-adhered glass substrate is sequentially washed with a neutral detergent, deionized water, water, and isopropyl alcohol and then, treated with UV-ozone.

Subsequently, on this ITO-adhered glass substrate, poly (3,4-ethylenedioxythiophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (dry film thickness) of 30 nm is formed on the ITO-adhered glass substrate.

Next, each copolymer ((or homopolymer) (hole transport material) is dissolved in toluene (solvent) at a concentration of 1 wt % to prepare each coating liquid (1) for forming a hole transport layer. On the hole injection layer, the coating liquid (1) for forming the hole transport layer is applied by spin coating so that the thickness (dry film thickness) may be 25 nm and then heated at 230° C. for 1 hour to form a hole transport layer having a thickness (dry film thickness) of 25 nm.

Quantum dot dispersion is prepared by dispersing blue quantum dots of ZnTeSe/ZnSe/ZnS (core/shell/shell; average diameter=about 10 nm) in cyclohexane at 1.0 wt %.

On the other hand, the hole transport layer (particularly, Copolymers A-1 to A-4) is not dissolved in cyclohexane. This quantum dot dispersion is spin-coated to have a dry film thickness of 20 nm on the hole transport layer (HTL) and dried. As a result, a quantum dot light emitting layer with a thickness (dry film thickness) of 20 nm is formed on the hole transport layer (HTL).

This quantum dot light emitting layer is completely dried. On this quantum dot light emitting layer, α-NPD (N,N'-di-1-naphthyl-N,N'-diphenyl benzidine) and HAT-CN (dipyrazino[2,3-f:2',3'-h]quinoxaline-2,3,6,7,10,11-hexacarbonitrile) are sequentially deposited with each thickness of 36 nm and 10 nm using a vacuum deposition apparatus by vacuum deposition to form an electron blocking layer.

On the electron blocking layer, aluminum (hereinafter, Al) is deposited in a vacuum depositing device to form a 100 nm-thick second electrode (cathode). Accordingly, Hole-only devices 1 to 4 (respectively, Copolymers A-1 to A-4 are used as a hole transport material) and Comparative Hole-only device 1 (TFB is used as a hole transport material) are obtained.

The hole-only devices are measured with respect to a current value (current density A/m$^2$) at 8 V while gradually increasing the voltage by using a DC constant voltage power supply (a source meter made by KEYENCE Corp.) and then, expressed as "Hole Current Density@8 V."

Durability (LT50)

The DC constant voltage power supply (a source meter made by KEYENCE Corp.) is used to apply a predetermined voltage to each electroluminescent device and thus make the quantum dot electroluminescent device emit light.

While the light emission of the quantum dot electroluminescent device is measured by using the luminance-measuring device (SR-3, Topcom Technology Co., Ltd.), a current is gradually increased and then, is made constant, when the luminance reached 280 nit (cd/m$^2$), and then, the device is left alone.

"LT50(hr)" is obtained by measuring time when luminance measured by a luminance-measuring device is gradually deteriorated and reaches 50% of initial luminance.

TABLE 2

| | Polymer compound | EQE (%) | LT50 (relative value) | Hole Current Density @ 8 V (relative value) |
|---|---|---|---|---|
| Example 1 | A-1 | 12.9 | 1.7 | 1.9 |
| Example 2 | A-2 | 10.0 | 1.4 | 1.8 |
| Comparative Example 1 | TFB | 9.2 | 1.0 | 1.7 |

Referring to the results of Table 2, Electroluminescent devices 1 and 2 of the examples exhibit significantly high luminous efficiency (EQE) and durability (significantly long luminescence life-span) compared with Comparative electroluminescent device 1.

A proposed reason for the improved properties is that a copolymer having Structural Unit (1-1) with a shallow HOMO level and Structural Unit (1-2) with a deep HOMO level exhibits improved hole mobility from a hole injection layer (HIL) to a light emitting layer, which is confirmed by Hole Current Density@8 V.

On the other hand, in the present exemplary embodiments, blue quantum dot electroluminescent devices are evaluated, but the same results as above may be obtained in red quantum dot electroluminescent devices and the like.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: electroluminescent device (EL device)

110: substrate

120: first electrode

130: hole injection layer (HIL)

140: hole transport layer (HTL)

150: light emitting layer,

160: electron transport layer (ETL)

170: electron injection layer (EIL)

180: second electrode

What is claimed is:

1. A copolymer comprising a structural unit represented by Chemical Formula 1:

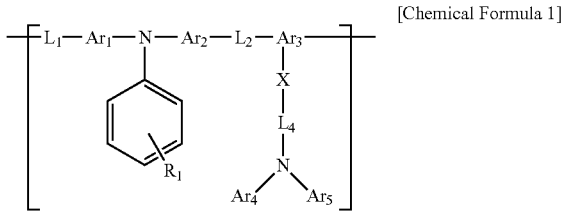

[Chemical Formula 1]

wherein, in Chemical Formula 1, $Ar_1$ and $Ar_2$ are each independently a substituted or unsubstituted divalent aromatic hydrocarbon group having 6 to 30 carbon atoms or a substituted or unsubstituted divalent aromatic heterocyclic group having 3 to 30 ring-member atoms, wherein when a plurality of $Ar_1$'s and $Ar_2$'s are present, they are the same or different, $Ar_3$ is a substituted or unsubstituted trivalent aromatic hydrocarbon group having 6 to 30 carbon atoms or a substituted or unsubstituted trivalent aromatic heterocyclic group having 3 to 30 ring-member atoms, wherein when a plurality of $Ar_3$'s are present, they are the same or different, $Ar_4$ and $Ar_5$ are each independently a substituted or unsubstituted aromatic hydrocarbon group having 6 to 30 carbon atoms or a substituted or unsubstituted aromatic heterocyclic group having 3 to 30 ring-member atoms, wherein when a plurality of $Ar_4$'s and $Ar_5$'s are present, they are the same or different, $L_1$ and $L_2$ are each independently a single bond or a substituted or unsubstituted divalent aromatic hydrocarbon group having 6 to 30 carbon atoms, X is a single bond, $-L_{3a}-$, or $-L_{3b}-L_{3c}-$, wherein $L_{3a}$, $L_{3b}$, and $L_{3c}$ are each independently a substituted or unsubstituted divalent aromatic hydrocarbon group having 6 to 30 carbon atoms, $L_4$ is a substituted or unsubstituted aromatic hydrocarbon group having 6 to 30 carbon atoms, wherein $L_4$ is optionally linked with $Ar_4$, $Ar_5$, or a combination thereof to form a ring, and $R_1$ is hydrogen, a substituted or unsubstituted alkyl group having 1 to 20 carbon atoms, a substituted or unsubstituted alkoxy group having 1 to 20 carbon atoms, or a substituted or unsubstituted aromatic hydrocarbon group having 6 to 30 carbon atoms, and $R_1$ is optionally linked to the phenylene ring to provide a fused ring, wherein at least one of $Ar_4$, $Ar_5$, or a combination thereof is a group represented by Chemical Formula 4:

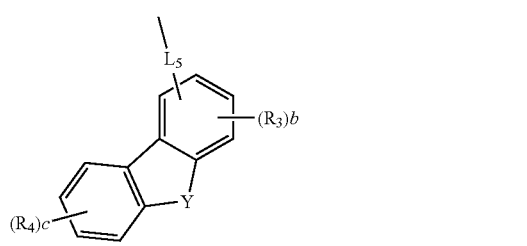

[Chemical Formula 4]

wherein, in Chemical Formula 4, $L_5$ is a single bond, a substituted or unsubstituted divalent aromatic hydrocarbon group having 6 to 30 carbon atoms, or a substituted or unsubstituted divalent aromatic heterocyclic group having 3 to 30 ring-member atoms, $R_3$ and $R_4$ are the same or different, and are each independently a substituted or unsubstituted alkyl group having 1 to 20 carbon atoms, a substituted or unsubstituted alkoxy group having 1 to 20 carbon atoms, a substituted or unsubstituted monovalent aromatic hydrocarbon group having 6 to 30 carbon atoms, or a substituted or unsubstituted monovalent aromatic heterocyclic group having 3 to 30 ring-member atoms, Y is $=CR_5R_6-$, $-O-$, or $-S-$, wherein $R_5$ and $R_6$ are each independently a substituted or unsubstituted aryl group having 6 to 30 carbon atoms or a substituted or unsubstituted alkyl group having 1 to 20 carbon atoms, and $R_5$ and $R_6$ are optionally linked to each other to form a ring structure, b is 0, 1, 2, or 3, and c is 0, 1, 2, 3, or 4.

2. The copolymer of claim 1, wherein the structural unit of Chemical Formula 1 is represented by Chemical Formula 2:

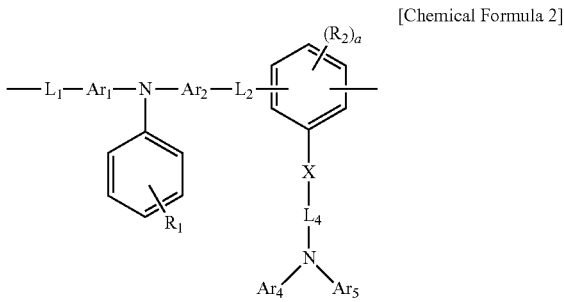

[Chemical Formula 2]

wherein, in Chemical Formula 2, $Ar_1$, $Ar_2$, $Ar_4$, $Ar_5$, $L_1$, $L_2$, X, $L_4$, and $R_1$ are the same as in Chemical Formula 1, $R_2$ is a substituted or unsubstituted alkyl group having 1 to 20 carbon atoms, a substituted or unsubstituted alkoxy group having 1 to 20 carbon atoms, or a substituted or unsubstituted monovalent aromatic hydrocarbon group having 6 to 30 carbon atoms, and a is 0, 1, 2, or 3.

3. The copolymer of claim 2, wherein the structural unit of Chemical Formula 1 is represented by Chemical Formula 3:

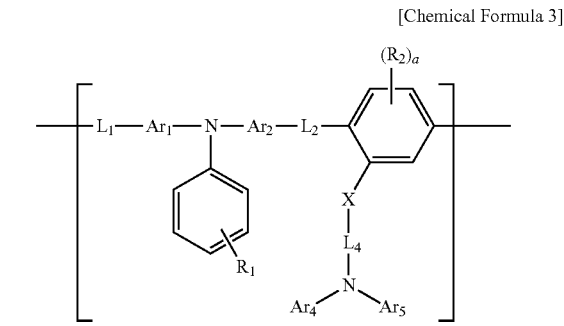

[Chemical Formula 3]

wherein, in Chemical Formula 3,
Ar$_1$, Ar$_2$, Ar$_4$, Ar$_5$, L$_1$, L$_2$, X, L$_4$, and R$_1$ are the same as in Chemical Formula 1, and
R$_2$ and a are the same as in Chemical Formula 2.

4. The copolymer of claim 1, wherein in Chemical Formula 1, the structural unit represented by Chemical Formula 1-1 is a moiety represented by Chemical Formula 1-1a, Chemical Formula 1-1b, or Chemical Formula 1-1c:

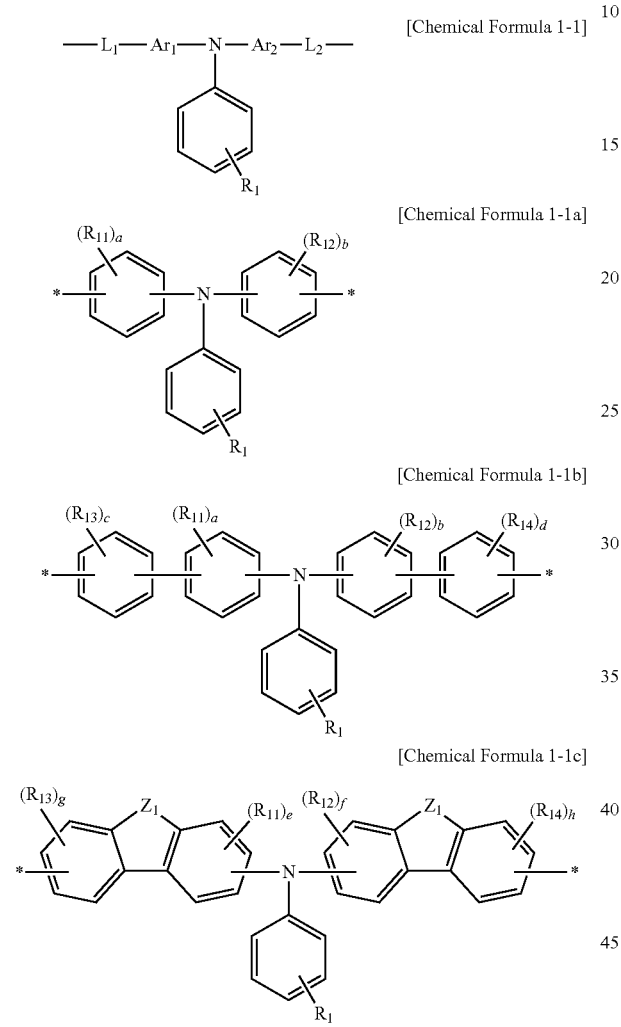

wherein, in Chemical Formula 1-1a, Chemical Formula 1-1b, and Chemical Formula 1-1c,
R$_{11}$, R$_{12}$, R$_{13}$, and R$_{14}$ are each independently a hydrogen atom, a substituted or unsubstituted C1 to C20 alkyl group, a substituted or unsubstituted C1 to C20 alkoxy group, or a substituted or unsubstituted C6 to C30 aromatic hydrocarbon group,
Z$_1$ and Z$_2$ are each independently CR$_a$R$_b$, NR$_c$, O, S, Se, or Te, wherein R$_a$, R$_b$, and R$_c$ are each independently hydrogen, a linear or branched hydrocarbon group having 1 to 14 carbon atoms, or an aromatic hydrocarbon group having 6 to 14 carbon atoms, and R$_a$ and R$_b$ are optionally linked to each other to form a spiro structure,
a, b, c, and d are each independently an integer of 1 to 4,
e, f, g, and h are each independently an integer of 1 or 2,
R$_1$ is the same as in Chemical Formula 1, and
* indicates a bonding portion linked to the main chain.

5. The copolymer of claim 1, wherein the group represented by Chemical Formula 4 is one of Group 2 (Chemical Formulas 5 to 20):

[Group 2]

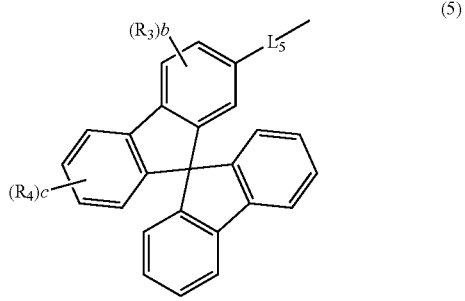

(5)

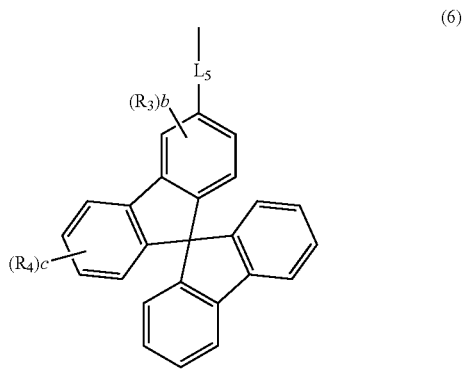

(6)

(7)

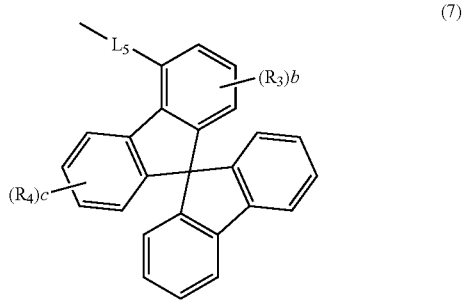

(8)

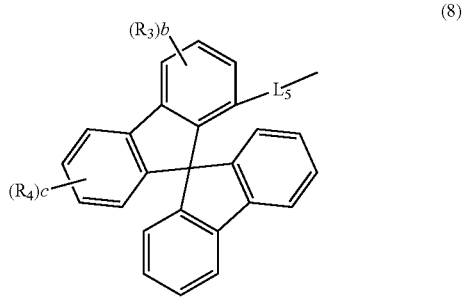

(9)

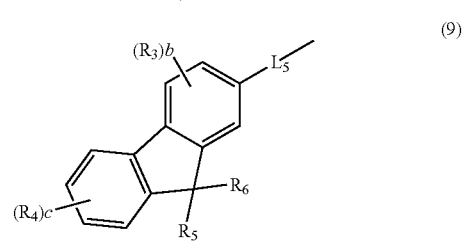

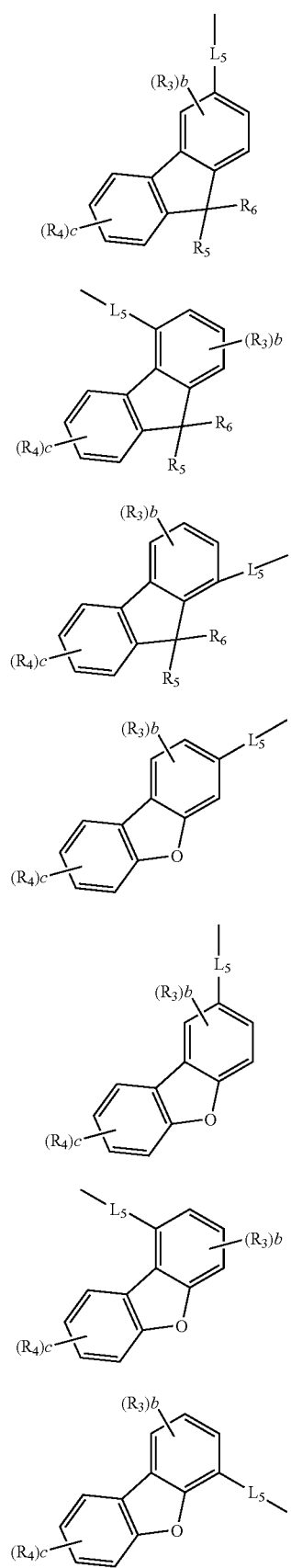
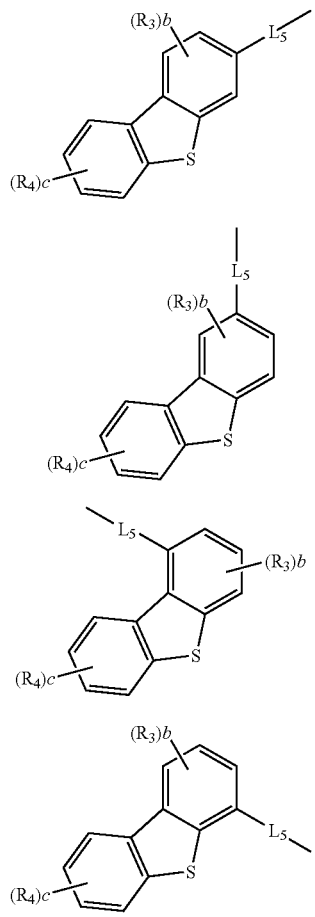
wherein, in Group 2 (Chemical Formulas 5 to 20),
$L_5$, $R_3$, $R_4$, $R_5$, $R_6$, b, and c are the same as in Chemical Formula 4.
6. The copolymer of claim 1, wherein $L_4$ forms a ring with $Ar_4$, and $-L_4-N(Ar_4)(Ar_5)$ has a structure represented by Chemical Formula 21 or 22:
[Chemical Formula 21]
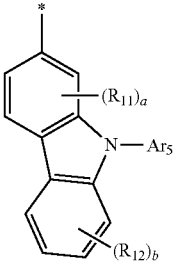
[Chemical Formula 22]
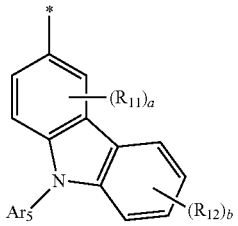

wherein, in Chemical Formula 21 and Chemical Formula 22, $Ar_5$ is the same as in Chemical Formula 1, and $R_{11}$ and $R_{12}$ are each independently a hydrogen atom, a linear alkyl group having 3 to 10 carbon atoms, or a branched alkyl group having 3 to 10 carbon atoms, a is an integer of 1 to 3, and b is an integer of 1 to 4.

7. An electroluminescent device material comprising the copolymer of claim 1.

8. An electroluminescent device, comprising
a first electrode and a second electrode, and
at least one organic layer between the first electrode and the second electrode comprising at least one layer,
wherein the at least one layer of the organic layer comprises the copolymer of claim 1.

9. The electroluminescent device of claim 8, wherein the at least one layer of the organic layer comprising the copolymer is a hole transport layer or a hole injection layer.

10. The electroluminescent device of claim 8, wherein the organic layer comprises a light emitting layer comprising semiconductor nanoparticles or an organometallic complex.

* * * * *